(12) United States Patent
Cameron et al.

(10) Patent No.: US 7,032,164 B2
(45) Date of Patent: Apr. 18, 2006

(54) EFFICIENT DESIGN TO CALCULATE EXTRINSIC INFORMATION FOR SOFT-IN-SOFT-OUT (SISO) DECODER

(75) Inventors: Kelly Brian Cameron, Irvine, CA (US); Hau Thien Tran, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 560 days.

(21) Appl. No.: 10/264,766

(22) Filed: Oct. 4, 2002

(65) Prior Publication Data

US 2003/0226095 A1 Dec. 4, 2003

Related U.S. Application Data

(60) Provisional application No. 60/384,698, filed on May 31, 2002, provisional application No. 60/384,702, filed on May 31, 2002.

(51) Int. Cl.
*H03M 13/03* (2006.01)
(52) U.S. Cl. ............... 714/792; 375/265; 714/796
(58) Field of Classification Search ............... 714/755, 714/701, 786, 792, 794–796; 375/262, 265, 375/261, 341, 279
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,029,264 A * | 2/2000 | Kobayashi et al. | ......... 714/755 |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,484,283 B1 * | 11/2002 | Stephen et al. | ............. 714/786 |

(Continued)

FOREIGN PATENT DOCUMENTS

EP 0 735 696 A2 10/1996

(Continued)

OTHER PUBLICATIONS

Benedetto S et al: "Parallel Concatenated Trellis Coded Modulation" Proc. 1996 IEEE International Conference on Communications (ICC), Dallas, USA, vol. vol. 2, (Jun. 23, 1996), pp. 974-978, XP000625917 ISBN: 0-7803-3251-2 p. 975-976: figure 2.

(Continued)

*Primary Examiner*—Guy J. Lamarre
(74) *Attorney, Agent, or Firm*—Garlick Harrison & Markison LLP; Shayne X. Short

(57) ABSTRACT

Efficient design to calculate extrinsic information for Soft-In-Soft-Out (SISO) decoder. A design provides for very efficient performing extrinsic value calculation when performing iterative decoding. The design also accommodates a variety of rate controls each having varying bandwidth efficiencies. By grouping and capitalizing on the commonality of many of the intermediate terms that are employed when calculating the extrinsic values needed to perform iterative decoding, a great saving in terms of hardware may be achieved. In addition, this also provides a great deal of improvement in terms of operational speed and overall decoder system efficiency. The design is also adaptable to assist in performing decoding input symbols having multiple bits; a single design may be employed to accommodate different input symbols that have different numbers of bits. The extrinsic calculation employs min* processing in one embodiment; however, the design may also be performed using max*, min, or max processing.

56 Claims, 74 Drawing Sheets

One to Many TTCM Communication System 900

U.S. PATENT DOCUMENTS

2002/0061078 A1    5/2002    Cameron

FOREIGN PATENT DOCUMENTS

EP    0 735 696 A3    1/1999
FR    91 05278 A1    10/1992

OTHER PUBLICATIONS

Robertson P et al: "Bandwidth-Efficient Turbo Trellis-Coded Modulation Using Punctured Component Codes" IEEE Journal on Selected Areas in Communications, IEEE Inc. New York, US, vol. 16, No. 2, (Feb. 1998), pp. 206-218, XP000741775 ISSN: 0733-8716 p. 211-213 p. 216-217; figures 1,4,5.

Ogiwara H et al: "Improvement of Turbo Trellis-Coded Modulation System" IEICE Transactions on Fundamentals of Electronics, Communications and Computer Sciences Inst. Electron. Inf. & Commun. Eng Japan, vol. E81-A, No. 10, (Oct. 1998), pp. 2040-2046, XP0O23O6298 ISSN:0916-8508 p. 2042-2043; figure 5.

Vishwanath S et al: "Exploring Adaptive Turbo Coded Modulation for Flat Fading Channels" Proc. of VIC 2000, vol. 4, (Sep. 24, 2000), pp. 1778-1783, XP010524335 the whole document.

\* cited by examiner

High Definition Television (HDTV) Communication System 200

Cellular Communication System 300

Cellular Communication System 400

Microwave Communication System 500

Point-to-Point Radio Communication System 600

Bi-directional TTCM Communication System 800

One to Many TTCM Communication System 900

Single Interleaver Embodiment of Turbo Encoder 1111

Dual Interleaver Embodiment of Turbo Encoder 1111

Systematic Encoder 1400

Non-Systematic Encoder Using Puncturing and Rate Control Sequencer to Support Multiple Encoders 1600

Periodic Sequencing of Non-Systematic Encoder Using Puncturing and Rate Control Sequencer 1700

Generic Embodiment of Variable Puncturing, Constellations, and Mapping Using Single Encoder 1800

Rate 1/2 Recursive Convolutional Encoder with Non-Systematic Output 1900

Rate 2/5 Prototype Encoder 2000

Block Diagram of Rate 2/5 Systematic Prototype Encoder 2100

Block Diagram of Rate 2/5 Non-Systematic Prototype Encoder 2000

Trellis 2300 of Rate 2/5 Non-Systematic Prototype Encoder 2000
(Input: $i_0i_1$ =input symbol's bits)

Non-Systematic Rate 2/5 Encoder 2000 Using Puncturing and Rate Control Sequencer 1150 to Support Multiple Encoders Non-Systematic Rate 2/5 Encoder Using 2000 Puncturing and Rate Control Sequencer 1150 to Support Multiple Encoders Non-Systematic Rate 2/5 Encoder 2000 Using Puncturing and Rate Control Sequencer 1150 to Support Multiple Encoders Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Periodic Sequencing of Non-Systematic Rate 2/5 Encoder 2000 Using Puncturing and Rate Control Sequencer 1150

Rate Control Governed Symbol Mapping to 8 PSK Constellations

Rate Control Governed Symbol Mapping to QPSK Constellations

Rate Control Governed Symbol Mapping to QPSK Constellations
(Constellations Points Tilted With Respect to Axes)

Rate Control Governed Symbol Mapping to QPSK Constellations
(Distance from Origin to Const. Pts. may Differ for Various QPSKs)

Rate Control Governed Symbol Mapping to 16 QAM Constellation

Rate Control Governed Symbol Mapping to 16 APSK Constellations

Fig. 37

Embodiment of Variable Puncturing, Constellations, and Mapping Using Single Non-Systematic Rate 2/5 Encoder 2000

TTCM Decoder System 3800

Alternative TTCM Decoder System 3900 That Recycles Single SISO (Receiving I,Q inputs)

Rx I,Q Mapping Based on RC

Metric Calculation Performed by Metric Generator 3733 (Embodiment Using RC 9)

Metric Mapping Functionality

SISO Calculations and Operations

Alpha, Beta, and Extrinsic Calculation Based on Trellis 2300 of Rate 2/5 Non-Systematic Prototype Encoder 2000

Final Output of Decoding

Embodiment of Variable Code Rate Codec (Encoder/Decoder) Servicing Channels of Various SNRs

| Rate Control= | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| Trellis Outputs (in octal) | | | | | | | | | Calculated-Metric Index (to be mapped to metric outputs) | | | | | | | |
| 0 1 4 3 1 2 5 | 0642 | 0132 | 0132 | 0132 | 0642 | 04MM | 0132 | 02MM | 0MMM | 04MM | 02MM | 0642 | 0132 | 02MM | 0132 | 0132 |
| 3 1 2 5 0 1 4 | 4206 | 3201 | 3201 | 3201 | 4206 | MM04 | 3201 | MM02 | MM0M | MM04 | MM02 | 4206 | 3201 | MM02 | 3201 | 3201 |
| 1 2 6 2 3 3 7 | 5317 | 1023 | 1023 | 1023 | 5317 | 26MM | 1023 | 13MM | M2MM | 26MM | 13MM | 5317 | 1023 | 13MM | 1023 | 1023 |
| 2 3 3 7 1 2 6 | 1753 | 2310 | 2310 | 2310 | 1753 | MM26 | 2310 | MM13 | MMM2 | MM26 | MM13 | 1753 | 2310 | MM13 | 2310 | 2310 |
| 2 4 3 0 1 5 1 | 2460 | 2310 | 2310 | 2310 | 2460 | MM51 | 2310 | MM20 | MMM1 | MM51 | MM20 | 2460 | 2310 | MM20 | 2310 | 2310 |
| 1 5 1 2 4 3 0 | 6024 | 1023 | 1023 | 1023 | 6024 | 51MM | 1023 | 20MM | M1MM | 51MM | 20MM | 6024 | 1023 | 20MM | 1023 | 1023 |
| 3 6 2 2 7 1 3 | 7135 | 3201 | 3201 | 3201 | 7135 | MM73 | 3201 | MM31 | MM3M | MM73 | MM31 | 7135 | 3201 | MM31 | 3201 | 3201 |
| 7 1 3 3 6 2 2 | 3571 | 0132 | 0132 | 0132 | 3571 | 73MM | 0132 | 31MM | 3MMM | 73MM | 31MM | 3571 | 0132 | 31MM | 0132 | 0132 |

M = Maximum value to be used for metric

Trellis Output vs. Metric Index 4800

Fig. 48

| Trellis Outputs (in octal) | Rate Control=<br>Metric Outputs | Calculated-Metric Index (to be mapped to metric outputs) | | | | | | | | | | | | | | |
|---|---|---|---|---|---|---|---|---|---|---|---|---|---|---|---|---|
| | | 0 | 1 | 2 | 3 | 4 | 6 | 7 | A | B | C | D | E | F |
| 0 1 4 3 1 2 5 | 0 6 4 2 | 0 6 4 2 | 0 1 3 2 | 0 1 3 2 | 0 1 3 2 | 0 6 4 2 | 0 1 3 2 | 0 2 M M | 0 2 M M | 0 6 4 2 | 0 1 3 2 | 0 2 M M | 0 1 3 2 | 0 1 3 2 |
| 3 1 2 5 0 1 4 | 4 2 0 6 | 4 2 0 6 | 3 2 0 1 | 3 2 0 1 | 3 2 0 1 | 4 2 0 6 | 3 2 0 1 | M M 0 2 | M M 0 2 | 4 2 0 6 | 3 2 0 1 | M M 0 2 | 3 2 0 1 | 3 2 0 1 |
| 1 2 6 2 3 3 7 | 5 3 1 7 | 5 3 1 7 | 1 0 2 3 | 1 0 2 3 | 1 0 2 3 | 5 3 1 7 | 1 0 2 3 | 1 3 M M | 1 3 M M | 5 3 1 7 | 1 0 2 3 | 1 3 M M | 1 0 2 3 | 1 0 2 3 |
| 2 3 3 7 1 2 6 | 1 7 5 3 | 1 7 5 3 | 2 3 1 0 | 2 3 1 0 | 2 3 1 0 | 1 7 5 3 | 2 3 1 0 | M M 1 3 | M M 1 3 | 1 7 5 3 | 2 3 1 0 | M M 1 3 | 2 3 1 0 | 2 3 1 0 |
| 2 4 3 0 1 5 1 | 2 4 6 0 | 2 4 6 0 | 2 3 1 0 | 2 3 1 0 | 2 3 1 0 | 2 4 6 0 | 2 3 1 0 | M M 2 0 | M M 2 0 | 2 4 6 0 | 2 3 1 0 | M M 2 0 | 2 3 1 0 | 2 3 1 0 |
| 1 5 1 2 4 3 0 | 6 0 2 4 | 6 0 2 4 | 1 0 2 3 | 1 0 2 3 | 1 0 2 3 | 6 0 2 4 | 1 0 2 3 | 2 0 M M | 2 0 M M | 6 0 2 4 | 1 0 2 3 | 2 0 M M | 1 0 2 3 | 1 0 2 3 |
| 3 6 2 2 7 1 3 | 7 1 3 5 | 7 1 3 5 | 3 2 0 1 | 3 2 0 1 | 3 2 0 1 | 7 1 3 5 | 3 2 0 1 | M M 3 1 | M M 3 1 | 7 1 3 5 | 3 2 0 1 | M M 3 1 | 3 2 0 1 | 3 2 0 1 |
| 7 1 3 3 6 2 2 | 3 5 7 1 | 3 5 7 1 | 0 1 3 2 | 0 1 3 2 | 0 1 3 2 | 3 5 7 1 | 0 1 3 2 | 3 1 M M | 3 1 M M | 3 5 7 1 | 0 1 3 2 | 3 1 M M | 0 1 3 2 | 0 1 3 2 |

M = Maximum value to be used for metric

Trellis Outputs Mapped to Metric Outputs (without flags) 4900

Fig. 49

| Trellis Outputs (in octal) | Rate Control= Metric Outputs | Calculated-Metric Index (to be mapped to metric outputs) | | |
| --- | --- | --- | --- | --- |
| | | 5 | 8 | 9 |
| 0 14 31 25 | 06MM | 04MM | 0MMM | 04MM |
| 31 25 0 14 | MM06 | MM04 | MM0M | MM04 |
| 12 6 23 37 | 53MM | 26MM | M2MM | 26MM |
| 23 37 12 6 | MM53 | MM26 | MMM2 | MM26 |
| 24 30 15 1 | 71MM | 51MM | MMM1 | MM51 |
| 15 1 24 30 | MM71 | MM51 | M1MM | 51MM |
| 36 22 7 13 | MM24 | MM73 | MM3M | MM73 |
| 7 13 36 22 | 24MM | 73MM | 3MMM | 73MM |
| | Flags = | Rate_ctl_9=1 | Rate_ctl_8=1 | Rate_ctl_9=1 |

Trellis Outputs Mapped to Metric Outputs (with flags) 5000

Fig. 50

Extrinsic Top Level Functional Block 5100

Embodiment 5200 of Extrinsic Top Level Functional Block 5100

An Implementation of Embodiment 5200 of Extrinsic Top Level Functional Block 5100

Embodiment of Extrinsic Functional Block 5010

Alternative Embodiment 5500 of Extrinsic Functional Block 5010

An Implementation of Alternative Embodiment 5500 of Extrinsic Functional Block 5010

Embodiment 5700 of Metric and app Combination

An Implementation of Embodiment 5700 of Metric and app Combination

Embodiment of Ext min* Tree

An Implementation of min_star_ext_tree_00 (Embodiment for 2 Bit Symbol Input: Prob. bit 0=0)

An Implementation of min_star_ext_tree_10 (Embodiment for 2 Bit Symbol Input: Prob. bit 0=1)

An Implementation of min_star_ext_tree_01 (Embodiment for 2 Bit Symbol Input: Prob. bit 1=0)

An Implementation of min_star_ext_tree_11 (Embodiment for 2 Bit Symbol Input: Prob. bit 1=1)

An Implementation of Extrinsic min* Functional Block (including equation)

$$\underbrace{\text{Min\_star}(A,B) = \text{minimum}(A,B)}_{\text{Min\_out}} - \underbrace{\ln(1+e^{-|A-B|}) + \text{constant offset}}_{\text{Log\_out}}$$

| Delta[3:0] | Log(+value) | Log(-value) |
|---|---|---|
| 1111 | 11 | 01 |
| 1110 | 11 | 01 |
| 1101 | 11 | 01 |
| 1100 | 11 | 10 |
| 1011 | 11 | 10 |
| 1010 | 11 | 10 |
| 1001 | 10 | 10 |
| 1000 | 10 | 11 |
| 0111 | 10 | 11 |
| 0110 | 10 | 11 |
| 0101 | 10 | 11 |
| 0100 | 01 | 11 |
| 0011 | 01 | 11 |
| 0010 | 01 | 11 |
| 0001 | 01 | 11 |
| 0000 | 00 | 11 |

Log Table (includes constant offset of 0.75)

Fig. 65

An Implementation of Decoding FB 5020, Normalize FB 5022, and Saturate FB 5024

An Implementation of Uncoded Bit FB 5030 (for RCs 4&B)

Fig. 68 An Implementation of Uncoded Bit FB 5030 (for RC 5)

| Inputs | | | Rate_ctl= | |
|---|---|---|---|---|
| | | | 4 & B | 1 |
| Decoded_Bit_1 | Decoded_Bit_0 | Uncoded_Bit_Select | (UC3C2C1) Uncoded_Bit Index | (UC4C3) Uncoded_Bit Index |
| 0 | 0 | 0 | 0 | 0 |
| 0 | 0 | 1 | 3 | 0 |
| 0 | 1 | 0 | 6 | 5 |
| 0 | 1 | 1 | 5 | 5 |
| 1 | 0 | 0 | 4 | 4 |
| 1 | 0 | 1 | 7 | 4 |
| 1 | 1 | 0 | 2 | 2 |
| 1 | 1 | 1 | 1 | 2 |

Index Table to Decode Uncoded Bit(s) (for RCs 1,4&B)

Fig. 69

| | Rate_ctl= | | 5 (UC2C1C0) |
|---|---|---|---|
| | Inputs | | |
| Decoded_Bit_0 | Uncoded_Bit_Select_1 | Uncoded_Bit_Select_0 | Uncoded_Bit Index |
| 0 | 0 | 0 | 0 |
| 0 | 0 | 1 | 1 |
| 0 | 1 | 0 | 3 |
| 0 | 1 | 1 | 2 |
| 1 | 0 | 0 | 6 |
| 1 | 0 | 1 | 7 |
| 1 | 1 | 0 | 5 |
| 1 | 1 | 1 | 4 |

Index Table to Decode Uncoded Bit(s) (for RC 5)

Fig. 70

Extrinsic Calculation and Decoding Method 7200

Extrinsic Calculation Method 7400

EFFICIENT DESIGN TO CALCULATE EXTRINSIC INFORMATION FOR SOFT-IN-SOFT-OUT (SISO) DECODER

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications which are hereby incorporated herein by reference in their entirety and are made part of the present U.S. Utility Patent Application for all purposes:
1. U.S. Provisional Application Ser. No. 60/384,698, entitled "VARIABLE CODE RATE AND SIGNAL CONSTELLATION TURBO TRELLIS CODED MODULATION CODEC," filed May 31, 2002, pending.
2. U.S. Provisional Application Ser. No. 60/384,702, entitled "EFFICIENT DESIGN TO CALCULATE EXTRINSIC INFORMATION FOR SOFT-IN-SOFT-OUT (SISO) DECODER," filed May 31, 2002, pending.

The following U.S. Utility Patent Application, being filed concurrently, is hereby incorporated herein by reference in its entirety and made part of the present U.S. Utility Patent Application for all purposes:
1. U.S. Utility Patent application Ser. No. 10/264,486, entitled "VARIABLE CODE RATE AND SIGNAL CONSTELLATION TURBO TRELLIS CODED MODULATION CODEC," filed Oct. 4, 2002, pending.

BACKGROUND OF THE INVENTION

1. Technical Field of the Invention

The invention relates generally to communication systems; and, more particularly, it relates to turbo trellis coded modulation (TTCM) communication systems and/or parallel concatenated turbo code modulated (PC-TCM) communication systems.

2. Description of Related Art

Turbo code and variants thereof have been the focus of a great deal of interest in the recent years. A primary directive in this area of development has been to try continually to lower the error floor within a communication system. The ideal goal has been to try reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate. The modulation may be viewed as including a constellation and mapping. The code rate may be viewed as the ratio of information bits over the total number of bits transmitted within the communication system. In the turbo code context, it is common to refer to code rate of n/m, where n is the number of information bits and m is the total number of bits, and where m>n. The difference between m and n typically being referred to as the number of redundant bits. Turbo codes typically introduce a degree of redundancy to at least a portion of data prior to transmission through a communication channel. This is generally referred to as forward error correction (FEC) coding.

Although there has been much development within the context of turbo code and related coding applications with increased interest recently, this focus has been primarily towards achieving very low bit error rates (BERs) across relatively noisy communication channels. As such, these prior art turbo codes largely operate at relatively low data rates across these noisy communication channels. The area of turbo code and variants thereof is still an area of relative immaturity in the technological development sense. While there has no doubt been a great amount of progress achieved this far, there still remains a great deal of development and improvement that can be done. This is a technology area where industry-wide consensus has certainly not yet been achieved, and there are many competing viewpoint within the industry as to which direction/directions the technological community's effort should be directed.

The use of turbo codes to provide such low error, while operating at relatively low rates, has largely been in the context of communication systems having a large degree of noise within the communication channel and where substantially error free communication is held at the highest premium. Some of the earliest application arenas for turbo coding were space related where accurate (ideally error free) communication is often deemed an essential design criterion. The direction of development then moved towards developing terrestrial-applicable and consumer-related applications. Still, the focus of effort here has continued to be achieving low error floors, and not specifically towards reaching higher throughput.

As such, there exists a need in the art to develop turbo code related coding that is operable to support higher amounts of throughput while still preserving the relatively low error floors offered within the turbo code context. Whereas the development of turbo code related technology has primarily been directed towards relatively low rates across noisy communication channels, there exists a need to overcome the many hurdles that prevent the application of turbo code to higher data rate applications. In doing so, these higher data rate applications may benefit from the low BERs offered by turbo codes.

There are many bottlenecks that have prevented the implementation of turbo code within communication applications that operate at high data rates. Many of these bottlenecks are computational in nature and simply require such significant processing resources that they cannot be implemented to support high data rate applications. One of the problematic areas within the turbo code context is the relatively extensive calculation of values that are needed to perform turbo decoding.

One of the bottlenecks in performing the iterative decoding employed within the turbo code context involves calculating the extrinsic information that is used within Soft-In-Soft-Out (SISO) decoders. Typical decoders employ a straightforward, brute force approach to calculating these extrinsic values that are employed to the iterative decoding. In most prior art contexts, where speed and data throughput were not primary design considerations, theses decoders would simply provision a great deal of processing resources to meet the extremely high demand of resources to meet these needs. However, there are many, many applications where it is simply cost-prohibitive to allocate such a significant amount of needed hardware to allow for the full blown processing and calculation of these values using the conventional approaches. A more common result was this: when the implementation at hand did not lend itself to such a large allocation of processing resources (which certainly included most commercial communication applications), then the data rate would suffer significantly at the expense of ensuring as low BER operation as possible.

When the primary design directive was to achieve as close to error free transmission as possible, then a slow down in data rate (from an already relatively low data rate) was not of significant concern and would be accepted relatively easily. Of the many, the calculation of extrinsic values that are employed to perform iterative decoding is one area where a great deal of development must be made in order to allow the entrance of turbo code into commercial, specifically consumer-level, communication applications on a broad scale. As such, there exists a need to provide for more efficient calculation of extrinsic values for use in performing iterative decoding within the turbo code context.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 37 is a diagram illustrating an embodiment of variable puncturing, modulation, and mapping using the single non-systematic rate 2/5 encoder of the FIG. 20 according to the invention.

FIG. 48 is a table illustrating an embodiment of a mapping of trellis metrics vs. metric index according to the invention.

FIG. 49 is a table illustrating an embodiment of trellis outputs mapped to metric outputs (without flags) according to the invention.

FIG. 50 is a table illustrating an embodiment of trellis outputs mapped to metric outputs (with flags) according to the invention.

FIG. 65 is a table illustrating an embodiment of a log table (including a constant offset) according to the invention.

FIG. 69 is a table illustrating an embodiment of an index table that is used to decode uncoded bits employed using the RCs 1,4&B.

FIG. 70 is a table illustrating an embodiment of an index table that is used to decode uncoded bits employed using the RC 5.

DETAILED DESCRIPTION OF THE INVENTION

The variable code rate functionality of the invention may properly be described as being within the context of turbo trellis coded modulation (TTCM) communication systems. TTCM coding may also be viewed as a hybrid combination of turbo coding and trellis coded modulated (TCM). Some of the particular embodiments of the invention are performed within communication systems that may more properly be categorized as being parallel concatenated turbo code modulated (PC-TCM) communication systems.

FIGS. 1–9 illustrate a number of communication systems context embodiments where certain aspects of the invention may be implemented.

Figure 1:
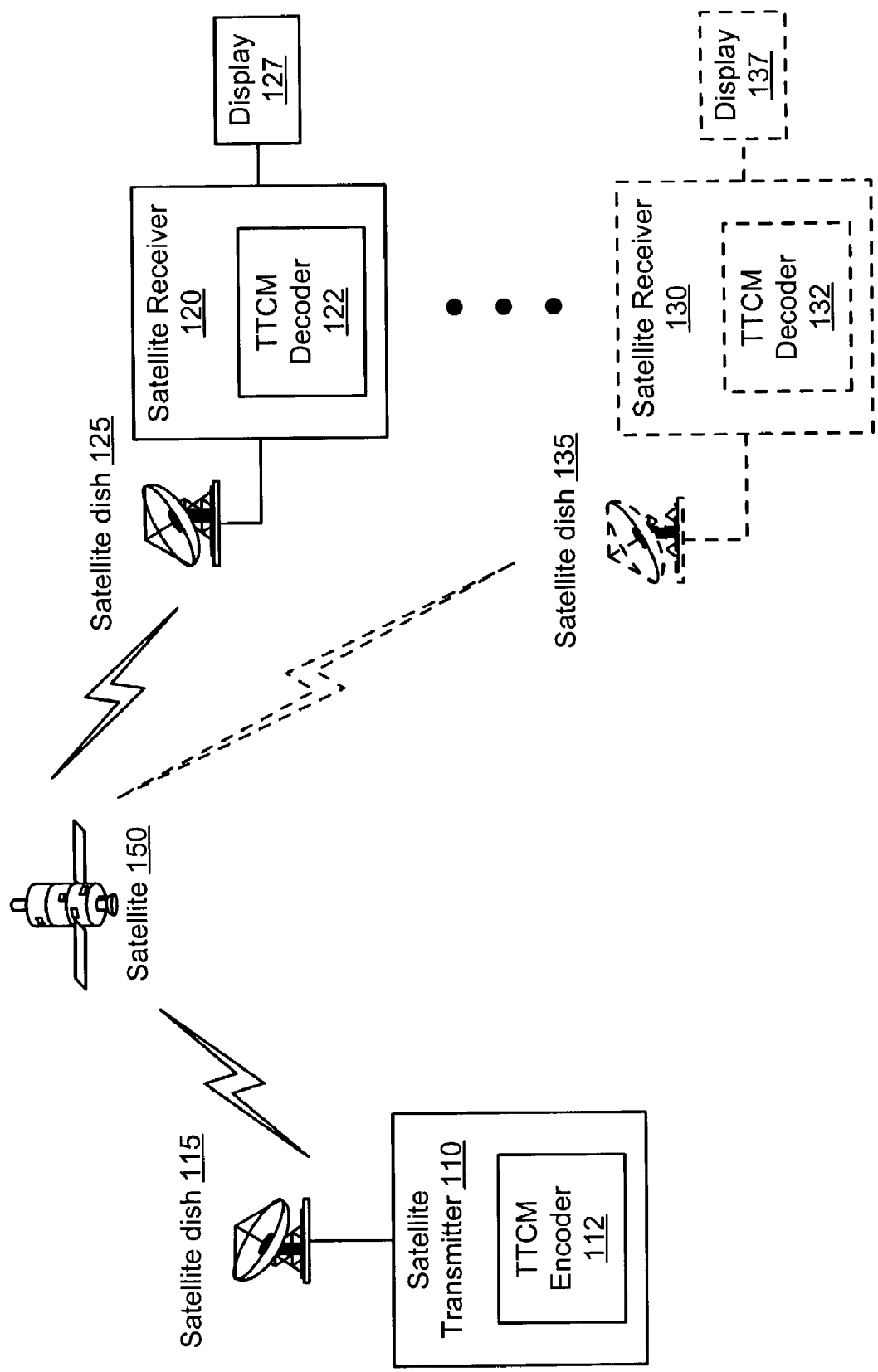
FIG. 1 is a system diagram illustrating an embodiment of a satellite communication system that is built according to the invention.

FIG. 1 is a system diagram illustrating an embodiment of a satellite communication system 100 that is built according to the invention. A satellite transmitter 110 includes a TTCM encoder 112. The TTCM encoder 112 is one of several possible embodiments that are described herein. The TTCM encoder 112 is operable to encode data that is to be transmitted by the satellite transmitter 110. The satellite transmitter 110 is communicatively coupled to a satellite dish 115 that is operable to communicate with a satellite 150. The satellite transmitter 110 may also be communicatively coupled to a wired network. This wired network may include any number of networks including the Internet, proprietary networks, and other wired networks. The satellite transmitter 110 employs the satellite dish 115 to communicate to the satellite 150 via a wireless communication channel. The satellite 150 is able to communicate with one or more satellite receivers, shown as a satellite receiver 120 (having a satellite dish 125), . . . , and a satellite receiver 130 (having a satellite dish 135). Each of the satellite receiver 120 and the satellite receiver 130 includes a TTCM decoder; specifically, the satellite receiver 120 includes a TTCM decoder 122, and the satellite receiver 130 includes a TTCM decoder 132. Each of the satellite receiver 120 and the satellite receiver 130 may also be communicatively coupled to a display. Again, specifically, the satellite receiver 120 may be communicatively coupled to a display 127, and the satellite receiver 130 may be communicatively coupled to a display 137. Various and further details will be provided below regarding the various embodiments in which the TTCM encoder 112, and the TTCM decoders 122 and 132 may be implemented.

Here, the communication to and from the satellite 150 may cooperatively be viewed as being a wireless communication channel, or each of the communication to and from the satellite 150 may be viewed as being two distinct wireless communication channels.

For example, the wireless communication "channel" may be viewed as not including multiple wireless hops in one embodiment. In other embodiments, the satellite 150 receives a signal received from the satellite transmitter 110 (via its satellite dish 115), amplifies it, and relays it to satellite receiver 120 (via its satellite dish 125); the satellite receiver 120 may also be implemented using terrestrial receivers such as satellite receivers, satellite based telephones, and satellite based Internet receivers, among other receiver types. In the case where the satellite 150 receives a signal received from the satellite transmitter 110 (via its satellite dish 115), amplifies it, and relays it, the satellite 150 may be viewed as being a "transponder." In addition, other satellites may exist that perform both receiver and transmitter operations in cooperation with the satellite 150. In this case, each leg of an up-down transmission via the wireless communication channel would be considered separately.

In whichever embodiment, the satellite 150 communicates with the satellite receiver 120. The satellite receiver 120 may be viewed as being a mobile unit in certain embodiments (employing a local antenna); alternatively, the satellite receiver 120 may be viewed as being a satellite earth station that may be communicatively coupled to a wired network in a similar manner in which the satellite transmitter 110 may also be communicatively coupled to a wired network. In both situations, the satellite receiver 110 and the satellite receiver 120 are each operable to support the TTCM encoder 112 and the TTCM decoder 122 contained therein. The FIG. 1 shows one of the many embodiments where TTCM coding (TTCM encoding and TTCM decoding) may be performed according to any one or more of the various embodiments of the invention.

Figure 2:
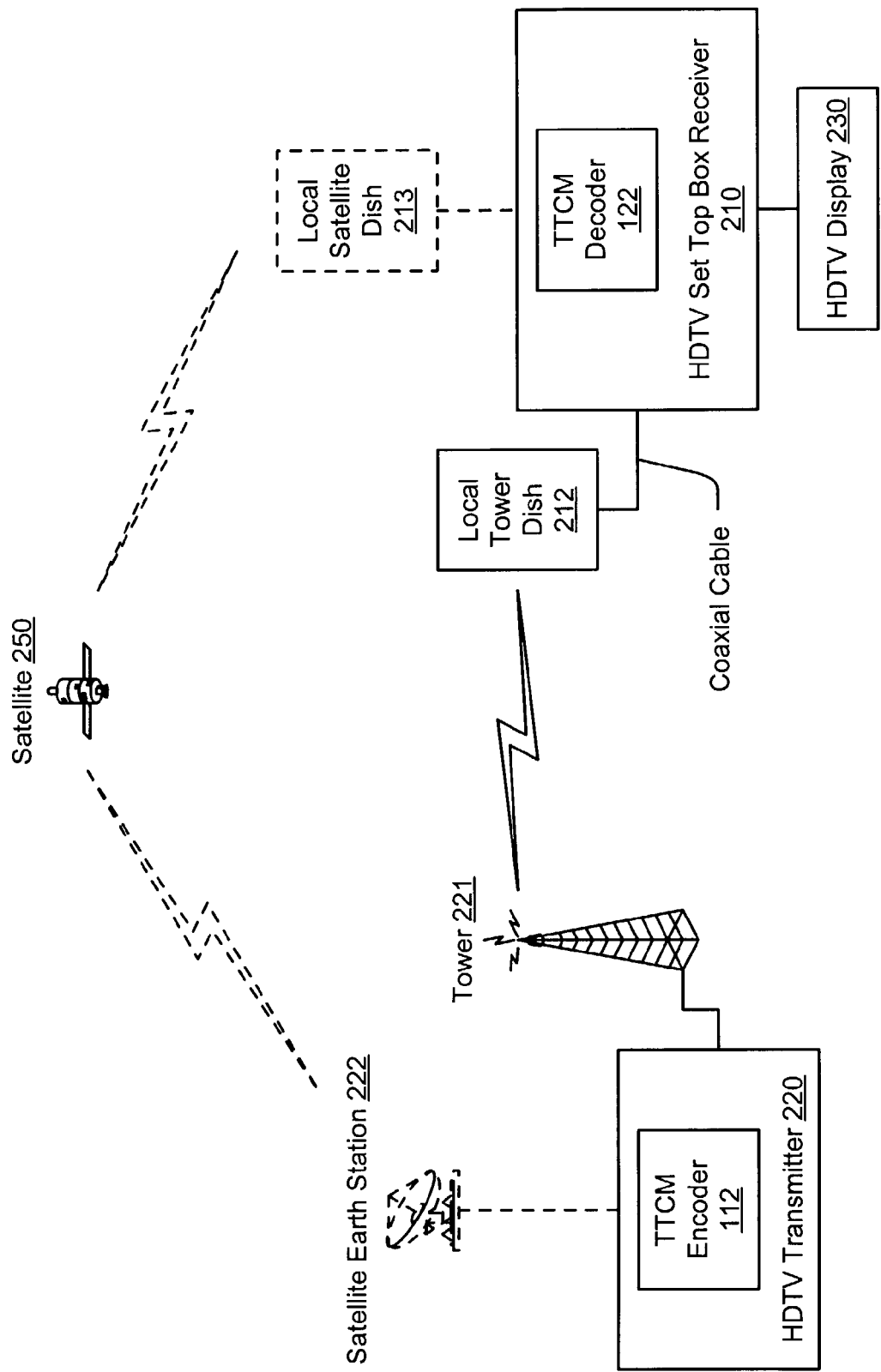
FIG. 2 is a system diagram illustrating an embodiment of a HDTV communication system that is built according to the invention.

FIG. 2 is a system diagram illustrating an embodiment of a HDTV communication system 200 that is built according to the invention. An HDTV transmitter 220 is communicatively coupled to a tower 221. The HDTV transmitter 220, using its tower 221, transmits a signal to a local tower dish 212 via a wireless communication channel. The local tower dish 212 communicatively couples to an HDTV set top box receiver 210 via a coaxial cable. The HDTV set top box receiver 210 includes the functionality to receive the wireless transmitted signal that has been received by the local tower dish 212; this may include any transformation and/or down-converting as well to accommodate any up-converting that may have been performed before and during transmission of the signal from the HDTV transmitter 220 and its tower 221.

The HDTV set top box receiver 210 is also communicatively coupled to an HDTV display 230 that is able to display the demodulated and decoded wireless transmitted signals received by the HDTV set top box receiver 210 and its local tower dish 212. The HDTV transmitter 220 (via its tower 221) transmits a signal directly to the local tower dish 412 via the wireless communication channel in this embodiment. In alternative embodiments, the HDTV transmitter 220 may first receive a signal from a satellite 250, using a satellite earth station 222 that is communicatively coupled to the HDTV transmitter 220, and then transmit this received signal to the to the local tower dish 212 via the wireless communication channel. In this situation, the HDTV transmitter 220 operates as a relaying element to transfer a signal originally provided by the satellite 250 that is destined for the HDTV set top box receiver 210. For example, another satellite earth station may first transmit a signal to the satellite 250 from another location, and the satellite 250 may relay this signal to the satellite earth station 222 that is communicatively coupled to the HDTV transmitter 220. The HDTV transmitter 220 performs receiver functionality and then transmits its received signal to the local tower dish 212.

In even other embodiments, the HDTV transmitter 220 employs the satellite earth station 222 to communicate to the satellite 250 via a wireless communication channel. The satellite 250 is able to communicate with a local satellite dish 213; the local satellite dish 213 communicatively couples to the HDTV set top box receiver 210 via a coaxial cable. This path of transmission shows yet another communication path where the HDTV set top box receiver 210 may communicate with the HDTV transmitter 220.

In whichever embodiment and whichever signal path the HDTV transmitter 220 employs to communicate with the HDTV set top box receiver 210, the HDTV set top box receiver 210 is operable to receive communication transmissions from the HDTV transmitter 220.

The HDTV transmitter 220 includes an embodiment of the TTCM encoder 112 described above. Similarly, the HDTV set top box receiver 210 includes an embodiment of the TTCM decoder 122 described above. Cooperatively, the TTCM encoder 112 and the TTCM decoder 122 form a TTCM codec according to the invention. The FIG. 2 shows yet another of the many embodiments where TTCM coding (TTCM encoding and TTCM decoding) may be performed according to any one or more of the various embodiments of the invention.

Figure 3:
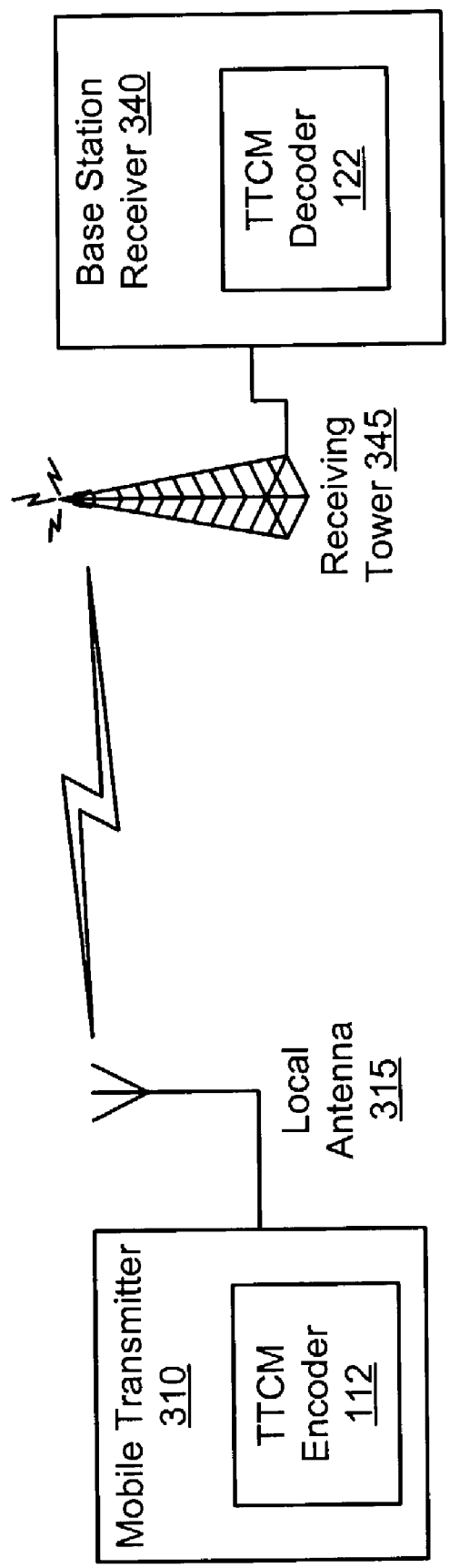
FIG. 3 is a system diagram illustrating an embodiment of a cellular communication system that is built according to the invention.

FIG. 3 is a system diagram illustrating an embodiment of a cellular communication system 300 that is built according to the invention. A mobile transmitter 310 includes a local antenna 315 communicatively coupled thereto. The mobile transmitter 310 may be any number of types of transmitters including a cellular telephone, a wireless pager unit, a mobile computer having transmit functionality, or any other type of mobile transmitter. The mobile transmitter 310 transmits a signal, using its local antenna 315, to a receiving tower 345 via a wireless communication channel. The receiving tower 345 is communicatively coupled to a base station receiver 340; the receiving tower 345 is operable to receive data transmission from the local antenna 315 of the mobile transmitter 310 that have been communicated via the wireless communication channel. The receiving tower 345 communicatively couples the received signal to the base station receiver 340.

The mobile transmitter 310 includes an embodiment of the TTCM encoder 112 described above. Similarly, the base station receiver 340 includes an embodiment of the TTCM decoder 122 described above. Cooperatively, the TTCM encoder 112 and the TTCM decoder 122 form a TTCM codec according to the invention. The FIG. 3 shows yet another of the many embodiments where TTCM coding (TTCM encoding and TTCM decoding) may be performed according to any one or more of the various embodiments of the invention.

Figure 4:
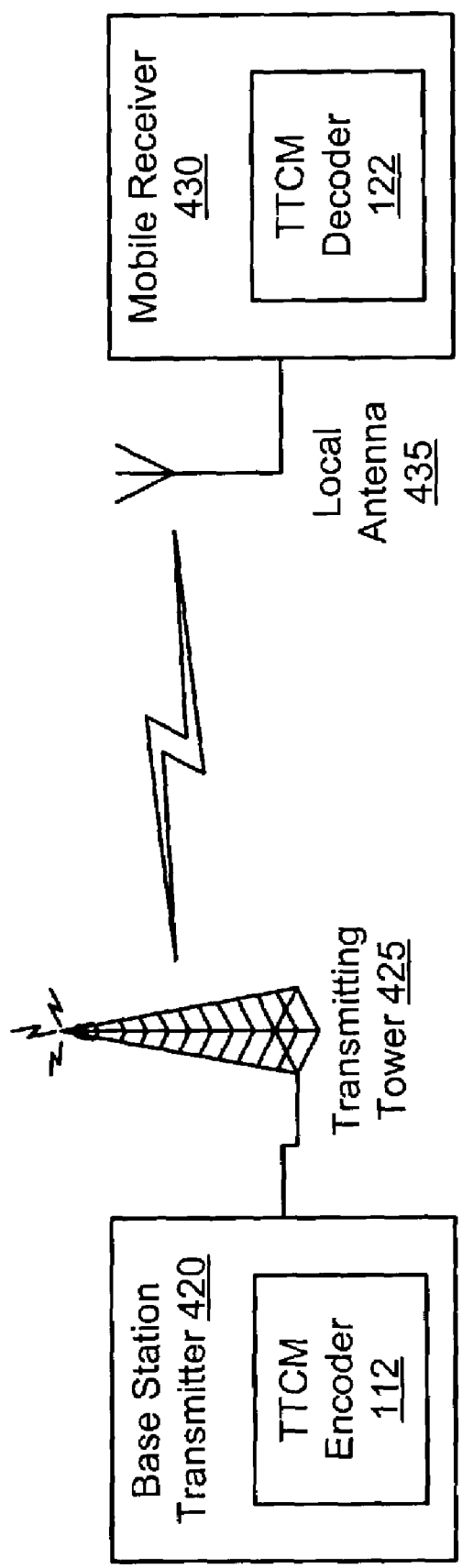
FIG. 4 is a system diagram illustrating another embodiment of a cellular communication system that is built according to the invention.

FIG. 4 is a system diagram illustrating another embodiment of a cellular communication system 400 that is built according to the invention. From certain perspectives, the cellular communication system 400 of the FIG. 4 may be viewed as being the reverse transmission operation of the cellular communication system 300 of the FIG. 3. A base station transmitter 420 is communicatively coupled to a transmitting tower 425. The base station transmitter 420, using its transmitting tower 425, transmits a signal to a local antenna 435 via a wireless communication channel. A mobile receiver 430 includes the local antenna 435 communicatively coupled thereto. The local antenna 435 is communicatively coupled to a mobile receiver 430 so that the mobile receiver 430 may receive transmission from the transmitting tower 435 of the base station transmitter 420 that have been communicated via the wireless communication channel. The local antenna 435 communicatively couples the received signal to the mobile receiver 430. It is noted that the mobile receiver 430 may be any number of types of receivers including a cellular telephone, a wireless pager unit, a mobile computer having receive functionality, or any other type of mobile receiver.

The base station transmitter 420 includes an embodiment of the TTCM encoder 112 described above. Similarly, the mobile receiver 430 includes an embodiment of the TTCM decoder 122 described above. Cooperatively, the TTCM encoder 112 and the TTCM decoder 122 form a TTCM codec according to the invention. The FIG. 4 shows yet another of the many embodiments where TTCM coding (TTCM encoding and TTCM decoding) may be performed according to any one or more of the various embodiments of the invention.

Figure 5:
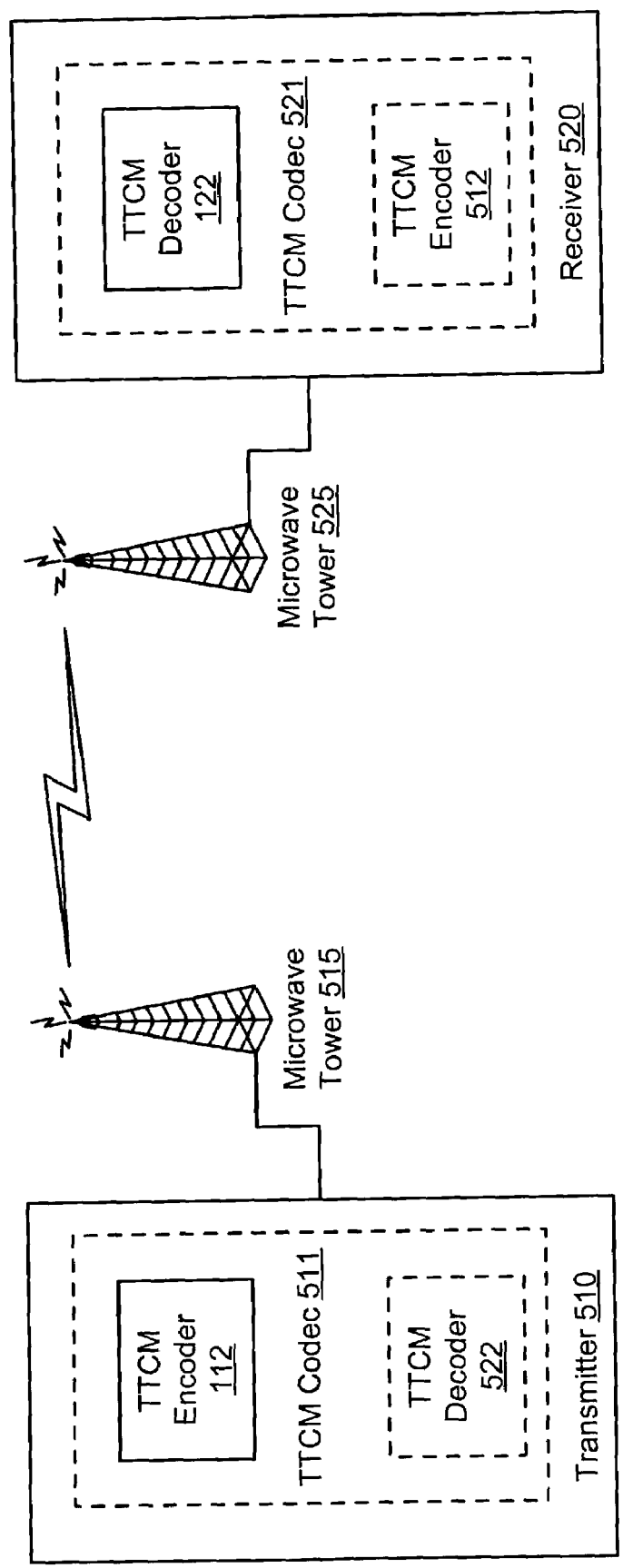
FIG. 5 is a system diagram illustrating an embodiment of a microwave communication system that is built according to the invention.

FIG. 5 is a system diagram illustrating an embodiment of a microwave communication system 500 that is built according to the invention. A transmitter 510 is communicatively coupled to a microwave tower 515. The transmitter 510, using its microwave tower 515, transmits a signal to a microwave tower 525 via a wireless communication channel. A receiver 520 is communicatively coupled to the microwave tower 525. The microwave tower 525 is able to receive transmissions from the microwave tower 515 that have been communicated via the wireless communication channel.

The transmitter 510 includes an embodiment of the TTCM encoder 112 described above. Similarly, the receiver 520 includes an embodiment of the TTCM decoder 122 described above. Cooperatively, the TTCM encoder 112 and the TTCM decoder 122 form a TTCM codec according to a uni-directional communication implementation of the invention.

However, in a bi-directional communication implementation of the invention, the transmitter 510 also includes an embodiment of a TTCM decoder 522; the embodiment of the TTCM decoder 522 may be viewed as being duplicative of the TTCM decoder 122 within the receiver 520. The TTCM encoder 112 and the TTCM decoder 522 together form a TTCM codec 511 within the transmitter 510. The receiver 520 also includes an embodiment of a TTCM encoder 512; the embodiment of the TTCM encoder 512 may be viewed as being duplicative of the TTCM encoder 112 within the transmitter 510. The TTCM decoder 122 and the TTCM encoder 512 together form a TTCM codec 521 within the receiver 520.

The embodiment of the invention described within the FIG. 5 shows an embodiment where a TTCM codec, built according to the invention, may be viewed as within a single device (such as the TTCM codec 511 within the transmitter 510 or the TTCM codec 521 within the receiver 520) or as being distributed across two separate devices, namely, the transmitter 510 and the receiver 520.

The FIG. 5 shows yet another of the many embodiments where TTCM coding (TTCM encoding and TTCM decoding) may be performed according to any one or more of the various embodiments of the invention.

Figure 6:
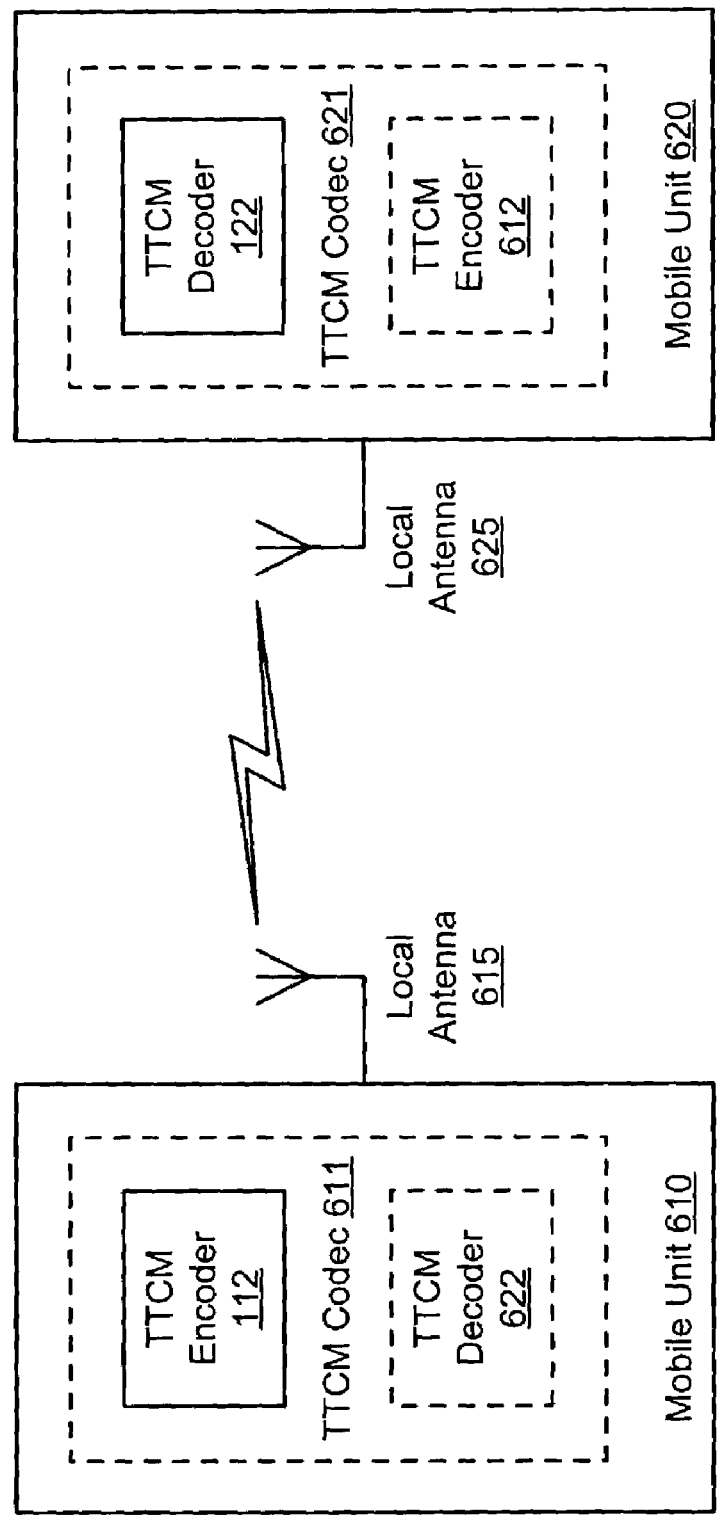
FIG. 6 is a system diagram illustrating an embodiment of a point-to-point communication system that is built according to the invention.

FIG. 6 is a system diagram illustrating an embodiment of a point-to-point communication system 600 that is built according to the invention. A mobile unit 610 includes a local antenna 615 communicatively coupled thereto. The mobile unit 610, using its local antenna 615, transmits a signal to a local antenna 625 via a wireless communication channel. A mobile unit 620 includes the local antenna 625 communicatively coupled thereto. The mobile unit 620 may receive transmissions from the mobile unit 610 that have been communicated via the wireless communication channel.

The mobile unit 610 includes an embodiment of the TTCM encoder 112 described above. Similarly, the mobile unit 620 includes an embodiment of the TTCM decoder 122 described above. Cooperatively, the TTCM encoder 112 and the TTCM decoder 122 form a TTCM codec according to a uni-directional communication implementation of the invention.

However, in a bi-directional communication implementation of the invention, the mobile unit 610 also includes an embodiment of a TTCM decoder 622; the embodiment of the TTCM decoder 622 may be viewed as being duplicative of the TTCM decoder 122 within the mobile unit 620. The TTCM encoder 112 and the TTCM decoder 622 together form a TTCM codec 611 within the mobile unit 610. The mobile unit 620 also includes an embodiment of a TTCM encoder 612; the embodiment of the TTCM encoder 612 may be viewed as being duplicative of the TTCM encoder 112 within the mobile unit 610. The TTCM decoder 122 and the TTCM encoder 612 together form a TTCM codec 621 within the mobile unit 620.

The embodiment of the invention described within the FIG. 6 shows an embodiment where a TTCM codec, built according to the invention, may be viewed as within a single device (such as the TTCM codec 611 within the mobile unit 610 or the TTCM codec 621 within the mobile unit 610) or as being distributed across two separate devices, namely, the mobile unit 610 and the mobile unit 620.

The FIG. 6 shows yet another of the many embodiments where TTCM coding (TTCM encoding and TTCM decoding) may be performed according to any one or more of the various embodiments of the invention.

Figure 7:
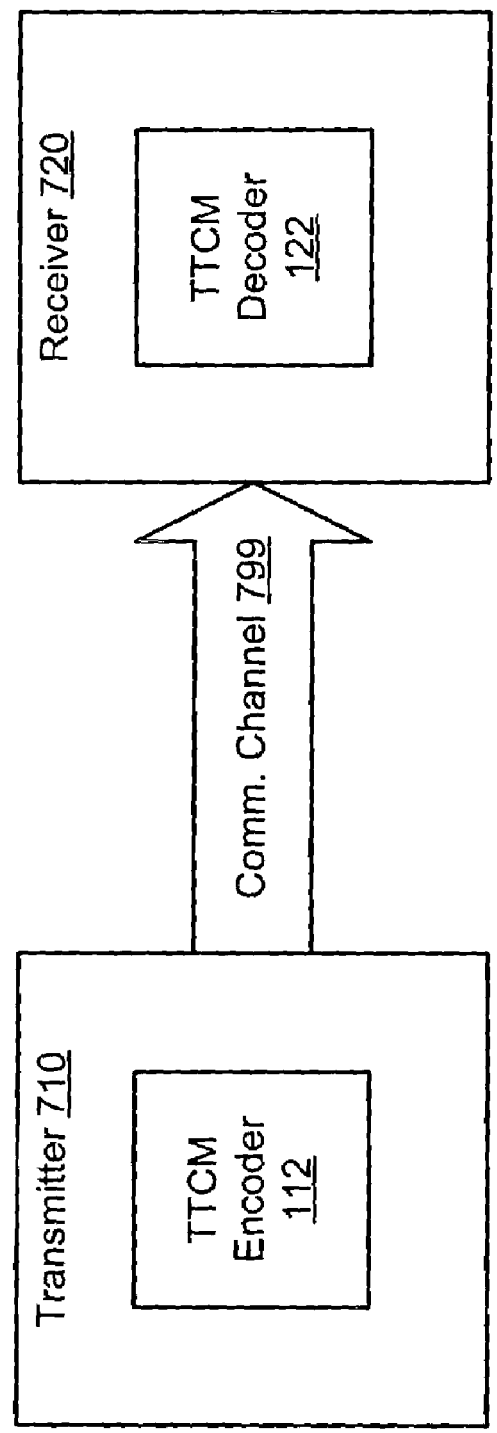
FIG. 7 is a system diagram illustrating an embodiment of a uni-directional TTCM communication system that is built according to the invention.

FIG. 7 is a system diagram illustrating an embodiment of a uni-directional TTCM communication system 700 that is built according to the invention. A transmitter 710 communicates with a receiver 720 via a uni-directional communication channel 799. The uni-directional communication channel 799 may be a wireline (or wired) communication channel or a wireless communication channel without departing from the scope and spirit of the invention. The wired media by which the uni-directional communication channel 799 may be implemented are varied, including coaxial cable, fiber-optic cabling, and copper cabling, among other types of "wiring." Similarly, the wireless manners in which the uni-directional communication channel 799 may be implemented are varied, including satellite communication, cellular communication, microwave communication, and radio communication, among other types of wireless communication.

The transmitter 710 includes an embodiment of the TTCM encoder 112. Similarly, the receiver 720 includes an embodiment of the TTCM decoder 122. Cooperatively, TTCM encoder 112 and the TTCM decoder 122 form a TTCM codec according to the invention. The FIG. 7 shows yet another of the many embodiments where TTCM coding (TTCM encoding and TTCM decoding) may be performed according to any one or more of the various embodiments of the invention.

Figure 8:
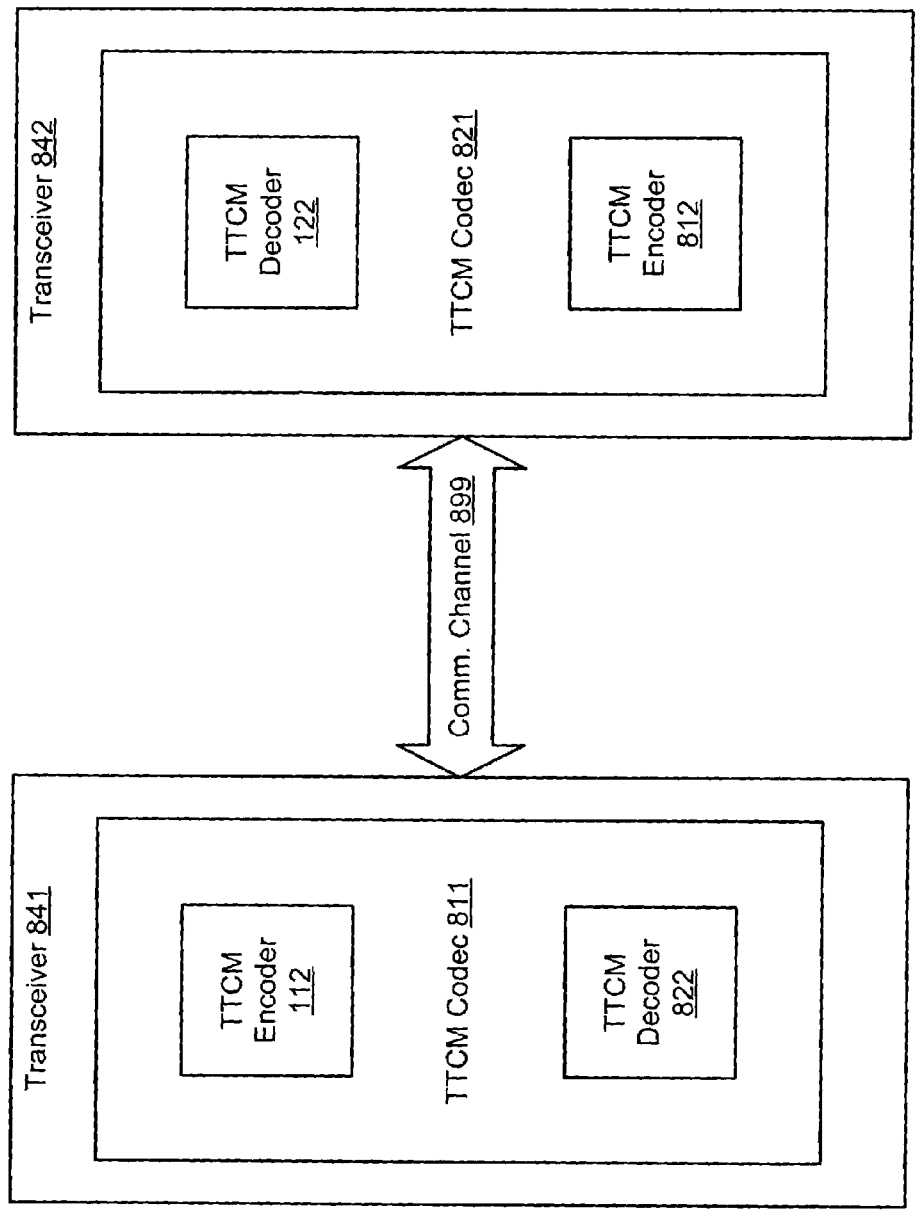
FIG. 8 is a system diagram illustrating an embodiment of a bi-directional TTCM communication system that is built according to the invention.

FIG. 8 is a system diagram illustrating an embodiment of a bi-directional TTCM communication system 800 that is built according to the invention. A transceiver 841 and a transceiver 842 are able to communicate with one another via a bi-directional communication channel 899. The bi-directional communication channel 899 may be a wireline (or wired) communication channel or a wireless communication channel without departing from the scope and spirit of the invention. The wired media by which the bi-directional communication channel 899 may be implemented are varied, including coaxial cable, fiber-optic cabling, and copper cabling, among other types of "wiring." Similarly, the wireless manners in which the bi-directional communication channel 899 may be implemented are varied, including satellite communication, cellular communication, microwave communication, and radio communication, among other types of wireless communication.

The transceiver 841 includes a TTCM codec 811 that includes a TTCM encoder 112 and a TTCM decoder 822. Similarly, transceiver 842 includes a TTCM codec 821 that includes a TTCM decoder 122 and a TTCM encoder 812. The TTCM codec 811 and the TTCM codec 821 may be viewed as being duplicative of one another within the transceivers 841 and 842.

The FIG. 8 shows yet another of the many embodiments where TTCM coding (TTCM encoding and TTCM decoding) may be performed according to any one or more of the various embodiments of the invention.

Figure 9:
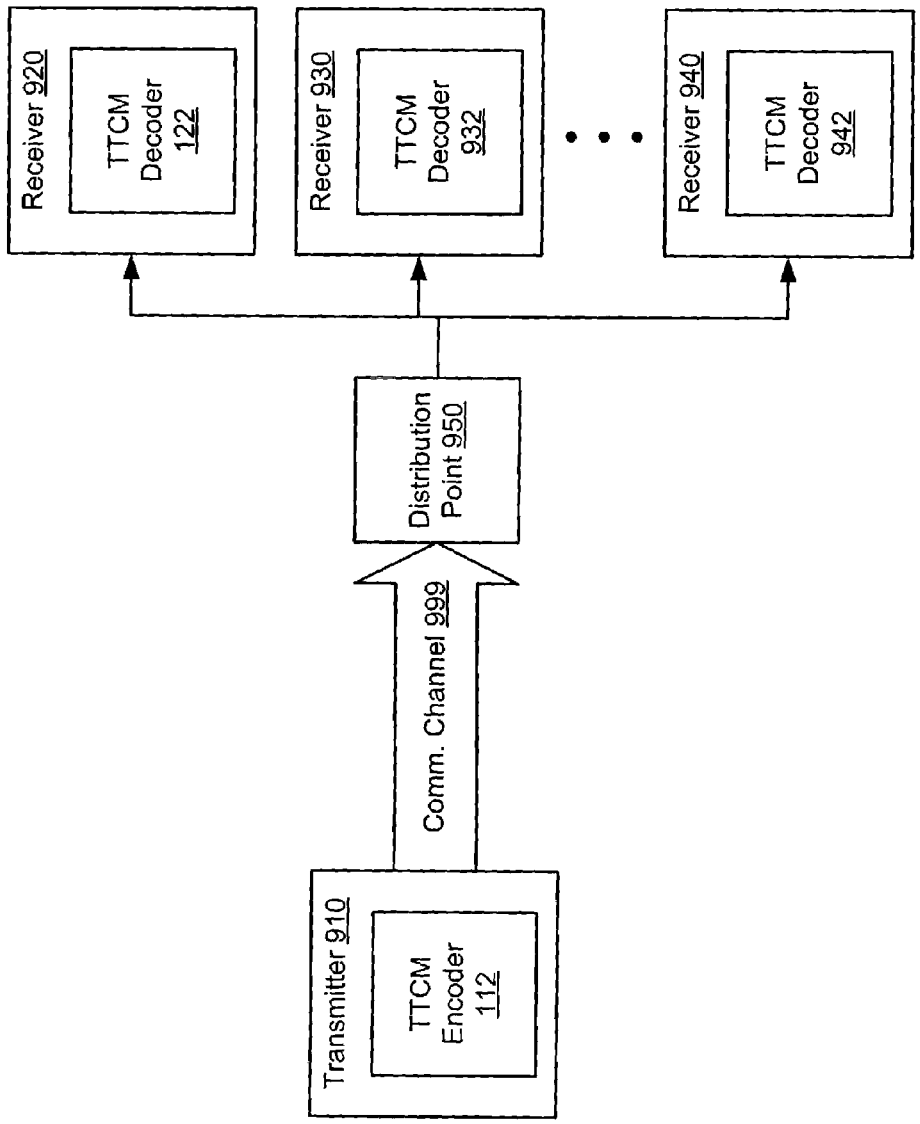
FIG. 9 is a system diagram illustrating an embodiment of a one to many TTCM communication system that is built according to the invention.

FIG. 9 is a system diagram illustrating an embodiment of a one to many TTCM communication system 900 that is built according to the invention. A transmitter 910 is able to communicate, via broadcast in certain embodiments, with a number of receivers, shown as receivers 910, 920, . . . , and 940 via a uni-directional communication channel 999. The uni-directional communication channel 999 may be a wireline (or wired) communication channel or a wireless communication channel without departing from the scope and spirit of the invention. The wired media by which the bi-directional communication channel 999 may be implemented are varied, including coaxial cable, fiber-optic cabling, and copper cabling, among other types of "wiring." Similarly, the wireless manners in which the bi-directional communication channel 999 may be implemented are varied, including satellite communication, cellular communication, microwave communication, and radio communication, among other types of wireless communication.

A distribution point 950 is employed within the one to many TTCM communication system 900 to provide the appropriate communication to the receivers 910, 920, . . . , and 940. In certain embodiments, the receivers 910, 920, . . . , and 940 each receive the same communication and individually discern which portion of the total communication is intended for themselves.

The transmitter 910 includes an embodiment of the TTCM encoder 112. Similarly, each of the receivers 910, 920, . . . , and 940 includes an embodiment of the TTCM decoder; specifically, the receiver 920 includes an embodiment of the TTCM decoder 122; the receiver 930 includes an embodiment of the TTCM decoder 932; and the receiver 940 includes an embodiment of the TTCM decoder 942. Cooperatively, the TTCM encoder 112 and each of the TTCM decoders 122, 932, . . . , and 942 form TTCM codecs according to the invention. The FIG. 9 shows yet another of the many embodiments where TTCM coding (TTCM encoding and TTCM decoding) may be performed according to any one or more of the various embodiments of the invention.

Figure 10:
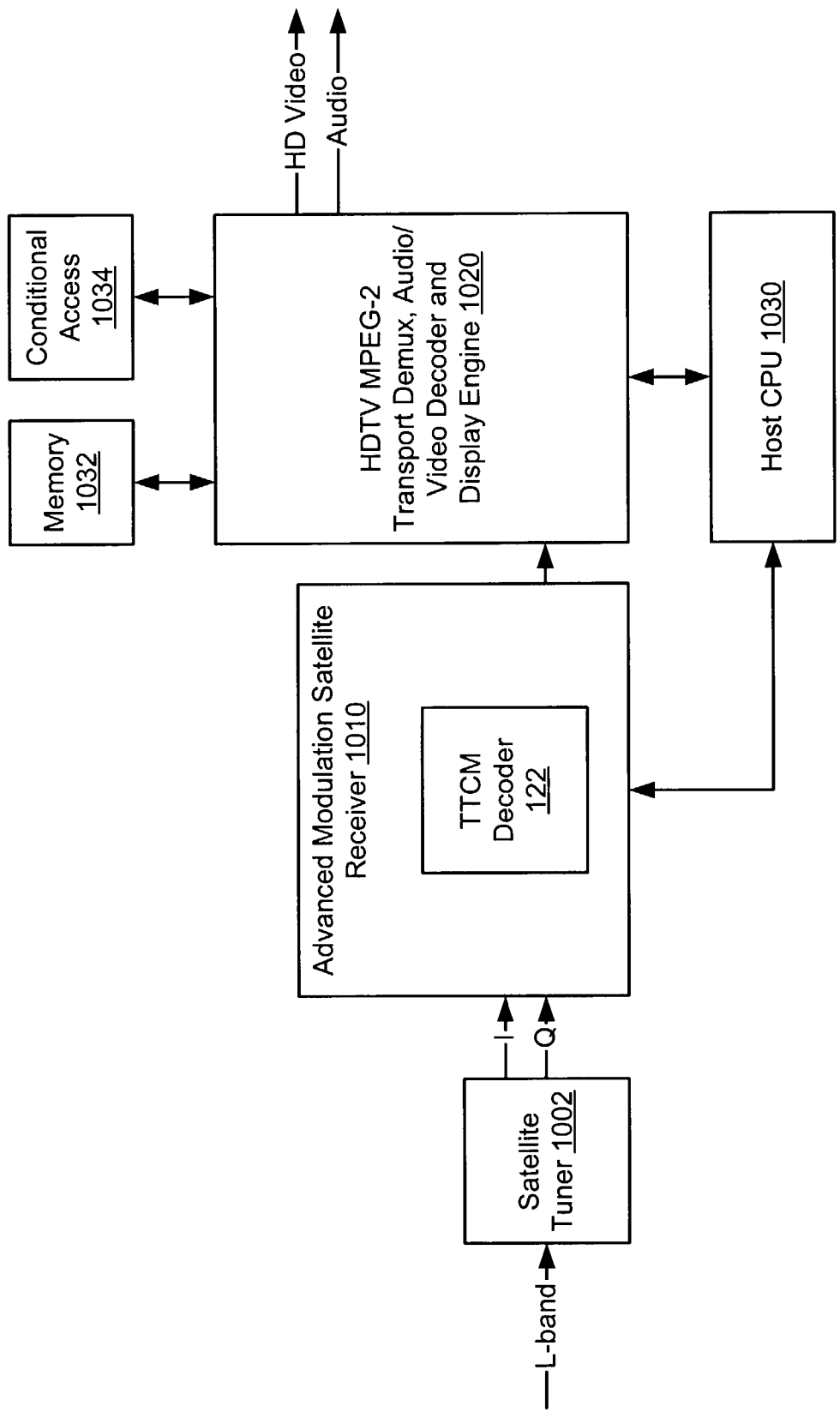
FIG. 10 is a system diagram illustrating an embodiment of a satellite receiver set-top box system that is built according to the invention.

FIG. 10 is a system diagram illustrating an embodiment of a satellite receiver set-top box system 1000 that is built according to the invention. The satellite receiver set-top box system 1000 includes an advanced modulation satellite receiver 1010 that is implemented in an all digital architecture. The satellite receiver set-top box system 1000 includes a satellite tuner 1002 that receives a signal via the L-band. The satellite tuner 1002 extracts I,Q (in-phase and quadrature) components from a signal received from the L-band and provides them to the advanced modulation satellite receiver 1010. The advanced modulation satellite receiver 1010 includes an embodiment of the TTCM decoder 112. The advanced modulation satellite receiver 1010 communicatively couples to an HDTV MPEG-2 (Motion Picture Expert Group) transport de-mux, audio/video decoder and display engine 1020. Both the advanced modulation satellite receiver 1010 and the HDTV MPEG-2 transport de-mux, audio/video decoder and display engine 1020 communicatively couple to a host central processing unit (CPU) 1030. The HDTV MPEG-2 transport de-mux, audio/video decoder and display engine 1020 also communicatively couples to a memory module 1032 and a conditional access functional block 1034. The HDTV MPEG-2 transport de-mux, audio/video decoder and display engine 1020 provides HD video and audio output that may be provided to an HDTV display.

The advanced modulation satellite receiver 1010 is a single-chip digital satellite receiver supporting the TTCM decoder 122 and variable code rate operation. Several of the many embodiments of the variable code rate operation are described in even more detail below. Multiple modulations (constellations and mappings) are supported with iteratively (turbo) decoded error correction coding within the TTCM decoder 122. The advanced modulation satellite receiver 1010 is operable to receive communication provided to it from a transmitter device that includes a TTCM encoder according to the invention.

It is noted that each of the various embodiments described above in which TTCM coding (TTCM encoding and/or TTCM decoding) is performed is operable to support variable code rate coding according to the invention. As will be described in the various embodiments below, this variable code rate functionality may include rotating through a number of various modulations (of different constellations) and mapping for those various modulations.

Figure 11:
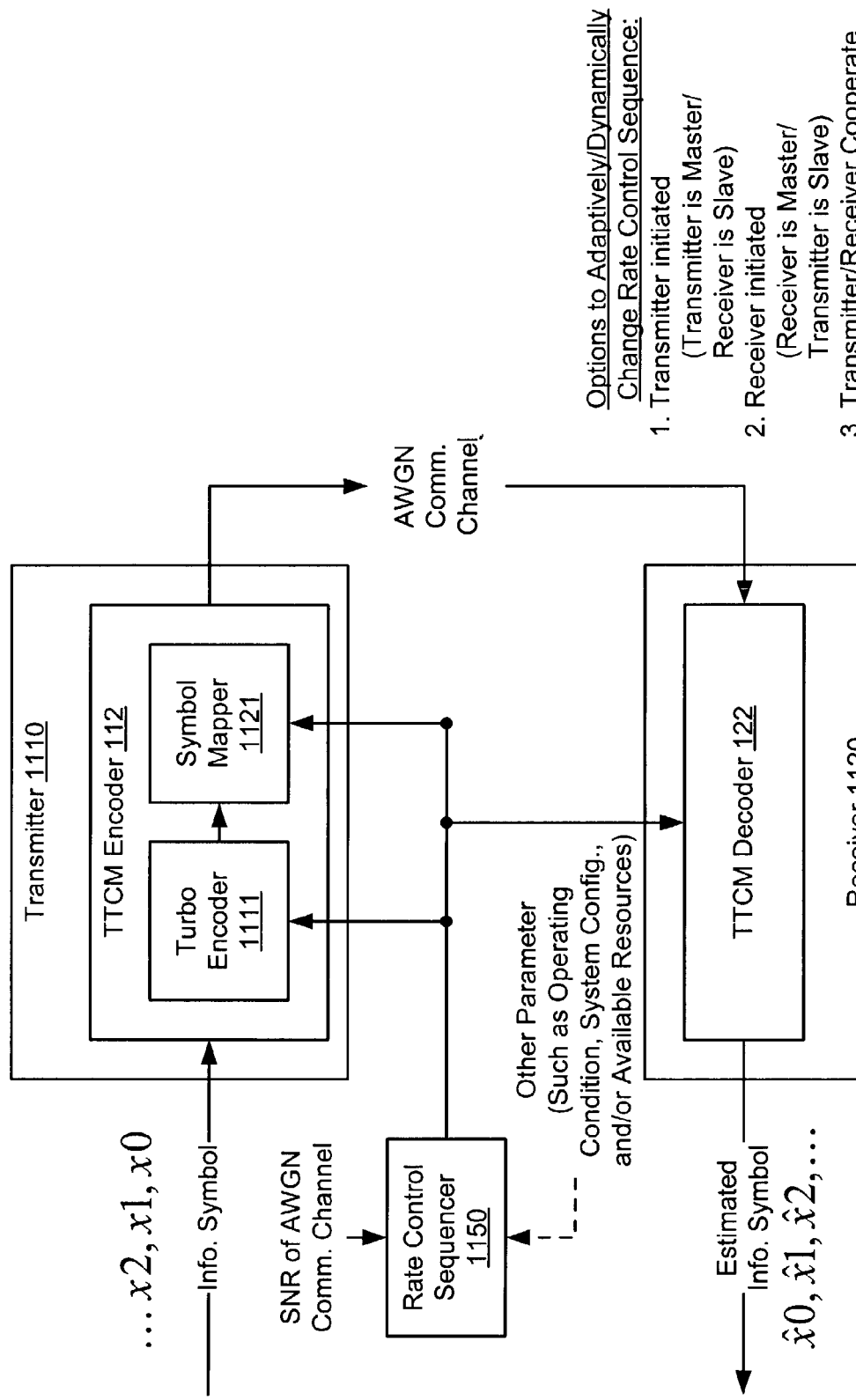
FIG. 11 is a system diagram illustrating an embodiment of a TTCM communication system that is built according to the invention.

FIG. 11 is a system diagram illustrating an embodiment of a TTCM communication system 1100 that is built according to the invention. The TTCM communication system 1100 includes a transmitter 1110 and a receiver 1120 that are communicatively coupled to one another via a communication channel that introduces Additive White Gaussian Noise (AWGN) to the signal. The communication channel may be wireline or wireless according to the invention. The AWGN communication channel may be viewed as being a relatively noisy communication channel.

The transmitter 1110 includes a TTCM encoder 112 that encodes one or more information symbols and then modulates those encoded symbols according to a constellation and a mapping. The transmitter 1110 then prepares this signal for transmission across the communication channel. At the other end of the communication channel, the receiver 1120 includes a TTCM decoder 122 that receives and estimates the encoded symbols that have been transmitted across the communication channel. Further details of the operation of the various functional blocks contained within the TTCM encoder 112 and the TTCM decoder 122 are described in more detail below.

In addition, a rate control sequencer 1150 provides one or more rate controls to the turbo encoder 1111 and the symbol mapper 1121 of the TTCM encoder 112 and to the TTCM decoder 122. This rate control sequencer 1150 provides rate control sequences (which may include as few as one rate control (RC) and as many as several RCs). Each RC includes one or more modulations (constellations and mappings). Each modulation provides a bandwidth efficiency that may be viewed as being a total number of information bits per symbol that is encoded; a number of redundancy bits contained therein. Each of the TTCM encoder 112 and the TTCM decoder 122 is operable to cycle through the rate control sequence at their respective locations when performing encoding and decoding of symbols, respectively.

Generally speaking within the TTCM encoder 112, the turbo encoder 1111 performs the symbol encoding and the symbol mapper 1121 maps those encoded symbols to the appropriate modulation according to the rate control sequence provided by the rate control sequencer 1150. Similarly, generally speaking within the TTCM decoder 122, the TTCM decoder 122 performs calculations that are employed to perform decoding of the received symbols according to the rate control sequence provided by the rate control sequencer 1150. There are a whole host of various embodiments in which various modulations (having various modulations and various mappings), and various periodic sequencing of rate control sequence may be used to perform the encoding and decoding of data using the TTCM techniques described herein. In some embodiments, the rate control sequence is adaptively changed during operation to provide for improved performance. In other embodiments, predetermined rate control sequences are employed.

In adaptive embodiments, certain operating conditions may be employed, such as a measurement of the communication channel's SNR, to direct the changing of the rate control sequence or rate control sequences to be used by both the TTCM encoder 112 and the TTCM decoder 122. It is understood that either one or both of the TTCM encoder 112 and the TTCM decoder 122 may perform the measurement of such operating conditions and direct the TTCM communication system 1100 to change rate control sequences. In some embodiments, such as a uni-directional communication system embodiment, it may make more sense for the transmitter to perform such measurement and direction, whereas within bi-directional communication system embodiments, either of the transceivers may provide such functionality. The particular implementation may be left to one who implements the invention in a particular application. There exist several options that may be employed to adaptively/dynamically change the rate control sequence.

For example, one embodiment operates such that the transmitter is a master to the receiver (which operates as a slave). The transmitter determines some operational parameter, such as the Signal to Noise Ratio (SNR) of the AWGN communication channel (or some other parameter including, but not limited to, an operating condition of the communication system, the system's configuration, and/or the available resources of the communication system), and then the transmitter directs the rate control sequencer 1150 so that both the transmitter and the receiver change to a new rate control sequence synchronously.

In another embodiment, the transmitter is a slave to the receiver (which operates as a master). The receiver determines some operational parameter, such as the Signal to Noise Ratio (SNR) of the AWGN communication channel (or some other parameter including, but not limited to, an operating condition of the communication system, the system's configuration, and/or the available resources of the communication system), and then the receiver directs the rate control sequencer 1150 so that both the transmitter and the receiver change to a new rate control sequence synchronously.

In even other embodiments, the transmitter and the receiver operate cooperatively to perform any changing to a new rate control sequence.

It is also understood that a variety of means of modulation, transmission, receipt, and demodulation may be performed to generate the analog signals to be transmitted across the communication channel without departing from the scope and spirit thereof. Each and any such means may be practiced according to the invention while performing the TTCM encoding/decoding described herein.

Figure 12:
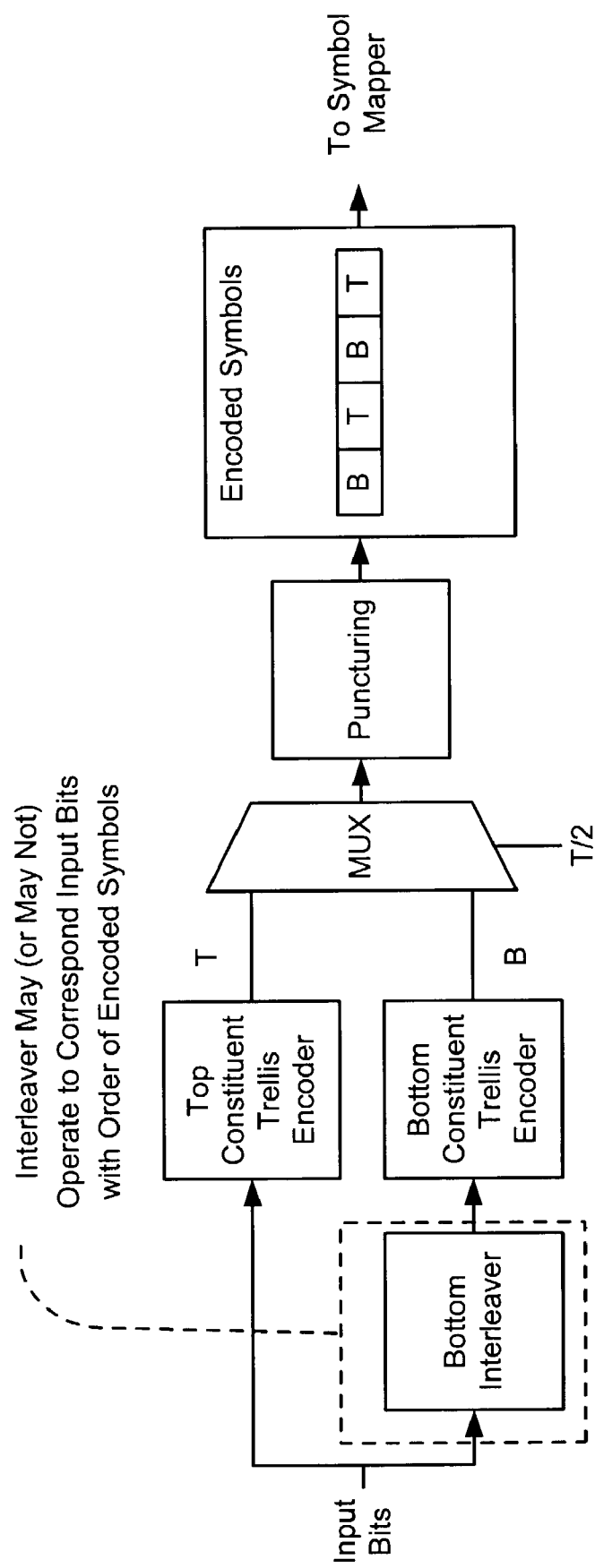
FIG. 12 is a diagram illustrating a single interleaver embodiment of the turbo encoder of the FIG. 11.

FIG. 12 is a diagram illustrating a single interleaver embodiment of the turbo encoder 1111 of the FIG. 11. The variable code rate functionality described herein may be performed within this single interleaver embodiment of the turbo encoder 1111. Input bits are provided simultaneously to a top path and a bottom path. The top path includes a top constituent trellis encoder, and the bottom path includes a bottom interleaver communicatively coupled to a bottom constituent trellis encode. A variety of interleaves may be performed as selected for the particular application within the bottom interleaver. The outputs from the top and bottom paths are provided to a multiplexor (MUX) whose selection is provided by a clock signal that is clocked at 1/2 the rate at which the input bits are provided to the top and bottom paths. This way, the output of the MUX will alternatively select the outputs from the top and bottom paths.

These output bits are then output to a puncturing functional block. In certain embodiments, no puncturing is performed on the bits output from the MUX; they are all simply passed as output from the puncturing functional block. However, in other embodiments, puncturing is performed according to the rate control sequence provided by the rate control sequencer 1150. A variety of encoded symbols may then be then generated according to the outputs from the top and bottom paths; the bottom path being an interleaved path. These encoded symbols are then passed to the symbol mapper according to the invention where the symbols are mapped according to the appropriate modulation (constellation and mapping) as governed by the rate control sequence provided by the rate control sequencer 1150. The single interleaver embodiment of the turbo encoder 1111 shows just one of the many embodiments in which TTCM encoding may be performed. Other turbo encoding embodiments are also envisioned within the scope and spirit of the invention to support the variable code rate functionality described herein.

It is noted that the interleaver within the FIG. 12 may be implemented such that it operates to correspond the order of the input bits with the order in which the encoded symbols are output from this embodiment of the turbo encoder. That is to say, the first output, encoded symbol corresponds to the first group of input bits (or first input symbol); the second output, encoded symbol corresponds to the second group of input bits (or second input symbol). Alternatively, the interleaver may be implemented such that corresponding the order of the input bits (or symbols) need not necessarily correspond to the output order of the encoded symbols to the input order of the groups of input bits (or input symbols).

Figure 13:
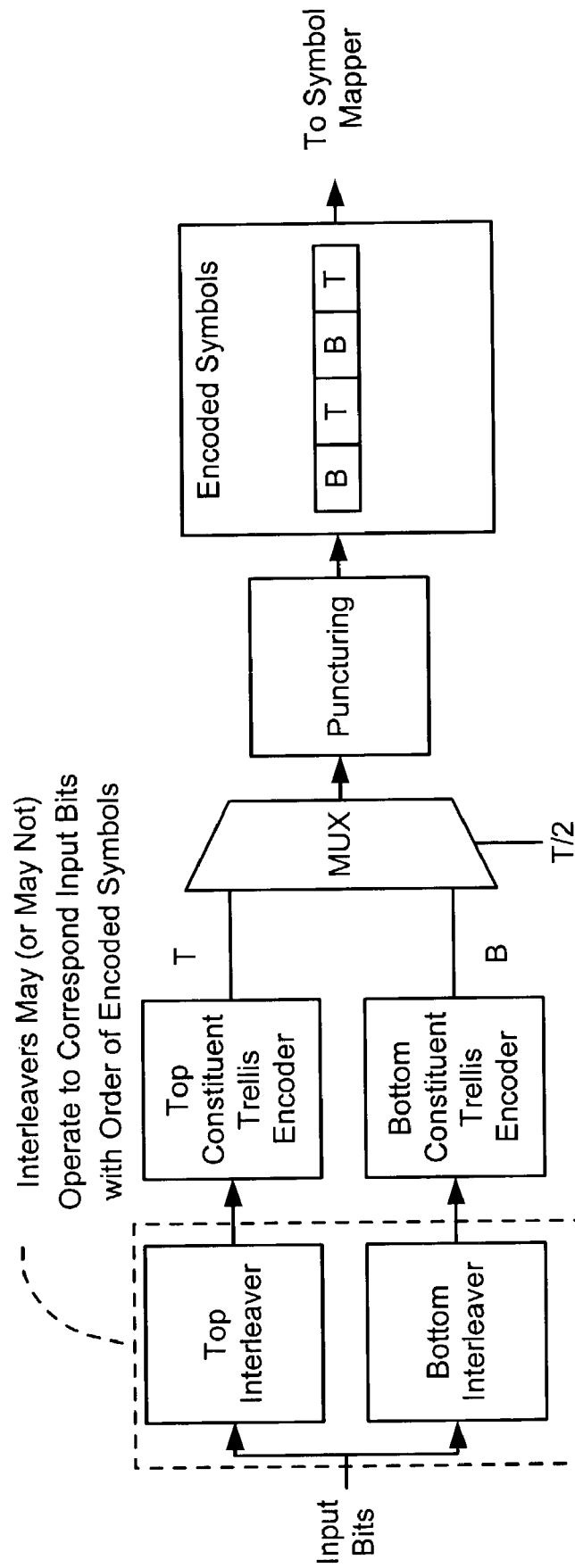
FIG. 13 is a diagram illustrating a dual interleaver embodiment of the turbo encoder of the FIG. 11.

FIG. 13 is a diagram illustrating a dual interleaver embodiment of the turbo encoder 1111 of the FIG. 11. Similar to the embodiment of the FIG. 12, the variable code rate functionality described herein may be performed within this dual interleaver embodiment of the turbo encoder 1111. Input bits are provided simultaneously to a top path and a bottom path. The top path includes a top interleaver communicatively coupled to a top constituent trellis encoder, and the bottom path includes a bottom interleaver communicatively coupled to a bottom constituent trellis encoder.

It is also noted here (similar to FIG. 12) that the interleavers within the FIG. 13 may be implemented such that they operate to correspond the order of the input bits with the order in which the encoded symbols are output from this embodiment of the turbo encoder. That is to say, the first output, encoded symbol corresponds to the first group of input bits (or first input symbol); the second output, encoded symbol corresponds to the second group of input bits (or second input symbol). Alternatively, the interleaver may be implemented such that corresponding the order of the input bits (or symbols) need not necessarily correspond to the output order of the encoded symbols to the input order of the groups of input bits (or input symbols).

The outputs from the top and bottom paths are provided to a multiplexor (MUX) whose selection is provided by a clock signal that is clocked at 1/2 the rate at which the input bits are provided to the top and bottom paths. This way, the output of the MUX will alternatively select the outputs from the top and bottom paths.

As with the embodiment described above in the FIG. 12 for the interleaving performed by the bottom interleaver, a variety of interleaves may be performed as selected for the particular application. The following example shows one embodiment of how the interleaving may be performed for the top interleaver and the bottom interleaver.

For each of the top interleaver and the bottom interleaver, we let $\pi_0$ and $\pi_1$ be the interleaves for each bit within the two bit input symbol, $i_0 i_1$. According to the FIG. 13, we employ the following modified interleavers (Top interleaver and Bottom interleaver) within the encoding process; these modified interleavers are each variants of the interleaver, $\pi_I$, as defined below. There are, in effect, two interleaves that are functionally performed within the Top interleaver, and two interleaves are functionally performed within the Bottom interleaver. A total of four interleaves are performed by the Top interleaver and Bottom interleaver in this embodiment. These interleaves are performed independently for each bit within the two bit input symbol, $i_0 i_1$. The decoding process, described in more detail below, may employ the modified interleaving/de-interleaving shown here during initialization; however, when performing actual decoding of a received symbol's bits, it only employs the non-modified interleaver, $\pi_I$, and the de-interleaver, $\pi_I^{-1}$. Within this dual interleaver embodiment of the turbo encoder 1111, the modified interleaving is performed as follows:

Top interleaver=i for i mod 2=0 (for even positions)
Top interleaver=$\pi_I^{-1}$ (i) for i mod 2=1 (for odd positions)
Bottom interleaver=$\pi_I$ (i) for i mod 2=0
Bottom interleaver=i for i mod 2=1
Where, l=0,1 for two bit input symbol, $i_0 i_1$.

This modified interleaving is performed to ensure the following: when we input a symbol sequence, $S_1 S_2 S_3 S_4$, then we want encoded corresponding output from those symbols to be in the same order, namely, the encoded output for $S_1$, followed by the encoded output for $S_2$, followed by the encoded output for $S_3$, and finally followed by the encoded output for $S_4$. The output encoded symbol sequence, shown as BTBT, will maintain this sequential order (based on the order of the input symbols) because of the modified interleaving performed herein.

In other words, the input symbols (or input bits) come into the encoder according to a particular sequence, and the encoded symbols that are output from the TTCM encoder leave according to that same sequence.

Again, this interleaving shows just one example of how interleaving may be performed according to the invention. Other interleaves may also be designed for a particular application. This particular interleaving is used to illustrate the functionality of the invention in several embodiments of the invention in the various Figures and written description.

These output bits, after having undergone interleaving and encoding, are then output to a puncturing functional block. In certain embodiments, no puncturing is performed on the bits output from the MUX. However, in other embodiments, puncturing is performed according to the rate control sequence provided by the rate control sequencer 1150. A variety of encoded symbols may then be generated according to the outputs from the top and bottom paths. These encoded symbols are then passed to the symbol mapper according to the invention where the symbols are mapped according to the appropriate modulation (constellation and mapping) as governed by the rate control sequence provided by the rate control sequencer 1150. The dual interleaver embodiment of the turbo encoder 1111 shows yet another of the many embodiments in which TTCM encoding may be performed. It is noted that other turbo encoding embodiments are also envisioned within the scope and spirit of the invention to support the variable code rate functionality described herein.

Figure 14:
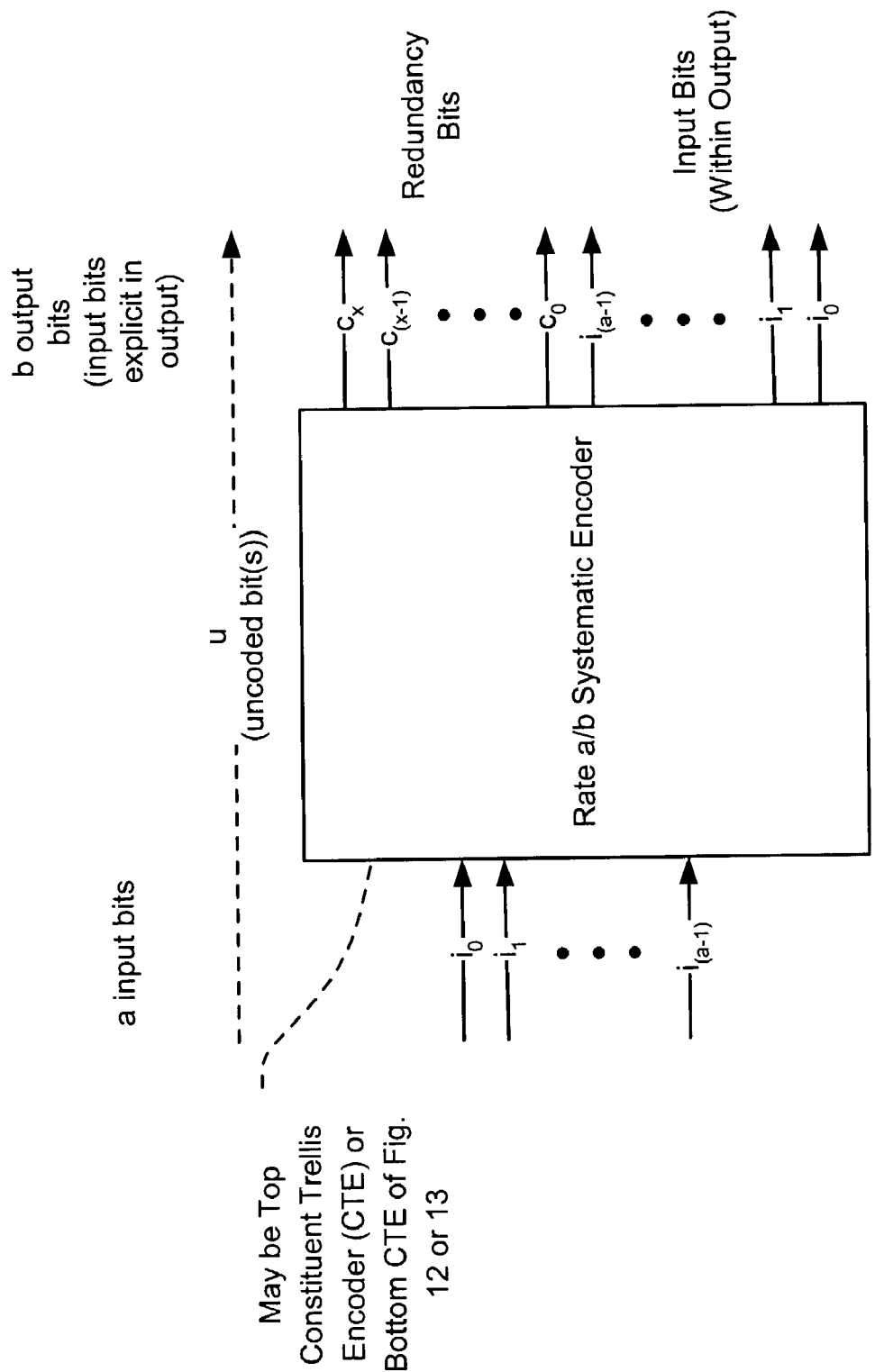
FIG. 14 is a diagram illustrating an embodiment of a systematic encoder that is built according to the invention.

FIG. 14 is a diagram illustrating an embodiment of a systematic encoder 1400 that is built according to the invention. In general terms, the systematic encoder 1400 shows an encoder that encodes "a" input bits (shown as $i_0$, $i_1$, . . . , and $i_{(a-1)}$). The systematic encoder 1400 is a rate a/b encoder where "a" input bits are provided and "b" output bits are output. The "b" output bits include "x" number of redundancy bits (shown as $c_x$, $c_{(x-1)}$, . . . , and $c_0$) that are coded as a function of one or more of the "a" input bits as well as each of the "a" input bits themselves. A systematic encoder may be viewed as being an encoder where the input bits are explicitly represented and available in the output of the encoder. In addition, one or more uncoded bits u may be provided as output of the encoder without having undergone any encoding at all. It is noted that sum of the total number of coded bits "x" and the "a" input bits is equal to the number of output bits "b" in this rate a/b encoder.

It is also noted that one or both of the top constituent trellis encoder and the bottom constituent trellis encoder in the FIG. 12 or 13 may be implemented using the systematic encoder 1400 of the FIG. 14.

Figure 15:
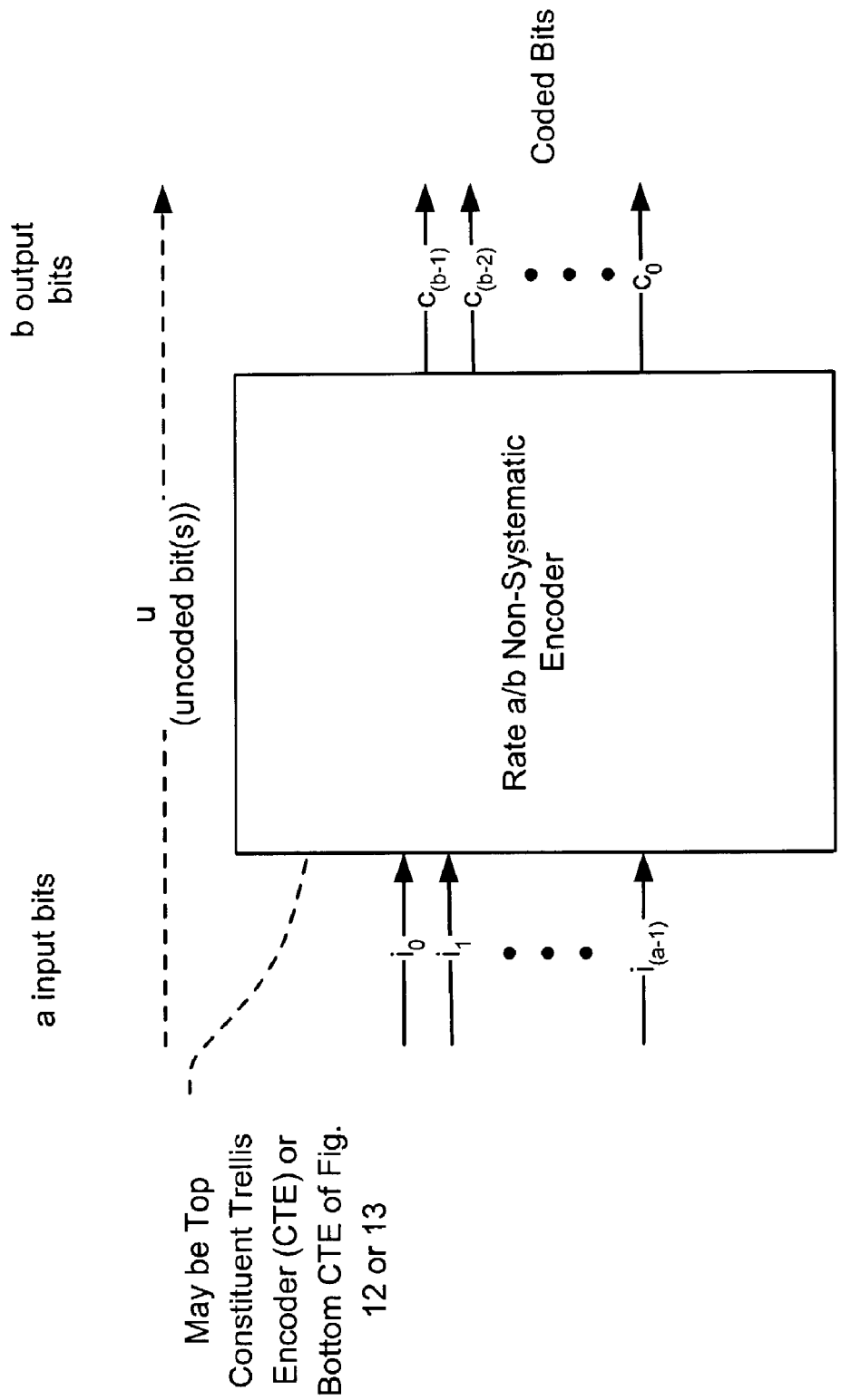
FIG. 15 is a diagram illustrating an embodiment of a non-systematic encoder that is built according to the invention.

FIG. 15 is a diagram illustrating an embodiment of a non-systematic encoder 1500 that is built according to the invention. In general terms, the non-systematic encoder 1500 shows an encoder that encodes "a" input bits (shown as $i_0$, $i_1$, . . . , and $i_{(a-1)}$) to provide "b" output bits (shown as $c_{(b-1)}$, $c_{(b-2)}$, . . . , and $c_0$). A non-systematic encoder may be viewed as being an encoder where the input bits are not explicitly represented and available in the output of the encoder. In addition, one or more uncoded bits u may be provided as output of the encoder without having undergone any encoding at all. While the invention envisions employing either systematic or non-systematic encoding, a non-systematic encoder is employed to illustrate the invention's variable code rate functionality in many of the various Figures and description. It will be understood that systematic encoding may also be employed to perform the various aspects of the invention as well.

It is also noted that one or both of the top constituent trellis encoder and the bottom constituent trellis encoder in the FIG. 12 or 13 may be implemented using the non-systematic encoder 1500 of the FIG. 15.

Figure 16:
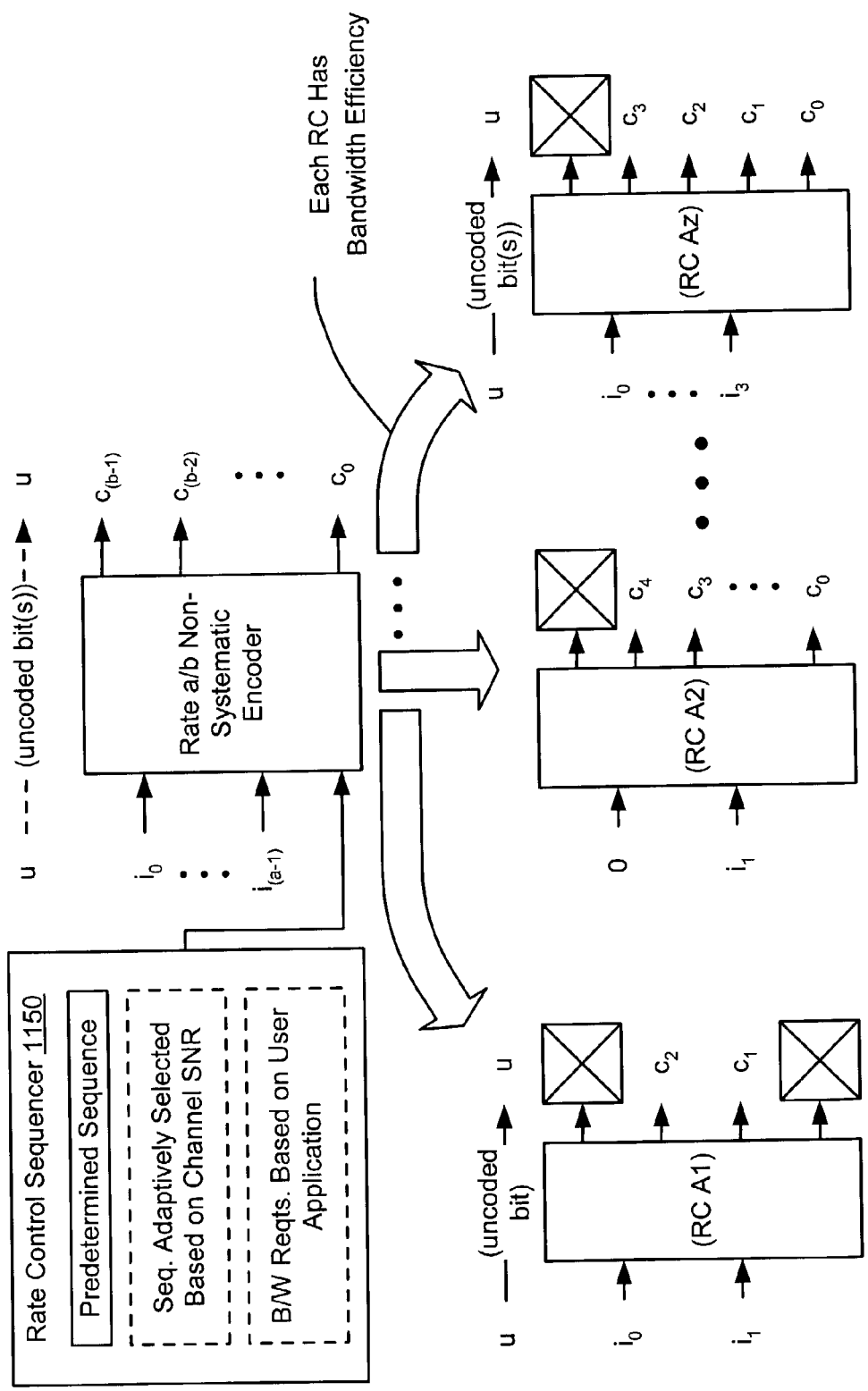
FIG. 16 is a diagram illustrating an embodiment of a non-systematic encoder using puncturing and rate control sequencer to support multiple encoders according to the invention.

FIG. 16 is a diagram illustrating an embodiment of a non-systematic encoder using puncturing and rate control sequencer to support multiple encoders 1600 according to the invention. Here, a single non-systematic encoder is implemented to perform the functionality of multiple encoders. A single hardware implementation may be used to support the functionality of each of a number of encoders. We illustrate the non-systematic encoder as being a rate a/b non-systematic encoder that that encodes "a" input bits (shown as $i_0, i_1, \ldots,$ and $i_{(a-1)}$) to provide "b" output bits (shown as $c_{(b-1)}, c_{(b-2)}, \ldots,$ and $c_0$). As mentioned above, one or more uncoded bits may also be used. Each of the rate control sequences provided by the rate control sequencer 1150 may select none, some, or all of the "a" input bits and generate none, some, or all of the "b" output bits as well as selecting none, some, or all of a number of available uncoded bits. Puncturing is performed on the output bits of the encoder to generate the various options of encoded symbols that include encoded bits and/or uncoded bits.

To show the generic applicability of the variable code rate functionality of the invention, the rate a/b non-systematic encoder cycles through a number of rate controls (that constitute a rate control sequence—shown as a RC A1, a RC A2, ..., and a RC Az). Each of the RCs has a particular bandwidth efficiency. Cooperatively, the bandwidth efficiencies of the individual RCs (RC A1, RC A2, ..., and RC Az) define the rate control sequence provide an average bandwidth efficiency across the entire rate control sequence. These RCs are shown generically to illustrate the wide applicability of the variable code rate functionality of the invention.

The rate control sequencer 1150 may cycle through a predetermined rate control sequence; it may adaptively select one or more new rate control sequences based on operating conditions such as a communication channel's SNR, bandwidth requirements based on various user applications, or according to some other consideration as well.

The rate control sequence as illustrated within the example embodiment shown in the FIG. 16 may be described as follows:

Within the encoder as implemented according to RC A1, two information bits ($i_0$ and $i_1$) and one uncoded bit u are input to the encoder. The output of the encoder punctures all of the coded bits except for $c_2$ and $c_1$, and the uncoded bit u; these remaining bits are then used to generate a 3 bit symbol that will be mapped according to a 3 bit symbol modulation (constellation and mapping) as defined by RC A1.

Within the encoder as implemented according to RC A2, one information bits ($i_1$) is input to the encoder. The output of the encoder punctures all of the coded bits except for $c_4$, $c_3, \ldots c_0$; these remaining bits are then used to generate a 5 bit symbol that will be mapped according to a 5 bit symbol modulation (constellation and mapping) as defined by RC A2.

Within the encoder as implemented according to RC Az, four information bits ($i_0, i_1, i_2, i_3$) and one uncoded bit u are input to the encoder. The output of the encoder punctures all of the coded bits except for $c_3, c_2, c_1, c_0$, and the uncoded bit u; these remaining bits and the uncoded bit are then used to generate a 5 bit symbol that will be mapped according to a 5 bit symbol modulation (constellation and mapping) as defined by RC Az. While the RC A2 and RC Az both employ 5 bit symbols, they may nevertheless employ different modulations (different constellations and different mappings) without departing from the scope and spirit of the invention.

The rate a/b non-systematic encoder may then cycle through the rate control sequence defined by the (RC A1, RC A2, ..., and RC Az) a predetermined number of times within a data frame. Alternatively, the rate a/b non-systematic encoder may adaptively select a new rate control sequence based on operating conditions of the communication system in which the rate a/b non-systematic encoder is implemented. Each of the individual RCs may be viewed as being functionality supported by distinct encoders.

Figure 17:
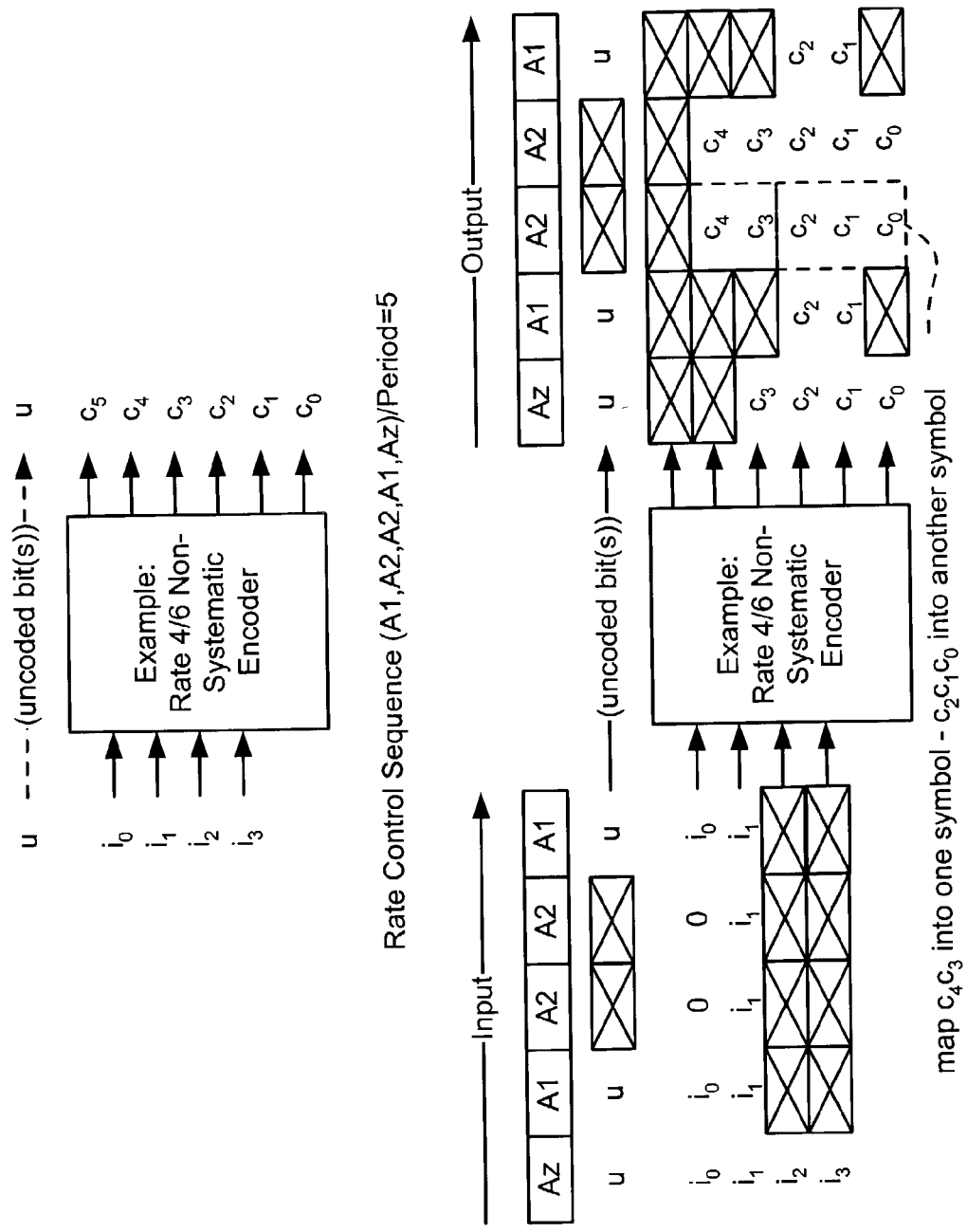
FIG. 17 is a diagram illustrating an embodiment of periodic sequencing of a non-systematic encoder using puncturing and rate control sequencer according to the invention.

FIG. 17 is a diagram illustrating an embodiment of periodic sequencing of a non-systematic encoder using puncturing and rate control sequencer 1700 according to the invention. In this example to show the periodic sequencing, a rate 4/6 non-systematic encoder is employed. The rate control sequence in this embodiment includes the RCs (RC A1, RC A2, RC A2, RC A1, and RC Az) having a period of 5 RCs.

The available input of this exemplary rate 4/6 non-systematic encoder is ($i_0, i_1, i_2, i_3$) and the uncoded bit, and the available output is ($c_5, c_4, c_3, c_2, c_1, c_0$) as well as the uncoded bit. Puncturing is performed to select a predetermined sub-set of all of the available input and output bits of the rate 4/6 non-systematic encoder. The input cycles through the period of 5 RCs described above. The inputs bits cycle through the following sequence according to this particular period:

RC A1: $ui_0i_1$
RC A1: $ui_0i_1$
RC A2: $0i_1$
RC A2: $0i_1$
RC Az: $ui_0i_1i_2i_3$

The output bits of this period of RCs is as follows:

RC A1: $uc_2c_1$
RC A1: $uc_2c_1$
RC A2: $c_4c_3c_2c_1c_0$
RC A2: $c_4c_3c_2c_1c_0$
RC Az: $uc_3c_2c_1c_0$

Clearly, additional rate control sequences that include different RCs may also be employed to perform and support the functionality described herein. The generic embodiment of FIG. 17 shows how different constellations (3 bit symbols and 5 bit symbols in this example) may be used within a single rate control sequence. This means that various modulations, each having different numbers of total constellation points, may be used in a single rate control sequence.

In another embodiment of the invention, the encoder of the FIG. 17 is implemented such that the remaining bits, output from the encoder, may be groups to support multiple modulations. For example, for one of the groups of output bits for one of the RCs, the remaining output bits $c_4c_3$ are used for one modulation (such as a QPSK or APSK type constellation and mapping that employs 2 bits), and the other bits are $c_2c_1c_0$ are used for another modulation (such as an 8 PSK type constellation and mapping that employs 3 bits). Other variations may also be employed as well, such as those that operate using 6 available encoded bits. In such a possible embodiment, 4 of the bits may be used for one modulation (such as a 16 QAM or 16 APSK type constellation and mapping that employs 4 bits), and the other 2 bits may be used for another modulation (such as a QPSK or APSK type constellation and mapping that employs 2 bits).

Figure 18:
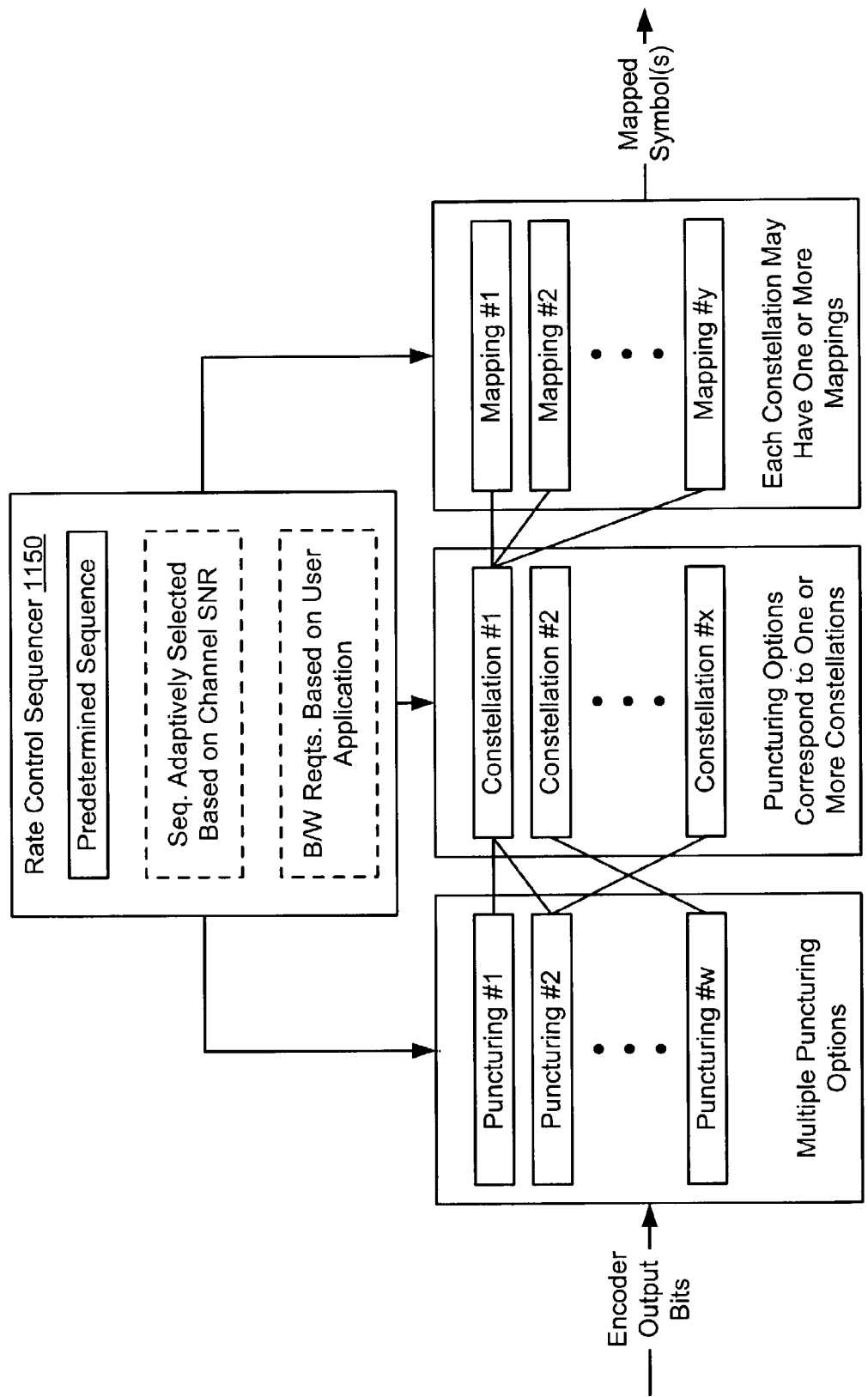
FIG. 18 is a diagram illustrating a generic embodiment of variable puncturing, constellation, and mapping using a single encoder according to the invention.

FIG. 18 is a diagram illustrating a generic embodiment of variable puncturing, constellations, and mapping using a single encoder 1800 according to the invention. The FIG. 18 particularly shows how encoder output bits are punctured, and how the remaining bits are associated with one or more particular constellations and how each of those constellations may have a unique mapping. The control of the puncturing, the constellation, and the mapping are all governed by the rate control sequencer 1150. Again, the rate control sequencer 1150 may cycle through a predetermined rate control sequence; it may adaptively select one or more new rate control sequence based on operating conditions such as a communication channel's SNR, bandwidth requirements based on various user applications, or according to some other consideration as well.

The available encoder output bits are provided to a functional block that may employ one or more of a number of multiple puncturing options. These puncturing options are shown generically as puncturing #1, puncturing #2, . . . , and puncturing #w. Each of these puncturing options is associated with one or more constellations (shown as constellation #1, constellation #2, . . . , and constellation #x). For example, the output bits remaining after having performed the puncturing #1 are then associated with the constellation #1. The output bits remaining after having performed the puncturing #2 may then be associated with either the constellation #1 or the constellation #x. The output bits remaining after having performed the puncturing #w are then associated with the constellation #2.

Each constellation is associated with one or more mappings, shown as mapping #1, mapping #2, . . . mapping #y. As an example, the constellation #1 is associated with more than one mapping, namely, mapping #1, mapping #2, and mapping #y. The other constellations may also be associated with various mappings as well. The encoding process includes performing encoding, puncturing, selection of a modulation (constellation and mapping).

As mentioned above, a number of types of encoders may be employed according to the invention, and the following examples of encoders show just some of the possible encoder types that may be used.

Figure 19:
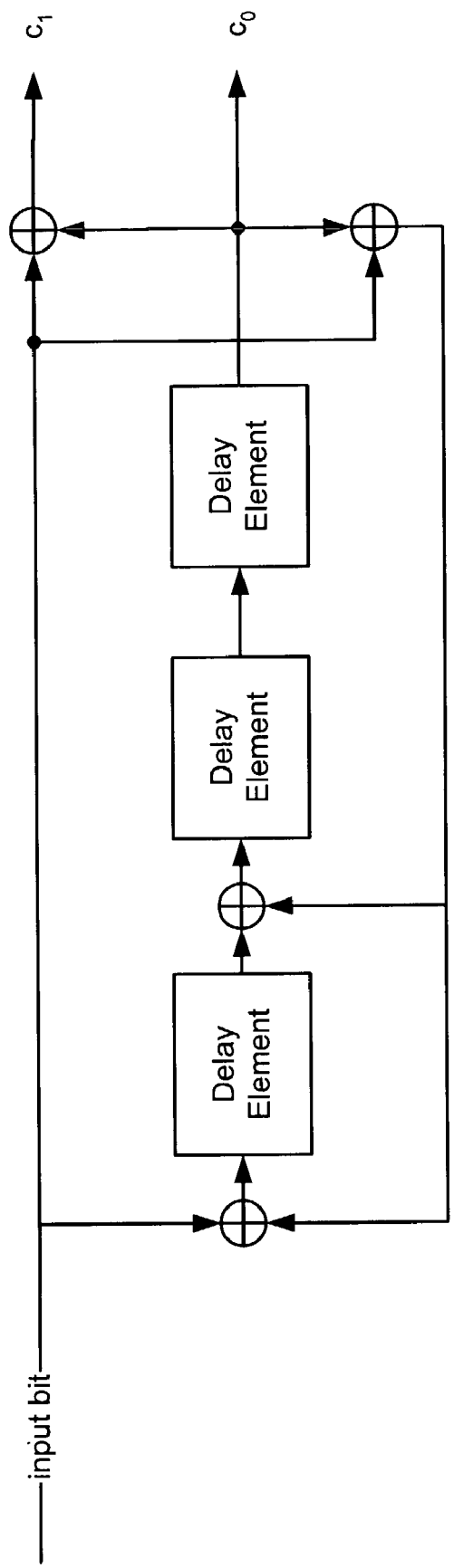
FIG. 19 is a diagram illustrating an embodiment of a rate 1/2 recursive convolutional encoder with non-systematic output that is built according to the invention.

FIG. 19 is a diagram illustrating an embodiment of a rate 1/2 recursive convolutional encoder with non-systematic output 1900 that is built according to the invention. The rate is 1/2 as there is one input information bit and two output encoded bits. The encoder receives a single input bit and generates two encoded bits ($c_1$, $c_0$). The recursive operation of the encoder in the FIG. 19 may be viewed as follows. The input bit is selectively summed with delayed versions of itself to generate the two encoded bits.

This encoder circuit represents one way to encode an input bit to generate two encoded bits. Clearly, the invention envisions other embodiments and types of encoders as well. This particular example of the rate 1/2 recursive convolutional encoder with non-systematic output 1900 is used to illustrate the scalability and extendibility of the invention across a number of encoding schemes. This rate 1/2 recursive convolutional encoder with non-systematic output 1900 will be used as one building block to generate a rate 2/5 encoder as will be described below in FIG. 20.

Figure 20:
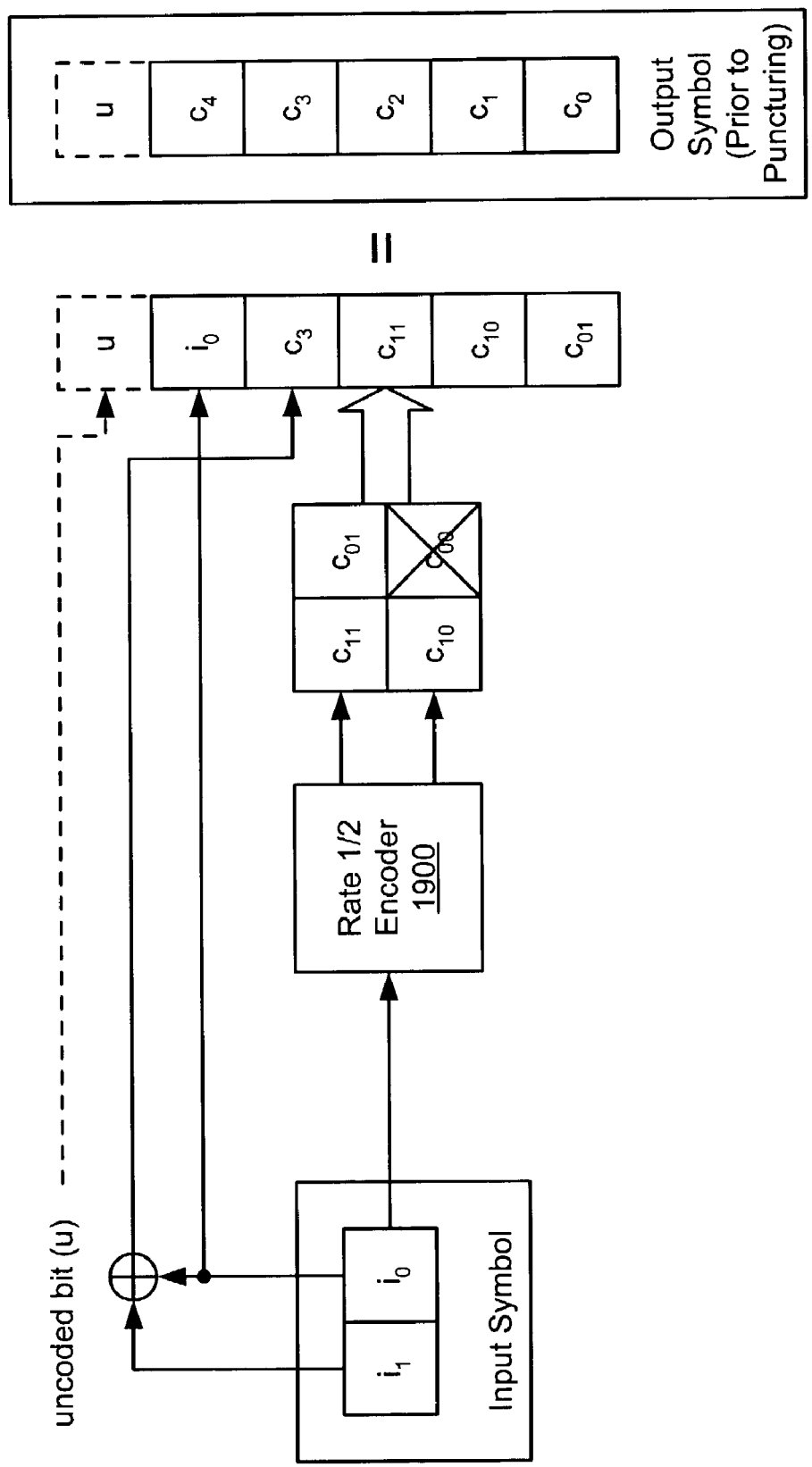
FIG. 20 is a diagram illustrating an embodiment of a rate 2/5 prototype encoder that is built according to the invention.

FIG. 20 is a diagram illustrating an embodiment of a rate 2/5 prototype encoder 2000 that is built according to the invention. Two bits are provided at a time as an input symbol (having input bits $i_1 i_0$) to the rate 2/5 prototype encoder 2000. These two bits may be provided to the rate 2/5 prototype encoder 2000 serially, or alternatively, in a parallel manner. The input of the rate 2/5 prototype encoder 2000 includes both of these input bits. One of the bits of the input symbol is provided as output of the encoder, $i_0$, but because both input bits $i_1 i_0$ are not available in the form in which they are provided, the encoder may be viewed as a non-systematic encoder. In certain situations as will be seen below, an uncoded bit may also be employed during the encoding.

The two binary consecutive inputs that are provided to the encoder may be viewed as ($i_0, i_1$). These two binary consecutive inputs are provided to the rate 1/2 encoder of the FIG. 19 above. Two consecutive cycles are employed, by providing inputs $i_0$ (first) and then $i_1$ (second), to generate the following outputs of the rate 1/2 encoder (($c_{0,1}$, $c_{1,0}$) and ($c_{1,1}$, $c_{1,0}$)). Three of these values are selected and are set to be the coded bits ($c_{1,1}=c_2$, $c_{1,0}=c_1$, $c_{0,1}=c_0$). The coded output bit $c_3$ is taken as the sum of the two binary consecutive inputs, namely $i_0$ and $i_1$. The final output coded bit $c_4$ is taken as the second of the two binary consecutive inputs, namely $i_0$. This particular encoder is used to perform illustration of one example of the invention's operation within many of the embodiments described below.

The encoding/decoding of bits put into the rate 2/5 prototype encoder 2000 may be described mathematically as follows. We begin by establishing the following notation.

1. $S^n(m,i_0,i_1)$: the next state after inputting the symbol, $i_0,i_1$, to the rate 2/5 prototype encoder 2000 with the current state m.

2. $S^p(m,i_0,i_1)$: the previous state after inputting the symbol, $i_0,i_1$, to the rate 2/5 prototype encoder 2000 with the current state m.

3. $c^n(m,i_0,i_1)$: the output of a selected trellis used to perform the encoding/decoding by inputting the symbol, $i_0,i_1$, to the rate 2/5 prototype encoder 2000 with the current state m.

4. $c^p(m,i_0,i_1)$: the output of a selected trellis used to perform the encoding/decoding by inputting the symbol, $i_0,i_1$ to the rate 2/5 prototype encoder 2000 with the previous state m.

5. app denotes using "a priori" probability. For example, $app_{0,50}(1)$ is the app of $i_0=1$ for the $50^{th}$ symbol in a frame of data.

6. met denotes using metric of the index provided within the parentheses.

It is noted that any selected trellis may be employed to do this encoding. One particular embodiment of a trellis is described in detail below in the FIG. 23, yet other trellises could similarly be used without departing from the scope and spirit of the invention.

Within many of the following notations, the use of Greek letter and English equivalent is understood as being the same element. For example, alpha=$\alpha$; alpha_0=$\alpha_0$; beta=$\beta$; beta_0=$\beta_0$; and so on.

The decoding process employs forward metrics (alphas) and backward metrics (betas), and extrinsic values according to the trellis employed. Each of these alphas, beta, and extrinsics are calculated as shown in the generic manner described below.

$$\alpha_k(s)=\min^*_{(i_0 i_1)=0,\ldots,3}[\alpha_{k-1}(S^p(s,i_0,i_1))+app_{0,k-1}(i_0)+app_{1,k-1}(i_1)+met_{t,k-1}(c^p(s,i_0,i_1))]$$

$$\beta_k(s)=\min^*_{(i_0 i_1)=0,\ldots,3}[\beta_{k+1}(S^n(s,i_0,i_1))+app_{0,k+1}(i_0)+app_{1,k+1}(i_1)+met_{t,k+1}(c^n(s,i_0,i_1))]$$

It is noted that the variable "s" identifies the trellis state that varies from 0=000, 1=001, . . . , to 7=111.

We then calculate the following intermediate variables, $E_m(s,i)$ and $E_l(s,i)$, before calculating the extrinsic values (ext) that will be used to perform the final decoding.

$$E_0(s,i)=\min^*_{j=0,1}(\text{met}_{t,k}(c''(s,i,j))+\beta_k(S''(s,i,j))+\text{app}_{1,k}(j))$$

$$\text{ext}_{0,k}(i)=\min^*_{s=0,\ldots,7}\{\alpha_k(s)+E_0(s,i)\}$$

We also calculate the following ext.

$$E_1(s,i)=\min^*_{j=0,1}(\text{met}_{t,k}(c''(s,j,i))+\beta_k(S''(s,j,i))+\text{app}_{0,k}(j))$$

$$\text{ext}_{1,k}(i)=\min^*_{s=0,\ldots,7}\{\alpha_k(s)+E_1(s,i)\}$$

It is noted that the value of i (i=0 or i=1) is the possible value for the denoted decoded bit. After performing these above calculations, we then use the following comparisons to make estimates of the input bits ($i_{k,m}$, $i_{k,l}$).

$\hat{i}_{0,k}=0$, if we find that $\text{ext}_{0,k}(1)+\text{app}_{0,k}(1)>\text{ext}_{0,k}(0)+\text{app}_{0,k}(0)$ $\hat{i}_{0,k}=1$, if we find that $\text{ext}_{0,k}(1)+\text{app}_{0,k}(1)<\text{ext}_{0,k}(0)+\text{app}_{0,k}(0)$ $\hat{i}_{1,k}=0$, if we find that $\text{ext}_{1,k}(1)+\text{app}_{1,k}(1)>\text{ext}_{1,k}(0)+\text{app}_{1,k}(0)$ $\hat{i}_{1,k}=1$, if we find that $\text{ext}_{1,k}(1)+\text{app}_{1,k}(1)<\text{ext}_{1,k}(0)+\text{app}_{1,k}(0)$ These equations show the generic applicability of how to perform decoding of encoded bits according to one embodiment of the invention. Specific examples are also shown below of how the encoding/decoding may be performed according to the invention while supporting variable code rate functionality in accordance with the invention. It is also noted, however, that other encoders may also be employed (besides the rate 2/5 prototype encoder 2000) without departing from the scope and spirit of the invention.

Figure 21:
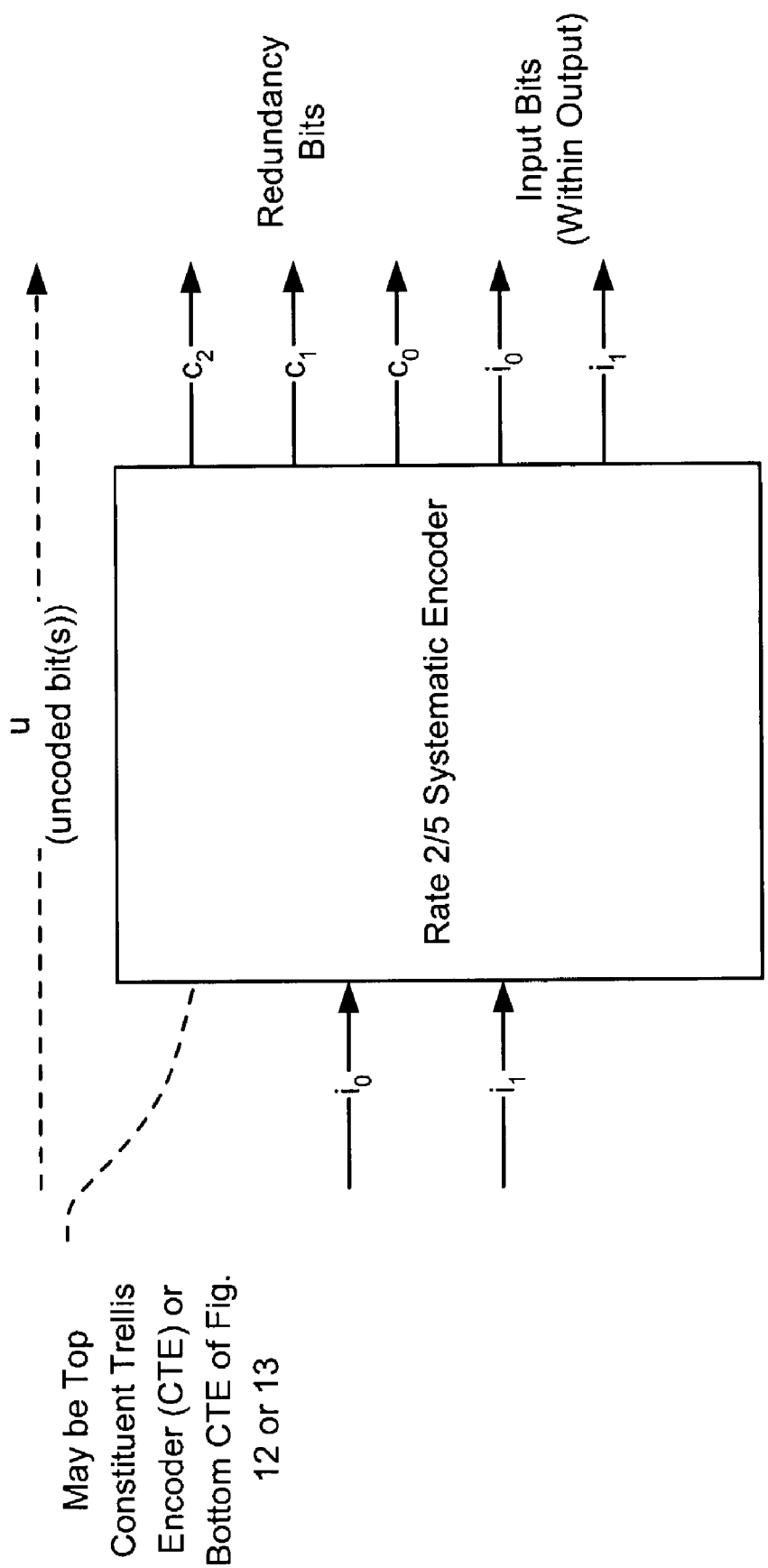
FIG. 21 is a block diagram of a rate 2/5 systematic prototype encoder that is built according to the invention.

FIG. 21 is a block diagram of a rate 2/5 systematic prototype encoder 2100 that is built according to the invention. In general terms, the rate 2/5 systematic prototype encoder 2100 encodes "2" input bits (shown as $i_0$ and $i_1$) and generates "3" redundancy output bits (shown as $c_2$, $c_1$, $c_0$) as well as explicitly providing the input bits ($i_0$ and $i_1$). In addition, one or more uncoded bits u may be provided as output of the encoder without having undergone any encoding at all. The rate 2/5 systematic prototype encoder 2100 may be viewed as being just one of many possible embodiments of the rate a/b systematic prototype encoder 1400 of the FIG. 14. It is also noted that the total rate of the rate 2/5 systematic prototype encoder 2100 may be modified when employing an uncoded bit; a rate of 3/6 may be achieved when employing both input bits ($i_0$ and $i_1$) and the uncoded bit as input and when performing no puncturing of any bits at all.

Figure 22:
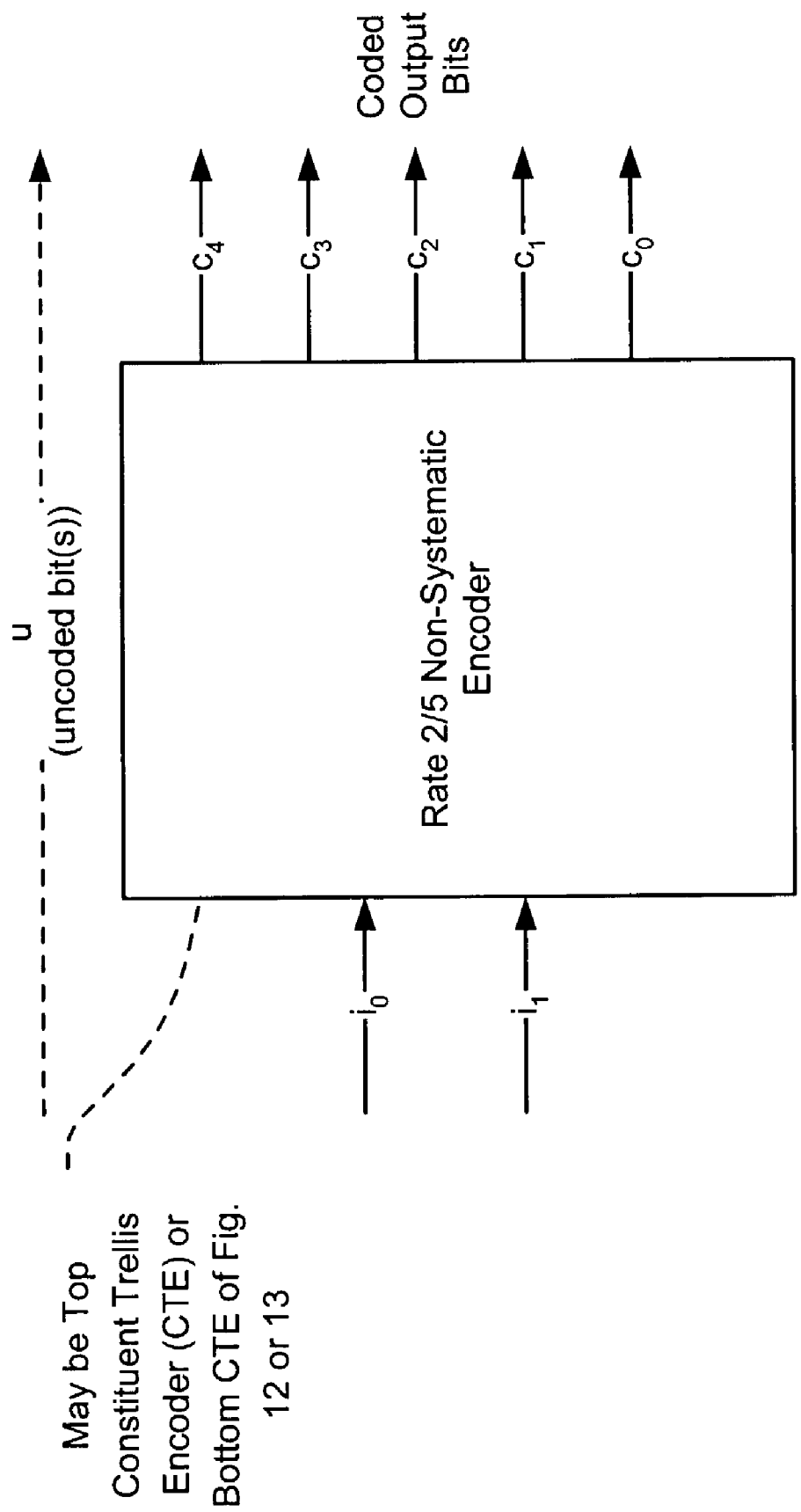
FIG. 22 is a block diagram of the rate 2/5 non-systematic prototype encoder of the FIG. 20.

FIG. 22 is a block diagram of the rate 2/5 non-systematic prototype encoder 2000 of the FIG. 20 that is built according to the invention. In general terms, the rate 2/5 non-systematic prototype encoder 2000 encodes "2" input bits (shown as $i_0$ and $i_1$) and generates "5" coded output bits (shown as $c_4$, $c_3$, $c_2$, $c_1$, $c_0$). In addition, one or more uncoded bits u may be provided as output of the encoder without having undergone any encoding at all. This illustration may be viewed as being a prototype encoder from which many various types of encoding may be performed. The rate 2/5 non-systematic prototype encoder 2000 may be viewed as being just one of many possible embodiments of the rate a/b non-systematic prototype encoder 1500 of the FIG. 15. It is also noted that the total rate of the rate 2/5 non-systematic prototype encoder 2200 may be modified when employing an uncoded bit; a rate of 3/6 may be achieved when employing the "2" input bits (shown as $i_0$ and $i_1$) and the uncoded bit and when performing no puncturing of any bits at all.

Figure 23:
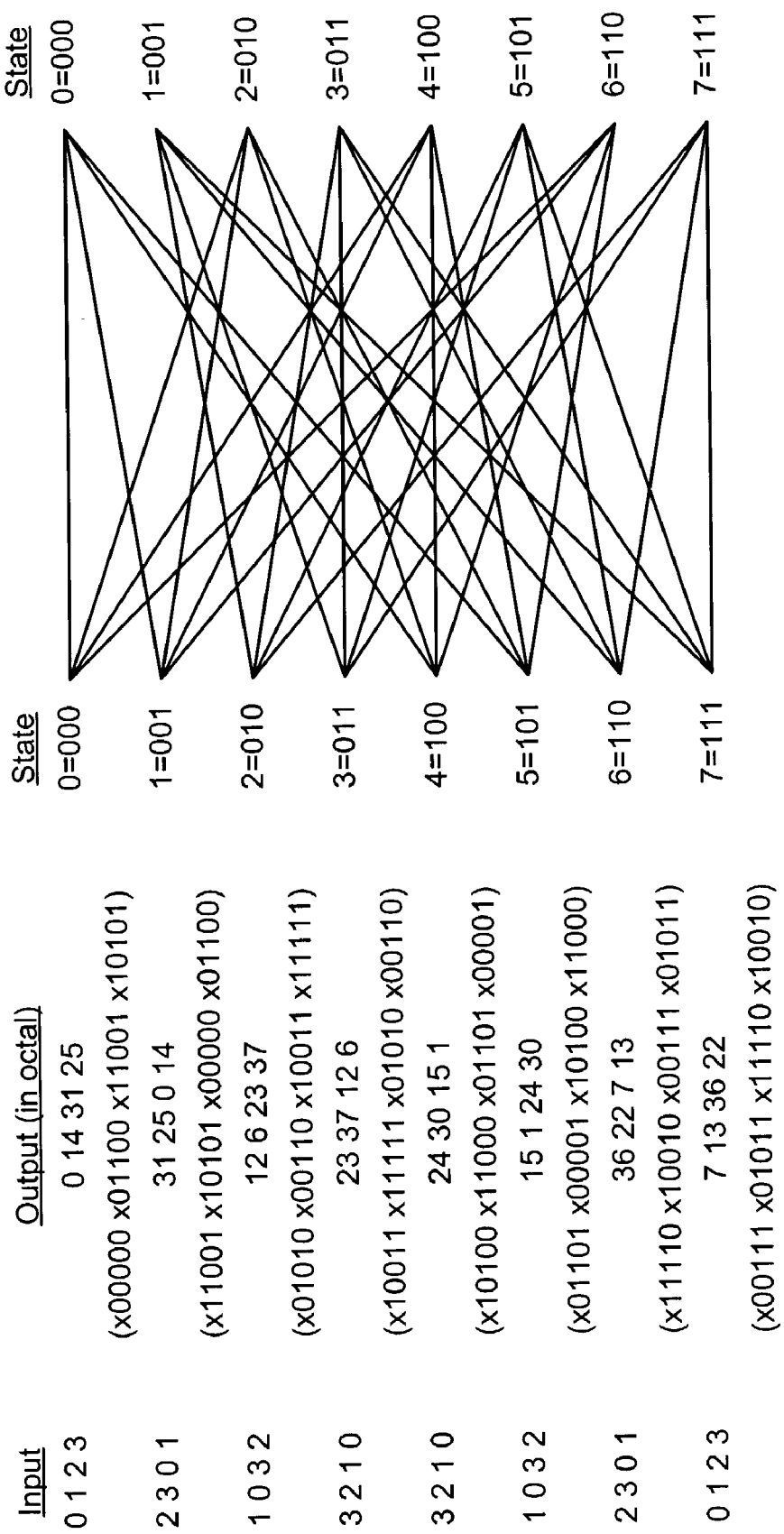
FIG. 23 is a trellis diagram of a trellis employed by the rate 2/5 non-systematic prototype encoder of the FIG. 20.

FIG. 23 is a trellis diagram of a trellis 2300 employed by the rate 2/5 non-systematic prototype encoder 2000 of the FIG. 20 that is built according to the invention. It is noted that the trellis 2300 is selected offline and employed for all of the encoding/decoding in this particular embodiment. The trellis 2300 is an 8 state (3 register) trellis whose input/output trellis transfer function is shown within the FIG. 23. Each of the inputs is shown in symbol form of the 4 possible inputs: 0 is for $i_0i_1$=00, 1 is for $i_0i_1$=01, 2 is for $i_0i_1$=10, and 3 is for $i_0i_1$=11. The outputs are shown in octal; however, only the first 5 bits are employed in this embodiment. Again, the rate 2/5 non-systematic prototype encoder 2000 of the FIG. 20 employs the trellis 2300, so only five coded output bits are available. It is noted that all of the metrics according to the trellis 2300 may be represented by 16 unique metrics. Although there are 5 available bits as the output of the rate 2/5 non-systematic prototype encoder 2000, when considering the number of options as being $2^5$=32, it is seen that this particular trellis design may be represented with 16 distinct metrics. Moreover, an efficient hardware implementation allows these 16 distinct metrics to be represented with 8 distinct metric values.

The $6^{th}$ bit is simply not existent in the rate 2/5 encoder described here; the outputs may be viewed, in octal form, as being $xc_4c_3c_2c_1c_0$, where x represents the unused bit. It is noted, however, that some other embodiments (say, in a rate 2/6 encoder) may employ all 6 output bits when performing a rate 2/6 encoder.

For example, following the operation and function of the trellis, starting from the state of 0=000, the following transitions may be achieved:

When the encoder is in the state 0=000, and when the input $i_0i_1$=00=0, then the state of the encoder will transition to state 0=000, and the output will be $xc_4c_3c_2c_1c_0$=x00000=0. When the encoder is in the state 0=000, and when the input $i_0i_1$=01=1, then the state of the encoder will transition to state 2=010, and the output will be $xc_4c_3c_2c_1c_0$=x01100=14. When the encoder is in the state 0=000, and when the input $i_0i_1$=10=2, then the state of the encoder will transition to state 4=100, and the output will be $xc_4c_3c_2c_1c_0$=x10101=31. When the encoder is in the state 0=000, and when the input $i_0i_1$=11=3, then the state of the encoder will transition to state 6=110, and the output will be $xc_4c_3c_2c_1c_0$=x10101=25.

The transitions from other initial states may similarly be followed according to the trellis 2300. It is here noted that the trellis 2300 represents one such trellis that may be employed to perform TTCM encoding. Other trellises may similarly be employed without departing from the scope and spirit of the invention. The encoding employs this trellis when performing each of the various rate control sequences provided by the rate control sequencer 1150 to the rate 2/5 non-systematic prototype encoder 2000. As will be seen below as well, this same trellis 2300 is also employed to performing decoding of data for each of the various rate control sequences provided by the rate control sequencer 1150.

Figure 24:
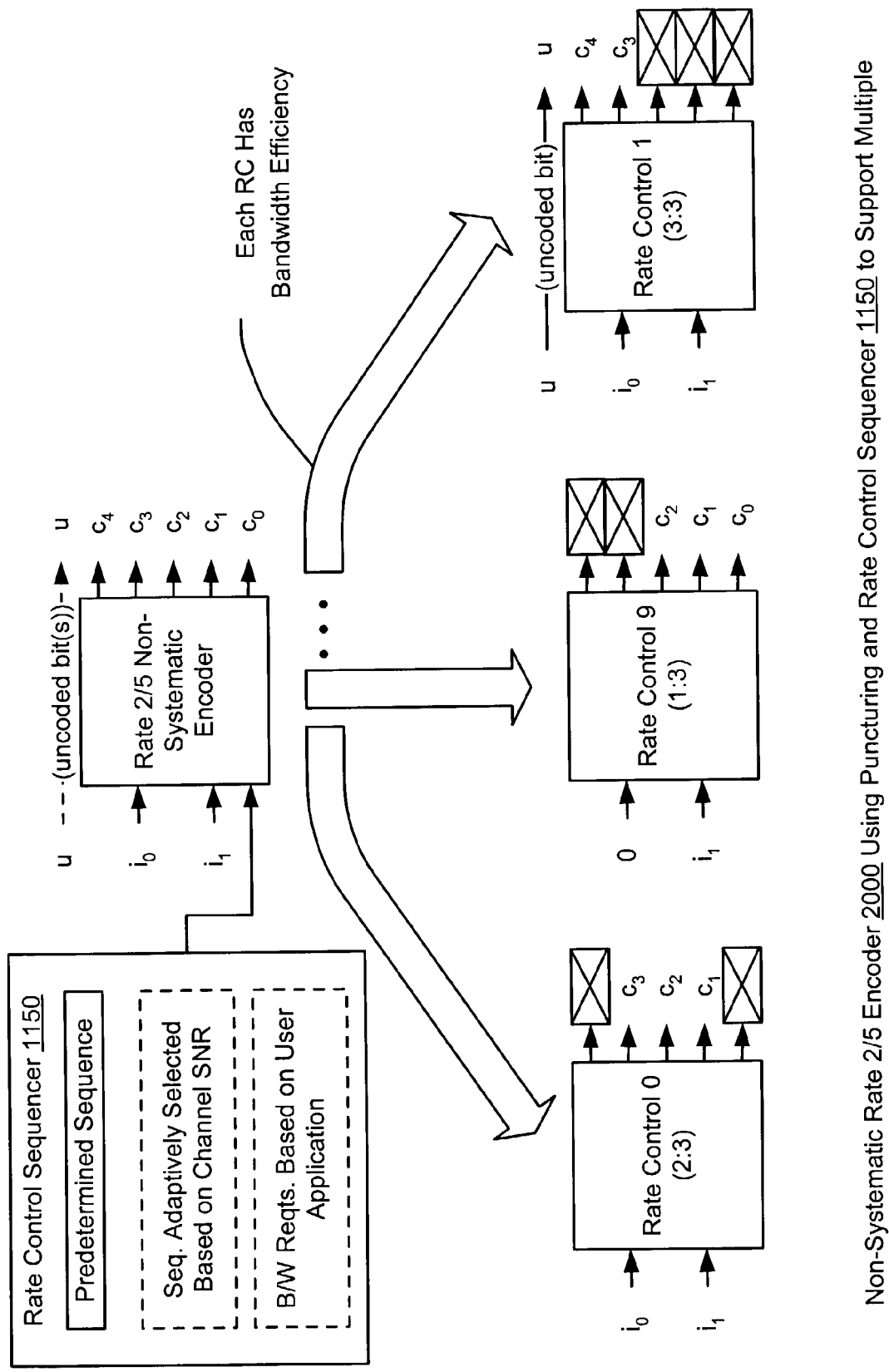
FIG. 24 is a diagram illustrating the functional operation the non-systematic rate 2/5 encoder of the FIG. 20 using puncturing and rate control sequencer to support multiple encoders performing various rate controls according to the invention.

FIG. 24 is a diagram illustrating the functional operation of the non-systematic rate 2/5 encoder 2000 using puncturing and rate control sequencer 1150 to support multiple encoders performing various rate controls according to the invention. Here, the non-systematic rate 2/5 encoder 2000 is implemented to perform the functionality of multiple encoders. Puncturing is performed on the output bits of the encoder to generate the various options of encoded symbols that include encoded bits and/or uncoded bits. The variable code rate functionality of the invention, shown in the context of the non-systematic rate 2/5 encoder 2000 cycles through a number of rate controls (that constitute a rate control sequence—shown as a RC 0, a RC 9, and RC 1) in the FIG. 24. Each of these RCs has a particular bandwidth efficiency. Cooperatively, the bandwidth efficiencies of the individual RCs (RC 0, a RC 9, and RC 1) define the rate control sequence provide an average bandwidth efficiency across this entire rate control sequence.

The rate control sequencer 1150 may cycle through a predetermined rate control sequence; it may adaptively select one or more new rate control sequences based on operating conditions such as a communication channel's SNR, bandwidth requirements based on various user applications, or according to some other consideration as well.

The rate control sequence as illustrated within the example embodiment shown in the FIG. 24 may be described as follows:

Within the non-systematic rate 2/5 encoder 2000 as implemented according to RC 0, a rate 2/3 encoder is achieved. Two information bits ($i_0$ and $i_1$) are input to the non-systematic rate 2/5 encoder 2000. The output of encoding punctures all of the coded bits except for $c_3c_2c_1$; these remaining bits are then used to generate a 3 bit symbol that will be mapped according to a 3 bit symbol modulation (constellation and mapping) as defined by RC 0.

Within the encoder as implemented according to RC 9, a rate 1/3 encoder is achieved. One information bits (ii) is input to the encoder. The output of the encoder punctures all of the coded bits except for $c_2c_1c_0$; these remaining bits are then used to generate a 3 bit symbol that will be mapped according to a 3 bit symbol modulation (constellation and mapping) as defined by RC 9.

Within the encoder as implemented according to RC 1, a rate 3/3 encoder is achieved. Two information bits ($i_0$ and $i_1$) and one uncoded bit u are input to the encoder. The output of the encoder punctures all of the coded bits except for $c_4c_3$ and the uncoded bit u; these remaining bits and the uncoded bit ($uc_4c_3$) are then used to generate a 3 bit symbol that will be mapped according to a 3 bit symbol modulation (constellation and mapping) as defined by RC A1.

The non-systematic rate 2/5 encoder 2000 may then cycle through the rate control sequence defined by the (RC 0, a RC 9, and RC 1) a predetermined number of times within a data frame. Alternatively, the non-systematic rate 2/5 encoder 2000 may adaptively select a new rate control sequence based on operating conditions of the communication system in which the non-systematic rate 2/5 encoder 2000 is implemented. Each of the individual RCs may be viewed as being functionality supported by distinct encoders, yet a single device is operable to support all of these encoders according to the variable code rate functionality described herein. The above-referenced comments are also applicable to the cases presented below in the FIGS. 25 and 26.

Figure 25:
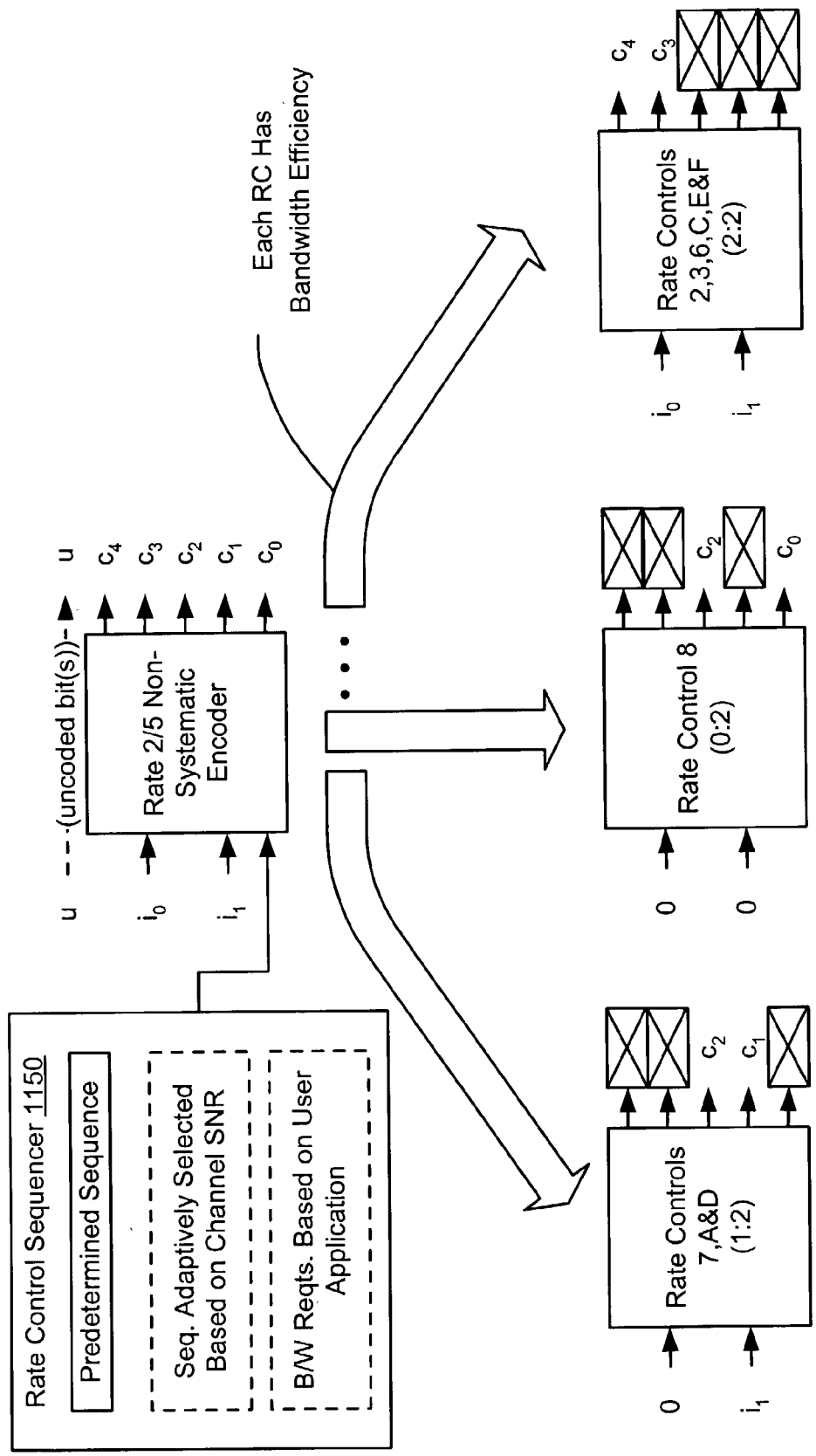
FIG. 25 shows additional rate controls supported by the non-systematic rate 2/5 encoder of the FIG. 20.

FIG. 25 shows additional rate controls supported by the non-systematic rate 2/5 encoder 2000 of the FIG. 20. Within the non-systematic rate 2/5 encoder 2000 as implemented according to RCs 7,A&D, a rate 1/2 encoder is achieved. One information bit ($i_1$) is input to the non-systematic rate 2/5 encoder 2000. The output of encoding punctures all of the coded bits except for $c_2c_1$; these remaining bits are then used to generate a 2 bit symbol that will be mapped according to the appropriate 2 bit symbol modulation (constellation and mapping) as defined by one of the RCs 7,A&D.

Within the encoder as implemented according to RC 8, a rate 0/2 encoder is achieved. No information bits are input to the encoder. The output of the encoder punctures all of the coded bits except for $c_2c_0$; these remaining bits are then used to generate a 2 bit symbol that will be mapped according to a 2 bit symbol modulation (constellation and mapping) as defined by RC 8.

Within the encoder as implemented according to RCs 2,3,6,C,E&F, a rate 2/2 encoder is achieved. Two information bits ($i_0$ and $i_1$) are input to the encoder. The output of the encoder punctures all of the coded bits except for $c_4c_3$; these remaining bits ($c_4c_3$) are then used to generate a 2 bit symbol that will be mapped according to the appropriate 2 bit symbol modulation (constellation and mapping) as defined by one of the RCs 2,3,6,C,E&F.

Figure 26:
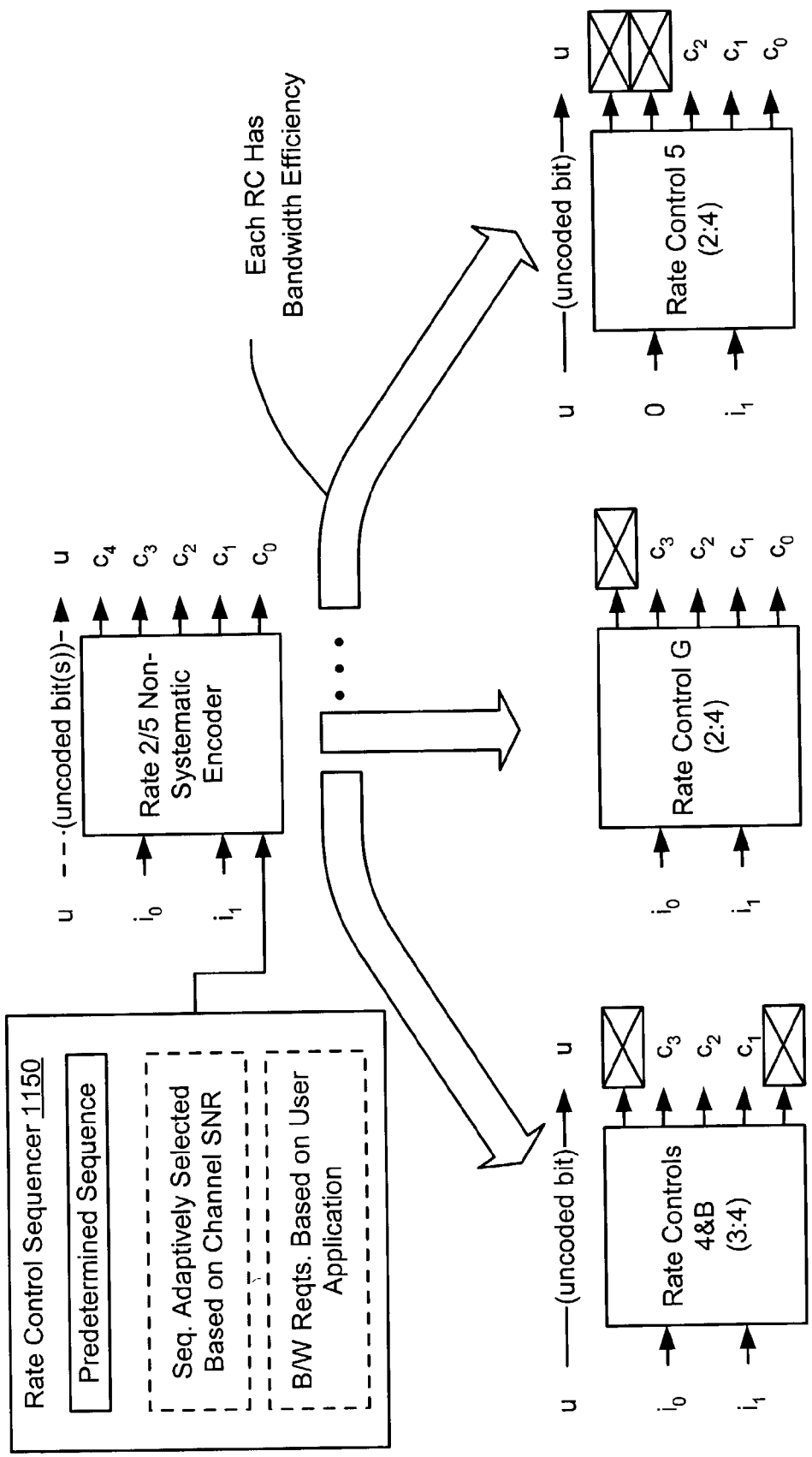
FIG. 26 shows yet additional rate controls supported by the non-systematic rate 2/5 encoder of the FIG. 20.

FIG. 26 shows yet additional rate controls supported by the non-systematic rate 2/5 encoder 2000 of the FIG. 20. Within the non-systematic rate 2/5 encoder 2000 as implemented according to RCs 4&B, a rate 3/4 encoder is achieved. Two information bits ($i_0$ and $i_1$) and one uncoded bit u are input to the non-systematic rate 2/5 encoder 2000. The output of encoding punctures all of the coded bits except for $c_3c_2c_1$ and the uncoded bit u, leaving $uc_3c_2c_1$; these remaining bits are then used to generate a 4 bit symbol that will be mapped according to the appropriate 4 bit symbol modulation (constellation and mapping) as defined one of the RCs 4&B.

Within the non-systematic rate 2/5 encoder 2000 as implemented according to RC G, a rate 2/4 encoder is achieved. Two information bits ($i_0$ and $i_1$) are input to the non-systematic rate 2/5 encoder 2000. The output of encoding punctures all of the coded bits except for $c_3c_2c_1c_0$; these remaining bits are then used to generate a 4 bit symbol that will be mapped according to a 4 bit symbol modulation (constellation and mapping) as defined by RC G.

Within the non-systematic rate 2/5 encoder 2000 as implemented according to RC 5, a rate 2/4 encoder is achieved. One information bit ($i_1$) and one uncoded bit u are input to the non-systematic rate 2/5 encoder 2000. The output of encoding punctures all of the coded bits except for $c_2c_1c_0$ and the uncoded bit u, leaving $uc_2c_1c_0$; these remaining bits are then used to generate a 4 bit symbol that will be mapped according to a 4 bit symbol modulation (constellation and mapping) as defined by RC 5.

Figure 27:
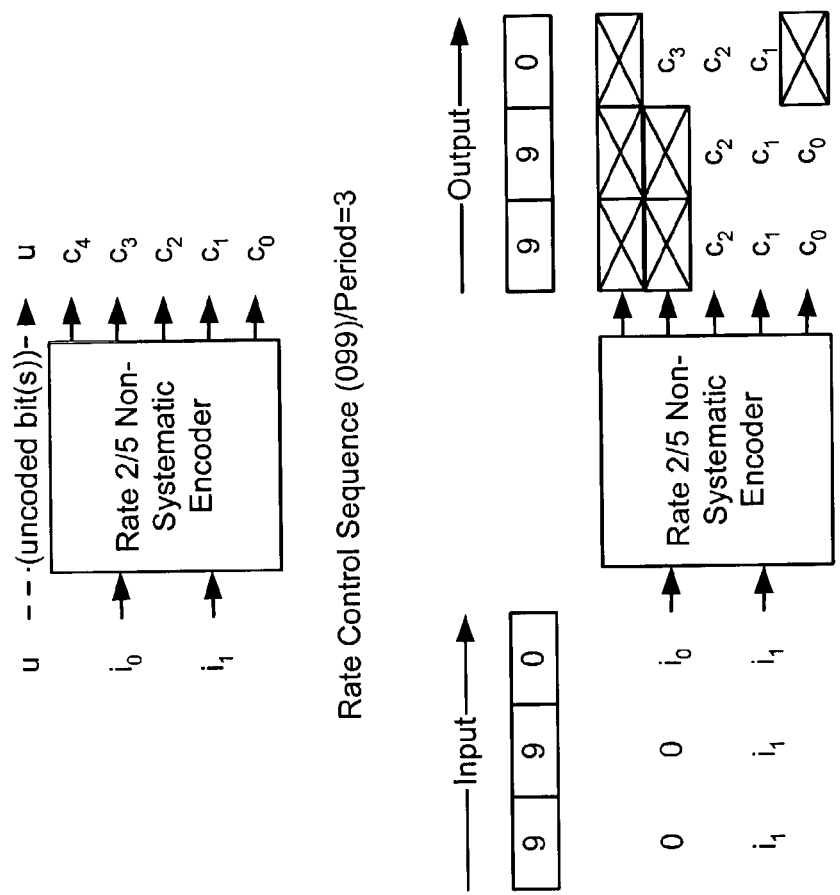
FIGS. 27, 28, 29, and 30 are diagrams illustrating embodiments of periodic sequencing of the non-systematic rate 2/5 encoder of the FIG. 20 using puncturing and rate control sequencer according to the invention.

FIG. 27 is a diagram illustrating an embodiment of periodic sequencing of a non-systematic rate 2/5 encoder 2000 using puncturing and rate control sequencer 1150 according to the, invention. The rate control sequence in this embodiment includes the RCs (RC 0, RC 9, and RC 9) having a period of 3 RCs.

The available input of this non-systematic rate 2/5 encoder 2000 is ($i_0i_1$) as well as the uncoded bit, and the available output is ($c_4c_3c_2c_1c_0$) as well as the uncoded bit u, leaving the possible output to be $uc_4c_3c_2c_1c_0$. Puncturing is performed to select a predetermined sub-set of all of the available input and output bits of this non-systematic rate 2/5 encoder 2000. The input cycles through the period of 3 RCs described above. The inputs bits cycle through the following sequence according to this particular period:

RC 0: $i_0i_1$,

RC 9: $0i_1$;

RC 9: $0i_1$;

The output bits of this period of RCs is as follows:

RC 0: $c_3c_2c_1$;

RC 9: $c_2c_1c_0$;
RC 9: $c_2c_1c_0$.

Clearly, additional rate control sequences that include different RCs may also be employed to perform and support the functionality described herein.

Figure 28:
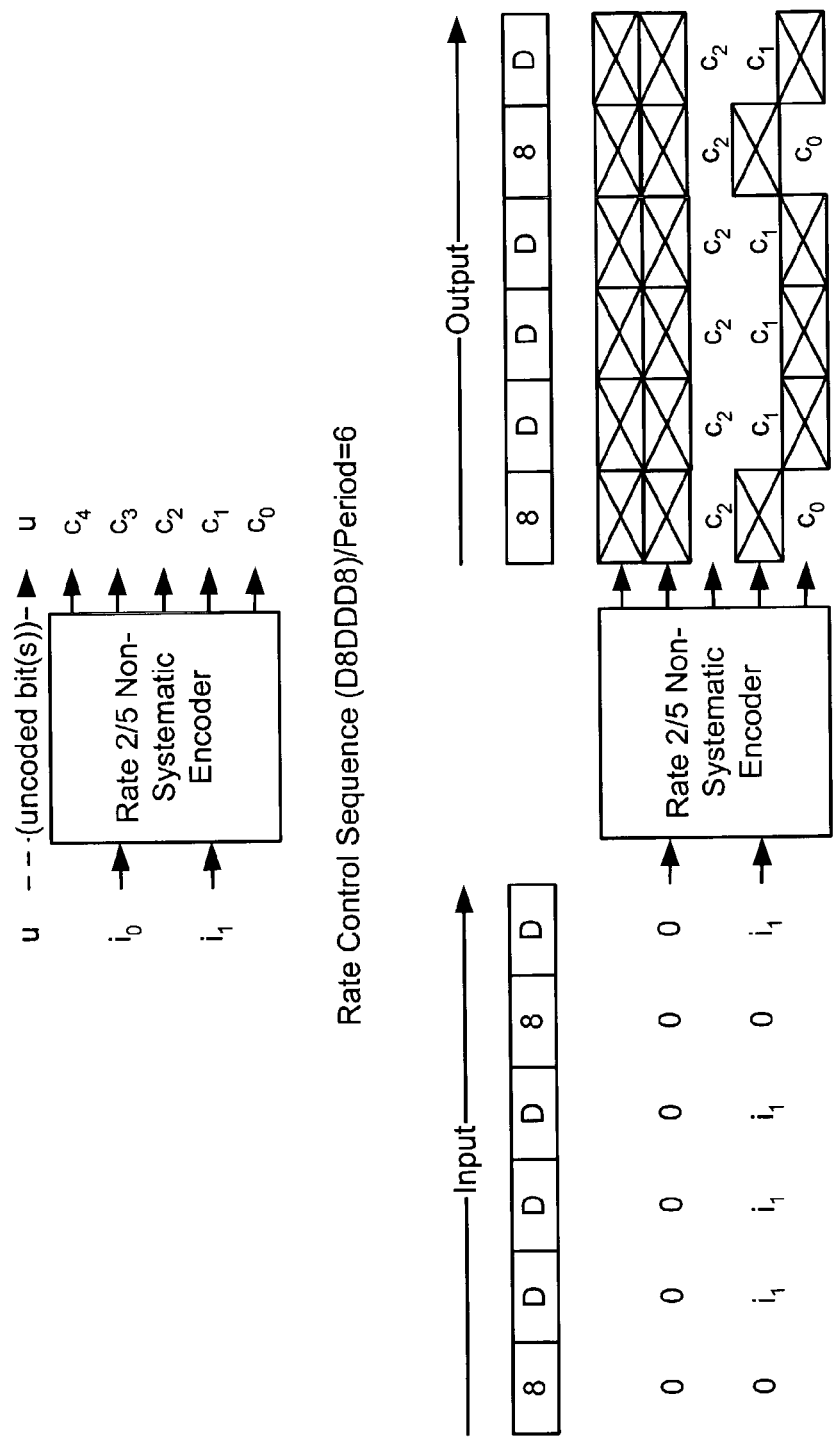

FIG. 28 shows additional periodic sequencing of rate controls supported by the non-systematic rate 2/5 encoder 2000 of the FIG. 20. The rate control sequence in this embodiment includes the RCs (RC D, RC 8, RC D, RC D, RC D, and RC 8) having a period of 6 RCs. Within the FIG. 28, the inputs bits cycle through the following sequence according to this particular period:

RC D: $0i_1$
RC 8: 00
RC D: $0i_1$
RC D: $0i_1$
RC D: $0i_1$
RC 8: 00

The output bits of this period of RCs is as follows:

RC D: $c_2c_1$
RC 8: $c_2c_0$
RC D: $c_2c_1$
RC D: $c_2c_1$
RC D: $c_2c_1$
RC 8: $c_2c_0$

Figure 29:
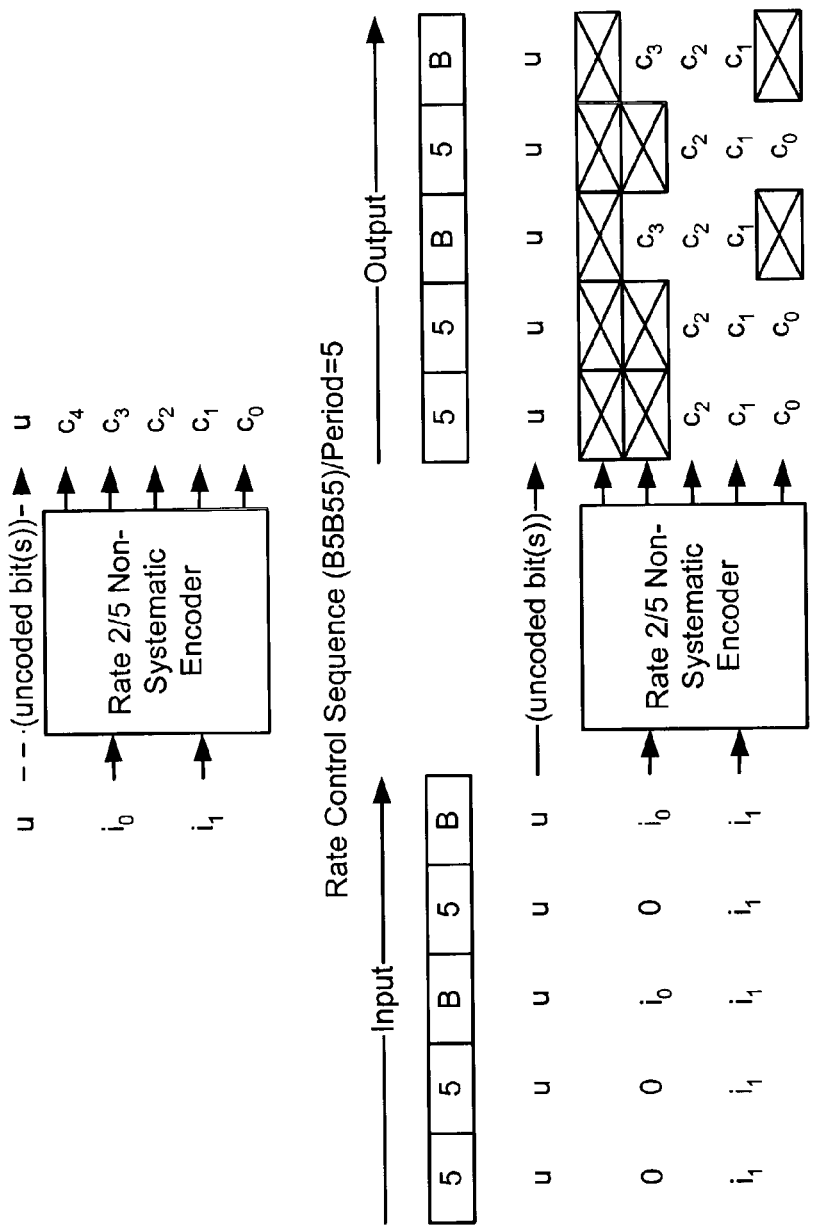

FIG. 29 shows yet additional periodic sequencing of rate controls supported by the non-systematic rate 2/5 encoder 2000 of the FIG. 20. The rate control sequence in this embodiment includes the RCs (RC B, RC 5, RC B, RC 5, and RC 5) having a period of 5 RCs. Within the FIG. 29, the inputs bits cycle through the following sequence according to this particular period:

RC B: $u_i0i_1$
RC 5: $u0i_1$
RC B: $u_i0i_1$
RC 5: $u0i_1$
RC 5: $u0i_1$

The output bits of this period of RCs is as follows:

RC B: $uc_3c_2c_1$
RC 5: $uc_2c_1c_0$
RC B: $uc_3c_2c_1$
RC 5: $uc_2c_1c_0$
RC 5: $uc_2c_1c_0$

Figure 30:
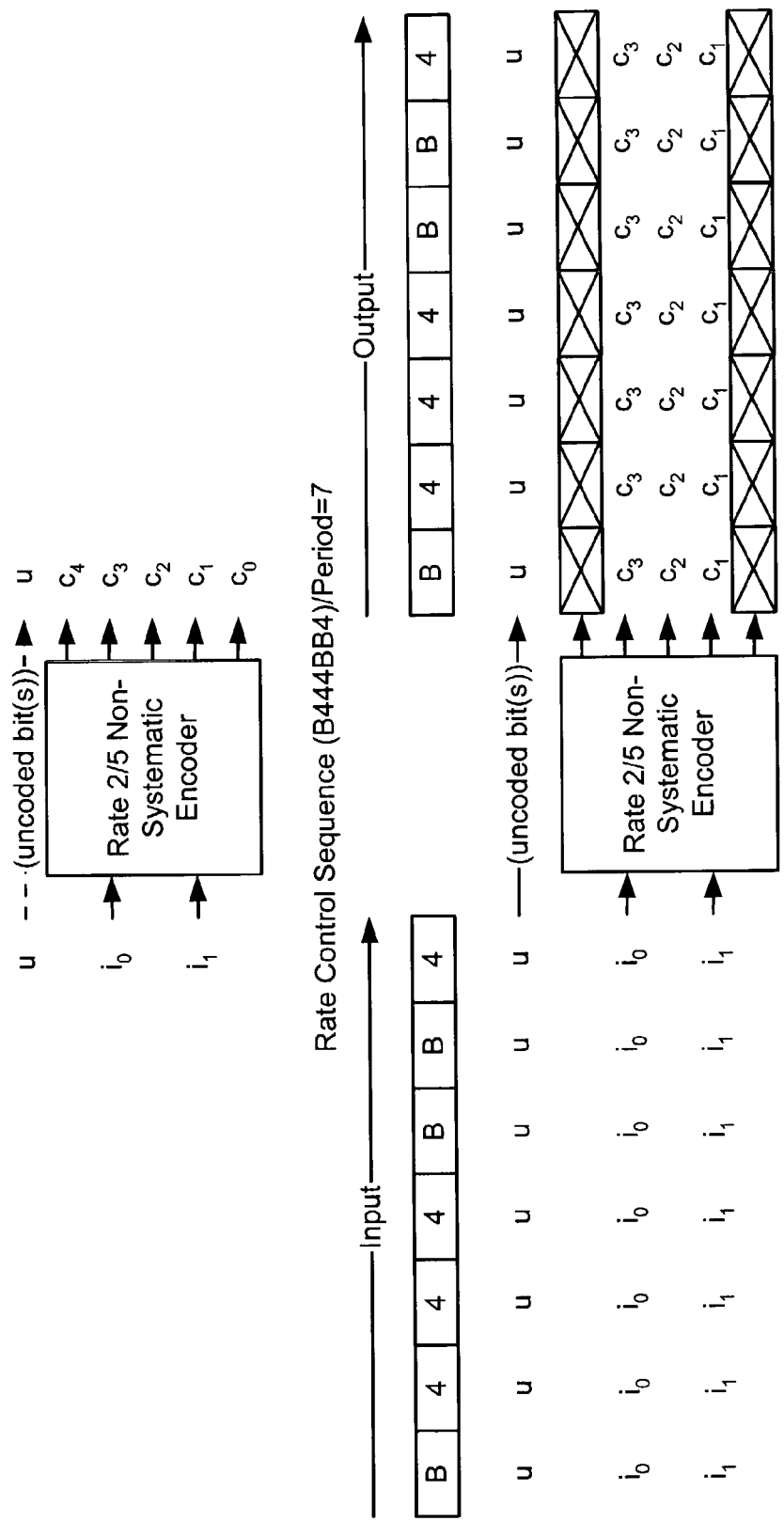

FIG. 30 shows yet additional periodic sequencing of rate controls supported by the non-systematic rate 2/5 encoder 2000 of the FIG. 20. The rate control sequence in this embodiment includes the RCs (RC B, RC 4, RC 4, RC 4, RC B, RC B, and RC 4) having a period of 7 RCs. Within the FIG. 30, the inputs bits cycle through the following sequence according to this particular period:

RC B: $u_i0i_1$
RC 4: $u_i0i_1$
RC 4: $u_i0i_1$
RC 4: $u_i0i_1$
RC B: $u_i0i_1$
RC B: $u_i0i_1$
RC 4: $u_i0i_1$

The output bits of this period of RCs is as follows:

RC B: $uc_3c_2c_1$
RC 4: $uc_3c_2c_1$
RC 4: $uc_3c_2c_1$
RC 4: $uc_3c_2c_1$
RC B: $uc_3c_2c_1$
RC B: $uc_3c_2c_1$
RC 4: $uc_3c_2c_1$

The FIG. 30 shows one of the many possible examples of where different modulations are employed within the same rate control sequence. This particular example shows the mixing of 16 APSK and 16 QAM modulations. Each of the modulations of these two RCs 4 and B employs different constellations altogether. It is understood that other modulations may also be mixed together within a rate control sequence without departing from the scope and spirit of the invention.

The FIGS. 31, 32, 33, 34, 35 and 36 are examples of some of the possible modulations (constellations and mappings) that may be employed in accordance with the invention. It is noted that any number and types of modulations may be used (provided there are sufficient bits available in the encoding). Some examples of modulations include BPSK (Binary Phase Shift Keying), QPSK (Quadrature Phase Shift Keying), QAM (Quadrature Amplitude Modulation), APSK (Amplitude Phase Shift Keying), and variants thereof including 8 PSK, and higher orders of PSK, 16 QAM, and other higher orders of QAM (such as 64 QAM, 256 QAM, 1024 QAM), among other types of modulation.

Figure 31:
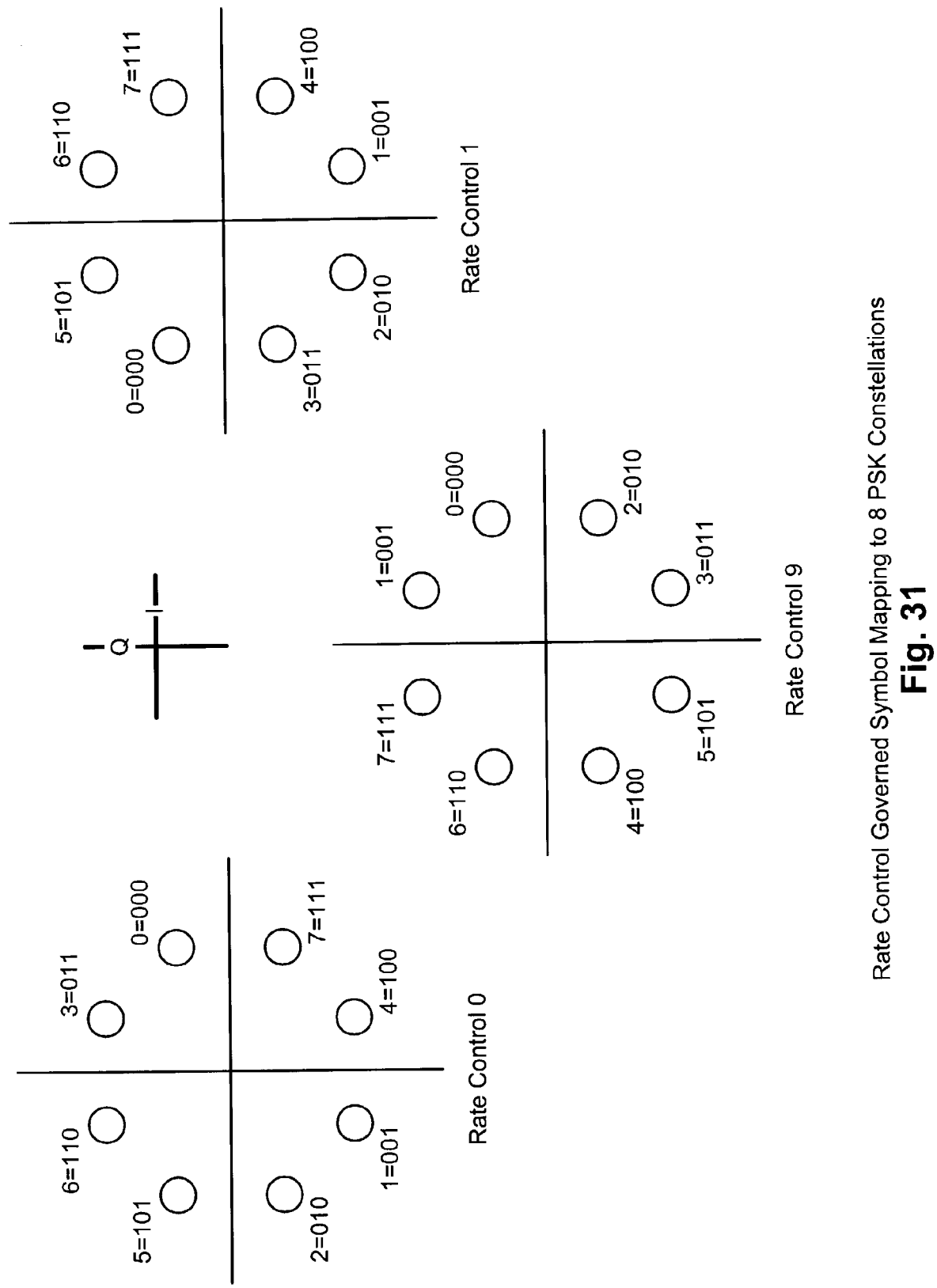
FIG. 31 is a constellation diagram illustrating an embodiment of rate control governed mapping to 8 PSK constellations according to the invention.

FIG. 31 is a constellation diagram illustrating an embodiment of rate control governed mapping to 8 PSK constellations according to the invention. The FIG. 31 shows modulations (constellations and mappings) that may be performed according to the 3 bit symbols generated during encoding and puncturing. Depending on the RCs employed within a rate control sequence, when an 8 PSK modulation is selected, then one of these appropriate mappings may be selected. In one embodiment, these three modulations and their respective mappings are used to perform the final symbol mapping. The non-systematic rate 2/5 encoder 2000 employs these modulations (constellations and their mappings) when employing the RCs (RC 0, RC 9, and RC 1). It is noted that these RCs are exemplary and that other 3 bit symbol modulations and different mappings of those 3 bit symbols modulations may also be employed without departing from the scope and spirit of the invention.

Figure 32:
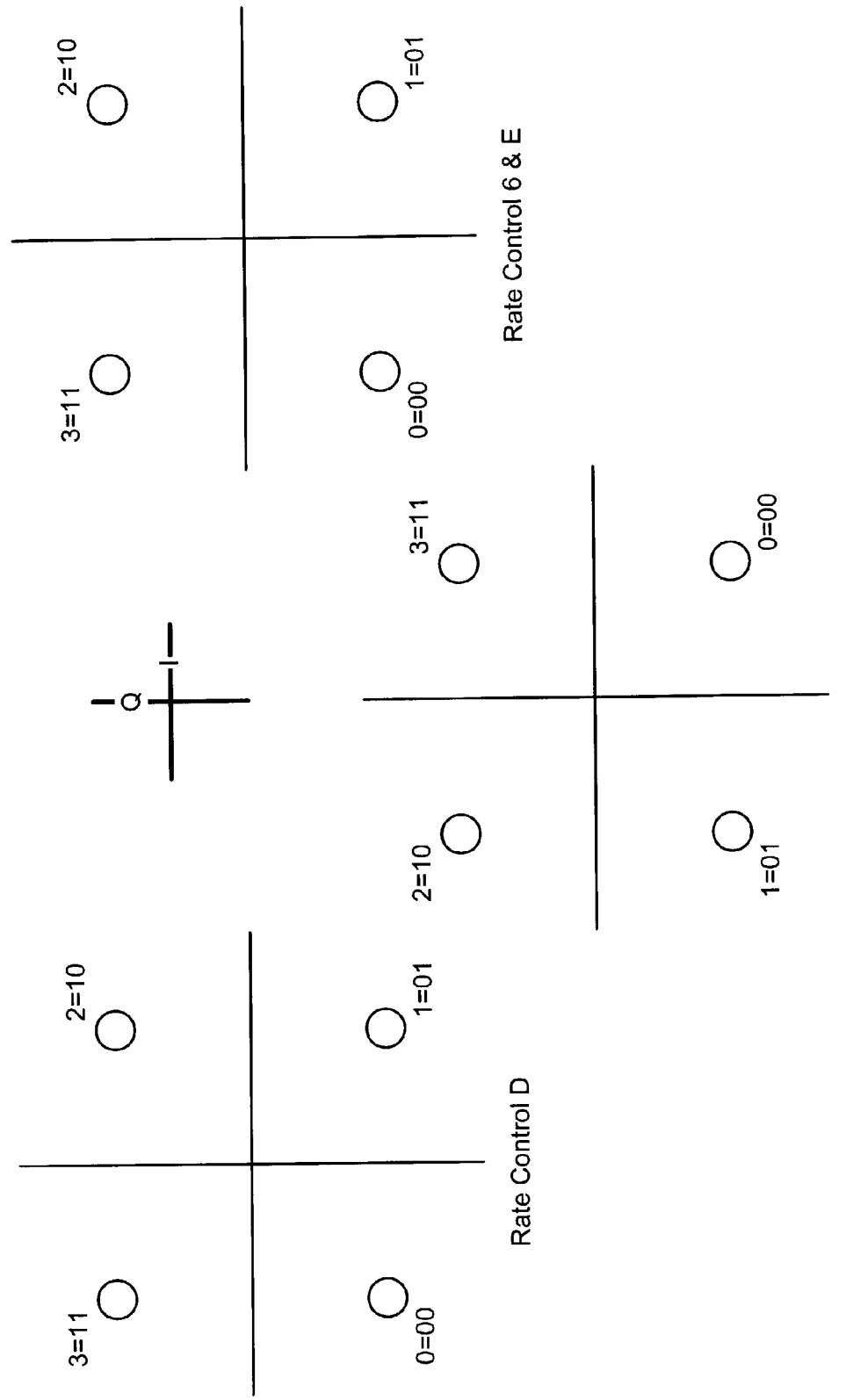
FIGS. 32, 33, and 34 are constellation diagrams illustrating embodiments of rate control governed mapping to QPSK constellations according to the invention.
Figure 33:
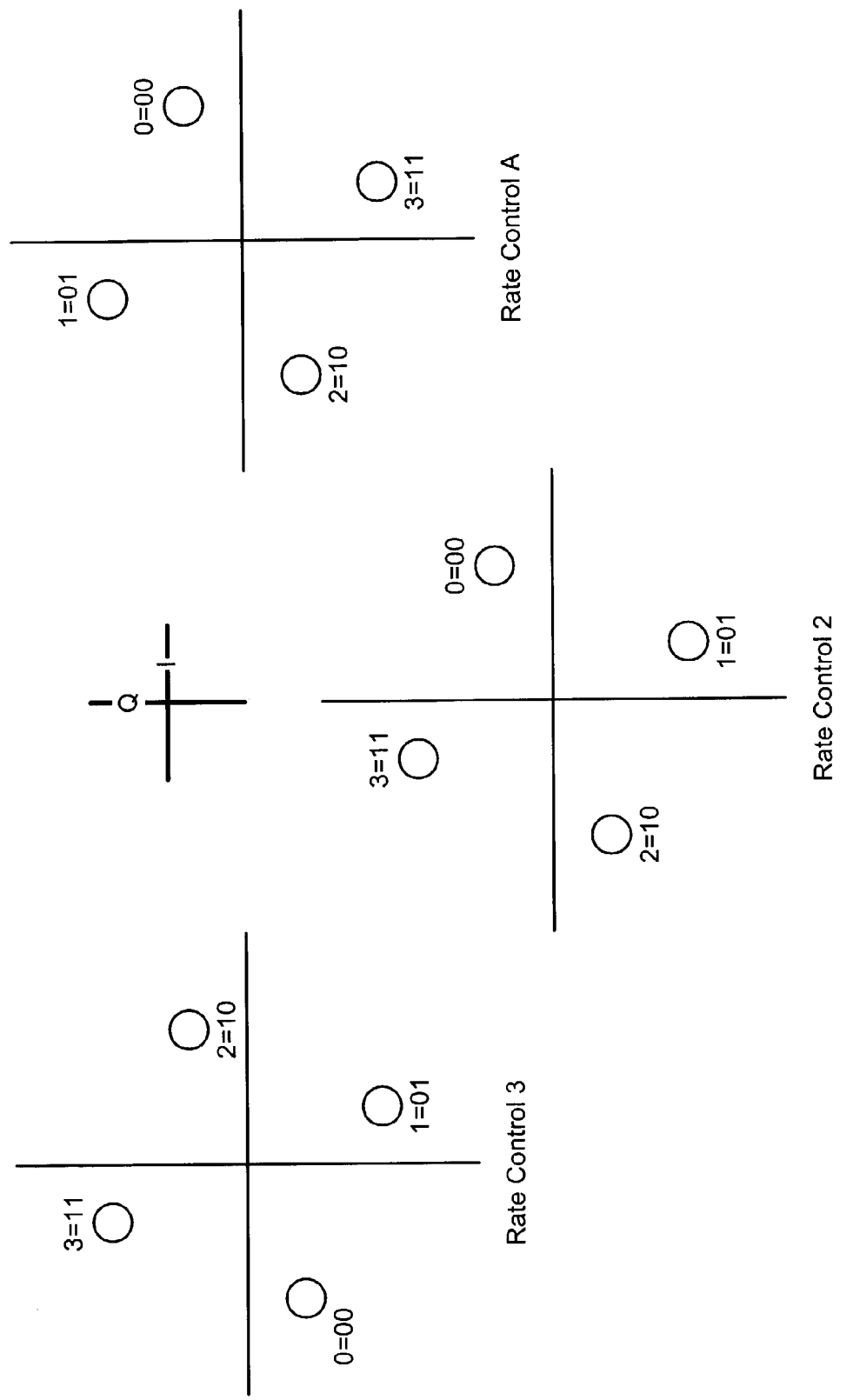
Figure 34:
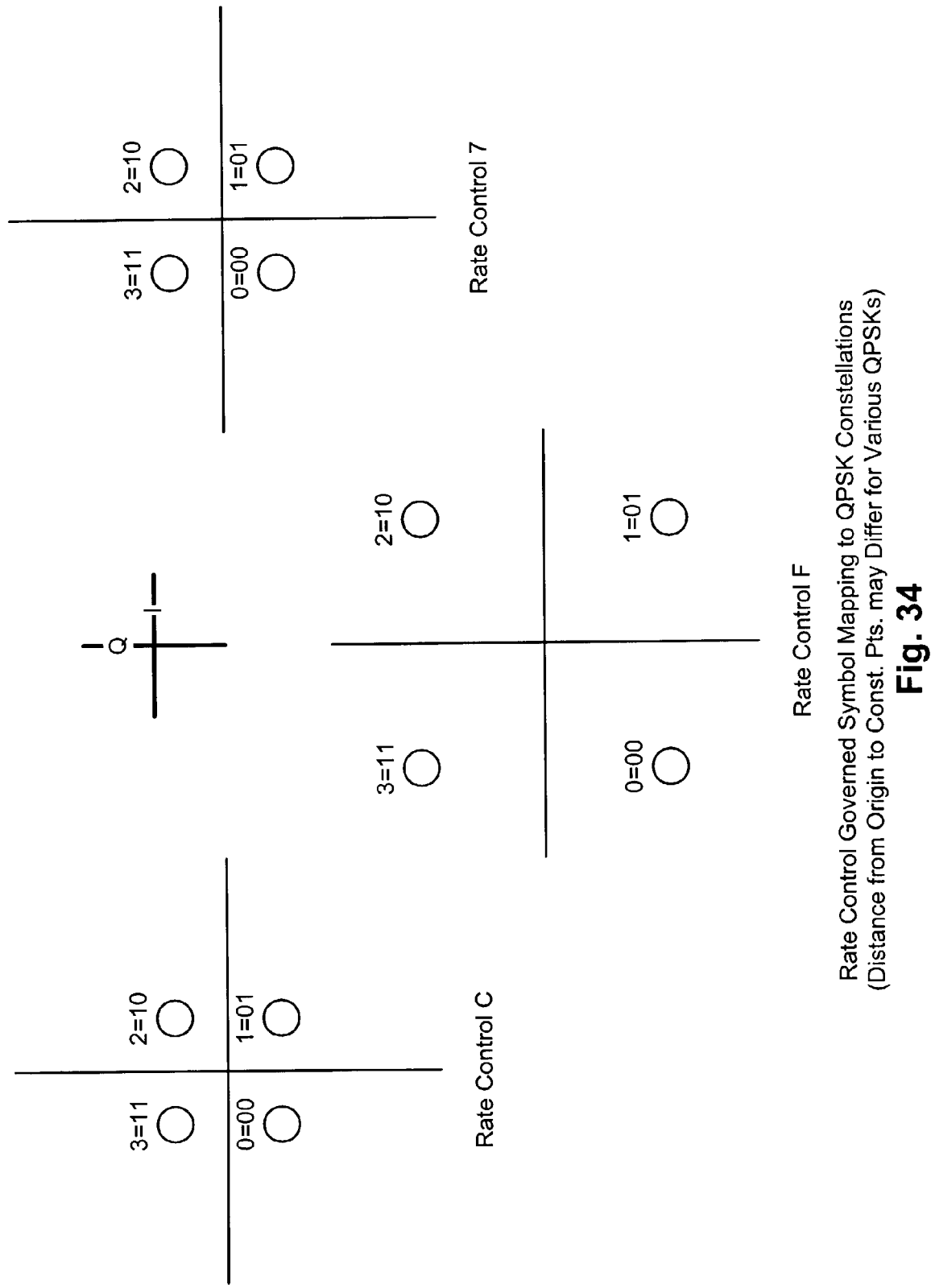

FIGS. 32, 33, and 34 are constellation diagrams illustrating embodiments of rate control governed mapping to QPSK constellations according to the invention. These FIGS. 32, 33, and 34 show modulations (constellations and mappings) that may be performed according to the 2 bit symbols generated during encoding and puncturing. It is noted that a variety of QPSK modulations may be employed. The RCs 3,2,A within the FIG. 33 show modulations whose constellations points are titled with respect to the I,Q axes. The RCs C,F,&7 within the FIG. 34 show modulations whose constellations points have different distances from the origin of the I,Q plane. A variety of modulations may performed according to QPSK, including embodiments where the constellation points align along the I,Q axes themselves and those whose constellation points are not equidistantly spaces with respect to the origin of the I,Q plane. These statements are also true for the other modulations employed as well. The invention envisions any number of modulations without departing from the scope and spirit of the invention.

Figure 35:
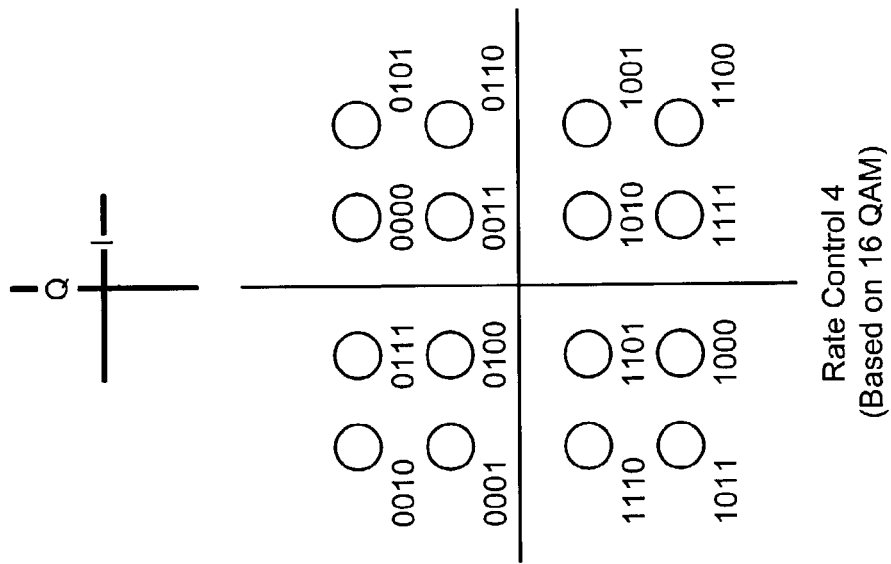
FIG. 35 is a constellation diagram illustrating an embodiment of rate control governed mapping to a 16 QAM constellation according to the invention.

FIG. 35 is a constellation diagram illustrating an embodiment of rate control governed mapping to a 16 QAM constellation according to the invention. The FIG. 35 shows the modulation for RC 4 that corresponds to a 16 QAM constellation having a particular mapping.

Figure 36:
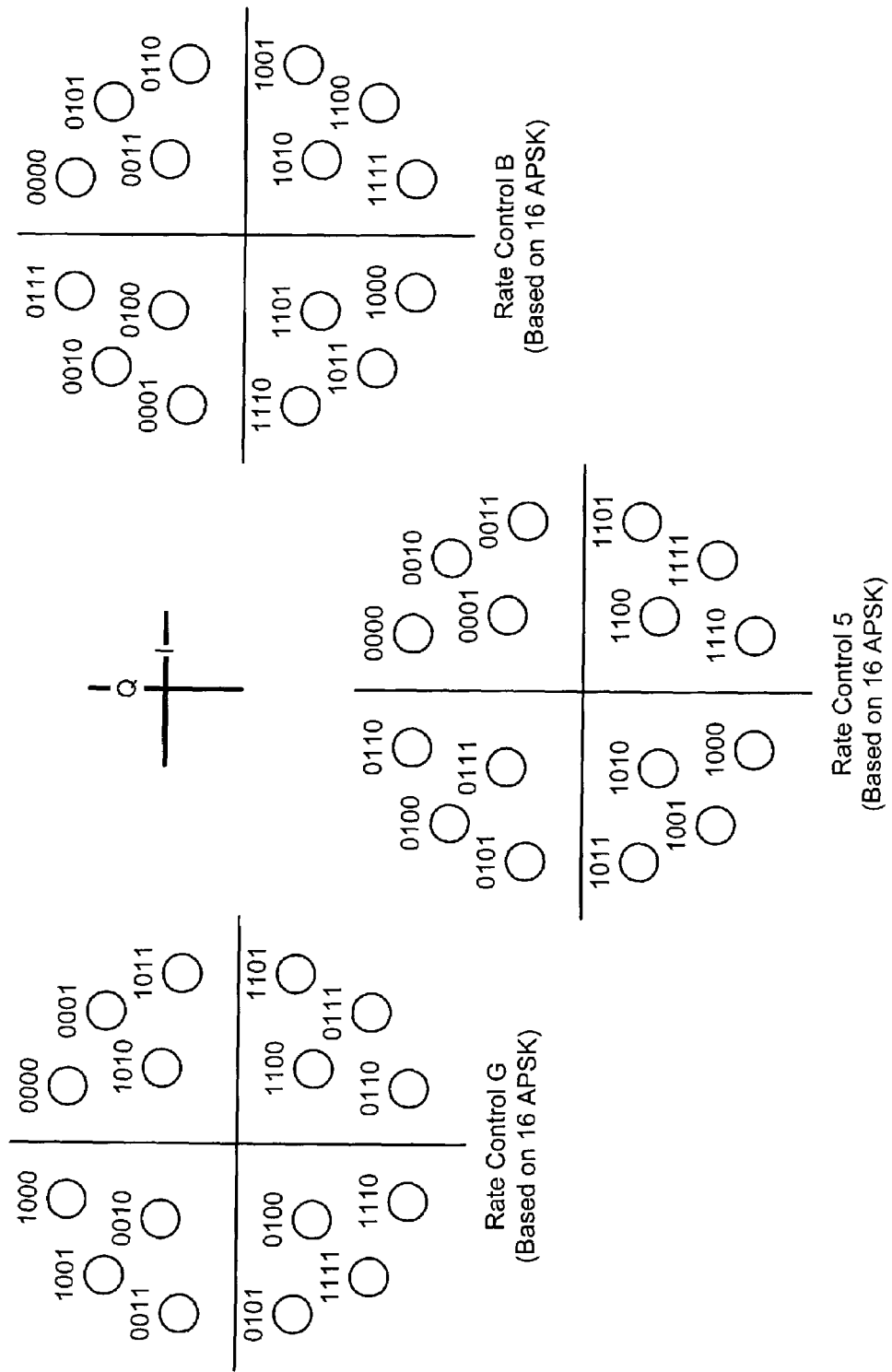
FIG. 36 is a constellation diagram illustrating an embodiment of rate control governed mapping to 16 APSK constellations according to the invention.

FIG. 36 is a constellation diagram illustrating an embodiment of rate control governed mapping to 16 APSK constellations according to the invention. The FIG. 36 shows the modulations for RCs G,5&B that corresponds to a 16 APSK constellation having a particular mapping.

The following table shows some examples of different rate control sequences that may be supported by the non-systematic rate 2/5 encoder 2000 and the rate control sequencer 1150. These are exemplary, and variations thereof may be implemented without departing from the scope and spirit of the invention. For example, other rate control sequence may also be determined to operate within a given bandwidth of a communication channel. In addition, it is also noted that the particular order of the RCs within the following table may also be permutated without departing from the scope and spirit of the invention. However, this permutation of the RCs within a rate control sequence may affect performance in some cases.

This table shows embodiments of how to generate various rate control sequences, according to various bandwidth efficiencies and periods, using the RCs described within the FIGS. 31, 32, 33, 34, 35 and 36.

| Constellation | Bandwidth efficiency (bits/second /Hz) | Rate control sequence | period |
|---|---|---|---|
| 8 PSK | 1.3333 (4/3) | 099 | 3 |
| | 1.5 (3/2) | 09 | 2 |
| | 1.6 (8/5) | 00909 | 5 |
| | 1.6667 (5/3) | 009 | 3 |
| | 1.7143 (12/7) | 0009009 | 7 |
| | 1.75 (7/4) | 0009 | 4 |
| | 2 | 0 | 1 |
| | 2.1 (21/10) | 0000000001 | 10 |
| | 2.2 (11/5) | 00001 | 5 |
| | 2.25 (9/4) | 0001 | 4 |
| | 2.3 (23/10) | 0001001001 | 10 |
| | 2.4 (12/5) | 00101 | 5 |
| | 2.5 (5/2) | 01 | 2 |
| QPSK | 0.6667 (2/3) | D8DDD8 | 6 |
| | 1 | D | 1 |
| | 1.3333 (4/3) | DDE | 3 |
| | 1.5 (3/2) | DDEE | 4 |
| | 1.6 (8/5) | DEE DEE DEE D | 10 |
| | 1.6667 (5/3) | DEEEED | 6 |
| | 1.7143 (12/7) | DDEEEDDEEEEEEEEEDDEEE | 21 |
| | 1.75 (7/4) | DDEEEEE | 8 |
| | 1.7778 (16/9) | DDEEEEEE | 9 |
| | 1.8 (9/5) | EEDEE | 5 |
| | 1.8182 (20/11) | EEEEEDEEED | 11 |
| | 1.8333 (11/6) | EEDEEEEEEDEE | 12 |
| | 1.8462 (24/13) | DEEDEEEEEEEE | 13 |
| | 1.8571 (13/7) | EDDEEEEEEEEEDEEEEEEE | 21 |
| 16 QAM | 3 | 4 | 1 |
| 16 APSK | 3 | B | 1 |
| | 2.8 (14/5) | BBBB5 | 5 |
| | 2.7 (27/10) | BBB5BB5BB5 | 10 |
| | 2.6 (13/5) | BB5B5 | 5 |
| | 2.5 (5/2) | B5 | 2 |
| | 2.4 (12/5) | B5B55 | 5 |
| | 2.3 (23/10) | B555B55B55 | 10 |
| | 2.25 (9/4) | B555 | 4 |
| | 2.2 (11/5) | B5555 | 5 |
| | 2.1 (21/10) | B555555555 | 10 |
| | 2 | 5 | 1 |

FIG. 37 is a diagram illustrating an embodiment of variable puncturing, constellations, and mapping using the single non-systematic rate 2/5 encoder 2000 according to the invention. The FIG. 37 particularly shows how encoder output bits are punctured, and how the remaining bits are associated with one or more particular constellations and how each of those constellations may have a unique mapping. The control of the puncturing, the constellations, and the mapping are all governed by the rate control sequencer 1150. The rate control sequencer 1150 may cycle through a predetermined rate control sequence; it may adaptively select one or more new rate control sequence based on operating conditions such as a communication channel's SNR, bandwidth requirements based on various user applications, or according to some other consideration as well.

The available encoder output bits are provided to a functional block that may employ one or more of a number of multiple puncturing options. In this embodiment, these puncturing options are shown as puncturing for the following RCs: 0,9,1,8,2,3,6,C,E,F,7,A,D,4,B,5&G. Each of these puncturing options is associated with one or more constellations (the constellations being of the form of 8 PSK, QPSK, 16 QAM, and 16 APSK).

In this embodiment, the output bits remaining after having performed the puncturing for RCs 0, 9, and 1 are then associated with the 8 PSK constellation. The output bits remaining after having performed the puncturing for RCs 8,2,3,6,C,E,F,7,A&D are then associated with the QPSK constellation. The output bits remaining after having performed the puncturing for RC 4 are then associated with the 16 QAM modulation. The output bits remaining after having performed the puncturing for RCs 4,B,5&G are then associated with the 16 APSK constellation.

The RC for each particular puncturing is not only associated with a constellation, but also with a mapping for that constellation. For example, even though each of the RCs 0, 9, and 1 is associated with the 8 PSK constellation, each of them has a unique mapping. Similarly, even though each of the 8,2,3,6,C,E,F,7,A&D is associated with the QPSK modulation, each of them has a unique mapping. Similarly, even though each of the RCs B,5,&G is associated with the 16 APSK modulation, each of them has a unique mapping.

Figure 38:
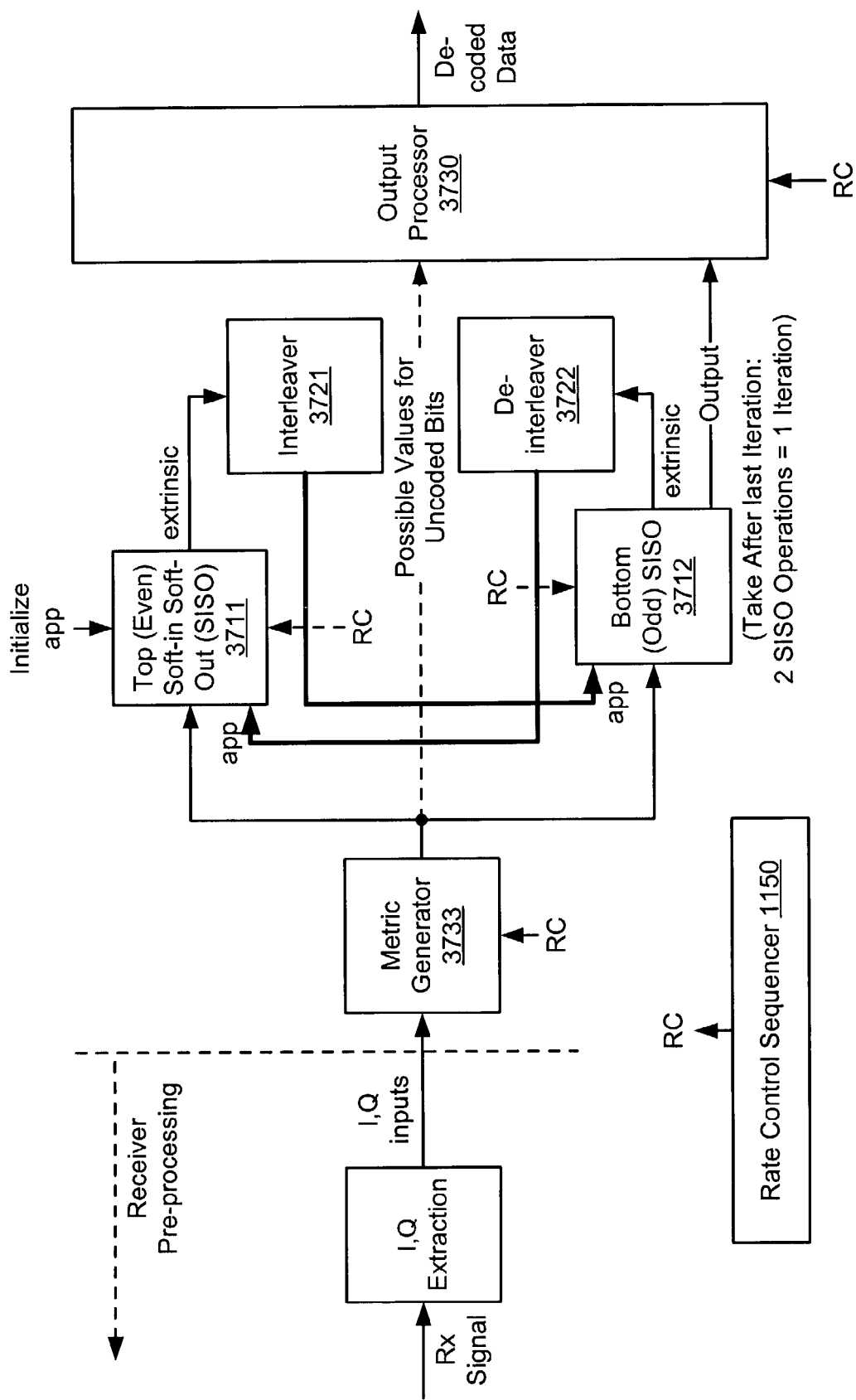
FIG. 38 is a system diagram illustrating an embodiment of a TTCM decoder system that is built according to the invention.

FIG. 38 is a system diagram illustrating an embodiment of a TTCM decoder system 3800 that is built according to the invention. A received signal is provided to an I,Q extraction functional block that extracts the I,Q (in-phase and quadrature) components from the received signal that are mapped according to a RC as determined by the rate control sequencer 1150. This may be viewed as being receiver pre-processing. The I,Q is then mapped according to the modulation's appropriate constellation and mapping. Then, the mapped I,Q is passed to a metric generator 3733 that also receives the RC input from the rate control sequencer 1150. The metric generator 3733 generates the appropriate metrics that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

We then compare the metric associated with uncoded bit (u=0) with the metric associated with uncoded bit (u=1), and we select the smaller metric value. The smaller metric value is deemed a higher likelihood than the larger metric value according to this embodiment's convention. We also select value of u based on which metric has the smaller value. We select the possible value of the uncoded bit u to be 1 or 0 as determined by which of the associated metrics has the smaller value (metric associated with uncoded bit (u=0) or the metric associated with uncoded bit (u=1)). In certain embodiments, we may perform a min* operation that includes a logarithmic correction in selecting the smaller metric. Alternatively, we may perform a max* operation that includes a logarithmic correction in selecting the smaller metric. It is noted that the various embodiments of the invention may be implemented using the max* operations in lieu of the min* operation when preferred in a given implementation.

The min* calculation may be expressed as follows:

$$\min{}^*(A,B) = \min(A,B) - \ln(1+e^{-|A-B|})$$

The max* calculation may be expressed as follows:

$$\max{}^*(A,B) = \max(A,B) + \ln(1+e^{-|A-B|})$$

As an example of this operation, let us assume that we are using RC 5, whose punctured encoder output is in the form of $uc_2c_1c_0$. We then set u=1 and then u=0 for every combination (looking at $c_2c_1c_0$=111 as an example), so we deal with the two possible values for $uc_2c_1c_0$=0111 and $uc_2c_1c_0$=1111. We then compare the location of the received symbol, as mapped within the constellation, to the two constellation points indexed by 0111 and 1111. We then select from these two constellation points indexed by 0111 and 1111 based on which one has the smaller valued metric. So, in the RC 5 example used here, we reduce the total number of 16 metrics down to 8. We then store these 8 metric values and 8 possible uncoded bit values (indexed by the metrics indices for each symbol in a received frame), for subsequent use in decoding the uncoded bit after we have decoded the input bits, $i_0i_1$. After we perform decoding of the input bits, $i_0i_1$, then we will know with certainty what the bits $c_2c_1c_0$ are, and then we may directly determine the uncoded bit value u based on these 8 possible uncoded bit values that we have stored.

Continuing on with the decoding process and functionality, the metrics that are calculated by the metric generator 3733 are then provided to a top (even) SISO 3711 and simultaneously to a bottom (odd) SISO 3712. Each of these SISOs 3711 and 3712 calculates forward metrics (alphas) and backward metrics (betas), and extrinsic values according to the trellis employed (such as the trellis 2300). The calculation of exactly how to calculate these alphas, betas, and extrinsics according to the trellis is performed within the TTCM decoder 122. These alphas, betas, and extrinsics are all calculated for each symbol within a frame that is to be decoded. These calculations of alphas, betas, and extrinsics are all based on the trellis and according to the RC provided by the RC input from the rate control sequencer 1150. Starting with the top SISO 3711, after the extrinsic values have been calculated, they are passed to an interleaver 3721 after which it is passed to the bottom SISO 3712 as "a priori probability" (app) information. Similarly, after extrinsic values have been calculated within the bottom SISO 3712, they are passed to an interleaver 3722 after which it is passed to the top SISO 3711 as "a priori probability" (app) information. It is noted that a single decoding iteration, within the iterative decoding process of the TTCM decoder system 3800 consists of performing two SISO operations; that is to say, the iterative decoding process must pass through both the top (even) SISO 3711 and through the bottom (odd) SISO 3712.

After a significant level of confidence has been achieved and a solution is being converged upon, or after a predetermined number of decoding iterations have been performed, then the output from the bottom (odd) SISO 3712 is passed as output to an output processor 3730. The operation of the SISOs 3711 and 3712 may generally be referred to as calculating soft symbol decisions of the symbol contained within the received symbol. These soft symbol decisions may be performed on a true bit level in certain embodiments. The output processor 3730 uses these soft symbol decisions to generate hard symbol decisions for the input bits $i_0i_1$ of the input symbol and to provide decoded output data.

Moreover, in the situation where we have uncoded bits u that result from the coding of the input bits, $i_0i_1$, we then also need to use as many as 8 possible uncoded bit values (indexed by the metrics indices), so that we can directly determine the value of the uncoded bit. Even greater detail is provided below in the discussion associated with FIG. 43 that continues on with the example embodiment of RC 5.

It is also noted that the app sequence for the top (even) SISO 3711 must be initialized before beginning the iterative decoding. The notation for the app sequence app[i][j][k] is as follows:

1. i represents the possible binary value of the estimated bit
2. The positions of the estimated bit are denoted as follows: (j=0 refers the first bit into the encoder and j=1 refers the second bit into the encoder)
3. k is the index of the symbol's location within the data block (or frame).

More specifically, k represents the symbol index of the symbols in a frame of data, j is the bit index (j=0 for bit $i_1$ and j=1 for bit $i_0$), and i is the bit value (i=0 or 1). For example, app[1][0][50] represents the app for bit $i_1$ of the $50^{th}$ symbol being a value of 1.

At least two ways to initialize app[i][j][k] are described below:

1. app[i][j][k]=0.0,i,j∈{0,1},k∈{0, ..., N−1 }. Each and every TTCM coding, using any of the possible combination of RCs for a rate control sequence may use this initialization.
2. The TTCM coding with RC sequence 8 can have different initialization defined as follows.

app[0][1][k]=0.0 app[1][1][k]=MAX, for all possible k.

app[0][0][k]=0.0

For the sequence app[0][0][k], we may first define the sequence based on the rate control sequence using the intermediate variable pP and pP* (which denotes the interleaved version of pP).

pP[1][0][k]=MAX for RC 8 pP[1][0][k]=0.0 otherwise

Then, we interleave this sequence with de-interleave $\pi^{-1}$ is employed to generate the sequence pP*[1][0][k]. Finally, we define the initial app[1][0][k] as follows:

app[1][0][k]=pP[1][0][k] if k mod2=0 app[1][0][k]=pP*[1][0][k] if k mod2=1

Moreover, by using the interleaving π, we can directly define the app[1][0][k] as follows:

app[1][0][k]=MAX if RC [π̂(k)]=8 app[1][0][k]=0.0 otherwise

Further detail of the TTCM decoding functionality and operation is provided within several of the following Figures.

Figure 39:
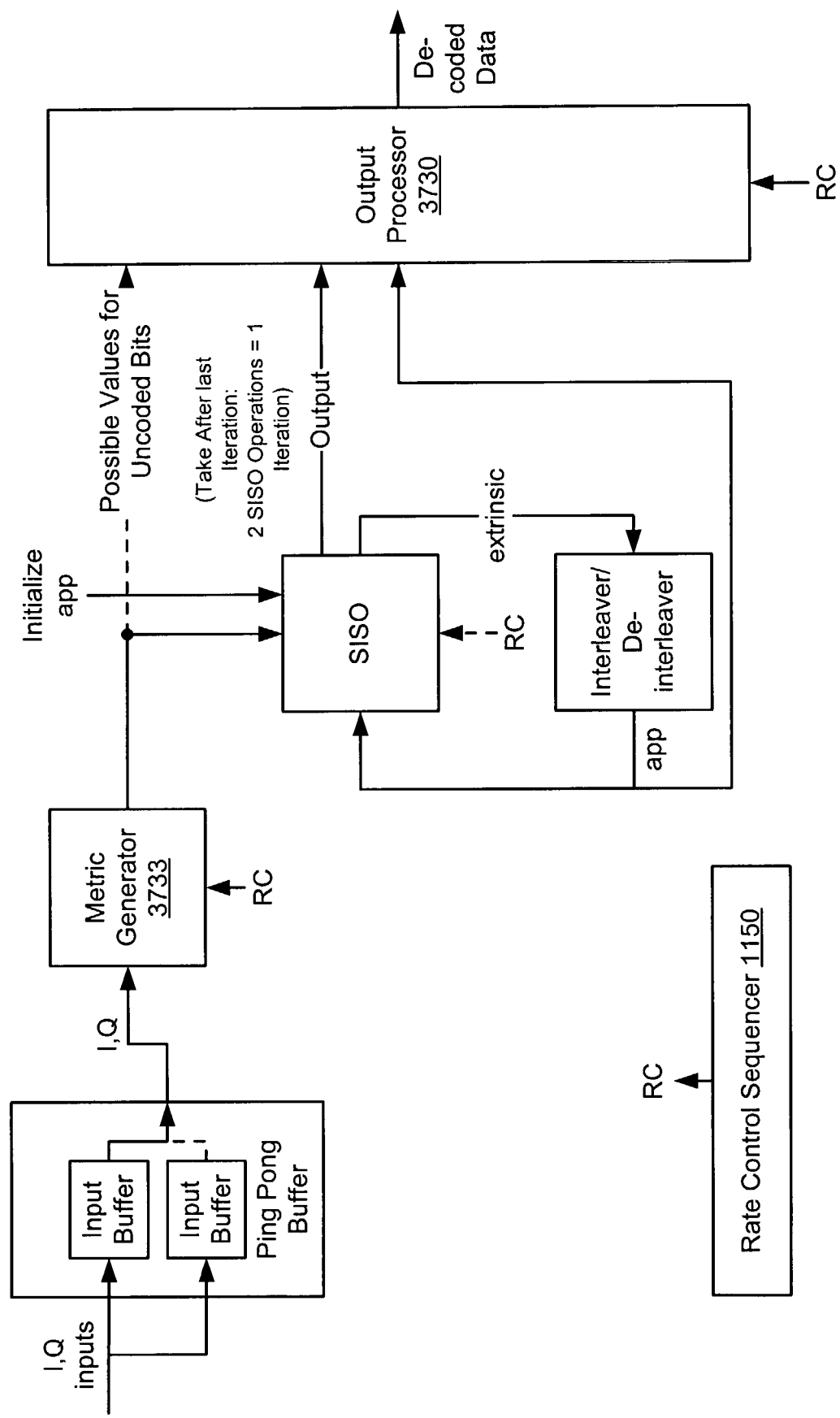
FIG. 39 is a system diagram illustrating an embodiment of an alternative TTCM decoder system that recycles a single SISO according to the invention.

FIG. 39 is a system diagram illustrating an embodiment of an alternative TTCM decoder system 3900 that recycles a single SISO according to the invention. The alternative TTCM decoder system 3900 receives as input the I,Q from a received signal. Similar to the embodiment of the FIG. 34, an I,Q extraction functional block may also be employed to extract these I,Q inputs within the FIG. 39 as well when performing receiver pre-processing. A ping pong buffer, employing two input buffers, is employed for efficient buffering of the I,Q inputs. The I,Q inputs are then passed to the metric generator 3733. The functionality of the metric generator 3733 may be similar in both the FIG. 38 and the FIG. 39.

The output of the metric generator 3733 is passed to the single SISO; the information necessary to perform decoding of any possible uncoded bits will be passed to the output processor 3730. The SISO calculates forward metrics (alphas), backward metrics (betas), and extrinsic values (exts) according to the trellis employed (such as the trellis 2300) and provides them to a functional block that is operable to perform both interleaving and de-interleaving (depending upon which SISO operation is being performed). The output of the interleaver/de-interleaver functional block is passed back to the SISO as app.

Similar to the embodiment of FIG. 38, it is noted that a single decoding iteration, within the iterative decoding process of the alternative TTCM decoder system 3900 consists of performing two SISO operations; that is to say, the iterative decoding process must pass through both the SISO once (when the SISO performs the top SISO functionality) and through the SISO again (when the SISO performs the bottom SISO functionality).

After a significant level of confidence for the soft symbol decisions within the SISO have been achieved and a solution is being converged upon, or after a predetermined number of decoding iterations have been performed, then the output from the SISO is passed as output to the output processor 3730. These soft symbol decisions may also be performed on a true bit level in certain embodiments. The output processor 3730 uses these soft symbol decisions to generate hard symbol decisions and to provide decoded output data. It is also noted that a similar app initialization of the FIG. 38 may be used within the FIG. 39.

Figure 40:
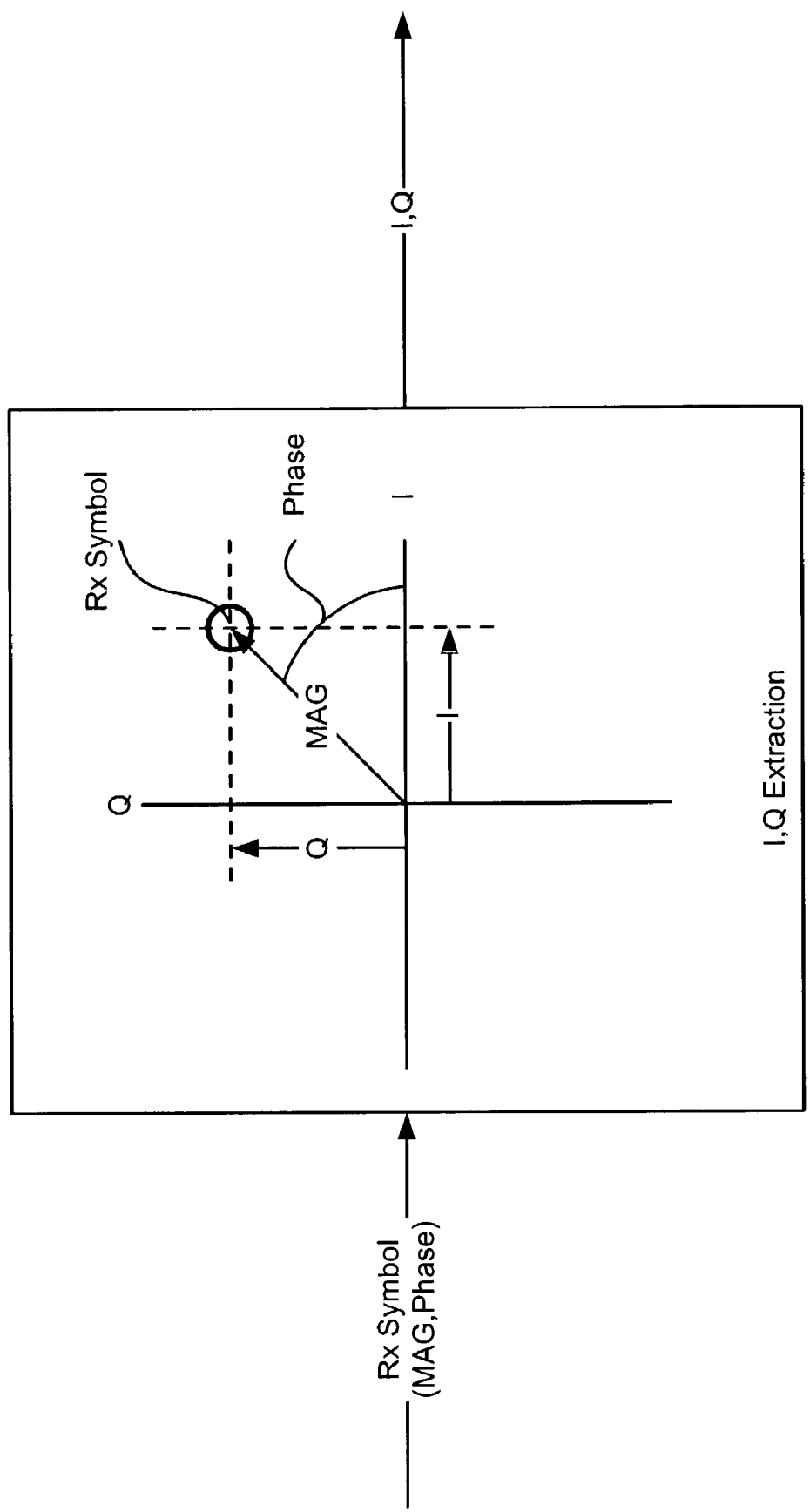
FIG. 40 is a diagram illustrating an embodiment of I,Q extraction that is performed according to the invention.

FIG. 40 is a diagram illustrating an embodiment of I,Q extraction that is performed according to the invention. A received symbol, having a magnitude and phase is provided to an I,Q extraction block. This symbol (or signal) is mapped in a two dimensional space such that an in-phase and a quadrature component. This in-phase measurement and the quadrature component are provided as output from the I,Q extraction functional block.

Figure 41:
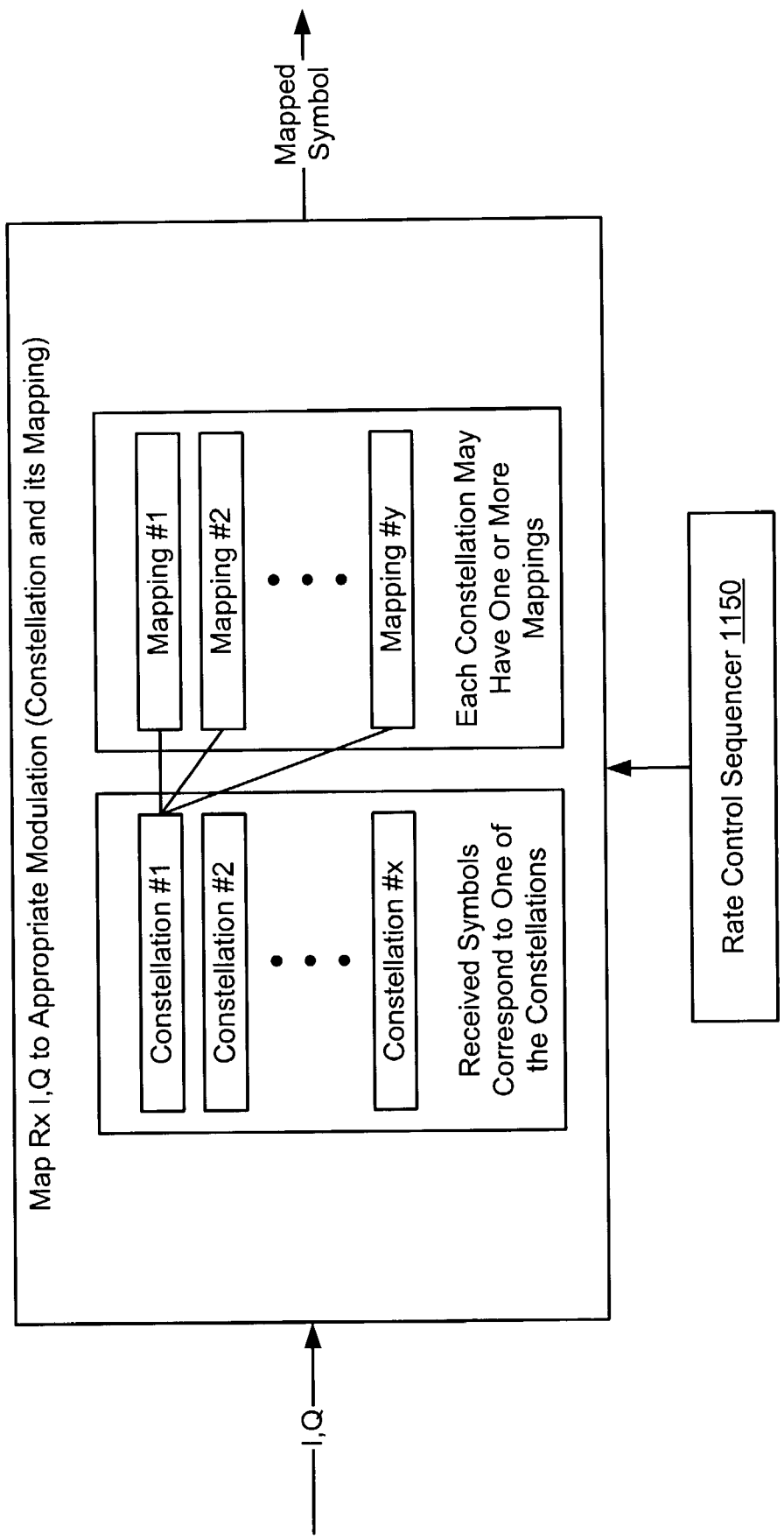
FIG. 41 is a diagram illustrating an embodiment of received I,Q mapping performed based on rate control according to the invention.

FIG. 41 is a diagram illustrating an embodiment of received I,Q mapping performed based on RC according to the invention. After the I,Qs are provided, then according to the RC provided by the rate control sequencer 1150, the received I,Q are mapped according to one of the modulation's constellations corresponding to the RC. Then, after the appropriate constellation has been selected, and the mapping has been determined based on the RC of the rate control sequence, the I,Q is mapped to a symbol in the appropriate modulation (with its particular constellation and mapping). Afterwards, a mapped symbol is provided as output from the FIG. 40.

Figure 42:
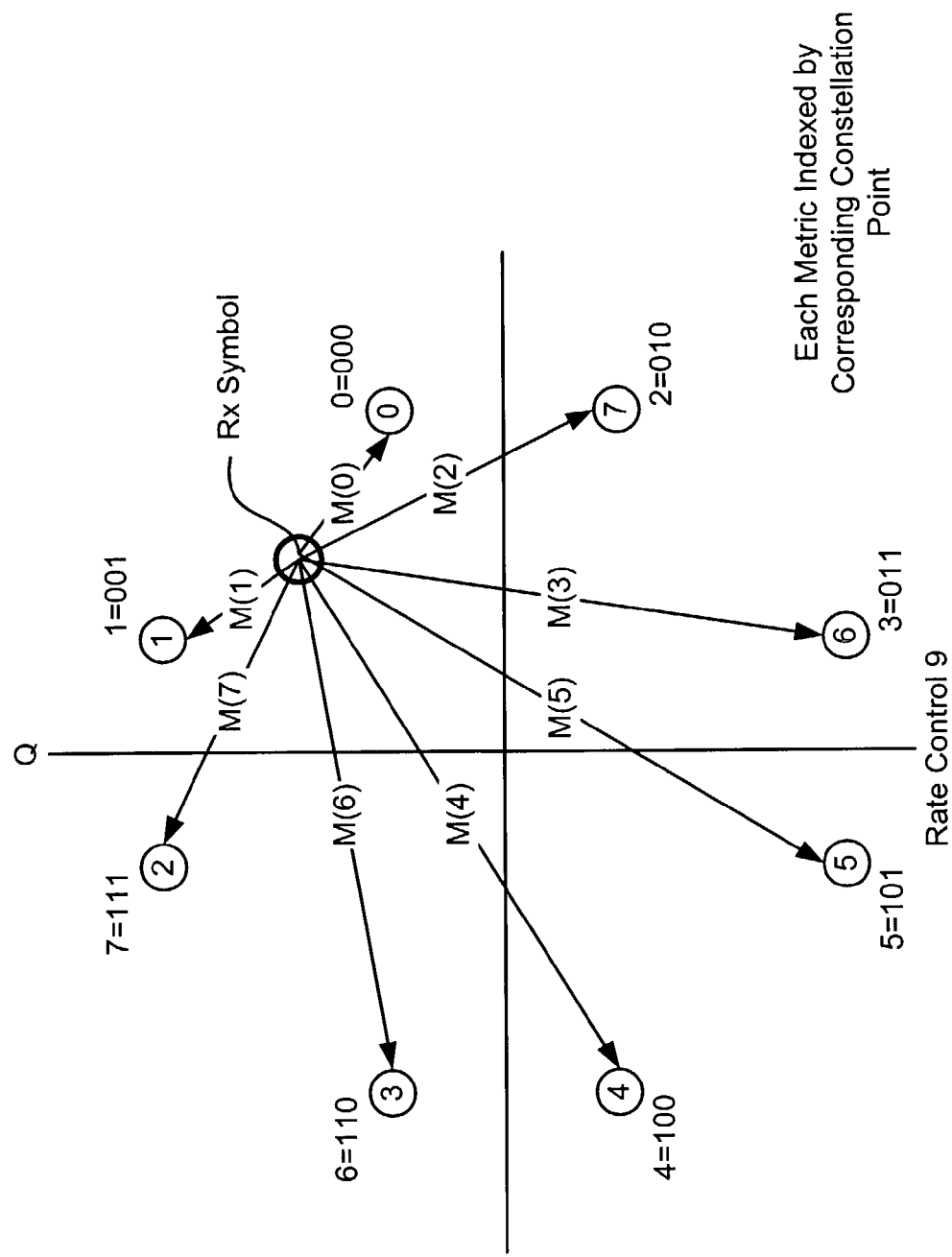
FIG. 42 is a diagram illustrating an embodiment of metric calculation performed by one of the metric generators shown in the FIG. 38 and the FIG. 39.

FIG. 42 is a diagram illustrating an embodiment of metric calculation performed by a metric generator 3733 according to the invention. A specific example is provided in the FIG. 42 using the RC 9, and it will then be understood how the metric calculation is performed for the other various modulations (constellations and mappings). The metric calculation may be performed in a similar manner in the other rate control sequences with their respective RCs.

The received symbol is mapped within this modulation (constellation and mapping). Then, the metric (scaled Euclidian distance) to each of the constellation points, from the received symbol, is calculated and indexed according to the mapping of the respective constellation points. This distance corresponds to the calculation in the metric generator that may be performed as follows:

$$\text{Metric}(U \times 2 \times 1 \times 0) = 1/(2\text{sigma}^2) * [(Rx\_I - I\_\text{Coef})2 + (Rx\_Q - Q\_\text{Coef})2]$$

Here, the scaling of the distance by $[1/(2\text{sigma}^2)]$ (where sigma is the standard deviation of the normalized noise of the received symbol) accommodates for the normalized noise of the received symbol in determining this distance. The I_Coef and the Q_Coef are the expected locations (in terms of I,Q) at which the received symbol is expected to be mapped (constellation point location), and Rx_I and Rx_Q are the actual locations at which the received symbol is mapped.

For example, the metric corresponds to the distance from the received symbol to the constellation point associated with the symbol 1=(001 in binary) is shown as M(1); . . . ; and the metric corresponding to the distance from the received symbol to the constellation point associated with the symbol 3=(011 in binary) is shown as M(3). These metrics are output from the metric generator 3733.

Figure 43:
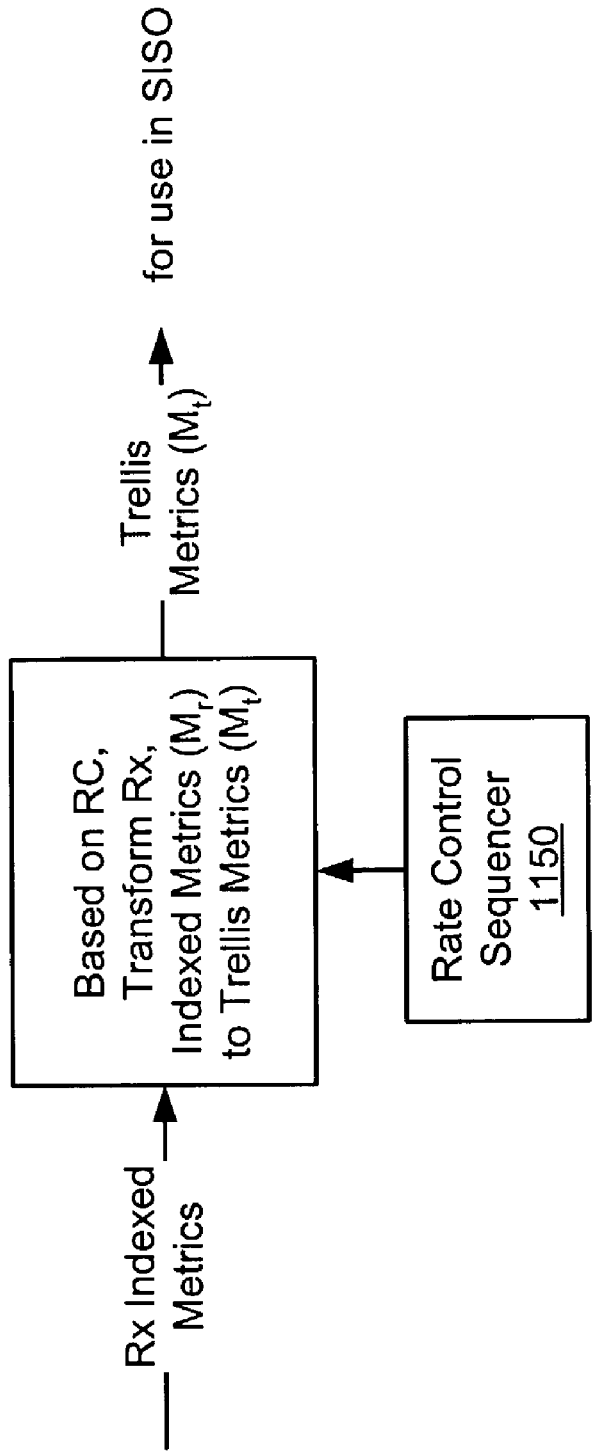
FIG. 43 is a functional block diagram illustrating an embodiment of metric mapping functionality that is performed according to the invention.

FIG. 43 is a functional block diagram illustrating an embodiment of metric mapping functionality that is performed according to the invention. The received symbol metrics (received metric=$M_r$), indexed according to the modulation (constellation and mapping) according to the RC (as provided by the rate control sequencer 1150), are then passed to a functional block that transforms these received metrics to trellis metrics (trellis metric=$M_t$). These trellis metrics are then used to calculate the alphas, betas, and extrinsics within the SISO. These alphas, betas, and extrinsics may be calculated using a min* approach according to the invention. Again, a max* approach may alternatively be used.

From the received I,Q values, a 2-bit metric for QPSK, a 3-bit metric $M_r(x_2x_1x_0)$ for 8-PSK, and a 4-bit metric $M_r(x_3x_2x_1x_0)$ for 16-QAM and 16-APSK can be computed. With either of these metrics, we may form a 3-bit metric $M_t$ that is to be sent to the SISO decoder with possible uncoded bit information. However, metric used in the SISO decoder depends on the trellis output that is a 5-bit symbol in general (using the rate 2/5 prototype encoder 2000). Some additional intelligence must be employed for proper assigning of these metrics to the trellis.

In order to have a universal decoder for all the RC number, some transforms from the received metric $M_r(x_3x_2x_1x_0)$ to $M_s(x_2x_1x_0)$ and from the trellis metric $M_t(c_4c_3c_2c_1c_0)$ to $M_s(abc)$ need to be introduced.

As an example, the transformation of the follow RCs are shown below.

For RC 0: the received metric $M_r(x_2x_1x_0)$ is mapped to an intermediate metric $M_s(c_3c_2c_1)$. This intermediate metric $M_s(c_3c_2c_1)$ is mapped to the trellis metric $M_t(c_4c_3c_2c_1c_0)$. The last three bits of the intermediate metric $M_s(c_3c_2c_1)$ are mapped to the four possible trellis metrics $M_t(c_4c_3c_2c_1c_0)$ where the bits and may be treated as don't care. For example, the four metrics $M_t(0c_3c_2c_10)$, $M_t(0c_3c_2c_11)$, $M_t(1c_3c_2c_10)$, and $M_t(1c_3c_2c_11)$ are all mapped to have the very same value for the metrics within the trellis 2300.

These operations may be described below as follows:

$$M_s(x_2x_1x_0) = M_r(x_2x_1x_0)$$

$$M_t(c_4c_3c_2c_1c_0) = M_s(c_3c_2c_1)$$

For RC 1: the received metric $M_r(ux_1x_0)$ that includes an uncoded bit is initially mapped using a min* operation to generate the following intermediate received metric $\overline{M}_r(x_1x_0)=\min^*\{M_r(0x_1x_0),M_r(1x_1x_0)\}$. The uncoded bit is dealt with via the min* operation to deal with the both of the possible values by which u may take.

These operations may be described below as follows:

$$\overline{M}_r(x_1x_0)=\min^*\{M_r(0x_1x_0),M_r(1x_1x_0)\}$$

$$M_s(x_2x_10)=M_s(x_2x_11)=\overline{M}_r(x_2x_1)$$

$$M_t(c_4c_3c_2c_1c_0)=M_s(c_4c_3c_2)$$

Now, each of the following metrics would all be assigned the same value according to the trellis.

$$M_t(c_4c_3c_200)=M_t(c_4c_3c_201)=M_t(c_4c_3c_210)=M_t(c_4c_3c_211)$$

The possible value of the uncoded bit indexed by $(x_1x_0)$ will be 0 if $M_r(0x_1x_0)<M_r(1x_1x_0)$, otherwise the possible value of the uncoded bit indexed by $(x_1x_0)$ will be 1 if $M_r(0x_1x_0) \geq M_r(1x_1x_0)$.

For RCs 2,3,6,C&E: for the received metric $M_r(x_2x_1)$, the following transformations are performed.

$$M_s(x_2x_10)=M_s(x_2x_11)=M_r(x_2x_1)$$

$$M_t(c_4c_3c_2c_1c_0)=M_s(c_4c_3c_2)$$

Now, each of the following metrics would all be assigned the same value according to the trellis.

$$M_t(c_4c_3c_200)=M_t(c_4c_3c_201)=M_t(c_4c_3c_210)=M_t(c_4c_3c_211)$$

For RCs 4&B: for the received metric $M_r(ux_2x_1x_0)$ that includes an uncoded bit, the min* operation is again employed. The following transformations are performed.

$$M_s(x_2x_1x_0)=\min^*\{M_r(0x_2x_1x_0),M_r(1x_2x_1x_0)\}$$

$$M_t(c_4c_3c_2c_1c_0)=M_t(c_3c_2c_1)$$

Now, each of the following metrics would all be assigned the same value according to the trellis.

$$M_t(0c_3c_2c_10)=M_t(0c_3c_2c_11)=M_t(1c_3c_2c_10)=M_t(1c_3c_2c_11)$$

The possible value of the uncoded bit indexed by $(x_2x_1x_0)$ will be 0 if $M_r(0x_2x_1x_0)<M_r(1x_2x_1x_0)$, otherwise the possible value of the uncoded bit indexed by $(x_2x_1x_0)$ will be 1 if $M_r(0x_2x_1x_0) \geq M_r(1x_2x_1x_0)$.

For RCs 7,A&D: for the received metric $M_r(x_1x_0)$, the following transformations are performed.

$$M_s(x_2x_1x_0)=M_r(x_1x_0), \text{ when } x_2=0$$

$$M_s(x_2x_1x_0)=\text{MAX}, \text{ when } x_2=1.$$

MAX is the maximum metric that is employed in the decoding system.

$$M_t(c_4c_3c_2c_1c_0)=M_s(c_4c_2c_1)$$

Now, each of the following metrics would all be assigned the same value according to the trellis.

$$M_t(c_40c_2c_10)=M_t(c_40c_2c_11)=M_t(c_41c_2c_10)=M_t(c_41c_2c_11)$$

For RC 9: for the received metric $M_r(x_2x_1x_0)$, the following transformations are performed.

$$M_s(x_2x_1x_0)=M_r(x_2x_1x_0)$$

$$M_t(c_4c_3c_2c_1c_0)=M_s(c_2c_1c_0), \text{ when } c_4=0.$$

$$M_t(c_4c_3c_2c_1c_0)=\text{MAX}, \text{ when } c_4=1.$$

For RC 5: for the received metric $M_r(ux_2x_1x_0)$ that includes an uncoded bit, the min* operation is again employed. The following transformations are performed.

$$M_s(x_2x_1x_0)=\min^*\{M_r(0x_2x_1x_0),M_r(1x_2x_1x_0)\}$$

$$M_t(c_4c_3c_2c_1c_0)=M_s(c_2c_1c_0), \text{ when } c_4=0.$$

$$M_t(c_4c_3c_2c_1c_0)=\text{MAX}, \text{ when } c_4=1.$$

The possible value of the uncoded bit indexed by $(x_2x_1x_0)$ will be 0 if $M_r(0x_2x_1x_0)<M_r(1x_2x_1x_0)$, otherwise the possible value of the uncoded bit indexed by $(x_2x_1x_0)$ will be 1 if $M_r(0x_2x_1x_0) \geq M_r(1x_2x_1x_0)$.

For RC 8: for the received metric $M_r(x_1x_0)$, the following transformations are performed.

$$M_s(x_2x_1x_0)=M_r(x_1x_0), \text{ when } x_2=0$$

$$M_s(x_2x_1x_0)=\text{MAX}, \text{ when } x_2=1.$$

MAX is the maximum metric that is employed in the decoding system.

$$M_t(c_4c_3c_2c_1c_0)=M_s(c_3c_2c_0), \text{ when } c_4=0.$$

$$M_t(c_4c_3c_2c_1c_0)=\text{MAX}, \text{ when } c_4=1.$$

For even greater understanding of the mapping of these metric functions to the trellis 2300 employed by the rate 2/5 prototype encoder 2000, we will walk through the following example. We use the outputs of the trellis 2300 to perform this assigning of the metrics. The following table is used to show how this mapping to the trellis is performed according to RC 8.

| state | output | output | output | output |
|---|---|---|---|---|
| 0 = 000 | 0<br>x00000 octal<br>Met(0) | 14<br>x01100 octal<br>Met(6)<br>MAX: as<br>$x_2 = c_4 = 1$ | 31<br>x11001 octal<br>Met(5)<br>MAX: as<br>$x_2 = c_4 = 1$ | 25<br>x10101 octal<br>Met(7)<br>MAX: as<br>$x_2 = c_4 = 1$ |
| 1 = 001 | 31<br>x11001 octal<br>Met(5)<br>MAX: as<br>$x_2 = c_4 = 1$ | 25<br>x10101 octal<br>Met(7)<br>MAX: as<br>$x_2 = c_4 = 1$ | 0<br>x00000 octal<br>Met(0) | 14<br>x01100 octal<br>Met(6)<br>MAX: as<br>$x_2 = c_4 = 1$ |
| 2 = 010 | 12<br>x01010 octal<br>Met(4)<br>MAX: as<br>$x_2 = c_4 = 1$ | 6<br>x00110 octal<br>Met(2) | 23<br>x10011 octal<br>Met(5)<br>MAX: as<br>$x_2 = c_4 = 1$ | 37<br>x11111 octal<br>Met(7)<br>MAX: as<br>$x_2 = c_4 = 1$ |
| 3 = 011 | 23<br>x10011 octal<br>Met(5)<br>MAX: as<br>$x_2 = c_4 = 1$ | 37<br>x11111 octal<br>Met(7)<br>MAX: as<br>$x_2 = c_4 = 1$ | 12<br>x01010 octal<br>Met(4)<br>MAX: as<br>$x_2 = c_4 = 1$ | 6<br>x00110 octal<br>Met(2) |
| 4 = 100 | 24<br>x10100 octal<br>Met(6)<br>MAX: as<br>$x_2 = c_4 = 1$ | 30<br>x11000 octal<br>Met(4)<br>MAX: as<br>$x_2 = c_4 = 1$ | 15<br>x01101 octal<br>Met(7)<br>MAX: as<br>$x_2 = c_4 = 1$ | 1<br>x00001 octal<br>Met(1) |
| 5 = 101 | 15<br>x01101 octal<br>Met(7)<br>MAX: as<br>$x_2 = c_4 = 1$ | 1<br>x00001 octal<br>Met(1) | 24<br>x10100 octal<br>Met(6)<br>MAX: as<br>$x_2 = c_4 = 1$ | 30<br>x11000 octal<br>Met(4)<br>MAX: as<br>$x_2 = c_4 = 1$ |
| 6 = 110 | 36<br>x11110 octal<br>Met(6)<br>MAX: as<br>$x_2 = c_4 = 1$ | 22<br>x10010 octal<br>Met(4)<br>MAX: as<br>$x_2 = c_4 = 1$ | 7<br>x00111 octal<br>Met(3) | 13<br>x01011 octal<br>Met(5)<br>MAX: as<br>$x_2 = c_4 = 1$ |

-continued

| state | output | output | output | output |
|---|---|---|---|---|
| 7 = 111 | 7<br>x00111 octal<br>Met(3) | 13<br>x01011 octal<br>Met(5)<br>MAX: as<br>$x_2 = c_4 = 1$ | 36<br>x11110 octal<br>Met(6)<br>MAX: as<br>$x_2 = c_4 = 1$ | 22<br>x10010 octal<br>Met(4)<br>MAX: as<br>$x_2 = c_4 = 1$ |

It is seen in this example that there are only 4 distinct valued metrics that need to be provided from the metric generator to a SISO in the RC 8. MAX (the maximum metric value) is used to define the "least likelihood probability." A great deal of memory may be saved by passing only a flag bit (for those metrics who will use the MAX value) that indicates such information to the SISO.

It is also noted that for the states 0=000 and 1=001, the metrics are all the same values only swapped. This is the case also for the state groupings {2=010, 3=011}, {4=100, 5=101}, and {6=110, 7=111}. Such efficiency may be similarly achieved with respect to each of the RCs, and efficient hardware implementations may capitalize thereon to provide for savings.

Figure 44:
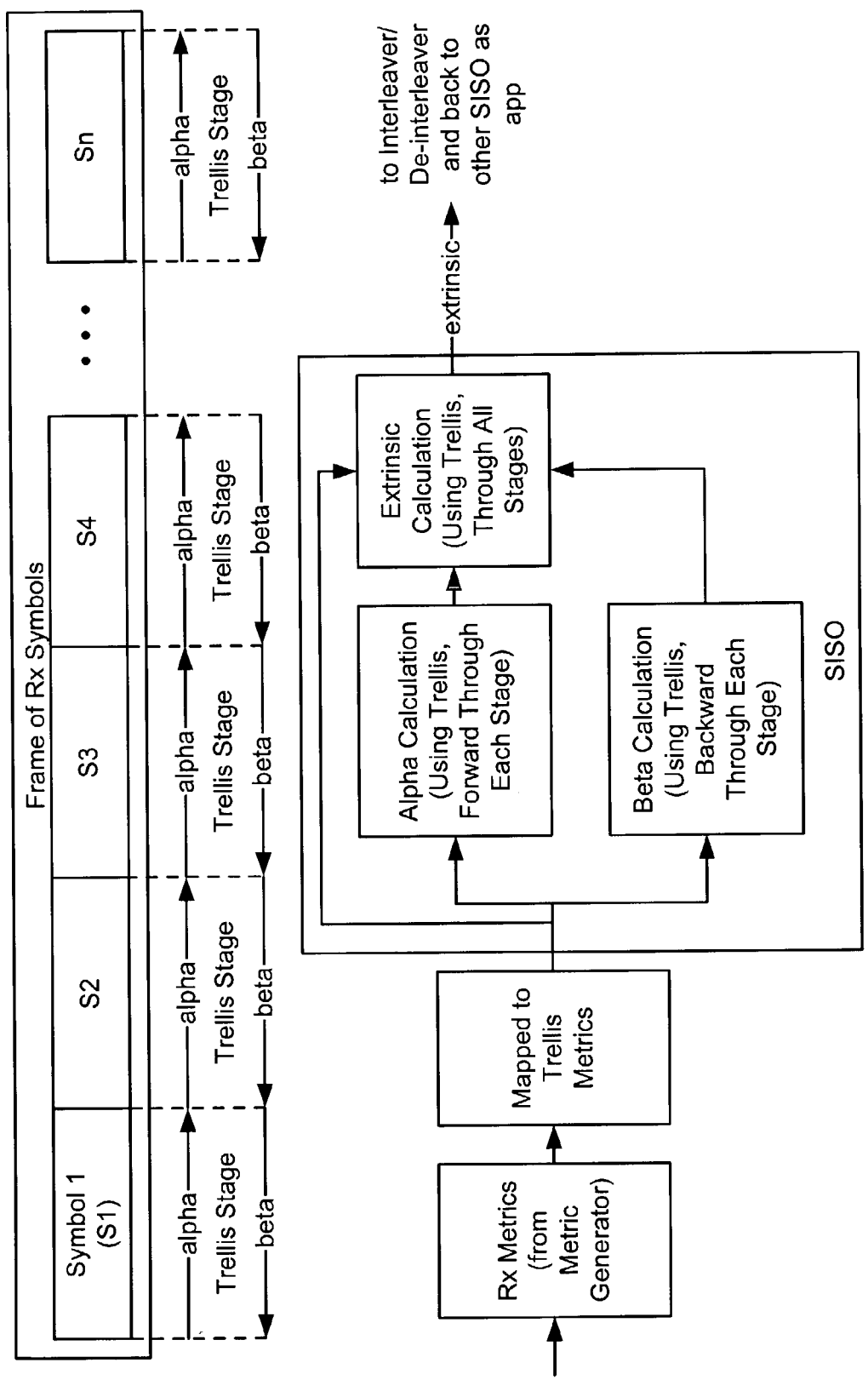
FIG. 44 is a diagram illustrating an embodiment of SISO calculations and operations that are performed according to the invention.

FIG. 44 is a diagram illustrating an embodiment of SISO calculations and operations that are performed according to the invention. For each stage (or each symbol) within a frame of received symbols (or sequence of received symbols), the forward metrics (alphas), the backward metrics (betas), and the extrinsics are calculated. The extrinsics value of a stage is a function of the alphas, betas, metrics, and apps ("a priori" probabilities) of that stage. The metrics (that have been mapped according to the trellis and according to the rate control sequence from the metric generator 3733 and as also described in greater detail above within the discussion of the FIG. 43) are provided to the SISO within the FIG. 44. The SISO employs these metrics to calculate the alphas, and the betas. Then, the alphas, betas, and metrics are used to calculate the extrinsics that are provided back to the other SISO through the other interleaver/de-interleaver as appropriate in the particular situation. It is noted that the values of metrics, alphas, betas, and extrinsics are all used to perform the TTCM decoding of the information bits that have been encoded by the TTCM encoder.

For even greater understanding of the calculation of these variables according to the trellis 2300 that is employed by the rate 2/5 prototype encoder 2000, we show the following steps of calculations. It is noted that this is one particular example of how these variables may be calculated, and other means are also envisioned within the scope and spirit of the invention that supports the variable code rate functionality described herein.

As mentioned above, the trellis 2300 may be represented using 8 distinct metric values in an efficient implementation. Therefore, for each stage (or symbol) of a received frame of symbols (I,Qs), we will have 8 different metrics, 8 different alphas, and 8 different betas. As also mentioned above, some savings may be achieved when more than one of the metrics has the same value according to the coding and the trellis 2300. Similar savings may also be achieved within other trellises that inherently support such redundancy.

We use the trellis to calculate the values for alpha. In this particular embodiment, a value of 0 is associated with a high likelihood and a value of N is associated with a value of less likelihood. However, if desired in a particular embodiment, the association may be reversed without departing from the scope and spirit of the invention.

When calculating the 8 alphas for the first symbol of the trellis 2300, we initially set the values to be as follows:

$\alpha_0(0)=0$; the value of 0 is assigned to be a high likelihood, and we set the other alphas to be the value of N, associated with the less likelihood.

$$\alpha_2(0)=\alpha_3(0)=\alpha_4(0)=\alpha_5(0)=\alpha_6(0)=\alpha_7(0)=N$$

We will show the manner in which we calculate the alphas for a first received symbol within a frame.

The alpha associated with the state 0 may be calculated as follows:

$$\alpha_n(0)=\min^*\{A_0, A_1, A_2, A_3\}$$

where, $A_0=\alpha_{n-1}(0)+\text{Met}(0)+\text{app}(i_1=0)+\text{app}(i_0=0)$, input 0=00, output=0=x00000

$A_1=\alpha_{n-1}(1)+\text{Met}(14)+\text{app}(i_1=0)+\text{app}(i_0=1)$, input 1=01, output=14=x01100

$A_2=\alpha_{n-1}(2)+\text{Met}(31)+\text{app}(i_1=1)+\text{app}(i_0=0)$, input 2=10, output=31=x11001

$A_3=\alpha_{n-1}(3)+\text{Met}(25)+\text{app}(i_1=1)+\text{app}(i_0=1)$, input 3=11, output=25=x10101

Similarly, the alpha associated with the state 1 may be calculated as follows:

$$\alpha_n(1)=\min^*\{AA_0, AA_1, AA_2, AA_3\}$$

where, $AA_0=\alpha_{n-1}(2)+\text{Met}(31)+\text{app}(i_1=1)+\text{app}(_1=0)$, input 2=10, output=31=x11001

$AA_1=\alpha_{n-1}(3)+\text{Met}(25)+\text{app}(i_1=1)+\text{app}(_0=1)$, input 3=11, output=25=x110101

$AA_2=\alpha_{n-1}(0)+\text{Met}(0)+\text{app}(i_1=0)+\text{app}(i_0=0)$, input 0=00, output=00=x00000

$AA_3=\alpha_{n-1}(1)+\text{Met}(14)+\text{app}(i_1=0)+\text{app}(i_0=1)$, input 1=01, output=14=x01100

This process will continue until all of the alphas are calculated for the symbol. The beta values are calculated in the backwards direction in a similar manner according to the same trellis. The same min* design, replicated many times in hardware, may be employed to perform simultaneous calculation of both the alphas and the betas. However, in slower data rate applications where throughput is not such a high priority, the same min* hardware element may be used to perform the alpha and beta calculations sequentially.

Once that the alphas and betas have been calculated at any stage, we can proceed to calculate for the extrinsic values so that we may decode the input bits of the input symbol, namely the two input bits ($i_0 i_1$), for that stage.

The following table may be used to illustrate how we calculate these values according to the trellis 2300 that is employed by the rate 2/5 prototype encoder 2000. In this embodiment, since we have two input bits ($i_0 i_1$), we need to calculate the extrinsic values for the possibility that each of the bits within the symbol may be 0 or may be 1. We will do this by calculating the following extrinsic values: ext(00), ext(01), ext(10), and ext(11).

The following table is used to show the 4 extrinsics that we need to calculate to perform proper decoding of the input symbol having the two input bits ($i_0 i_1$).

| Extrinsic value | bit of concern | possible two input bits [symbol = $(i_0 i_1)$] |
|---|---|---|
| ext(00) = ext($i_0$ = 0) | bit $i_0$ = 0 | 0 = 00 or 2 = 10 |
| ext(10) = ext($i_0$ = 1) | bit $i_0$ = 1 | 1 = 01 or 3 = 11 |
| ext(01) = ext($i_1$ = 0) | bit $i_1$ = 0 | 0 = 00 or 1 = 01 |
| ext(11) = ext($i_1$ = 1) | bit $i_1$ = 1 | 2 = 10 or 3 = 11 |

In this embodiment, we perform a min* calculation to calculate our four extrinsic values. It is noted, however, that other embodiments may perform a min only calculation, a max only calculation, or a max* calculation without departing from the scope and spirit of the invention. The variable code rate functionality of using multiple modulations (constellations and mappings), and cycling through rate control sequences thereof may still be performed when using other such functions to calculate the extrinsic values within the SISO functional blocks.

We perform the min* operation on a host of values to calculate these various extrinsic values.

First, we look at all branches within the trellis where ($i_0$=0), and we find that we get 16 branches. We do a min* operation across those branches to calculate this the extrinsic value.

ext(00)=ext($i_0$=0)=min*{

[beta_0+alpha_0+a priori(01)+met(0)]; [beta_0+alpha_1+a priori(11)+met(31)];

[beta_1+alpha_6+a priori(11)+met(36)]; [beta_1+alpha_7+a priori(01)+met(7)];

[beta_2+alpha_4+a priori(11)+met(30)]; [beta_2+alpha_5+a priori(11)+met(1)];

[beta_3+alpha_2+a priori(01)+met(6)]; [beta_3+alpha_3+a priori(01)+met(37)];

[beta_4+alpha_0+a priori(11)+met(31)]; [beta_4+alpha_1+a priori(11)+met(0)];

[beta_5+alpha_6+a priori(01)+met(7)]; [beta_5+alpha_7+a priori(01)+met(36)];

[beta_6+alpha_4+a priori(01)+met(1)]; [beta_6+alpha_5+a priori(11)+met(30)];

[beta_7+alpha_2+a priori(11)+met(37)]; [beta_7+alpha_3+a priori(01)+met(6)]}

Second, we now look at all branches within the trellis where ($i_0$=1), and we find that we also get 16 branches. We do a min* operation across those branches to calculate this the extrinsic value.

ext(110)=ext($i_0$=1)=min*{

[beta_0+alpha_4+a priori(11)+met(24)]; [beta_0+alpha_5+a priori(01)+met(15)];

[beta_1+alpha_2+a priori(01)+met(12)]; [beta_1+alpha_3+a priori(11)+met(23)];

[beta_2+alpha_0+a priori(01)+met(14)]; [beta_2+alpha_1+a priori(01)+met(25)];

[beta_3+alpha_6+a priori(11)+met(22)]; [beta_3+alpha_7+a priori(01)+met(13)];

[beta_4+alpha_4+a priori(01)+met(15)]; [beta_4+alpha_5+a priori(11)+met(24)];

[beta_5+alpha_2+a priori(11)+met(23)]; [beta_5+alpha_3+a priori(01)+met(12)];

[beta_6+alpha_0+a priori(11)+met(25)]; [beta_6+alpha_1+a priori(01)+met(14)];

[beta_7+alpha_6+a priori(01)+met(13)]; [beta_7+alpha_7+a priori(11)+met(22)]}

We may use these two extrinsic values calculated above to decode for the first bit of the input symbol that was encoded, namely $i_0$. We use the following equation to do the final decode for $i_0$.

$i_0 = sgn\{-[ext(i_0=0)+app(i_0=0)]+[ext(i_0=1)+app(i_0=1)]\}$

Functionally, we select the smaller one of [ext($i_0$=0)+app($i_0$=0)] and [ext($i_0$=1)+app($i_0$=1)] in the above equation, and we select the bit value associated with the smaller sum. For example, if [ext($i_0$=0)+app($i_0$=0)]<[ext($i_0$=1)+app($i_0$=1)], then we make $i_0$=0.

We perform similar operations to calculate for the bit value for $i_1$ within the input symbol.

Third, we look at all branches within the trellis where ($i_1$=0), and we find that we get 16 branches. We do a min* operation across those branches to calculate this the extrinsic value.

ext(01)=ext($i_1$=0)=min*{

[beta_0+alpha_0+a priori(00)+met(0)]; [beta_0+alpha_5+a priori(10)+met(15)];

[beta_1+alpha_2+a priori(10)+met(12)]; [beta_1+alpha_7+a priori(00)+met(7)];

[beta_2+alpha_0+a priori(10)+met(14)]; [beta_2+alpha_5+a priori(00)+met(1)];

[beta_3+alpha_2+a priori(00)+met(6)]; [beta_3+alpha_7+a priori(10)+met(13)];

[beta_4+alpha_1+a priori(00)+met(0)]; [beta_4+alpha_4+a priori(10)+met(15)];

[beta_5+alpha_3+a priori(10)+met(12)]; [beta_5+alpha_6+a priori(00)+met(7)];

[beta_6+alpha_1+a priori(10)+met(15)]; [beta_6+alpha_4+a priori(00)+met(1)];

[beta_7+alpha_3+a priori(00)+met(6)]; [beta_7+alpha_6+a priori(10)+met(13)]}

Fourth, we now look at all branches within the trellis where ($i_1$=1), and we find that we also get 16 branches. We do a min* operation across those branches to calculate this the extrinsic value.

ext(11)=ext($i_1$=1)=min*{

[beta_0+alpha_1+a priori(00)+met(31)]; [beta_0+alpha_4+a priori(10)+met(24)];

[beta_1+alpha_3+a priori(10)+met(23)]; [beta_1+alpha_6+a priori(00)+met(36)];

[beta_2+alpha_1+a priori(10)+met(25)]; [beta_2+alpha_4+a priori(00)+met(30)];

[beta_3+alpha_3+a priori(00)+met(37)]; [beta_3+alpha_6+a priori(10)+met(22)];

[beta_4+alpha_0+a priori(00)+met(31)]; [beta_4+alpha_5+a priori(10)+met(24)];

[beta_5+alpha_2+a priori(10)+met(23)]; [beta_5+alpha_7+a priori(00)+met(36)];

[beta_6+alpha_0+a priori(10)+met(25)]; [beta_6+alpha_5+a priori(00)+met(30)];

[beta_7+alpha_2+a priori(00)+met(37)]; [beta_7+alpha_7+a priori(10)+met(22)]}

We may use these two extrinsic values calculated above to decode for the first bit of the input symbol that was encoded, namely $i_0$. We use the following equation to do the final decode for $i_0$.

$$i_1 = sgn\{[ext(i_1=1)+app(i_1=1)]-[ext(i_1=0)+app(i_1=0)]\}$$

Functionally, we select the smaller one of $[ext(i_1=0)+app(i_1=0)]$ and $[ext(i_1=1)+app(i_1=1)]$ in the above equation, and we select the bit value associated with the smaller sum. For example, if $[ext(i_1=0)+app(i_1=0)]<[ext(i_1=1)+app(i_1=1)]$, then we make $i=0$.

Now we have decoder the individual bits for the input symbol, $(i_0 i_1)$, as being one of either $0=01$, $1=01$, $2=10$, or $3=11$.

In addition, we need to perform a little additional computation in the situation where we have a RC that includes an uncoded bit.

We continue on to use the RC 5 to illustrate this situation. The other RCs would undergo analogous calculations to determine the final value of the uncoded bit. The puncturing for the RC 5 may be seen in the FIG. 26, and its mapping may be seen in the FIG. 36. We use the earlier extrinsic calculated information to decode the uncoded bit for RC 5, whose punctured output takes the form of $uc_2c_1c_0$. We can narrow our input selection somewhat to have the form of only one of two input symbols, 0 and 1, or $0=(i_0 i_1=00)$ and $1=(i_0 i_1=01)$, because we know that this RC 5 always provides the bit $i_0$ as value 0. Therefore, we need only to decode the other input bit $i_1$ within this RC 5. The following table is employed to generate the indexing of the uncoded bit so that, after we have decoded the input bits, $i_0 i_1$, we will be able to decode the uncoded bit u properly.

| input symbol | Trellis output $c_4c_3c_2c_1c_0$ (octal) | $c_2c_1c_0$ | min* operation (metric indexed by $c_2c_1c_0$) |
|---|---|---|---|
| 0 ($i_0 i_1 = 00$) | 0 | 0 | min* {[alpha_0 + beta_0 + met(0)]; [alpha_1 + beta_4 + met(0)]} |
| 0 ($i_0 i_1 = 00$) | 1 | 1 | min* {[alpha_4 + beta_6 + met(1)]; [alpha_5 + beta_2 + met(1)]} |
| 0 ($i_0 i_1 = 00$) | 6 | 6 | min* {[alpha_2 + beta_3 + met(6)]; [alpha_3 + beta_7 + met(6)]} |
| 0 ($i_0 i_1 = 00$) | 7 | 7 | min* {[alpha_6 + beta_5 + met(7)]; [alpha_7 + beta_1 + met(7)]} |
| 1 ($i_0 i_1 = 01$) | 12 | 2 | min* {[alpha_2 + beta_1 + met(2)]; [alpha_3 + beta_5 + met(2)]} |
| 1 ($i_0 i_1 = 01$) | 13 | 3 | min* {[alpha_6 + beta_7 + met(3)]; [alpha_7 + beta_3 + met(3)]} |
| 1 ($i_0 i_1 = 01$) | 14 | 4 | min* {[alpha_0 + beta_2 + met(4)]; [alpha_1 + beta_6 + met(4)]} |
| 1 ($i_0 i_1 = 01$) | 15 | 5 | min* {[alpha_4 + beta_4 + met(5)]; [alpha_5 + beta_4 + met(5)]} |

From the decoder input, such as input bit symbol 0, $(i_0 i_1=00)$, we then determine which one of the four min* results above is the smallest. This is then the index that we use to select the one of the possible 8 values for the uncoded bit. As an example, if the min* of the metric for 6 {the min* calculation associated with met(6)} is the smallest, then we will use this index to select the value of the uncoded bit u from the previously stored values.

Figure 45:
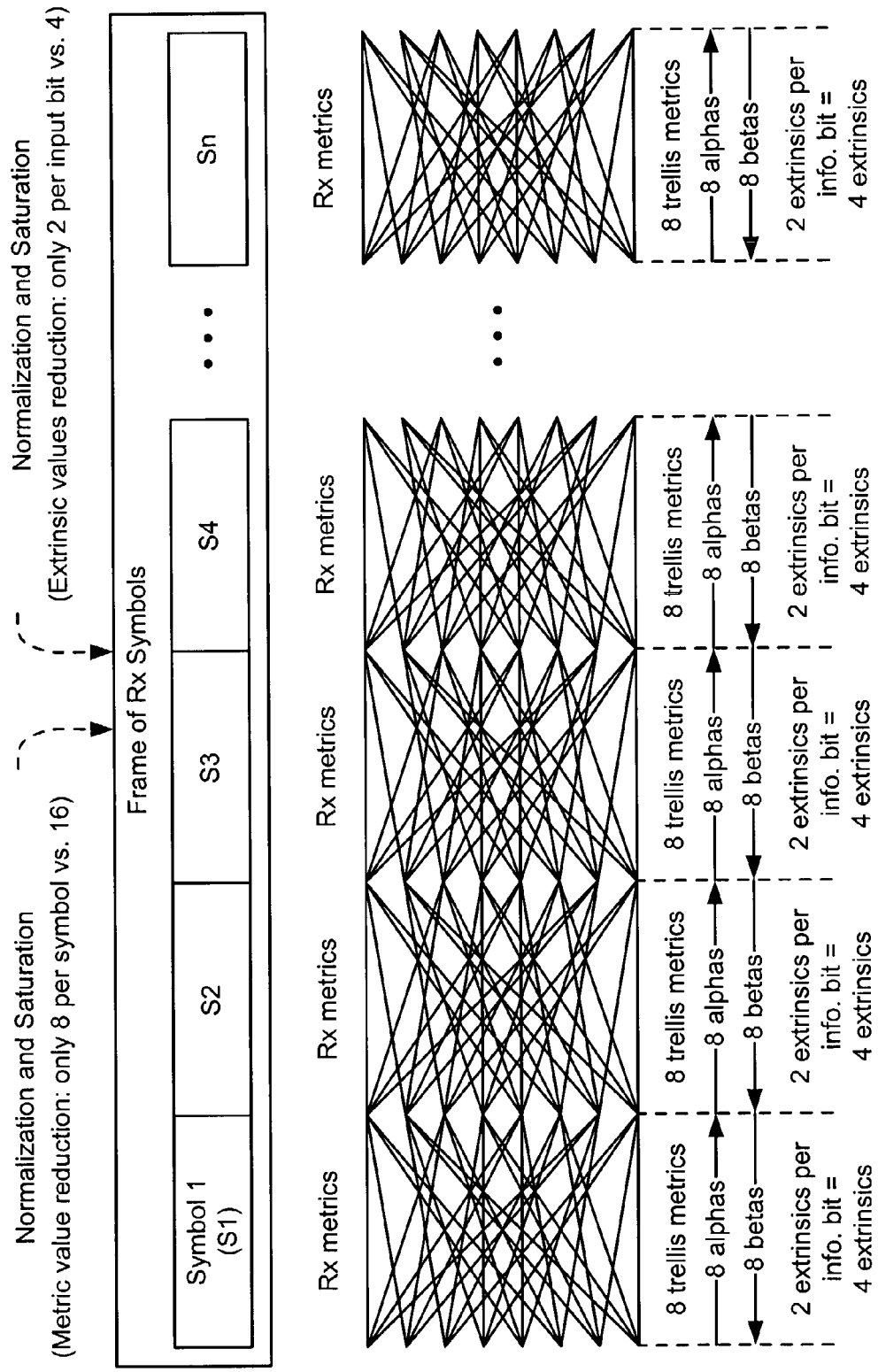
FIG. 45 is a diagram illustrating an embodiment of alpha, beta, and extrinsic calculation, based on the trellis of the FIG. 23 of the rate 2/5 non-systematic prototype encoder of the FIG. 20 according to the invention.

FIG. 45 is a diagram illustrating an embodiment of alpha, beta, and extrinsic calculation, based on a trellis 2300 of a rate 2/5 non-systematic prototype encoder 2000, that is performed according to the invention. The FIG. 45 shows how the trellis 2300 may be effectively overlaid at each symbol location within a frame of received symbols and how this particular trellis 2300 inherently provides an efficiency, in that, regardless of the RC that is being employed in a given instance, the received metrics associated with that RC may be mapped into the same trellis 2300 and reduced to a maximum of 8 trellis metrics in certain embodiments as opposed to storing all 16 metric values for each of the possible branches of the trellis 2300. This is performed using normalization and saturation in order to reduce the total number of trellis metrics that need to be stored; by reducing the required memory storage from 16 down to 8, a memory savings of a factor of 2 is achieved. Similarly, normalization and saturation is performed in order to reduce the total number of extrinsic values that need to be stored for each input bit that is encoded. In prior art systems, there would be a need for 4 extrinsic values per information bit thereby requiring 8 extrinsic values for this embodiment which has 2 input bits (4 extrinsic values each for the 2 bits). However, the invention is able to reduce the total number of extrinsic values that need to be stored to only 2 per bit thereby achieving a memory savings by a factor of 2. The received metrics are calculated for each symbol, these metrics are transformed into trellis metrics, and the alphas, betas, and extrinsics are all calculated for each symbol according to the invention. Again, it is noted that the trellis 2300 shows one embodiment of how the invention may be implemented. The invention envisions other trellises that also may be implemented to support the variable code rate functionality as well.

Figure 46:
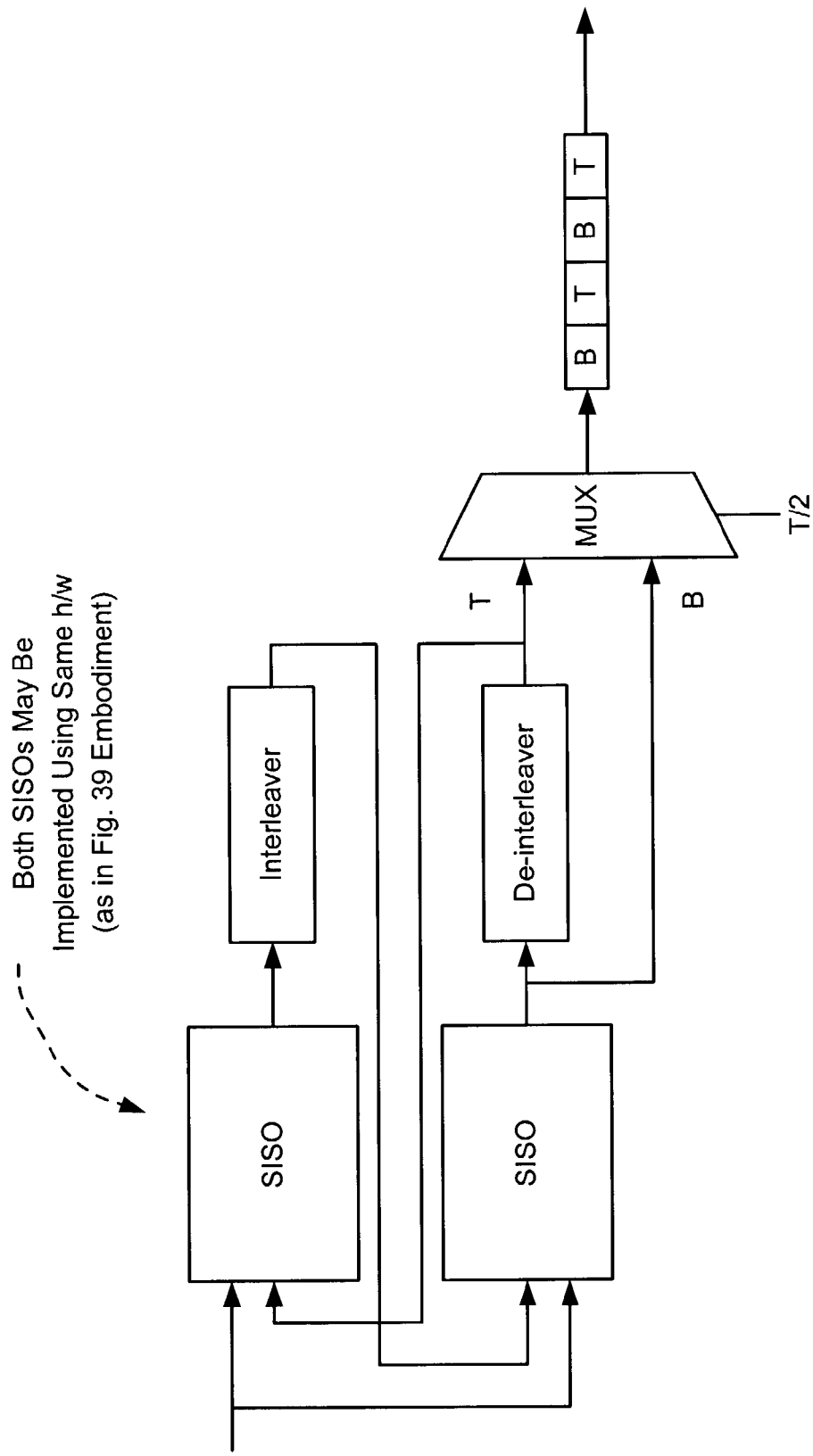
FIG. 46 is a diagram illustrating an embodiment of final output of decoding that is performed according to the invention.

FIG. 46 is a diagram illustrating an embodiment of final output of decoding that is performed according to the invention. In the situation where there may be only one SISO, then the odd symbol should be taken before de-interleave and the even symbol should be taken after de-interleave.

In a similar manner to the ordering in which the encoding may be performed (as described within the embodiment of the FIG. 13, for example), the order of the input symbols should be preserved upon decoding. The final output of decoding ensures the following: when we input a symbol sequence, $S_1 S_2 S_3 S_4$, to the encoder, and then when the following encoded symbols $(S_{1-enc} S_{2-enc} S_{3-enc} S_{4-enc})$ are received by the decoder, then the decoded estimates of these received symbols will maintain this sequential order. A MUX whose selection is provided by a clock signal that is clocked at ½ the rate will alternatively select the outputs from the output and input of the de-interleaver that is communicatively coupled to the lower SISO. This MUX in the FIG. 46 may be viewed as being within the output processor 3730 within either of the FIG. 38 or 39. The FIG. 46 shows an embodiment of how this may be performed in the final decoding step.

Figure 47:
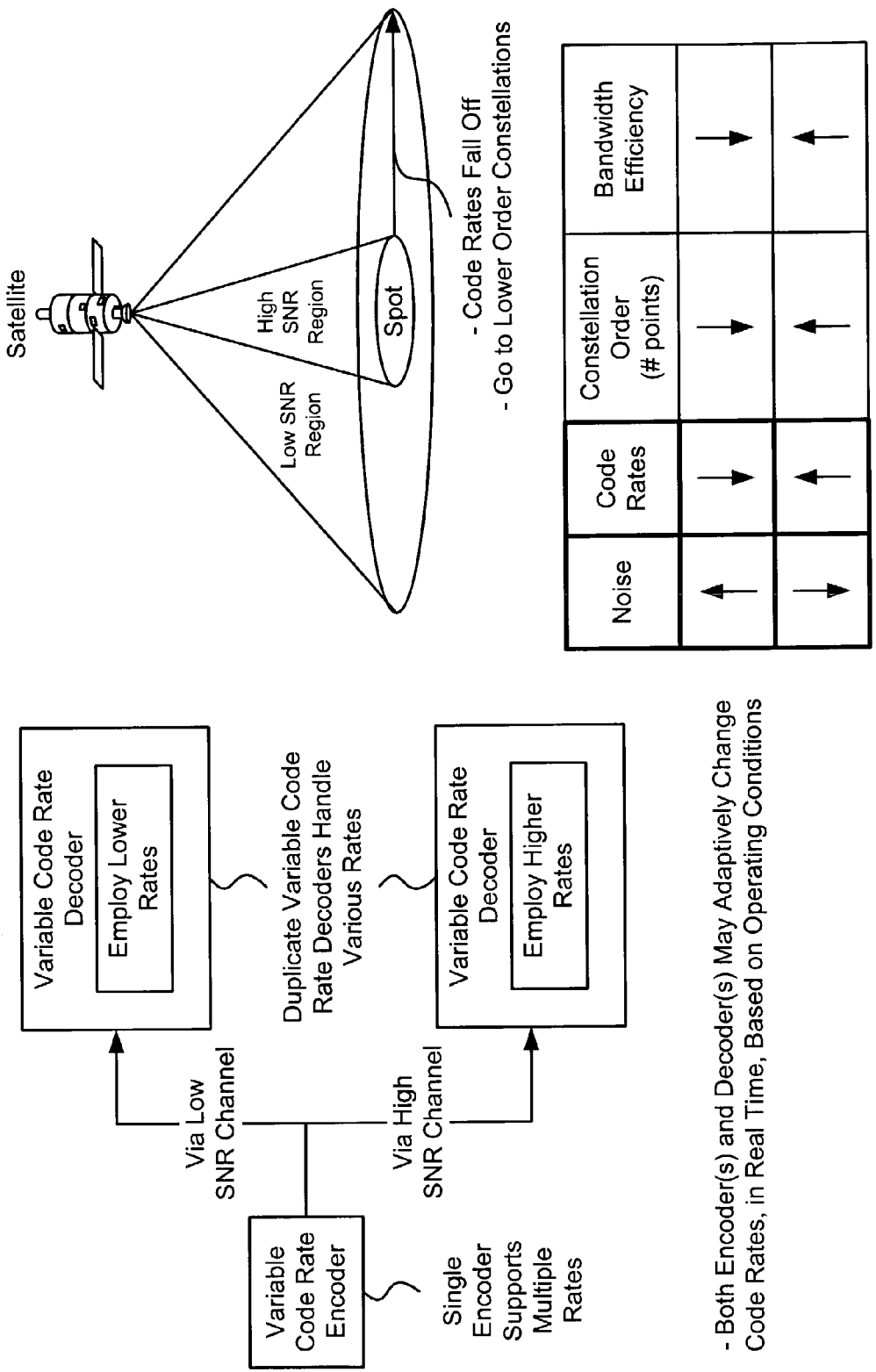
FIG. 47 is a diagram illustrating an embodiment of a variable code rate codec (encoder/decoder) servicing channels of various SNRs according to the invention.

FIG. 47 is a diagram illustrating an embodiment of a variable code rate codec (encoder/decoder) servicing channels of various SNRs according to the invention. A variable code rate encoder is operable to transit/broadcast simultaneously to multiple variable code rate decoders. When the communication channel that communicatively couples to one of the variable code rate decoders is of a low SNR, then the lower code rates may be employed when coding data for use by the variable code rate decoder. Analogously, when the communication channel that communicatively couples to one of the variable code rate decoders is of a high SNR, then the higher code rates may be employed when coding data for use by the variable code rate decoder. In addition, either one or both of the encoder and the decoder employed may adaptively change the rate control sequence, in real-time, based on the operating conditions of the communication channel; after there has been a change to a new rate control sequence, then both the encoder and the decoder will now operate at that new rate control sequence.

The rate control sequence to be employed when encoding and subsequently decoding information may be selected based on the given bandwidth of a communication channel. The rate control sequence is then selected, based on the bandwidth of the communication channel, as including the RCs that provide for the best performance (such as the grouping of RCs that provides for the lowest Bit Error Rate (BER)). This selection of which rate control sequence to employ may also be performed based on the application that is being used. For example, in some data applications, a slight latency in the delivery of information may sometimes be tolerated. However, in other applications, such as video or Voice over Internet Protocol (VOIP) applications, the latency will degrade the performance significantly. The inclusion of such parameters may be employed when selecting which RCs to be employed within a given rate control sequence.

Generally speaking, as the noise of the channel increases, the coding may select a new code rate as provided by a new rate control sequence. This new code rate (when channel noise increases) may employ employs RCs with constellations of lower order (having a fewer number of constellation points) and/or operate at lower bandwidth efficiencies (fewer information bits per symbol). Similarly, as the noise of the channel decreases, the coding may select a new rate control sequence. This new code rate (when channel noise decreases) may employ employs RCs with constellations of higher order (having a larger number of constellation points) and/or operate at higher bandwidth efficiencies (more information bits per symbol).

This variable code rate functionality, including the adaptive functionality thereof, may be implemented in a variety of contexts to provide for overall improvement in the communication system. One embodiment may include varying the rates to accommodate the different SNR regions within wireless transmission from a satellite to subscribers on the earth. A direct path from the satellite may be viewed as generating a beam spot that would likely have a SNR that is higher than the evanescent regions of the wireless transmission where the field will fall off. The variable code rate functionality, according to the invention, may be used to support different rates to these various regions. In such an implementation, a maximal throughput may be achieved by tailoring the code rate to the communication to a particular receiver based on the highest SNR that the channel to that receiver may support.

Moreover, the invention envisions modifying the code rate based on changes to the SNR of the channel as well; the device at either end of the communication channel may perform the measurement of the communication system's operating conditions including the SNR of various portions of the channel. This is also described above wherein either one or both of the transmitter and the receiver may be employed to monitor such parameters and to change the rate control sequence to be employed based on these parameters.

Both the encoder and decoder then will move to the new rate control sequence synchronously to ensure proper communication of information.

FIG. 48 is a table illustrating an embodiment of a mapping of trellis output vs. metric index 4800 according to the present invention. In this embodiment, the trellis outputs are those associated with the trellis 2300 of the FIG. 23. The table of the FIG. 48 shows the mapping for all of the RCs as described above in greater detail. As mentioned above, the received symbol metrics (received metric=$M_r$), indexed according to the modulation (constellation and mapping) according to the RC (as provided by the rate control sequencer 1150), are then passed to a functional block that transforms these received metrics to trellis metrics (trellis metric=$M_t$). These trellis metrics are then used to calculate the alphas, betas, and extrinsics within the SISO. These alphas, betas, and extrinsics may be calculated using a min* approach according to the invention. Alternatively, these alphas, betas, and extrinsics may be calculated using a min, max, and/or max* approach according to the invention.

A specific example is given above that shows how this mapping to the trellis is performed according to RC 8. By extension, the FIG. 48 shows how the mapping is performed for all 16 of the RCs supported by the rate 2/5 prototype encoder 2000 that employs the trellis 2300. Within the FIG. 48, M denotes the MAX (the maximum metric value) for the metrics, and this is used to define the "least likelihood probability" according to this embodiments convention. It is noted that such a table that maps trellis metrics vs. metric index may also be constructed for an alternative embodiment that employs another encoder and another trellis within the TTCM context.

FIG. 49 is a table illustrating an embodiment of trellis outputs mapped to metric outputs (without flags) 4900 according to the present invention. FIG. 50 is a table illustrating an embodiment of trellis outputs mapped to metric outputs (with flags) according to the present invention. Each of the FIGS. 49 and 50 are embodiments of the table within the FIG. 48. The FIG. 49 shows those RCs that do not employ flags, and the FIG. 50 shows those RCs that employ flags; these RCs are specifically those RCs 8,9&5. By employing these flags, we need not send the RC information to the SISO. This will provide for a savings of memory.

Figure 51:
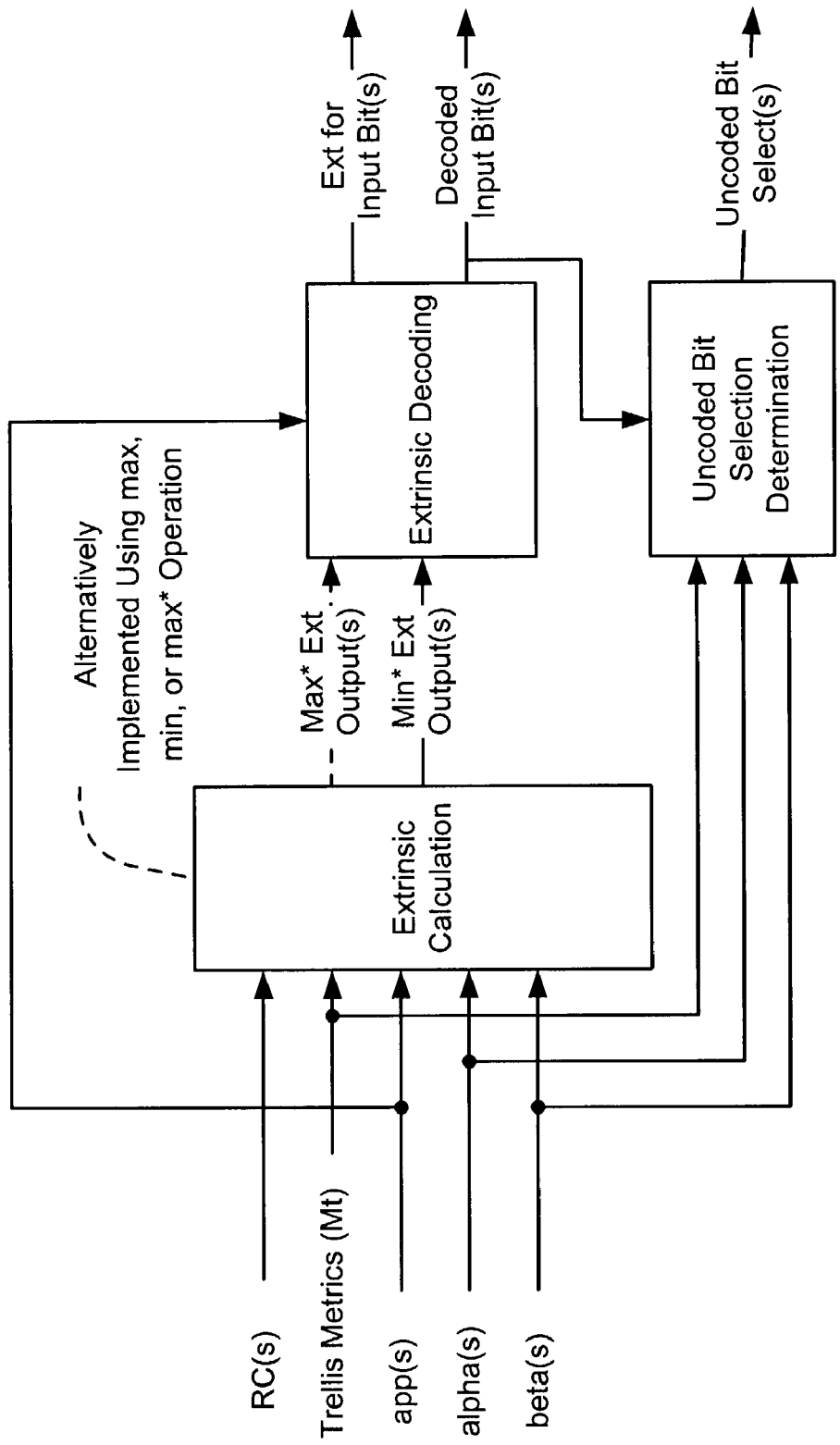
FIG. 51 is a diagram illustrating an embodiment of an extrinsic top level functional block that is built according to the invention.

FIG. 51 is a diagram illustrating an embodiment of an extrinsic top level functional block 5100 that is built according to the invention. An extrinsic calculation functional block receives information related to RCs, trellis metrics, "a priori probabilities" (app(s)), alpha(s), and beta(s). The extrinsic calculation functional block employs the min* operations according to the invention to generate min* extrinsic outputs. However, it is also noted that a max* operation may be implemented within the extrinsic calculation functional block without departing from the scope and spirit of the invention thereby generating max* outputs. These min* outputs are then provided to an extrinsic decoding functional block. In addition, the extrinsic decoding functional block also receives the app(s), alpha(s), and beta(s) that are provided to the extrinsic calculation functional block. The extrinsic decoding functional block generates extrinsic values that will be used when making best estimates of the inputs bit(s) that were encoded at an encoder before being transmitted from the encoder, across a communication channel, to the decoder. In addition, the extrinsic decoding functional block also provides the best estimates, or decoded input bit(s).

The extrinsic decoding functional block provides information to an uncoded bit selection determination functional block. This uncoded bit selection determination functional block also receives the alpha(s), beta(s), and metric(s) that are provided to extrinsic calculation functional block and to the extrinsic decoding functional block. The uncoded bit selection determination functional block employs all of this information to determine which best estimate value should be made for the uncoded bit(s). It is noted that the uncoded bit selection determination functional block may be implemented such that its operation is enabled only during the presence of one or more uncoded bit(s). When not enables, the uncoded bit selection determination functional block rests idle thereby consuming less processing resources and ensuring more efficient operation for the other components within the system. As described above, during various stages of the decoding process, a mapping of which values the uncoded bit may take (based on possible values of the input bits) is generated earlier; then, based on the actual decoded values of the input bits, then a straightforward selection of the actual values of the one or more uncoded bits. The FIG. 51 shows, in a general representation, the operation and interaction of the various values that are used to generate the best estimates, or decoded values, for the input bits and any uncoded bits that have been received by a receiver that employs the decoding operations described herein.

Figure 52:
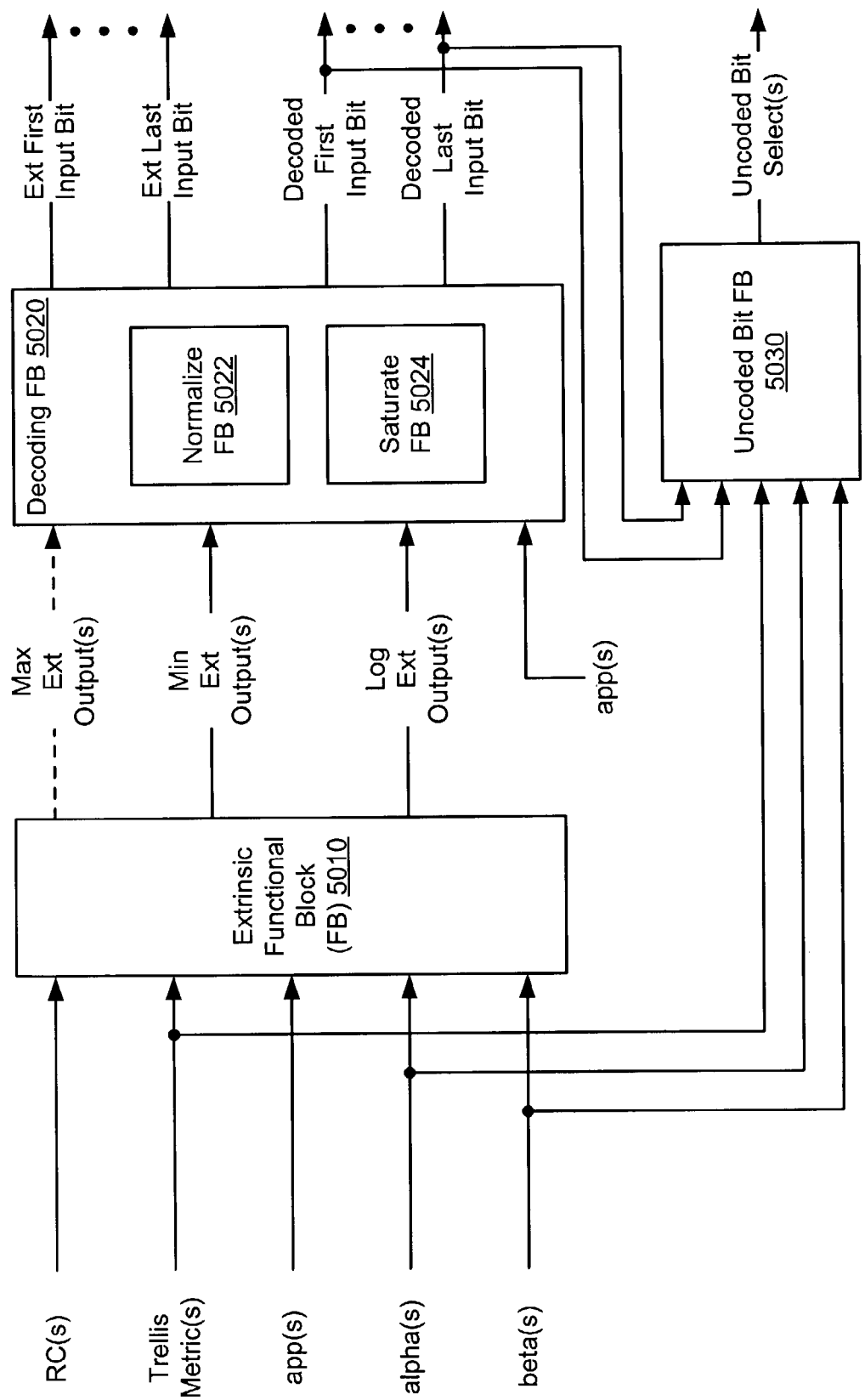
FIG. 52 is a diagram illustrating an embodiment of a possible implementation of extrinsic top level functional block of the FIG. 51.

FIG. 52 is a diagram illustrating an embodiment 5200 of a possible implementation of extrinsic top level functional block 5100 of the FIG. 51. The RCs, trellis metrics, apps, alphas, and betas are also provided to the extrinsic functional block 5010. In the first iteration, the apps, beta, and alphas may be those that were defined according to an initialization condition or an initialization process. In subsequent iterations of the iterative decoding process, the apps may be viewed as being the extrinsics provided from the other SISO and after having been passed through the interleaver or de-interleaver (in the two SISO embodiment) or the extrinsics just calculated by the SISO itself and after having been passed through the interleaver/de-interleaver operation of the common interleaver/de-interleaver functional block (in the single SISO embodiment). In addition, the alphas and betas are calculated in a manner such that they depend on the adjacent symbols within a data frame as described in more detail above.

The extrinsic functional block 5010 calculates one or more minimum extrinsic outputs and one or more log extrinsic outputs and provides them to a decoding functional block 5020. These two portions may be implemented using the min* processing described herein. Clearly, a min, max, and/or max* processing operation may alternatively be employed as well without departing from the scope and spirit of the invention. Depending on which embodiment (min* or max*) is employed, these results are passed to the decoding functional block 5020. In addition, the decoding functional block 5020 also receives the apps as input. The decoding functional block 5020 performs decoding to generate an extrinsic value for the first input bit, extrinsic values for every intervening bit, and an extrinsic value for the last input bit. In addition, the decoding functional block 5020 actually decodes the first input bit, any intervening bits, and the last input bit making best estimates thereof. In the event that the rate control sequence includes one or more uncoded bits, then the decoded values for the all of the input bits (the first input bit, any intervening bits, and the last input bit) are also provided to an uncoded bit functional block 5030 that will generate an uncoded bit select value that will be used to decode the final value of the one or more uncoded bit(s). The decoding functional block 5020 also receives as inputs the trellis metrics output from the functional block 4300 and the alphas and betas.

The FIG. 52 shows one possible embodiment of the extrinsic top level functional block 5100 of the FIG. 51. Among other details, the FIG. 52 shows the variability of the total number of input bits that may be employed according to the invention. Several of the following Figures also show various embodiments and implementations of some of the functional blocks contained herein. It is noted here that the design of the extrinsic top level functional block 5100, as well as the embodiment 5200, is operable to perform decoding of input symbols having multiple bits. Many of the embodiments shown and described below of the extrinsic top level functional block 5100 employ an input "symbol" comprising two input bits provided in a serial manner, namely, a first input bit and the second input bit ($i_0$ and $i_1$). However, input symbols of larger number of input bits per symbol may be employed as well without departing from the scope and spirit of the invention.

Figure 53:
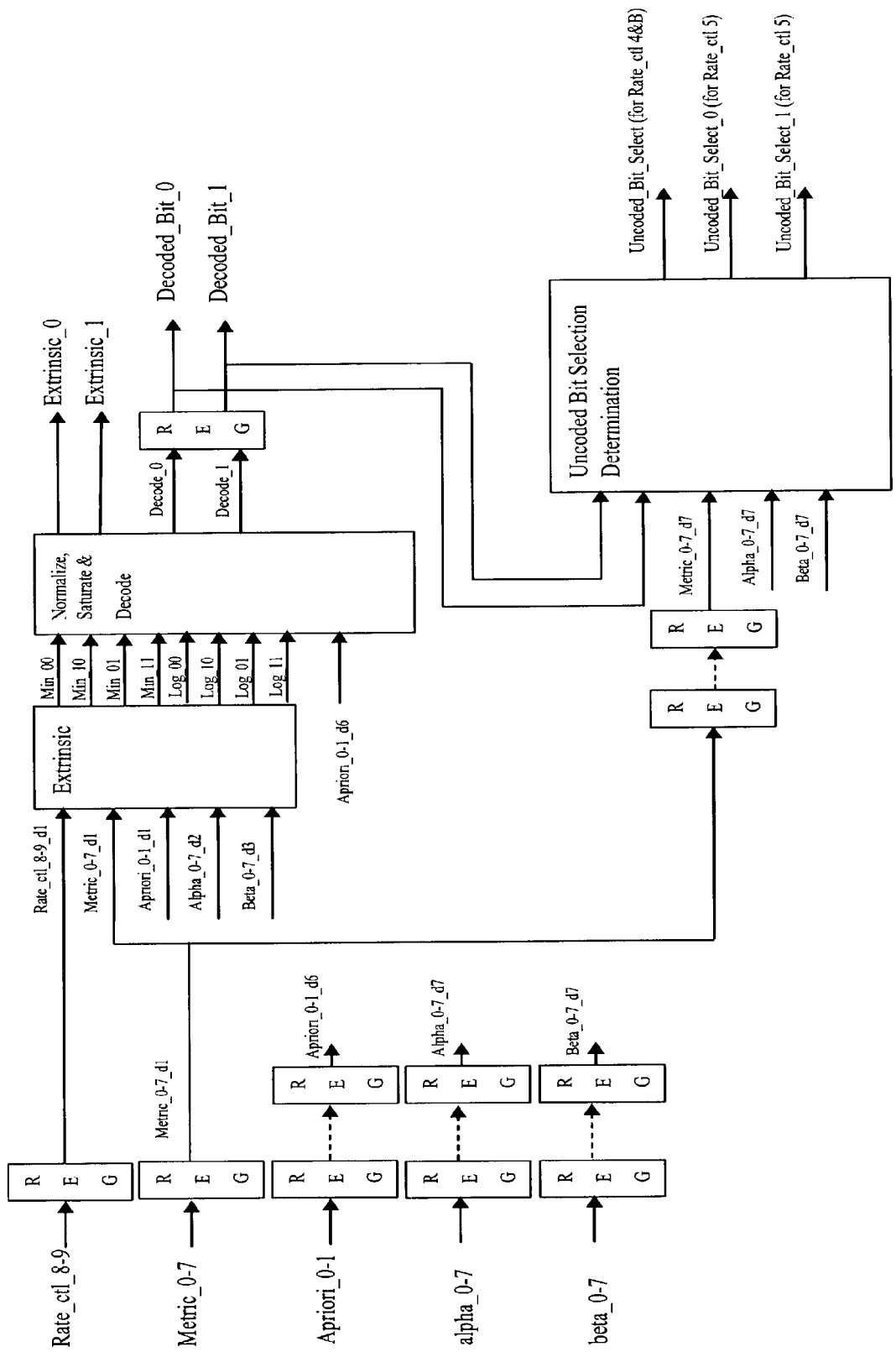
FIG. 53 is a diagram illustrating an implementation of the embodiment shown in the FIG. 51 of the extrinsic top level functional block of the FIG. 51.

FIG. 53 is a diagram illustrating an implementation of the embodiment 5200 shown in the FIG. 52 of the extrinsic top level functional block 5100 of the FIG. 51. In this embodiment, all of the RCs may be handled in a similar manner with the exception of the RCs 8,9. A flag indicating the use of one of the RCs 8 or 9 is provided to an extrinsic functional block. Similarly, the trellis metrics (shown as Metric_0–7), the apps (shown as Apriori_0–1), the alphas (shown as alpha_0–7), and the betas (shown as beta_0–7) are also provided to the extrinsic functional block. The embodiment shown here in the FIG. 53 is employed to decode a symbol that includes a first input bit and the second input bit ($i_0$ and $i_1$) and a maximum of one uncoded bit (u). The embodiment of the FIG. 53 also employs a min* calculation within the extrinsic functional block. Alternatively, min, max, and/or max* calculations may be performed without departing from the scope and spirit of the invention. Within the min* calculation, min (minimum) extrinsic and log extrinsic values are output from the extrinsic functional block for each and every possible input bit combination of the input bits of an input symbol. For example, a minimum value is generated for the possible input bit combinations of 00, 10, 01, and 11. Similarly, the log correction factors (sometimes referred to as log extrinsic outputs) are also generated for the possible input bit combinations of 00, 10, 01, and 11 according to the min*calculation process.

The min and log correction values, output from the extrinsic functional block, are provided to a normalize, saturate, and decode functional block; this normalize, saturate, and decode functional block also receives the values of the apps. The normalize, saturate, and decode functional block uses these min and log correction values are used to generate the extrinsic values for the first input bit (shown as Extrinic_0) and the second input bit (shown as Extrinic_1). This functionality shows how the inputs for 4 different extrinsic values (which result from the summing of the min and log correction values for each of 00, 10, 01, and 11) are reduced down to only 2 extrinsic values, shown as Extrinic_0 and Extrinic_1. This will result in a savings of 2 values per symbol that need to be stored; this can achieve a great deal of memory savings. In addition, the actual decoded values for the first input bit (shown as Decoded_Bit_0) and the second input bit (shown as Decoded_Bit_1) are also generated within the normalize, saturate, and decode functional block.

The first input bit (Decoded_Bit_0) and the second input bit (Decoded_Bit_1) that are provided from the normalize, saturate, and decode functional block are also provided to an uncoded bit selection determination functional block. The uncoded bit selection determination functional block similarly receives the trellis metrics, the alphas, and the betas that are also provided to the extrinsic functional block as described above.

The uncoded bit selection determination functional block then uses its inputs and then identifies the selection that is used to make the final determination of the uncoded bit. This particularly embodiment shows the uncoded bit selection that is provided for the RCs 4&B as well as for RC 5. For example, the Uncoded_Bit_Select (for Rate_ctl 4&B) and the Uncoded_Bit_Select_0 (for Rate_ctl 5) are all provided. As a brief reminder, the RC 4 includes a 16 QAM constellation, and the RCs B and 5 both include 16 APSK constellations in this particular embodiment. The ultimate output from the uncoded bit selection determination functional block in the FIG. 53 includes the selection that is then ultimately used to make the final determination of the best estimate of the uncoded bit.

Figure 54:
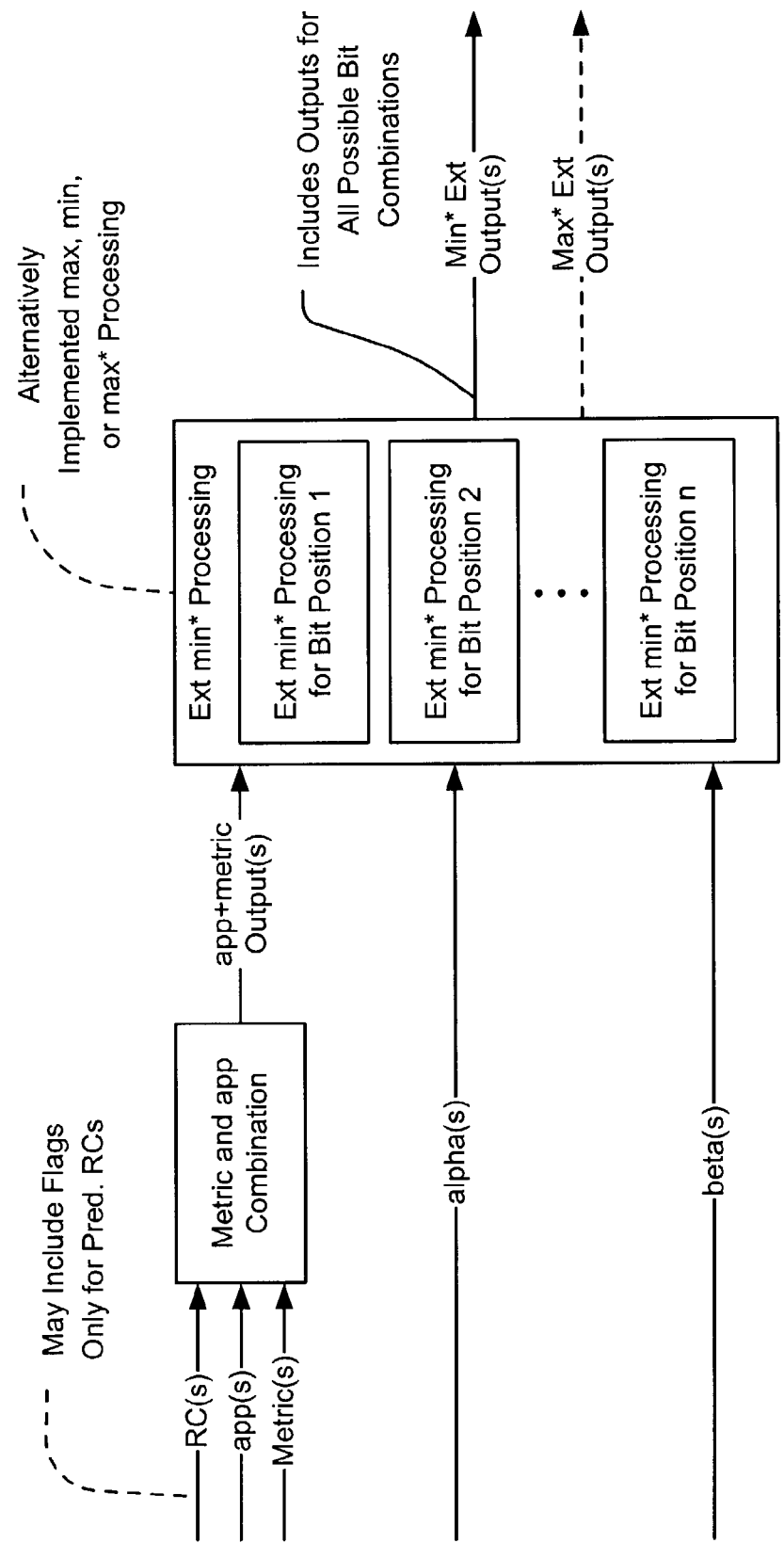
FIG. 54 is a diagram illustrating an embodiment of the extrinsic functional block within the FIG. 51.

FIG. 54 is a diagram illustrating an embodiment of the extrinsic functional block 5010 within the FIG. 52. This functional block is the one that generates the min* extrinsic outputs. Again, this functional block may be implemented to provide for min, max, and/or max* outputs depending on the particular implementation that is employed.

A metric and app combination functional block receives the RCs, the apps as well as the trellis metrics. This functional block generates app+metric outputs. This functional block ensures that the apps outputs are appropriate for the modulation, thereby ensuring the proper constellation and mapping, according to the RC that should be used to decode a particular symbol. Moreover, this functional block also employs the appropriate trellis metrics, generated from the received indexed metrics, as determined according to the RC. It is understood that different apps will be generated for the various RCs.

The app+metric outputs, from the metric and app combination functional block, are provided to an extrinsic (Ext) min* processing functional block. The metric and app combination functional block may be employed externally to the Ext min* processing functional block by capitalizing on the commonality of the metric and app values that are needed to perform the Ext min* processing within the Ext min* processing functional block. This functional block also receives the alphas and betas that are to be used to decode this particular symbol. The Ext min* processing functional block is operable to perform Ext min* processing for all of the bit positions within an input symbol. More specifically, this functional block is operable to perform Ext min* processing for bit position 1, Ext min* processing for bit position 2, . . . , and Ext min* processing for bit position n. This particular embodiment, is able to accommodate an input symbol having n bits.

Figure 55:
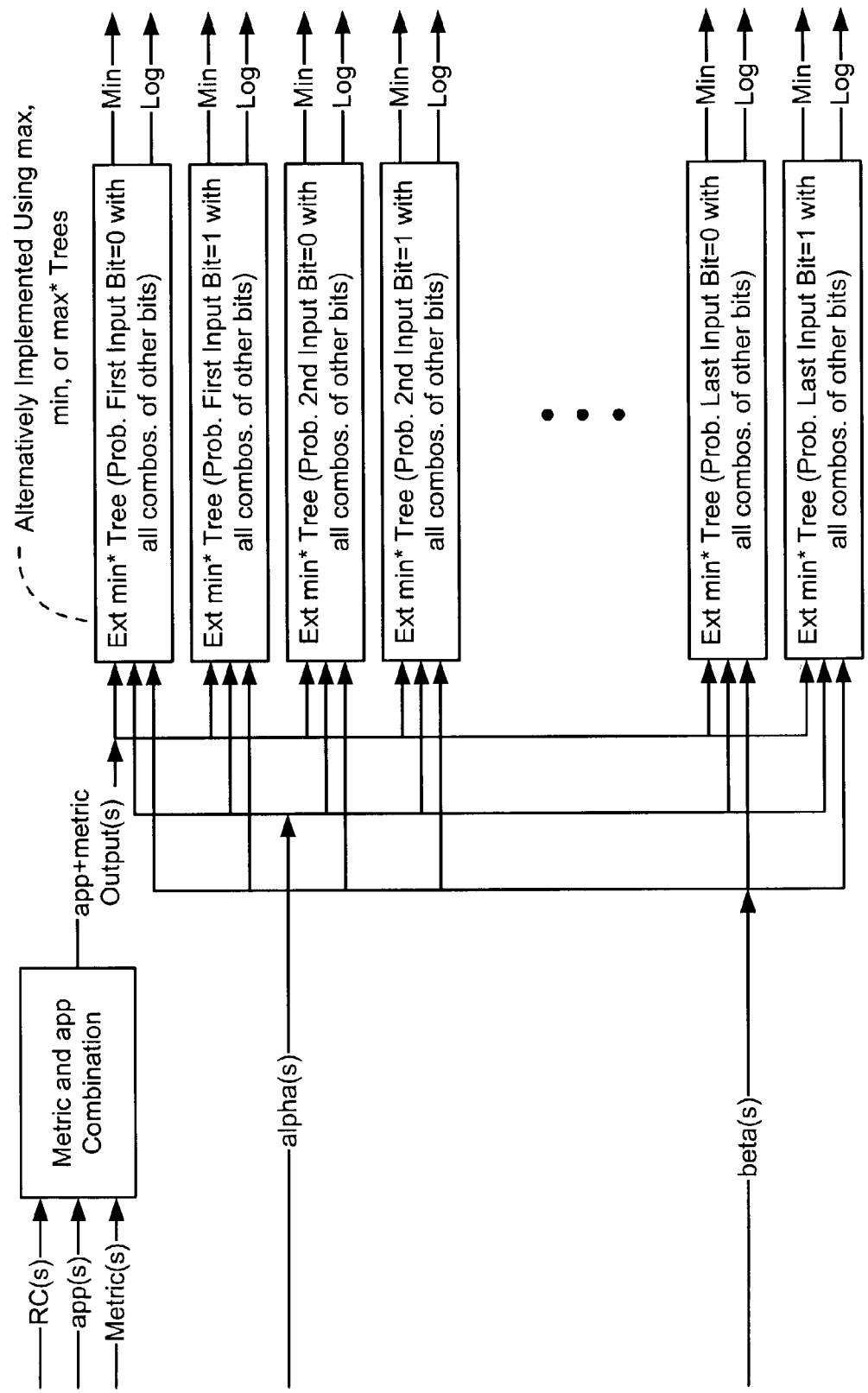
FIG. 55 is a diagram illustrating an alternative embodiment of the extrinsic functional block within the FIG. 51.

FIG. 55 is a diagram illustrating an alternative embodiment 5500 of the extrinsic functional block 5010 within the FIG. 52. This functional block is the one that generates the min* extrinsic outputs using extrinsic (Ext) min* trees. Again, this functional block may be implemented to provide for min, max, and/or max* outputs, by employing extrinsic (Ext) min trees, extrinsic (Ext) max trees, and/or extrinsic (Ext) max* trees, depending on the particular implementation that is employed.

Similar to the embodiment of the FIG. 54, a metric and app combination functional block receives the RCs, the apps as well as the trellis metrics. This functional block generates app+metric outputs. This functional block ensures that the apps outputs are appropriate for the modulation, thereby ensuring the proper constellation and mapping, according to the RC that should be used to decode a particular symbol. Moreover, this functional block also employs the appropriate trellis metrics, generated from the received indexed metrics, as determined according to the RC. It will be understood that different apps will be generated for the various RCs. This metric and app combination functional block ensures that the appropriate apps are generated to decode a particular symbol.

The app+metric outputs, from the metric and app combination functional block, are provided to each of the extrinsic (Ext) min* trees that are employed within a given implementation. Each of the Ext min* trees also receives the alphas and betas that are to be used to decode this particular symbol. Beginning with the top Ext min* tree, the probability of the first input bit of the input symbol being 0 is calculated; this also includes considering all of the possible combinations of other values for the other bits within the input symbol when calculating the probability that the first input of the input symbol is a value of 0. The min* result is provided as a min output and a log correction output according to the invention.

Continuing on with the next Ext min* tree, the probability of the first input bit of the input symbol being 1 is calculated; this also includes considering all of the possible combinations of other values for the other bits within the input symbol when calculating the probability that the first input of the input symbol is a value of 1. Similarly, the min* result is provided as a min output and a log correction output according to the invention.

A number of additional Ext min* trees may also be included to determine the probability of the intervening bits of the input symbol being either a 1 or 0 may be calculated; for example, the probability of the second bit of the input symbol being 0 or 1 may be calculated. In addition, two final Ext min* trees are included to calculate the probability of the last input bit of the input symbol being 0 as well as to calculate the probability of the last input bit of the input symbol being 1. These outputs are provided as a min output and a log correction output as well.

Figure 56:
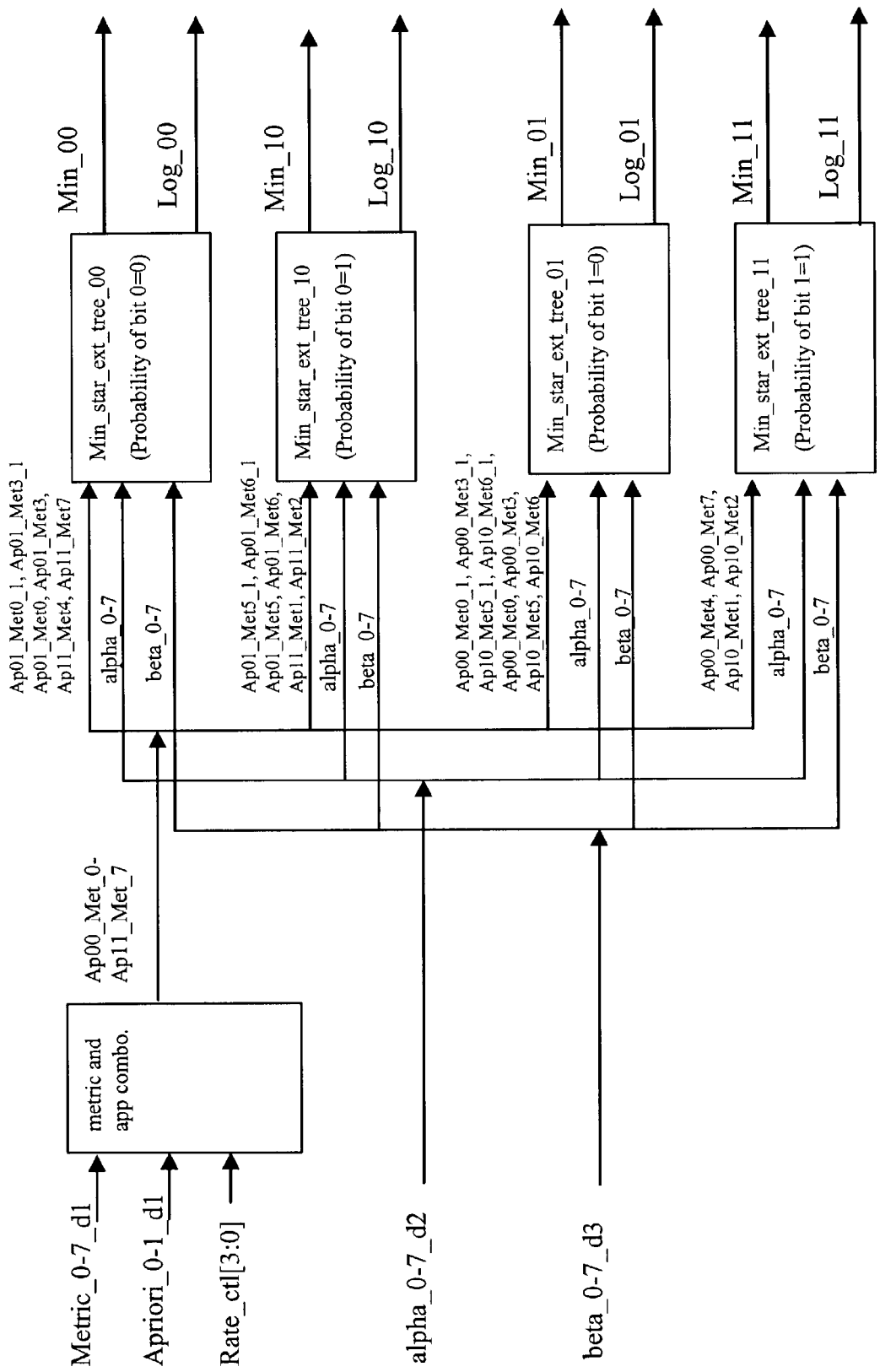
FIG. 56 is a diagram illustrating an implementation of the FIG. 55 alternative embodiment of the extrinsic functional block within the FIG. 51.

FIG. 56 is a diagram illustrating an implementation of the FIG. 55 alternative embodiment 5500 of the extrinsic functional block 5010 within the FIG. 52. The embodiment of the FIG. 56 is operable to accommodate the extrinsic calculation to be used within a system that decodes a two bit input symbol. The FIG. 56 is one particular implementation of the embodiment described above within the FIG. 55. For example, the FIG. 56 includes 4 different Ext min* trees (shown as Min_star_ex_tree_00, Min_star_ex_tree_10, Min_star_ex_tree_01, and Min_star_ex_tree_11) that are used to calculate the probability of the first bit of the two bit input symbol being 0, the probability of the first bit of the two bit input symbol being 1, the probability of the second bit of the two bit input symbol being 0, and the probability of the second bit of the two bit input symbol being 1, respectively. Again, these outputs of these four Ext min* trees are provided in the form of a min value and the log correction factor. In a max* implementation, outputs of four Ext max* trees would be provided in the form of a max value and the log correction factor.

Figure 57:
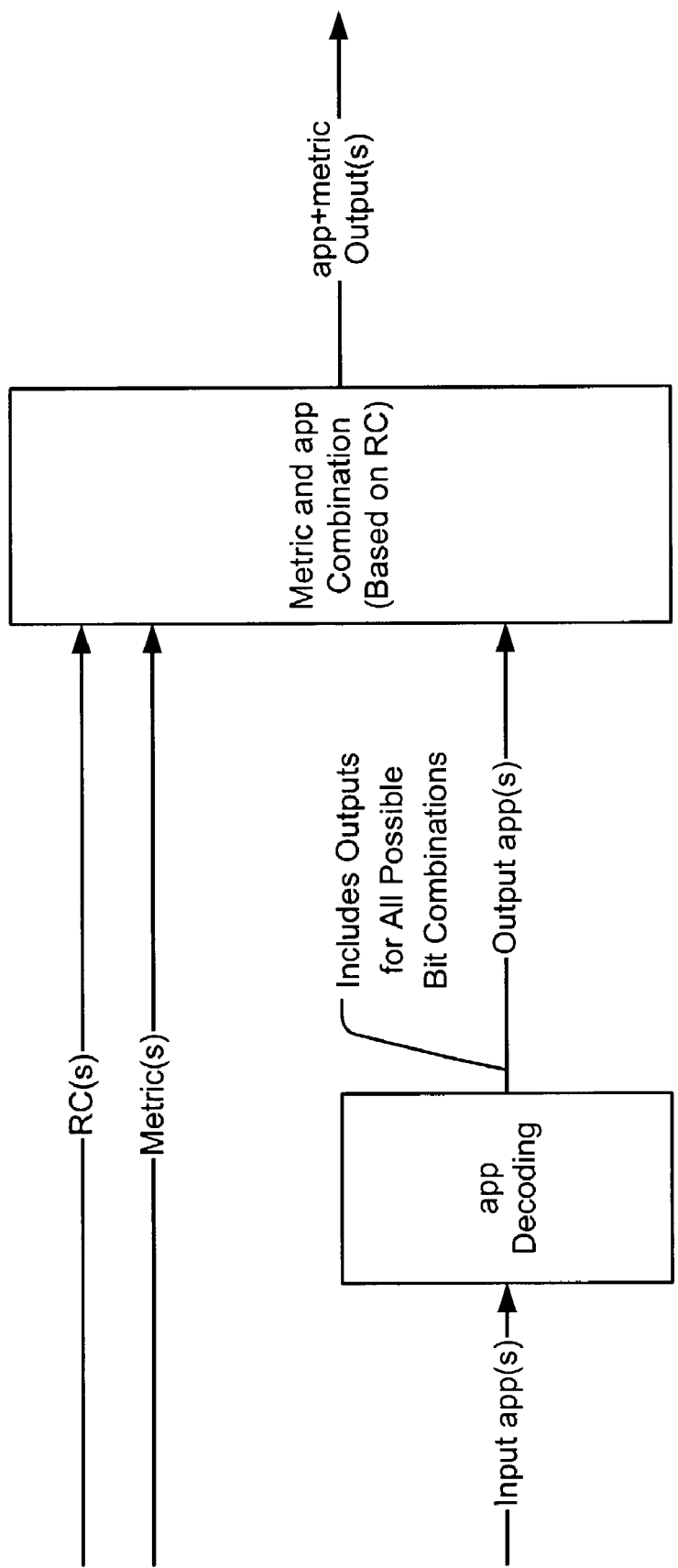
FIG. 57 is a diagram illustrating an embodiment of metric and app combination that is shown within the FIG. 54.

FIG. 57 is a diagram illustrating an embodiment of metric and app combination that is shown within the FIG. 54. In this embodiment, the RCs and the trellis metrics are provided to a metric and app combination functional block; this combination is performed based on the RC in question for a particular symbol. The input apps are provided to an app decoding functional block that generates the appropriate output app values based on the values of the input "a priori probabilities" (apps). For example, decoding logic may be performed within the app decoding functional block to generate the next value of the apps to be used within the iterative decoding process. Based upon the values of the apps within the previous iteration, the values of the apps within the next or current iteration may be obtained. These output apps are then combined with the appropriate trellis metrics based on the RC that is to be used to decode a particular symbol.

Figure 58:
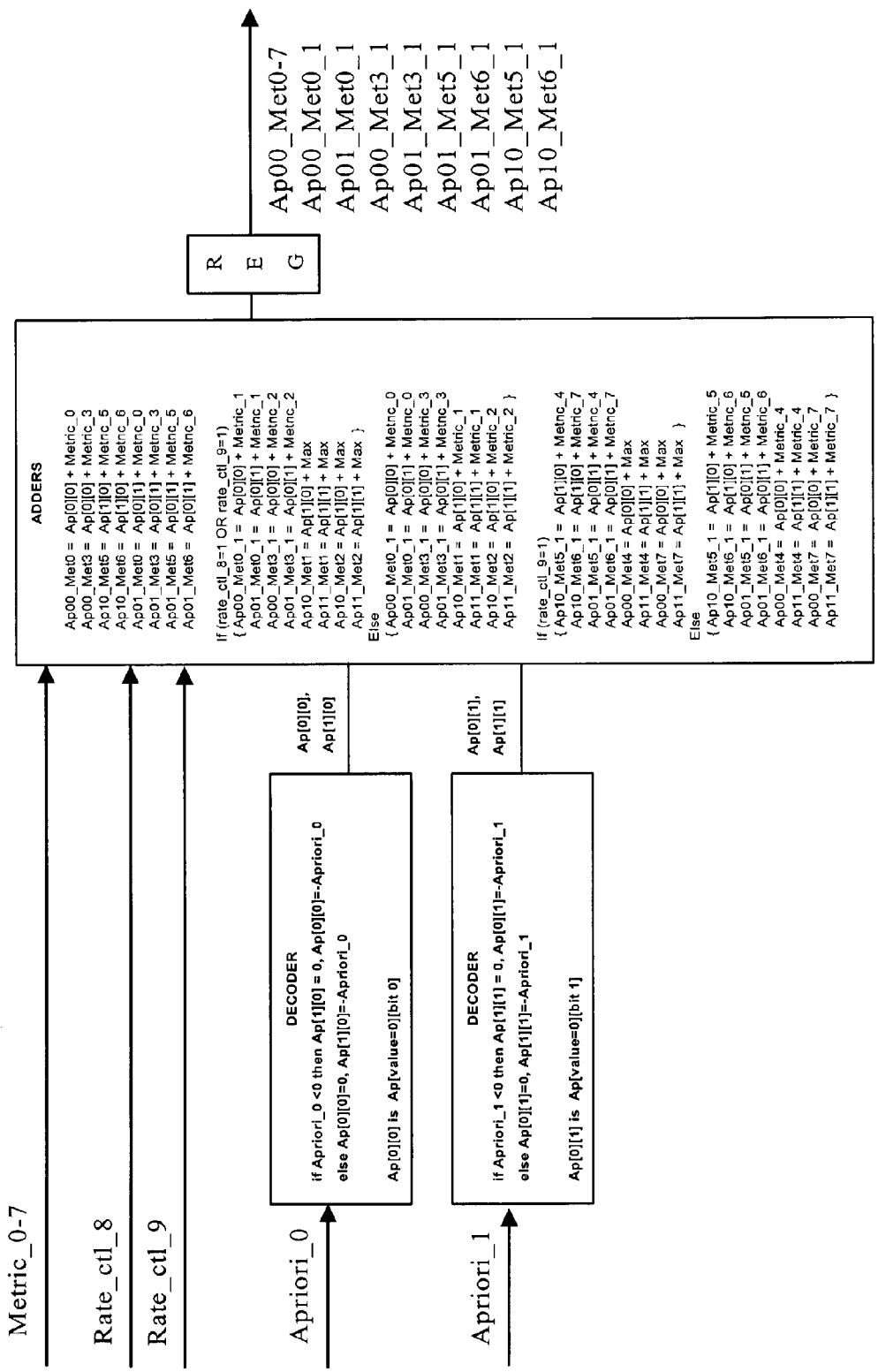
FIG. 58 is a diagram illustrating an implementation of the FIG. 57 embodiment 5600 of the metric and app combination.

FIG. 58 is a diagram illustrating an implementation of the FIG. 57 embodiment 5700 of the metric and app combination. The particular implementation of the FIG. 58 shows a design that is operable to generate the combined app and trellis metric values based on the RC to be used to decode a particular symbol based on a two bit input symbol. Two separate app decoders are shown to accommodate the decoding the app values associated with the first input bit of the symbol and the last/second input bit of the symbol. The metric and app combination functional block is implemented using adders that intelligently select the appropriate app output values from the decoders and the appropriate metrics based on the RC to be used.

Figure 59:
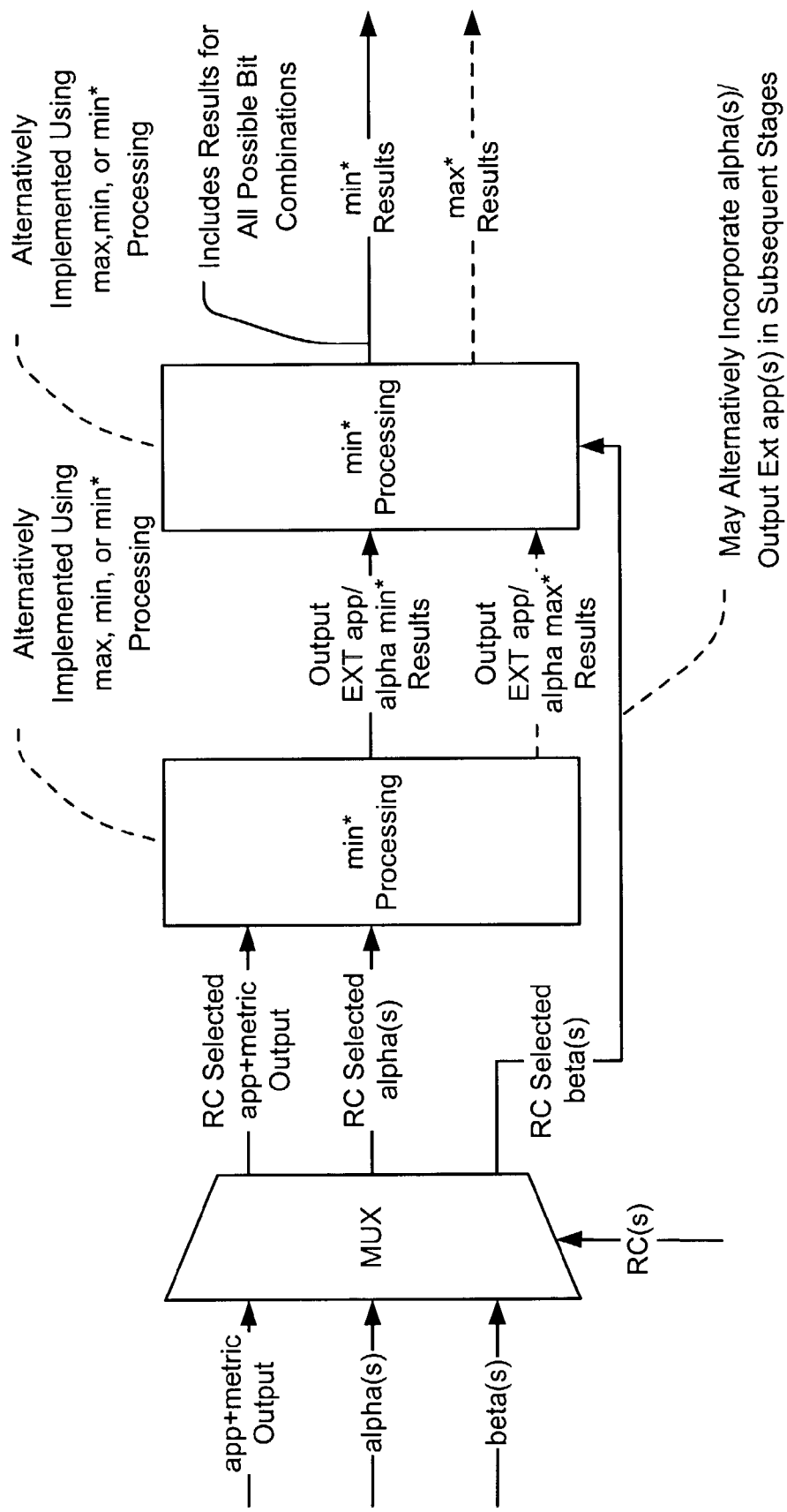
FIG. 59 is a diagram illustrating an embodiment of an extrinsic min* tree that is built according to the invention.

FIG. 59 is a diagram illustrating an embodiment of an extrinsic min* tree that is built according to the invention. Clearly, an extrinsic max* tree may also be employed without departing from the scope and spirit of the invention. This embodiment of the extrinsic min* tree may be implemented to accommodate the calculation of the probability of a bit, of an input symbol, being 0 or 1. A multiplexor (MUX), whose selection is made based on the RCs, may be employed to select the appropriate app+metric outputs, the appropriate alphas, and appropriate betas. The min* processing may be performed in two separate stages to accommodate the min* processing that includes these three variables: app+metric output, alphas, and betas. A first min* processing functional block performs the min* processing of the RC selected app+metric and the RC selected alphas. The RC selected betas are passed onto a second min* processing functional block. The outputs from the first min* processing functional block are provided to this second min* processing functional block. The ultimate min* (or max*, depending on the embodiment) operation results are provided as outputs of this embodiment of Ext min* tree. These output results include the results for all the possible bit combinations. Using the embodiment of the FIG. 59, the combinations of each of the appropriate alphas, betas, and metric+app output may be made to accommodate a number of RCs. This single design may employ a single architecture to perform the min* calculations for all of the RCs supported according to the invention.

The following FIGS. 60, 61, 62, and 63 show various implementations of the extrinsic min* tree within the FIG. 59 that are used to calculate the probability of the first bit of a two bit input symbol being 0, the probability of the first bit of the two bit input symbol being 1, the probability of the second bit of the two bit input symbol being 0, and the probability of the second bit of the two bit input symbol being 1, respectively. These FIGS. 60, 61, 62, and 63 are the implementations of the ext min* trees shown in the embodiment of the FIG. 56. More detail provided below for each of these 4 implementations. In addition, the operations of each of these ext min* trees may be viewed as being the operations performed above to calculate the 4 extrinsic values of ext(00)=ext($i_0$=0), ext(10)=ext($i_0$=1), ext(01)=ext($i_1$=0), and ext(11)=ext($i_1$=1), as described in detail within the 2 bit input symbol embodiment.

Figure 60:
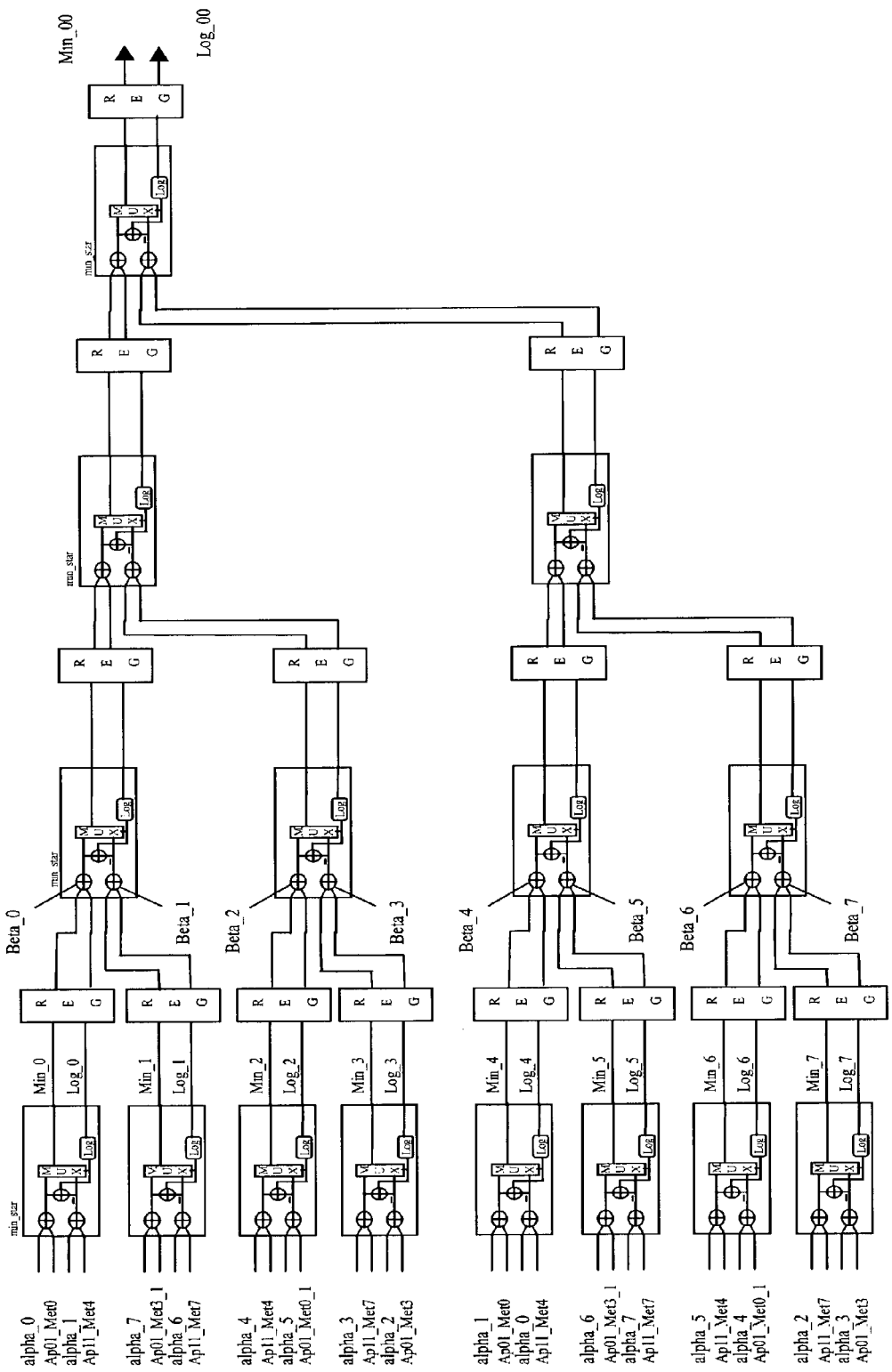
FIG. 60 is a diagram illustrating an implementation of the min_star_tree_00 that is shown within the FIG. 56.

FIG. 60 is a diagram illustrating an implementation of the min_star_tree__00 that is shown within the FIG. 56. The FIG. 60 shows 4 individual stages of min* processing functional blocks (shown as min_star functional blocks) arranged in a concatenated chain. Within the FIG. 60, the left hand most side includes the min* processing operations with the appropriate alphas and metric+app outputs that are selected according to the MUX based on the RC to be used to decode the particular symbols in question. As in shown within each min* processing functional block, a min output and a log correction output are both generated within each min* processing functional block. This makes the implementation of the min* operation more efficient. There are 8 different min* processing functional blocks that operate to perform min* processing for each of the 8 values of alpha and the 8 trellis metric associated metric+app outputs. This provides for 8 min* outputs from this first stage of the min* processing.

After the results from these 8 min* processing functional blocks are generated, these results are first summed together; the min output and a log correction output from each min* processing functional block is summed along with the values of the appropriate betas. These results will then undergo min* processing to incorporate the influence of the betas. The design for this two bit input symbol embodiment is chosen to capitalize on the common terms of beta that need to undergo min* processing. This will result in faster operation by delaying to add in the values of beta. More specifically, looking at the top left hand corner of the FIG. 60, we can see that the two branches that are provided as inputs to the min* processing functional block in the top left hand corner all employ the same beta. The operation of this min* processing may be viewed as initially performing min* processing on the forward metric values (alphas) and the ap_metrics thereby generating intermediate min* outputs and then subsequently performing min* processing on the intermediate min* outputs and the backward metric values (betas). We can delay adding in the beta until this stage, thereby avoiding at least one adder and also enhancing the operational speed of the device.

And once again, the output of this second stage of the min* processing, after incorporating the influence of the betas, is generated in the min output and log correction output format and will be summed together in the next stage. Two more stages of min* processing functional blocks are then used to combine all of these outputs into the final min output and log correction output for use in making the determination whether the $1^{st}$ bit of the input symbol was in fact encoded with the value of 0.

Figure 61:
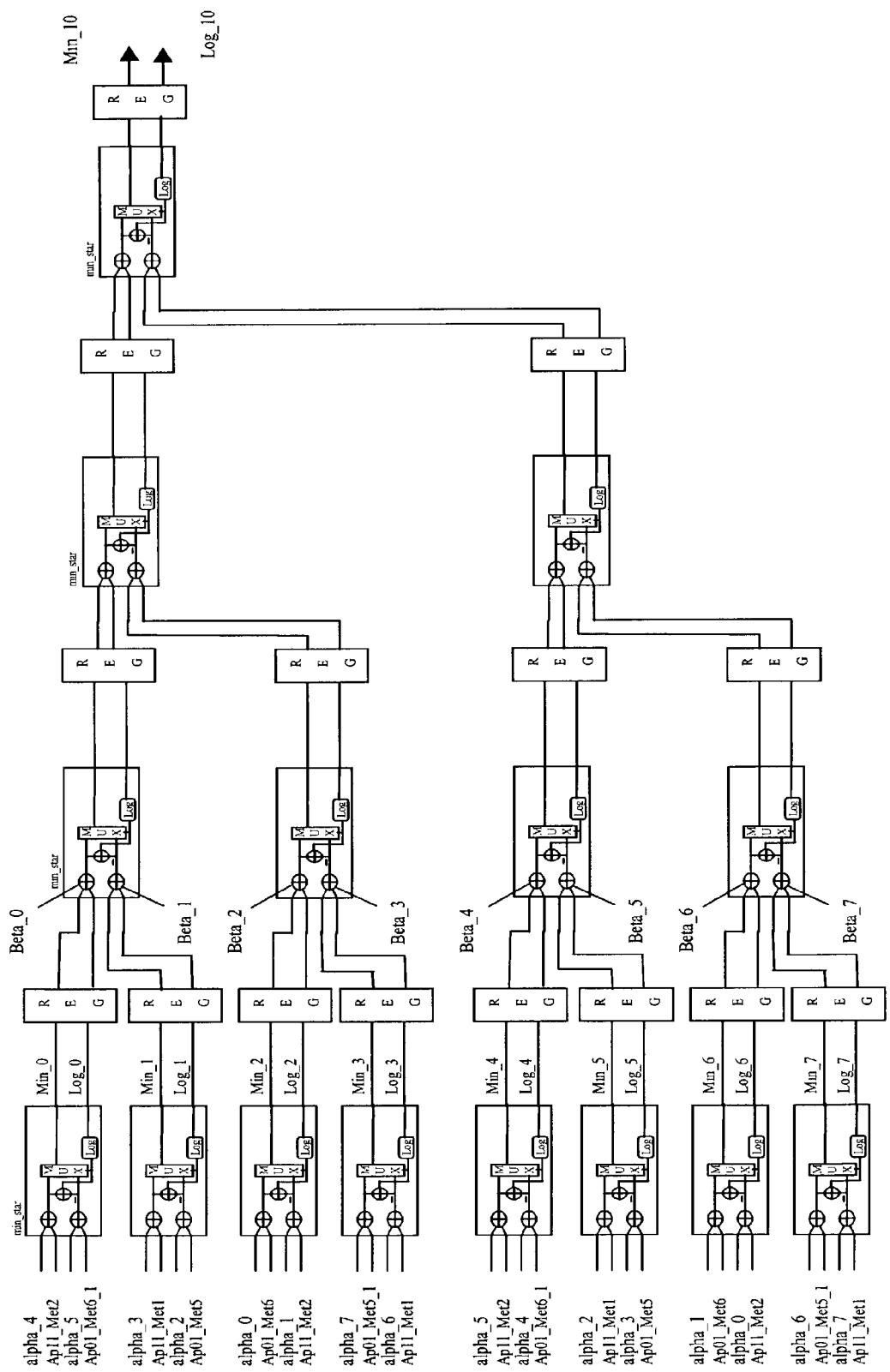
FIG. 61 is a diagram illustrating an implementation of the min star_tree_10 that is shown within the FIG. 56.
Figure 62:
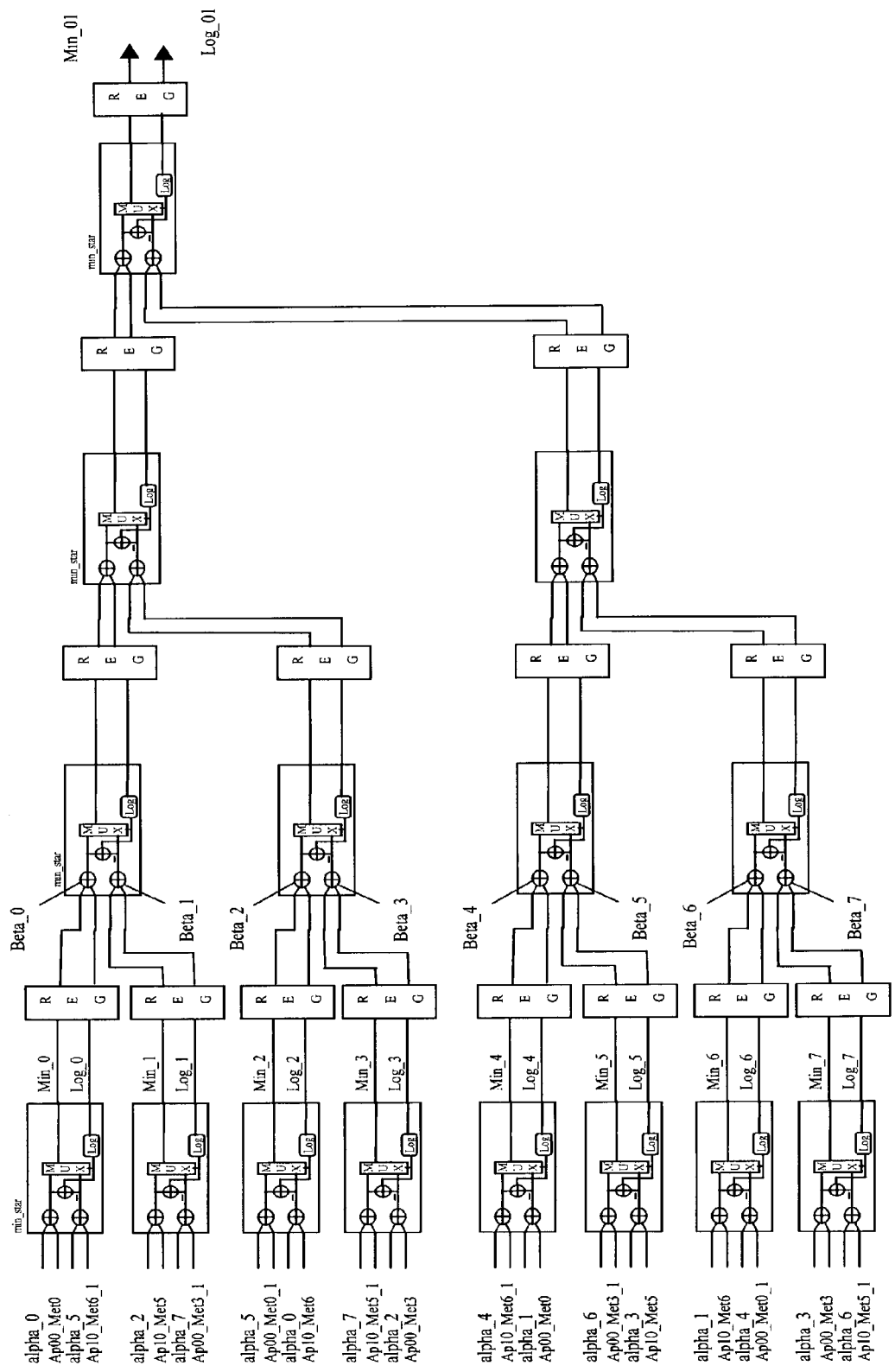
FIG. 62 is a diagram illustrating an implementation of the min_star_tree_01 that is shown within the FIG. 56.
Figure 63:
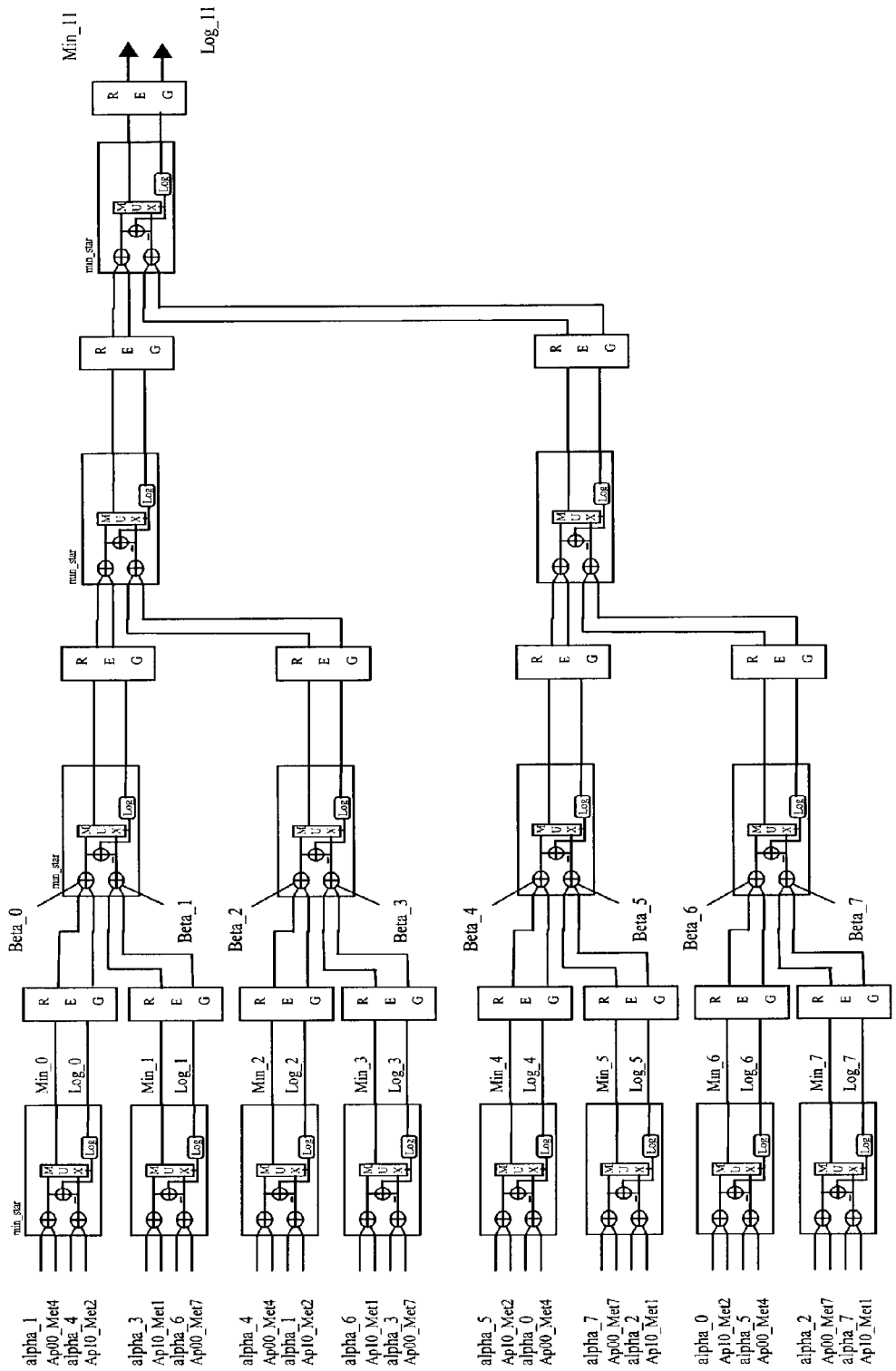
FIG. 63 is a diagram illustrating an implementation of the min_star_tree_11 that is shown within the FIG. 56.

FIG. 61 is a diagram illustrating an implementation of the min_star_tree_10 that is shown within the FIG. 56. FIG. 62 is a diagram illustrating an implementation of the min_star_tree_01 that is shown within the FIG. 56. FIG. 63 is a diagram illustrating an implementation of the min_star_tree_11 that is shown within the FIG. 56.

The implementation of the FIGS. 61, 62, and 63 are analogous to the implementation embodiment shown within the FIG. 60 with the exception that they are each operable to perform calculation for use in determining the probability of the first input bit being 1, the probability of the second input bit being 0, and the probability of the second input bit being 1. However, it is clear that the appropriate selection of the inclusion of the values of beta, being later along in the concatenation, will provide for hardware savings and improved operational speed and efficiency. It is also noted that the values for alpha could very well have been the values included in later during the min* processing, or alternatively the metric+app outputs. As an example, within an embodiment where the betas and metric+app outputs were to undergo the min* processing in the first stage, then the selection of which terms that include the common values of alpha would need to be made by appropriate selection (that could be made using an appropriately implemented MUX).

Figure 64:
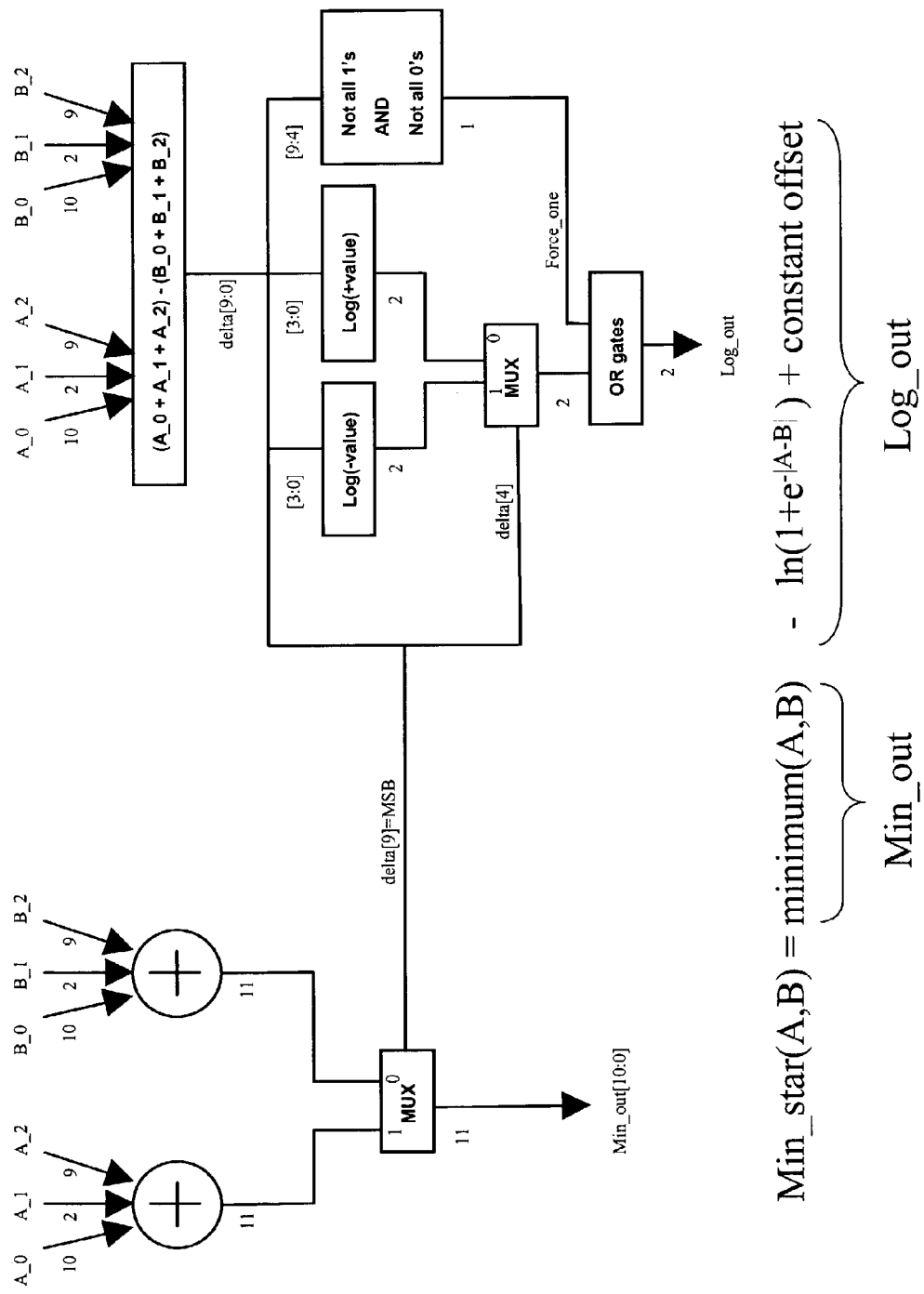
FIG. 64 is a diagram illustrating an implementation of the extrinsic min* functional block that is arranged according to the invention.

FIG. 64 is a diagram illustrating an implementation of the extrinsic min* functional block that is arranged according to the invention. This embodiment is operable to accommodate min* processing on input values of A shown as A_0, A_1, and A_2 as well as the input values of B shown as B_0, B_1, and B_2. This implementation shows how the calculation of the min output and the log correction output may be partitioned to provide for more efficient allocation of hardware. The left hand side of the FIG. 63 shows how the min output is generated using the sign of the delta, or sign of the difference, between the sum of the input values of A (that include A_0, A_1, and A_2) and the input values of B (that include B_0, B_1, and B_2). A MUX is used to determine which sum is to be used for the min output (shown as Min_out=minimum(A,B)). The right hand side of the FIG. 64 shows a hardware implementation by which the log correction output portion (shown as Log_out="ln(1+$e^{-|A-B|}$))+constant offset" is generated. To calculate the absolute value of the log value difference, both terms (A−B and B−A) are calculated and the one that is greater than zero is used as the absolute value difference. The parallel calculation of both of these values for (A−B and B−A) provides for an improvement of operational speed.

The extrinsic min* functional block shown within the FIG. 64 provides for very fast computation. The various intermediate parameters are simultaneously calculated in parallel as opposed to being performed sequentially. For example, once the higher significant bits of A−B is calculated (shown as the 4 bits [3:0] of delta), then the log(+value) and the log(−value) may be calculated using those bits. This may be performed by borrowing upon the pre-knowledge of the saturating characteristics of those log value terms.

In addition, the most significant bit of the term A−B (shown as delta[9]=MSB) is used to select the MUX that calculates the min product term. The log correction term is calculated using the 4 bits of the term A−B (shown as the [3:0] bits of delta). Once these 4 bits of the term A−B are calculated, then calculation of the log values (log(+value) and log(−value)) is begun.

$$\log(+\text{value}) = ln(1+e^{-(A-B)})$$

$$\log(-\text{value}) = ln(1+e^{-(B-A)})$$

The log values (log(+value) and log(−value)) and the remaining bits of A−B are calculated in parallel. In addition, the 4 bits of the term A−B (shown as the delta[4]) are used as the selection of the MUX that will determine which log value (log(+value) or log(−value)) will actually be used. For example, is A−B is greater than B−A, then the log(+value) will be used; alternatively, the log(−value) will be used.

In short, once the delta value (the bits of the term A−B, shown as [3:0]) are calculated, then the calculation of the log values (log(+value) and log(−value)) may begin. Thereafter, the calculation of the log values (log(+value) and log(−value)) and the remaining bits of the term A−B are calculated simultaneously. Thereafter, the sign bit of A−B is sued to select which log value, log(+value) or log(−value), should be used. The embodiment shown here in the FIG. 64 provides for very efficient computation by performing many of the intermediate calculations required to perform the entire min* calculation. It is also noted that two bits of precision are employed for the values of the log values (log(+value) and log(−value)).

The OR gates, in conjunction with the "Not all 1's/Not all 0's" functional block, may be viewed together as being a saturation circuit. This will be employed to override the delta[3]bits of the term A−B, if an improper selection was made. For example, if all of the values of the term A−B are in fact 1's or all 0's, then the value is forced to one; this will force the value of the log correction value (Log_out) to the proper value. The Log_out value may then be fed back to one of the inputs to A or B (for example, as one of the values of A_0, A_1, A_2, B_0, B_1, or B_2) for a subsequent calculation of an alpha value, a beta value, and/or an extrinsic value. The precision of the value of Log_out may be only 1 bit in some embodiments. By performing only a single bit (1 bit) of precision, an improved precision is achieved (as opposed to doing only a min operation without any log correction factor), yet there is no penalty in slowing down the min* calculation. Other approaches may employ several bits of precision for the Log_out value; however, this may reduce the speed of the overall calculation. The invention is able to perform this operation using only 1 bit of precision for the log correction value thereby gaining a majority of the total benefit offered by the min* calculation, yet by also maintaining a very fast operational speed. The embodiment employing one bit precision for Log_out may be viewed as a trade-off between accuracy and operational speed; the use of this one bit provides a great deal of improvement in the accuracy of the overall calculation, and it does not come at a cost of slower operational speed (e.g., no timing penalty).

It is also noted that although, in this example, the numbers of A and B are 10 bit numbers, and only 4 bits of the difference terms A−B (shown as [3:0]) are employed for the calculation of the log values (log(+value) and log(−value)), clearly other embodiments of word widths may be employed without departing from the scope and spirit of the invention. For example, when large word widths of A and B are employed, then more bits may be employed to calculate the log values (log(+value) and log(−value)).

Again, this Figure shows how a min* approach is implemented. If a max* approach, or alternatively simply a min or max approach (without performing log correction), is desired in a different embodiment, then those calculations may also be implemented while still capitalizing on the many benefits provided by the invention.

FIG. 65 is a table illustrating an embodiment of a log table (including a constant offset) according to the invention. While the FIG. 65 shows an embodiment that employs a constant offset of 0.75, it is understood that other offsets may be employed without departing from the scope and spirit of the invention. The table of the FIG. 65 shows how the log correction output (shown as Log_out) will vary as a function of the delta, or difference that is calculated above within the FIG. 64. This log correction output is symmetric around the origin of delta. The constant offset may also be employed to avoid using 2's complement that is necessitated to track the sign of the values. The FIG. 65 shows an embodiment where the word width of the value that is used within the extrinsic log table is 4 bits, and the word width of the positive and negative log values (shown as log(+value) and log(−value)) are each 2 bits. However, it is understood that these word widths may also be modified dependent on the application; different embodiments may use different word widths.

Figure 66:
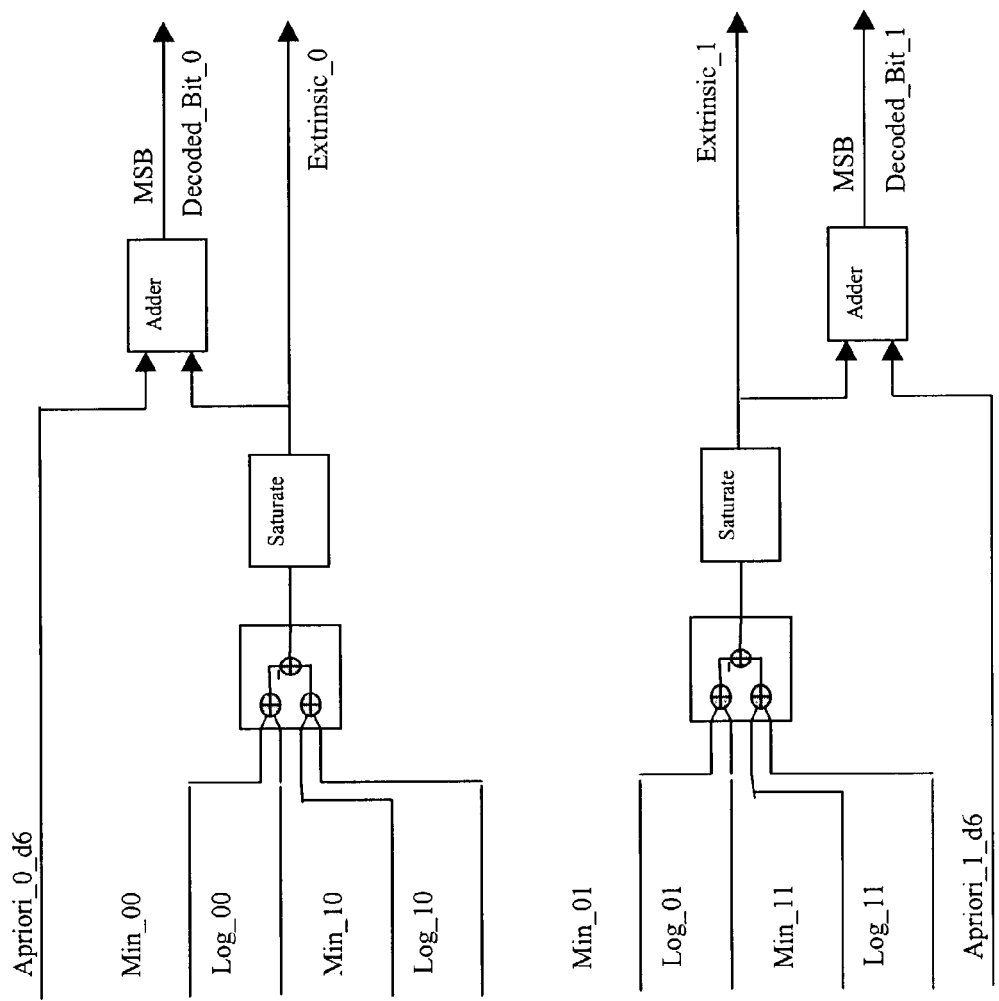
FIG. 66 is a diagram illustrating a possible implementation of the decoding, the normalize, and the saturate functional blocks within the FIG. 52.

FIG. 66 is a diagram illustrating a possible implementation of the decoding functional block 5020, the normalize functional block 5022, and the saturate functional block 5024 within the FIG. 52. There are two separate functional block portion in the FIG. 66; the top portion of the FIG. 66 accommodates the $1^{st}$ decoded input bit, and the bottom portion accommodates the $2^{nd}$ decoded input bit. This FIG. 66 shows how the particular values of the extrinsic value associated with each of the input bits as well as the actual best estimate of the decoded bit may be determined according to the invention.

The min output values and log correction output values are all summed together for each of the input bits to generate the actual extrinsic value associated with that input bit; this extrinsic value will be used in the next iteration of the iterative decoding process. The app value is also added with the total sum for each of these bits to generate decoded bit of each of the input bits; the most significant bit (MSB)/the sign bit is taken to be the actual decoded bit.

Figure 67:
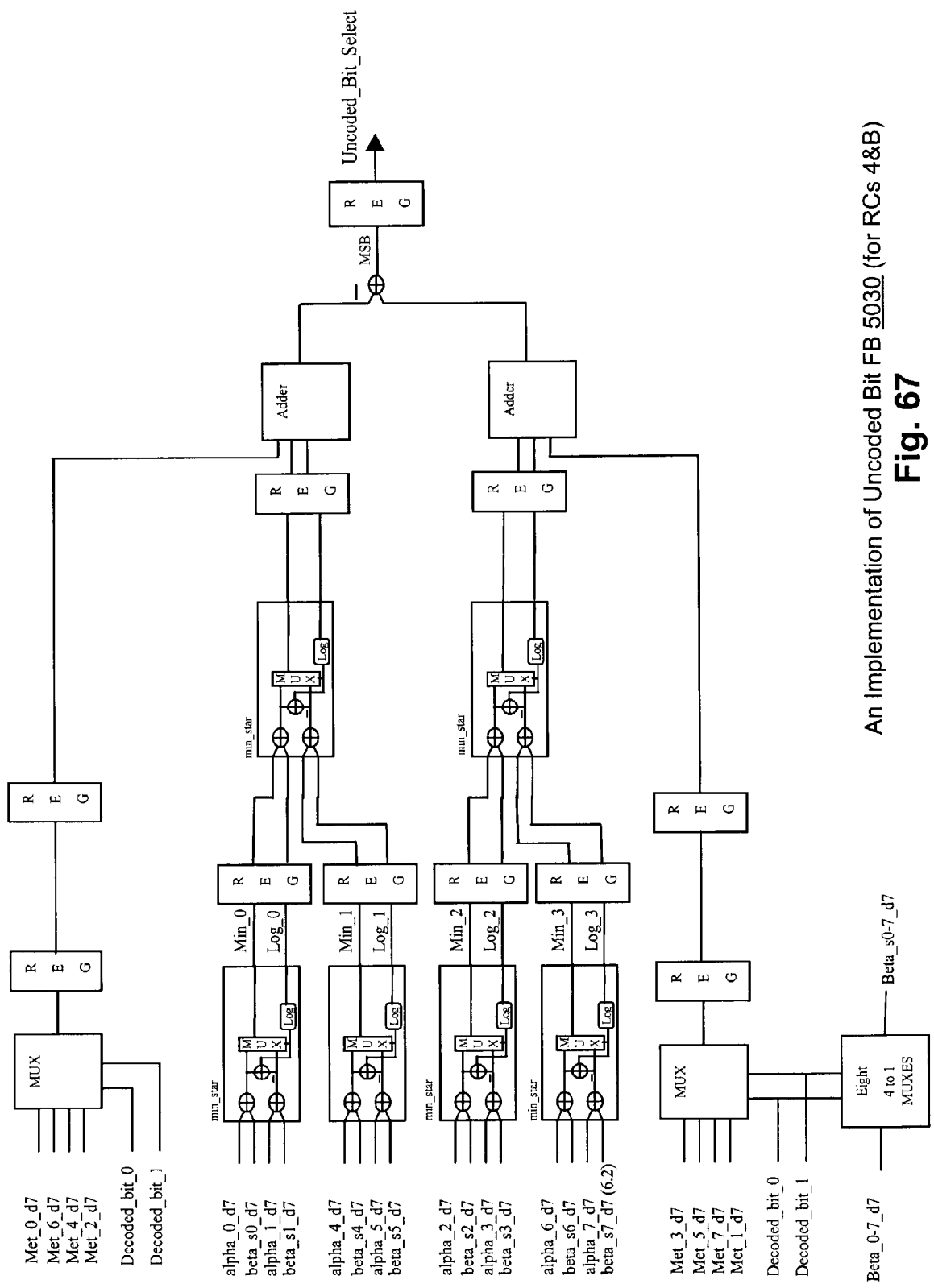
FIG. 67 is a diagram illustrating an implementation of the uncoded bit functional block within the FIG. 52 that accomodates the RCs 4&B.

FIG. 67 is a diagram illustrating an implementation of the uncoded bit functional block within the FIG. 52 that accommodates the RCs 4&B. Within the FIG. 67, the design is also implemented to capitalize on the common sharing of values of alpha and beta that will allow for a more efficient implementation. This FIG. 67 shows how the selection of which of the possible values of uncoded bit should be selected.

As shown in the upper left hand corner of the FIG. 67, this is performed by using the actual values of the decoded bits to serve as the selectors of a MUX that will select the appropriate trellis metric values to be used in the top portion; this is also performed in the lower left hand corner of the FIG. 67 where the actual values of the decoded bits to serve as the selectors of a MUX that will select the appropriate trellis metric values to be used in the bottom portion. In addition, these actual values of the decoded bits will also serve as the selectors for 8 different 4 to 1 MUXes that are employed to select the appropriate betas (from the available values shown as Beta 0–7_d7) to be used in the decoding process. Again, this may be performed by capitalizing on the commonality of terms within the calculations to be performed when doing the min* operations on these values.

In the particular embodiment of the FIG. 67, dealing with the RCs 4&B, the MSB of the output value Uncoded_bit_select will be used to determine which value of $c_3c_2c_1$ should be used based on the value of the input bits. Thereafter, the actual value of the uncoded bit u may be selected. The FIG. 69 shows a table that will be used to decode the uncoded bits; this decoding is performed using the value of Uncoded_bit_select generated within the FIG. 67 as well as the actual values of the decoded bits (Decoded_Bit_1 and Decoded_Bit_0).

Figure 68:
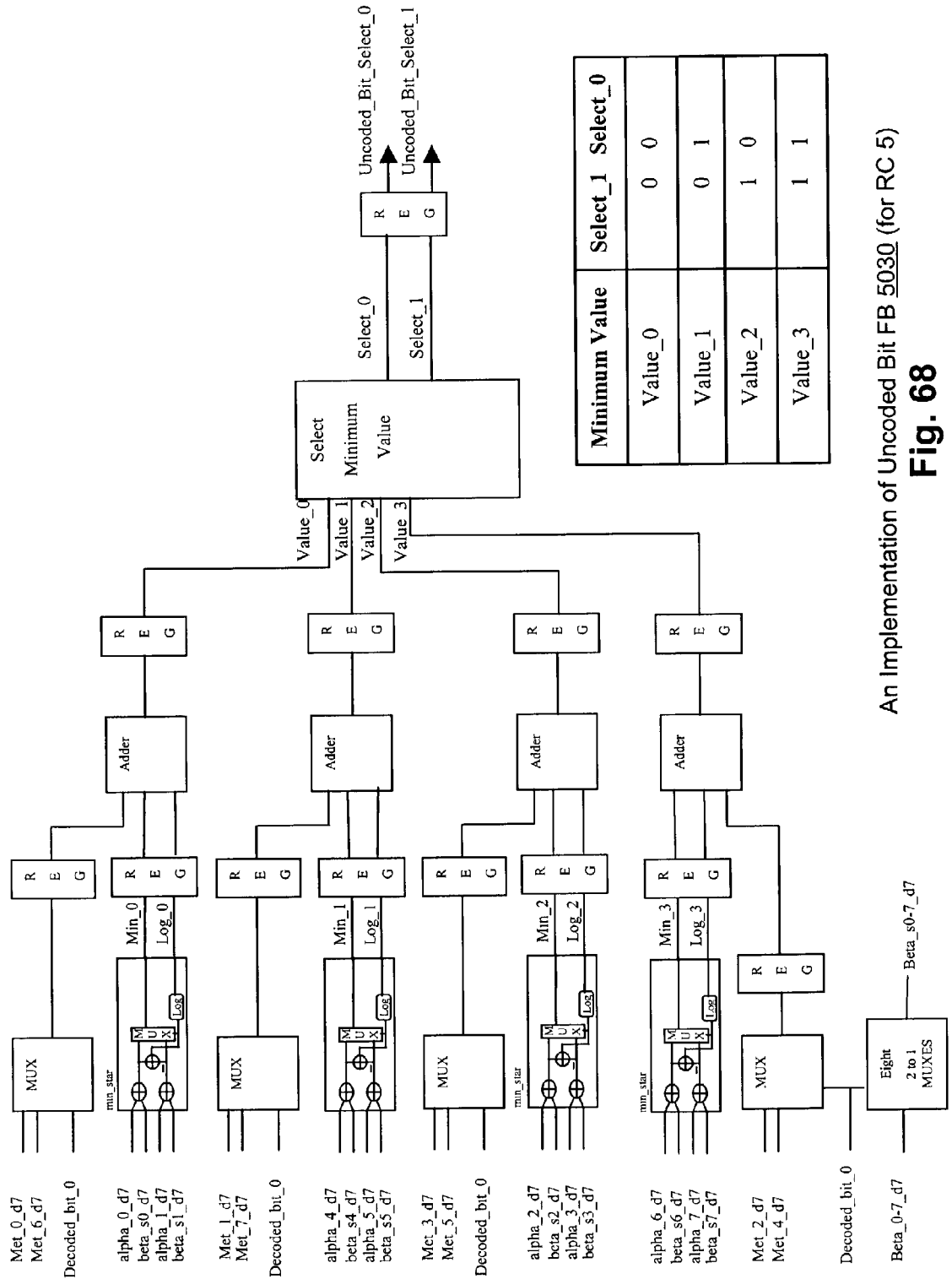
FIG. 68 is a diagram illustrating an implementation of the uncoded bit functional block within the FIG. 52 that accommodates the RC 5.

FIG. 68 is a diagram illustrating an implementation of the uncoded bit functional block within the FIG. 52 that accommodates the RC 5. The embodiment of the FIG. 68 is similar to the embodiment of the FIG. 67. Within the FIG. 68, the design also capitalizes on the common sharing of values of alpha and beta that will allow for a more efficient implementation. This FIG. 68 shows how the selection of which of the possible values of uncoded bit should be selected.

As shown in the upper left hand corner of the FIG. 68, this is performed by using the actual value of only one of the decoded bits to serve as the selectors of a MUX that will select the appropriate trellis metric values to be used in the top portion; this is also performed in the lower left hand corner of the FIG. 68 where the actual value of only one of the decoded bits to serve as the selectors of a MUX that will select the appropriate trellis metric values to be used in the bottom portion. This is achieved because we know in the RC 68 that out inputs are of the form $u0i_1$. We never input a value for $i_0$ in the RC 5. Similar to the embodiment of the FIG. 67, this may be performed by capitalizing on the commonality of terms within the calculations to be performed when doing the min* operations on these values.

In the particular embodiment of the FIG. 68, dealing with the RC 5, we use two different values of Uncoded_bit_select_0 and Uncoded_bit_select_0 to determine which value of $c_3c_2c_1$ should be used based on the value of the input bits. Thereafter, the actual value of the uncoded bit u may be selected. The FIG. 70 shows a table that will be used to decode the uncoded bits; this decoding is performed using the values of Uncoded_bit_select_0 and Uncoded_bit_select_1 generated within the FIG. 68 as well as the actual value of the single decoded bit used in the RC 5 (Decoded_Bit_0).

These FIGS. 67 and 68 for the implementation of the uncoded bit functional block within the FIG. 52 show possible ways to implement the functionality described herein. Clearly, other embodiments may be performed without departing from the scope and spirit of the invention. The designs within the FIGS. 67 and 68 may be implemented to recycle the min* hardware, used and described above, to perform the min* calculations that are used to decode the uncoded bits.

FIG. 69 is a table illustrating an embodiment of an index table that is used to decode uncoded bits employed using the RCs 1,4&B. The FIG. 69 shows a table that will be used to decode the uncoded bits. Looking at the table of the FIG. 69, it can be seen that decoded values of the inputs bits (Decoded_bit_1 and Decoded_bit_0) are grouped in pairs with the differing bit being the value of the uncoded bit select (Uncoded_bit_select).

For example, when the values of the decoded values of the inputs bits (Decoded_bit_1 and Decoded_bit_0) are 00, then an uncoded bit select (Uncoded_bit_select) value of 0 will indicate that the uncoded bit index of 0 for RCs 4&B. When the values of the decoded values of the inputs bits (Uncoded_bit_1 and Uncoded_bit_0) are 00, then an uncoded bit select (Uncoded_bit_select) value of 1 will indicate that the uncoded bit index of 3 for RCs 4&B. Similar look up achieved for the other values as well according to the table.

FIG. 70 is a table illustrating an embodiment of an index table that is used to decode uncoded bits employed using the RC 5. The FIG. 70 shows a table that will be used to decode the uncoded bits. The look up is similar to the look up performed within the table of the FIG. 69 with the exception that is employs the values of Uncoded_bit_select_0 and Uncoded_bit_select_1 as well as the actual value of the single decoded bit used in the RC 5 (Decoded_Bit_0).

For example, when the values of the single decoded bit used (Decoded_Bit_0), the values of Uncoded_bit_select_1 and Uncoded_bit_select_0 are 000, then the value of the uncoded bit index is 0. Analogously, when the values of the single decoded bit used (Decoded_Bit_0), the values of Uncoded_bit_select_1 and Uncoded_bit_select_0 are 001, then the value of the uncoded bit index is 1. As one final example, when the values of the single decoded bit used (Decoded_Bit_0), the values of Uncoded_bit_select_1 and Uncoded_bit_select_0 are 111, and then the value of the uncoded bit index is 4. Similar look up achieved for the other values as well according to the table.

Figure 71:
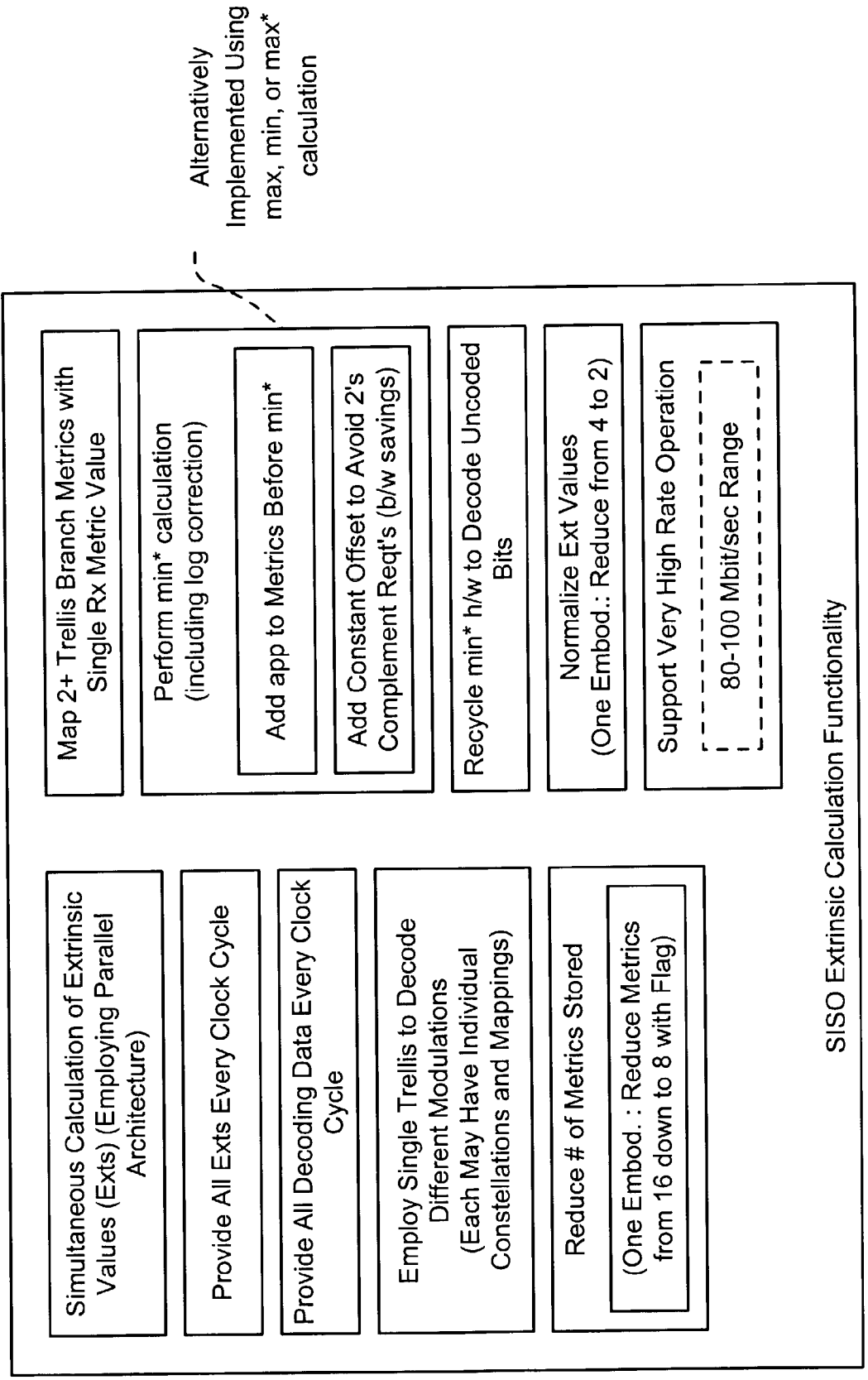
FIG. 71 is a diagram illustrating an embodiment of SISO extrinsic calculation functionality that is supported according to the invention.

FIG. 71 is a diagram illustrating an embodiment of SISO extrinsic calculation functionality that is supported according to the invention. The extrinsics calculation may simultaneously be performed for several symbols within a data frame to support high data rate according to the variable code rate functionality provided by certain aspects of the invention. The SISO extrinsic calculation functionality is able to provide all extrinsic information and decoding data in every clock cycle. A single trellis is employed to decode data of different modulations (that may each have individual constellations and mappings for those constellations). Each RC associated with a modulation is operable to support an individual bandwidth efficiency according to the variable code rate functionality.

The SISO extrinsic calculation functionality is also operable to provide a means to reduce the total number of metrics that need to be stored to perform the iterative decoding process. In one embodiment that employs a trellis having 16 distinct branches (for example, the trellis 2300 embodiment of the FIG. 23), the number of metrics to be stored is reduced down from 16 to 8—a memory savings of one half. When considering data frames that may include up to 1024 symbols, and also considering that alpha, beta, and extrinsic values must be generated for each symbol, a savings of one-half can be very substantial to the overall performance of a communication system. The SISO extrinsic calculation functionality also is able to map two or more trellis metrics with a single received metric value according to a RC. For example, within the one embodiment employs the trellis having 16 distinct branches, when this trellis is employed to decode a modulation whose constellation includes less than 16 constellation points, then some of the branches may be mapped with the same received metric value. For example, in the case of modulation employing QPSK with 4 constellation points, then 4 distinct received metric values will be mapped to the 16 branched where 4 different branches will all share the same metric value. By employing flags to indicate which trellis branches will share common values, an even greater memory savings can be achieved.

The SISO extrinsic calculation functionality is also operable to support invention also employs the min_star (min*) operation disclosed herein instead of max* which is typically performed within turbo code systems. However, it is also noted that the SISO extrinsic calculation functionality is also backward compatible with embodiments that employ min, max, and/or max* operations as well. The SISO extrinsic calculation functionality is able to adding "a priori" probabilities (apps) to metrics before using them in min* operations to improve speed (less number of inputs to be added in min*) and to reduce gate count (because the same added info can be used in multiple min* operations). In addition, a constant offset may also be employed to avoid using 2's complement that is necessitated to track the sign of the values. The constant offset in the min* operation (log correction factor) ensures that the calculation output is always positive; this eliminates the need to use 2's complement number that is used to track the sign of the number. Thereby, the bit width is 1 bit less, and this help to save memory and gates. Adding a constant offset does not have any degradation impact on performance.

The SISO extrinsic calculation functionality also capitalizes on the commonality of terms within the various terms that are needed to perform min* calculations. In doing so, the SISO extrinsic calculation functionality recycles the min* hardware to decode the uncoded bits. For example, there can be some sharing of circuits of the UNCODED BIT SELECTION DETERMINATION for rate_ctl 4&8 and rate_ctl 5. For instance the min* blocks may be shared to perform a variety of min* functional operations. This recycleable hardware implementation can provide for a large performance improvement.

The SISO extrinsic calculation functionality also performs normalization of the extrinsic information for an information bit to reduce the number of memory needed in decoding (e.g., [probability of bit 0=0]–[probability of bit 0=1]). For each symbol (for example, within the 2 bit symbol embodiment) of a block, we use only 2 normalized extrinsic values instead of 4.

In addition, the SISO extrinsic calculation functionality provides for a solution that enables very high rate applications. In some instances, these rates of communication approach the 80–100 Mbit/sec range. The invention is able to accommodate extremely high data rates (for example those employed within satellite communication systems), in addition to being backward compatible and able to support lower rate operations (such as those employed within cellular communication systems).

Figure 72:
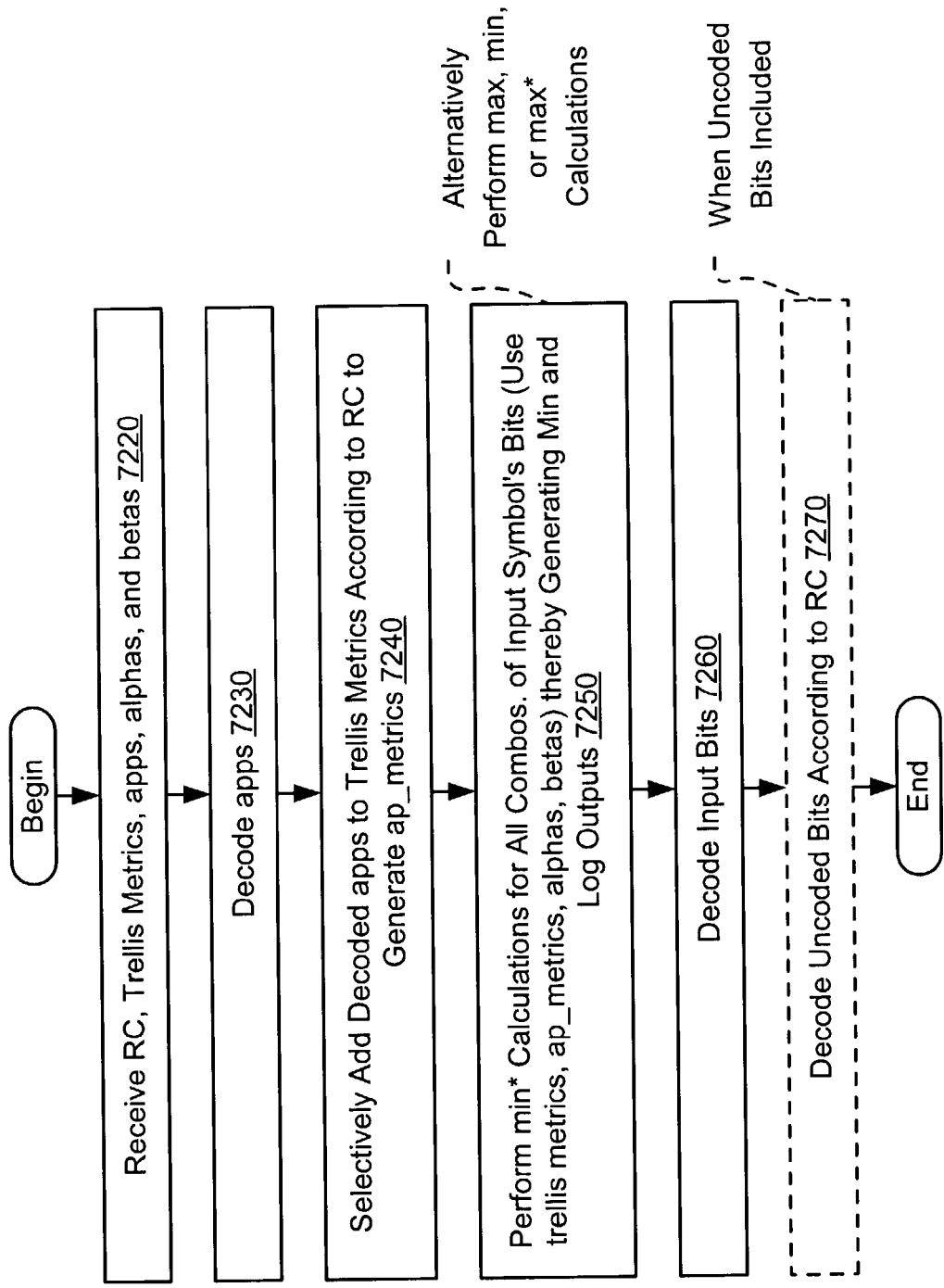
FIG. 72 is an operational flow diagram illustrating an embodiment of an extrinsic calculation and decoding method that is performed according to the invention.

FIG. 72 is an operational flow diagram illustrating an embodiment of an extrinsic calculation and decoding method 7200 that is performed according to the invention. In a block 7220, a RC, trellis metrics, apps, alphas, and betas are all received for use in a decoding method. These received apps undergo decoding in a block 7230. These decoded apps are selectively added to the trellis metrics according to the RC in a block 7240 to generate values that include the influence of both the apps and trellis metrics; the terms are shown as being ap_metrics.

As shown in a block 7250, min* calculations are performed for all possible combinations of the individual bits of an input symbol thereby generating the min output and log correction output values for each and every symbol to be decoded. In performed these min* calculations according to the invention, the trellis metrics, the ap_metrics, the alphas, and the betas are all employed to perform the min* extrinsic calculation employed according to the invention. It is also noted that the extrinsic calculation may be performed using a min, max, and/or max* approach as well.

After the min* extrinsic calculation has been performed within the block 7250, the input bits are decoded as shown in a block 7260. For example, in the two bit input symbol embodiment described above, the input bits of $i_0 i_1$ are decoded as shown in a block 7270; the decoded input bits may themselves be employed to decode the uncoded bits.

Figure 73:
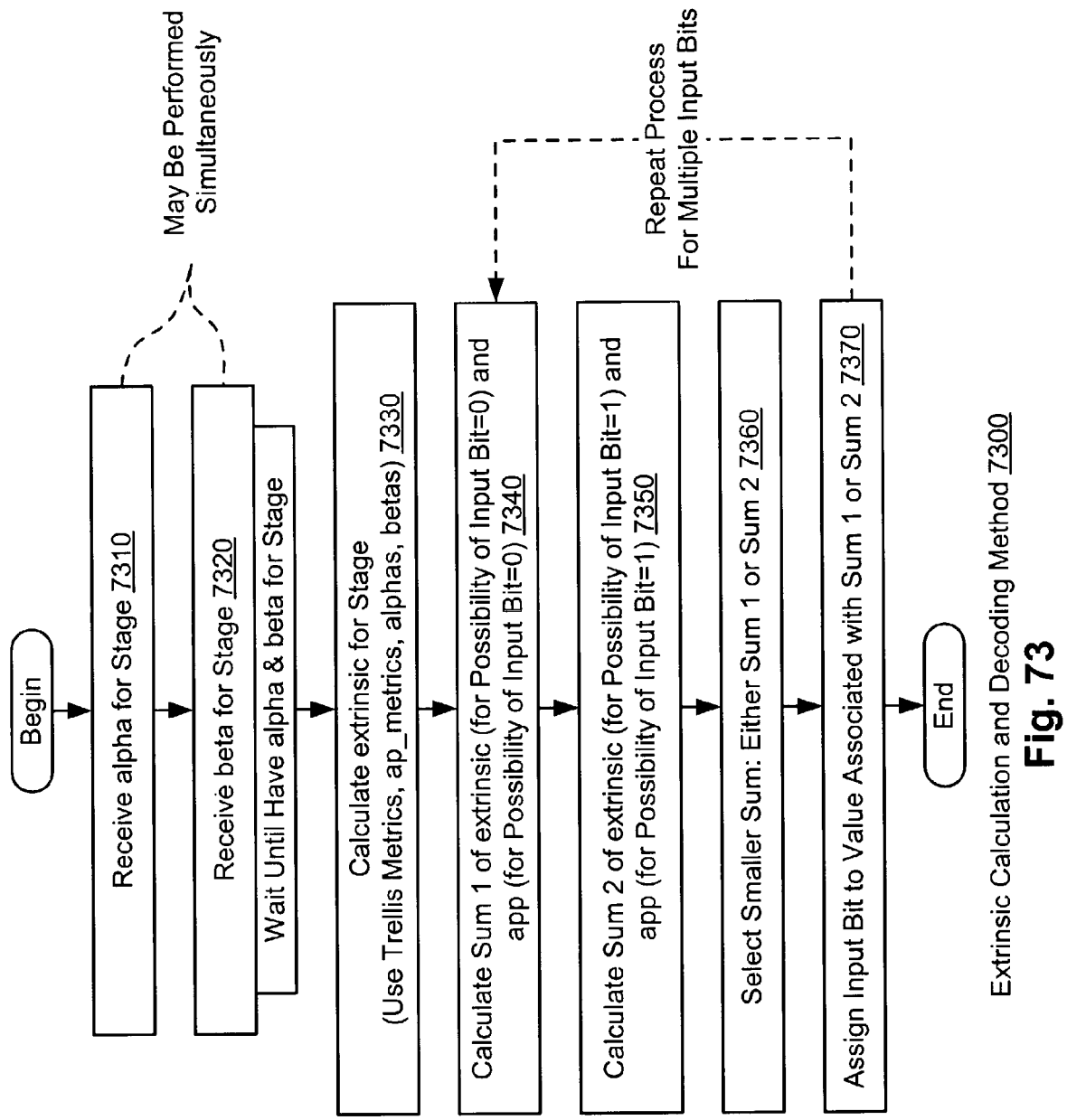
FIG. 73 is an operational flow diagram illustrating another embodiment of an extrinsic calculation and decoding method that is performed according to the invention.

FIG. 73 is an operational flow diagram illustrating another embodiment of an extrinsic calculation and decoding method 7300 that is performed according to the invention. In a block 7310, the alpha value for the stage is received. Then, in a block 7320, the beta value for the stage is received. These operations within the blocks 7310 and 7320 may be performed simultaneously in certain embodiments. In whichever case the operations of the blocks 7310 and 7320, the method waits until the alpha and beta values have been received for the stage before continuing on.

After the alpha and beta values for the stage have been received, then the method calculates the extrinsic value for the stage as shown in a block 7330. This is performed using the values of the trellis metrics, the ap_metrics (that are generated from the apps and the trellis metrics), the alphas, and the betas for the stage. After these extrinsic values are generated in the block 7330, then the method calculates a $1^{st}$ sum as shown in a block 7340 that is indicative of the possibility of one of the input bits of an input symbol having a value of 0. In the embodiment of a two bit input symbol, the block 7340 shows the calculation that the first input bit has a value of 0; the block 7340 also calculates the app value corresponding to the possibility that the input bit has a value of 0. Analogously, these calculations are also performed, as shown in a block 7350, to determine whether the input bit has a value of 1. For example, the method calculates a $2^{nd}$ sum as shown in a block 7350 that is indicative of the possibility of one of the input bits of an input symbol having a value of 1. In the embodiment of a two bit input symbol, the block 7350 shows the calculation that the first input bit has a value of 1; the block 7350 also calculates the app value corresponding to the possibility that the input bit has a value of 1. Clearly, input symbols having more than two input bits per symbol may be implemented without departing from the scope and spirit of the invention.

After both the sum1 and the sum 2 values have been calculated, then the method continue on with the operation in a block 7360 to determine which of the two sums is smaller. Depending on which of the two sums is smaller, then the input bit associated with the respective sum is assigned that bit value as shown in a block 7370. For example, if the sum 1 is smaller than the sum 2, then the value of the bit in question is assigned to have a value of 0; alternatively, if the sum 1 is larger than the sum 2, then the value of the bit in question is assigned to have a value of 1. The method may loop back to the operations shown in the block 7340 when dealing with input symbols having more than one input bit. The method may continue, in this loop to deal with all of the bits within the input symbol.

It is also noted that other embodiments of the invention may employ a decision criteria where a selection of a larger sum is the indicia that is used to determine the bit assignment value. For example, an alternative embodiment may select the larger value of the sum 1 and the sum 2 to assign the bit value to the one associated with that sum.

Figure 74:
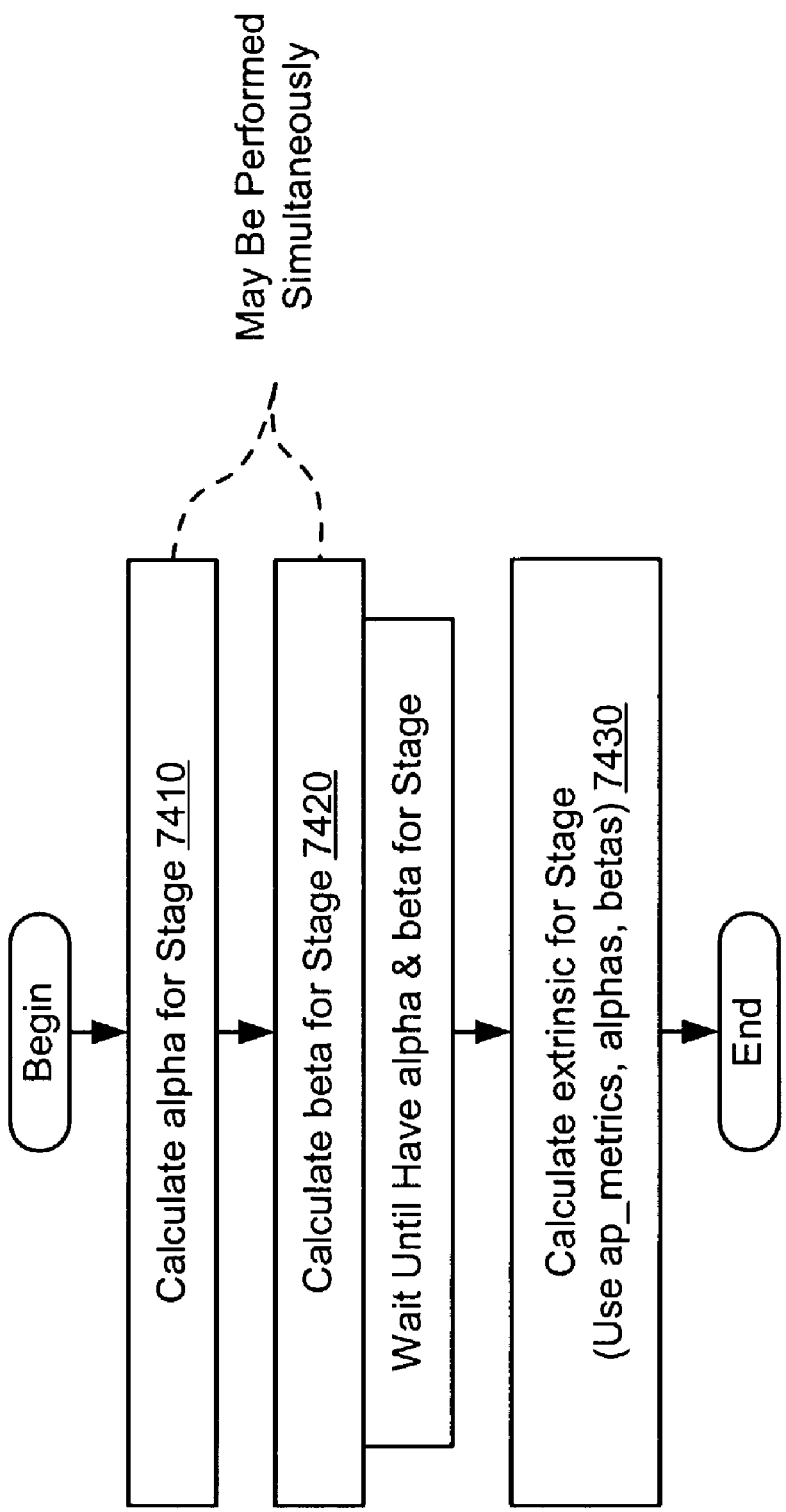
FIG. 74 is an operational flow diagram illustrating an embodiment of an extrinsic calculation method that is performed according to the invention.

FIG. 74 is an operational flow diagram illustrating an embodiment of an extrinsic calculation method 7400 that is performed according to the invention. As shown in a block 7410, the alpha value is calculated for the stage in question. Then, the beta value is calculated for the stage as well. These operations of the blocks 7410 and 7420 may be performed simultaneously for a stage. Alternatively, these operations may be performed simultaneously for different stages within a data frame or block of data. In either case, as soon as the alpha and beta value is available for a single stage, then the method will continue on.

Once the alpha and beta values have been calculated for the stage, then the method continues to calculate the extrinsic values for the stage as shown in a block 7430. In doing so, the method employs the intermediate values of ap_metrics (which include the influence of apps and trellis metrics), and the values of alphas, and betas. The FIG. 74 shows the methodological approach of how an extrinsic value for a stage of data may be calculated after first having attained the alpha and beta values for the stage.

In view of the above detailed description of the invention and associated drawings, other modifications and variations will now become apparent. It should also be apparent that such other modifications and variations may be effected without departing from the spirit and scope of the invention.

What is claimed is:

1. A soft-in soft-out functional block (SISO), within a turbo trellis coded modulation (TTCM) decoder, that calculates extrinsic information when iteratively decoding a plurality of symbols of a received data frame, the plurality of symbols being encoded according to a rate control sequence, the SISO comprising:

an extrinsic calculation functional block that determines a plurality of minimum extrinsic outputs and a plurality of log extrinsic outputs according to the rate control sequence, the extrinsic functional block employs a plurality of trellis metrics, a plurality of forward metric values (alphas) and a plurality of backward metric values (betas) corresponding to a trellis, and a plurality of 'a priori' probability values (apps);

an extrinsic decoding functional block that determines extrinsic information corresponding to input bits of symbols of the plurality of symbols using the plurality of minimum extrinsic outputs and the plurality of log extrinsic outputs, the decoding functional block also decodes the input bits using the extrinsic information corresponding to the input bits and the apps corresponding to the input bits; and an uncoded bit selection determination functional block that determines an uncoded bit select value that is used to selectively decode an uncoded bit when at least one symbol of the plurality of symbols comprises the uncoded bit; and wherein the uncoded bit selection determination functional block uses the decoded input bits to select a best estimate of the uncoded bit.

2. The SISO of claim 1, wherein the extrinsic functional block employs at least one of mm processing, max processing, and/or max* processing to determine the plurality of minimum extrinsic outputs and the plurality of log extrinsic outputs according to the rate control sequence.

3. The SISO of claim 1, wherein the extrinsic calculation functional block employs min* processing to determine the plurality of minimum extrinsic outputs and the plurality of log extrinsic outputs according to the rate control sequence.

4. The SISO of claim 3, wherein the min* processing employs a constant offset that ensures a positively valued output from the min* processing.

5. The SISO of claim 1, wherein the extrinsic calculation functional block employs a flag to represent at least two trellis metrics within the plurality of trellis metrics.

6. The SISO of claim 1, wherein at least two trellis metrics within the plurality of trellis metrics have a common received metric value, the received metric value corresponding to a symbol within the plurality of symbols within the received data frame.

7. The SISO of claim 1, wherein SISO performs processing on a clock cycle basis;

the extrinsic calculation functional block determines the extrinsic information on the clock cycle basis; and the extrinsic decoding functional block decodes the input bits on the clock cycle basis.

8. The SISO of claim 1, wherein the extrinsic calculation functional block comprises an extrinsic app functional block that selectively adds the plurality of 'a prior' probability values (apps) with the plurality of trellis metrics according to the trellis.

9. The SISO of claim 1, wherein the extrinsic calculation functional block initially performs min* processing on the plurality of forward metric values (alphas) and the plurality of trellis metrics thereby generating a plurality of intermediate min* outputs; and the extrinsic calculation functional block subsequently performs min* processing on the plurality of intermediate min* outputs and the plurality of backward metric values (betas).

10. The SISO of claim 9, wherein the plurality of forward metric values (alphas) and the plurality of trellis metrics are selectively combined for the min* processing according to the trellis.

11. The SISO of claim 1, wherein the extrinsic calculation functional block comprises a plurality of extrinsic min* trees, each extrinsic min* tree being operable to calculate a probability of a bit of an input symbol, of the plurality of symbols of the received data frame, comprising a value of a 1 or a 0.

12. The SISO of claim 11, further comprising a metric and 'a priori' probability combination functional block that selectively sums the plurality of trellis metrics and the plurality of 'a priori' probability values (apps) according to the rate control sequence; and
wherein the plurality of extrinsic min* trees initially performs min* processing that includes the plurality of forward metric values (alphas) and the sums of the plurality of trellis metrics and the plurality of 'a priori' probability values (apps); and
the plurality of extrinsic min* trees subsequently performs min* processing that includes the plurality of backward metric values (betas).

13. The SISO of claim 1, wherein at least one symbol of the plurality of symbols of the received data frame comprises two bits;
the extrinsic decoding functional block simultaneously determines extrinsic information for the two bits.

14. The SISO of claim 13, wherein the extrinsic decoding functional block comprises a normalize functional block and a saturate functional block that operate together to normalize the extrinsic information for the two bits thereby reducing the extrinsic information by a factor of two.

15. The SISO of claim 14, wherein the extrinsic information for the two bits comprises four values; and
the normalized extrinsic information for the two bits comprises two values.

16. The SISO of claim 1, wherein the plurality of symbols of the received data frame are encoded using a systematic encoder.

17. The SISO of claim 1, wherein the plurality of symbols of the received data frame are encoded using a non-systematic encoder.

18. The SISO of claim 1, wherein the uncoded bit selection determination functional block employs min* processing to generate the uncoded bit select value; and
the uncoded bit select value is used to select the best estimate of the uncoded bit from among a plurality of possible uncoded bit values.

19. The SISO of claim 18, wherein the uncoded bit select value and at least one of the decoded input bits are used to select the best estimate of the uncoded bit from among the plurality of possible uncoded bit values.

20. The SISO of claim 1, wherein the plurality of symbols being encoded using a systematic TTCM encoder.

21. The SISO of claim 1, wherein the plurality of symbols being encoded using a non-systematic TTCM encoder.

22. The SISO of claim 1, wherein the TTCM decoder is contained within at least one of a satellite receiver, a high definition television (HDTV) set top box receiver, a mobile receiver, a base station receiver, a receiver, and a transceiver.

23. The SISO of claim 1, wherein the TTCM decoder decodes information that is received at a rate greater than substantially 80 mega-bits per second.

24. A soft-in soft-out functional block (SISO) that iteratively decodes a plurality of symbols, of a received data frame, that are encoded according to a rate control sequence, the SISO comprising:
an extrinsic calculation functional block that calculates a plurality of min* extrinsic outputs for a plurality of input bits of a symbol within the plurality of symbols according to the rate control sequence;
an extrinsic decoding functional block that employs the plurality of min* extrinsic outputs and the plurality of apps to generate a plurality of extrinsic values and a decoded plurality of input bits of the symbol within the plurality of symbols; and
an uncoded bit selection determination functional block that generates an uncoded bit select value for use in selecting a best estimate of an uncoded bit from among a plurality of possible uncoded bit values when at least one symbol of the plurality of symbols of the received data frame comprises the uncoded bit.

25. The SISO of claim 24, wherein the extrinsic calculation functional block employs a plurality of trellis metrics, a plurality of 'a priori' probability values (apps), a plurality of forward metric values (alphas), and a plurality of backward metric values (betas) to calculate the plurality of min* extrinsic outputs.

26. The SISO of claim 24, wherein the extrinsic decoding functional block also employs a plurality of 'a priori' probability values (apps) to generate the plurality of extrinsic values and the decoded plurality of input bits of the symbol within the plurality of symbols.

27. The SISO of claim 24, wherein the uncoded bit selection determination functional block employs the decoded plurality of input bits of the symbol within the plurality of symbols, a plurality of forward metric values (alphas), and a plurality of backward metric values (betas) to generate the uncoded bit select value.

28. The SISO of claim 24, wherein the plurality of min* extrinsic outputs comprises a plurality of minimum extrinsic outputs and a plurality of log extrinsic outputs.

29. The SISO of claim 24, wherein the plurality of log extrinsic outputs comprises a constant offset that ensures positively valued log extrinsic outputs.

30. The SISO of claim 24, wherein the SISO performs processing on a clock cycle basis;
the extrinsic calculation functional block calculates the plurality of min* extrinsic outputs on the clock cycle basis; and
the extrinsic decoding functional block decodes the plurality of input bits of the symbol within the plurality of symbols on the clock cycle basis.

31. The SISO of claim 24, wherein the extrinsic calculation functional block comprises an extrinsic app functional block that selectively adds a plurality of 'a prior' probability values (apps) with a plurality of trellis metrics according to a trellis when calculating the plurality of min* extrinsic outputs; and
the trellis is employed to decode symbols encoded using different modulations according to the rate control sequence.

32. The SISO of claim 24, wherein the extrinsic calculation functional block initially performs min* processing on a plurality of forward metric values (alphas) and a plurality of trellis metrics thereby generating the plurality of min* outputs; and
the extrinsic calculation functional block subsequently performs min* processing on the plurality of min* outputs and a plurality of backward metric values (betas) when calculating the plurality of min* extrinsic outputs.

33. The SISO of claim 32, wherein the plurality of forward metric values (alphas) and the plurality of trellis metrics are selectively combined for the min* processing according to the trellis; and the trellis is employed to decode symbols encoded using different modulations according to the rate control sequence.

34. The SISO of claim 24, wherein the extrinsic calculation functional block comprises a plurality of extrinsic min* trees; and each extrinsic min* tree being operable to calculate a probability of an input bit of the plurality of input bits of the symbol within the plurality of symbols comprising a value of a 1 or a 0.

35. The SISO of claim 24, wherein the uncoded bit selection determination functional block employs min* processing to generate the uncoded bit select value.

36. The SISO of claim 35, wherein the uncoded bit select value and at least one of the decoded input bits is used to select the best estimate of the uncoded bit from among the plurality of possible uncoded bit values.

37. The SISO of claim 24, wherein the plurality of symbols being encoded using a systematic turbo trellis coded modulation (TTCM) encoder.

38. The SISO of claim 24, wherein the plurality of symbols being encoded using a non-systematic turbo trellis coded modulation (TTCM) encoder.

39. The SISO of claim 24, wherein the SISO is contained within a turbo trellis coded modulation (TTCM) decoder; and the TTCM decoder is contained within at least one of a satellite receiver, a high definition television (HDTV) set top box receiver, a mobile receiver, a base station receiver, a receiver, and a transceiver.

40. The SISO of claim 24, wherein the SISO is contained within a decoder that decodes information that is received at a rate greater than substantially 80 mega-bits per second.

41. An extrinsic calculation and decoding method that iteratively decodes a plurality of symbols, comprising:

receiving a rate control sequence, a plurality of trellis metrics, a plurality of forward metric values (alphas) and a plurality of backward metric values (betas) corresponding to a trellis, and a plurality of 'a priori' probability values (apps);

decoding the plurality of 'a priori' probability values (apps);

selectively adding the decoded plurality of 'a priori' probability values (apps) to the plurality of trellis metrics thereby generating a plurality of ap_metrics according to the rate control sequence;

performing min* processing on a plurality of combinations of input bits thereby generating a plurality of minimum extrinsic outputs and a plurality of log extrinsic outputs, the min* processing employs the plurality of forward metric values (alphas), the plurality of backward metric values (betas), and the plurality of ap_metrics; and decoding the input bits by selectively summing the plurality of minimum extrinsic outputs and the plurality of log extrinsic outputs thereby generating a plurality of extrinsic outputs.

42. The method of claim 41, further comprising selectively decoding an uncoded bit using the decoded input bits according to the rate control sequence when at least one symbol of the plurality of symbols comprises the uncoded bit.

43. The method of claim 42, further comprising performing min* processing to generate an uncoded bit select value for use in selecting a best estimate of the uncoded bit from among a plurality of possible uncoded bit values.

44. The method of claim 43, further comprising employing one of the decoded input bits, the plurality of forward metric values (alphas), and the plurality of backward metric values (betas) to generate the uncoded bit select value.

45. The method of claim 41, further comprising:

calculating a first sum of values selected from the plurality of extrinsic outputs that is indicative of a possibility of one of the input bits comprising a value of 1;

calculating a second sum of values selected from the plurality of extrinsic outputs that is indicative of a possibility of the one of the input bits comprising a value of 0; and assigning the value of the one of the inputs bits to the value 1 when a magnitude of the first sum is smaller than the second sum and alternatively assigning the value of the one of the inputs bits to the value 0 when a magnitude of the first sum is larger than the second sum.

46. The method of claim 41, wherein the min* processing comprises initially performing min* processing on the plurality of forward metric values (alphas) and the plurality of ap_metrics thereby generating a plurality of intermediate min* outputs; and subsequently performing min* processing on the plurality of intermediate min* outputs and the plurality of backward metric values (betas).

47. The method of claim 46, wherein the min* processing is performed using a plurality of extrinsic min* trees; and each extrinsic min* tree being operable to calculate a probability of one of the input bits comprising a value of a 1 or a 0.

48. The method of claim 41, wherein the plurality of extrinsic outputs comprises a constant offset to ensure each of the extrinsic outputs within the plurality of extrinsic outputs is positively valued.

49. The method of claim 41, wherein the method is performed within at least one of a satellite receiver, a high definition television (HDTV) set top box receiver, a mobile receiver, a base station receiver, a receiver, and a transceiver.

50. The method of claim 41, wherein the method decodes information that is received at a rate greater than substantially 80 mega-bits per second.

51. An extrinsic calculation and decoding method that iteratively decodes a plurality of symbols, comprising:

receiving a rate control sequence, a plurality of trellis metrics, a plurality of forward metric values (alphas) and a plurality of backward metric values (betas) corresponding to a trellis, and a plurality of 'a priori' probability values (apps);

decoding the plurality of 'a priori' probability values (apps);

selectively adding the decoded plurality of 'a priori' probability values (apps) to the plurality of trellis metrics thereby generating a plurality of ap_metrics according to the rate control sequence;

performing min* processing on a plurality of combinations of input bits thereby generating a plurality of minimum extrinsic outputs and a plurality of log extrinsic outputs, the min* processing employs the plurality of forward metric values (alphas), the plurality of backward metric values (betas), and the plurality of ap_metrics;

decoding the input bits by selectively summing the plurality of minimum extrinsic outputs and the plurality of log extrinsic outputs thereby generating a plurality of extrinsic outputs;

calculating a first sum of values selected from the plurality of extrinsic outputs that is indicative of a possibility of one of the input bits comprising a value of 1; and.

calculating a second sum of values selected from the plurality of extrinsic outputs that is indicative of a possibility of the one of the input bits comprising a value of 0; and assigning the value of the one of the inputs bits to the value 1 when a magnitude of the first sum is smaller than the second sum and alternatively assigning the value of the one of the inputs bits to the value 0 when a magnitude of the first sum is larger than the second sum; and selectively decoding an uncoded bit according to the rate control sequence by performing min* processing, employing one of the decoded input bits, the plurality of forward metric values (alphas), and the plurality of backward metric values (betas), to generate an uncoded bit select value for use in selecting a best estimate of an uncoded bit from among a plurality of possible uncoded bit values when at least one symbol of the plurality of symbols comprises the uncoded bit.

52. The method of claim 51, wherein the min* processing comprises initially performing min* processing on the plurality of forward metric values (alphas) and the plurality of ap_metrics thereby generating a plurality of intermediate min* outputs; and subsequently performing min* processing on the plurality of intermediate min* outputs and the plurality of backward metric values (betas).

53. The method of claim 51, wherein the min* processing is performed using a plurality of extrinsic min* trees; and each extrinsic min* tree being operable to calculate a probability of one of the input bits comprising a value of a 1 or a 0.

54. The method of claim 51, wherein the plurality of extrinsic outputs comprises a constant offset to ensure each of the extrinsic outputs within the plurality of extrinsic outputs is positively valued.

55. The method of claim 51, wherein the method is performed within at least one of a satellite receiver, a high definition television (HDTV) set top box receiver, a mobile receiver, a base station receiver, a receiver, and a transceiver.

56. The method of claim 51, wherein the method decodes information that is received at a rate greater than substantially 80 mega-bits per second.

* * * * *

UNITED STATES PATENT AND TRADEMARK OFFICE
CERTIFICATE OF CORRECTION

| | | |
|---|---|---|
| PATENT NO. | : 7,032,164 B2 | Page 1 of 1 |
| APPLICATION NO. | : 10/264766 | |
| DATED | : April 18, 2006 | |
| INVENTOR(S) | : Kelly Brian Cameron and Hau Thien Tran | |

It is certified that error appears in the above-identified patent and that said Letters Patent is hereby corrected as shown below:

Column 56, line 27, in Claim 2: replace "mm" with --min--

Signed and Sealed this

First Day of July, 2008

JON W. DUDAS
*Director of the United States Patent and Trademark Office*